US012765106B2

(12) United States Patent
Yamashita et al.

(10) Patent No.: US 12,765,106 B2
(45) Date of Patent: Oct. 13, 2026

(54) LIGHT DETECTING DEVICE AND ELECTRONIC DEVICE

(71) Applicant: SONY SEMICONDUCTOR SOLUTIONS CORPORATION, Kanagawa (JP)

(72) Inventors: Hirofumi Yamashita, Kanagawa (JP); Chihiro Tomita, Kanagawa (JP); Harumi Tanaka, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 324 days.

(21) Appl. No.: 18/440,310

(22) Filed: Feb. 13, 2024

(65) Prior Publication Data

US 2024/0213286 A1 Jun. 27, 2024

Related U.S. Application Data

(62) Division of application No. 18/259,947, filed as application No. PCT/JP2022/010411 on Mar. 9, 2022, now Pat. No. 12,262,565.

(30) Foreign Application Priority Data

Mar. 31, 2021 (JP) ................................ 2021-062418

(51) Int. Cl.
*H10F 39/00* (2025.01)

(52) U.S. Cl.
CPC ....... *H10F 39/811* (2025.01); *H10F 39/8037* (2025.01); *H10F 39/807* (2025.01)

(58) Field of Classification Search
CPC ... H10F 39/811; H10F 39/8037; H10F 39/813
See application file for complete search history.

(56) References Cited

U.S. PATENT DOCUMENTS 10,659,708 B2 * 5/2020 Ishiwata .............. H10F 39/802
12,100,718 B2 9/2024 Suzuki
(Continued)

FOREIGN PATENT DOCUMENTS

JP S61-232667 10/1986
JP 2000-050164 2/2000
(Continued)

OTHER PUBLICATIONS

International Search Report and Written Opinion for International (PCT) Patent Application No. PCT/JP2022/010411, dated Jun. 14, 2022, 6 pages.
(Continued)

*Primary Examiner* — Ali Naraghi
(74) *Attorney, Agent, or Firm* — SHERIDAN ROSS P.C.

(57) ABSTRACT

A light detecting device includes a semiconductor layer having a first surface and a second surface located on opposite sides to each other in a thickness direction, and a photoelectric conversion cell provided in the semiconductor layer and partitioned by a first isolation region. The photoelectric conversion cell includes a first photoelectric conversion region adjacent to a second photoelectric conversion region in plan view and each having a photoelectric conversion unit and a transfer transistor, a second isolation region arranged between the first photoelectric conversion region and the second photoelectric conversion region in plan view and extending in a thickness direction of the semiconductor layer, and an element formation region partitioned on the first surface side of the semiconductor layer by a third isolation region and provided with a pixel transistor. The element formation region extends over the first and second photoelectric conversion regions in plan view.

7 Claims, 62 Drawing Sheets

(56) References Cited

U.S. PATENT DOCUMENTS

| | | | | |
|---|---|---|---|---|
| 2013/0049082 | A1* | 2/2013 | Kato | H10F 39/811 257/292 |
| 2013/0056808 | A1 | 3/2013 | Tai et al. | |
| 2013/0194471 | A1 | 8/2013 | Yamashita | |
| 2014/0054662 | A1 | 2/2014 | Yanagita et al. | |
| 2014/0160335 | A1 | 6/2014 | Shimotsusa | |
| 2015/0001589 | A1 | 1/2015 | Tazoe et al. | |
| 2015/0109499 | A1 | 4/2015 | Yamashita | |
| 2015/0215554 | A1* | 7/2015 | Toyoguchi | H04N 23/672 348/300 |
| 2016/0056200 | A1 | 2/2016 | Lee et al. | |
| 2016/0064432 | A1 | 3/2016 | Shimotsusa | |
| 2016/0353040 | A1 | 12/2016 | Yamashita | |
| 2017/0012066 | A1 | 1/2017 | Choi et al. | |
| 2017/0263658 | A1 | 9/2017 | Shimotsusa | |
| 2017/0345853 | A1 | 11/2017 | Kato et al. | |
| 2018/0102384 | A1 | 4/2018 | Shimotsusa | |
| 2018/0190699 | A1 | 7/2018 | Lee | |
| 2018/0294297 | A1 | 10/2018 | Yun | |
| 2018/0301483 | A1 | 10/2018 | Shimotsusa | |
| 2019/0259788 | A1 | 8/2019 | Shimotsusa | |
| 2019/0342514 | A1 | 11/2019 | Kido | |
| 2020/0091212 | A1 | 3/2020 | Park | |
| 2020/0119082 | A1 | 4/2020 | Lee | |
| 2020/0161352 | A1 | 5/2020 | Takahashi et al. | |
| 2020/0177832 | A1* | 6/2020 | Kido | H04N 25/767 |
| 2020/0235149 | A1 | 7/2020 | Shiraishi | |
| 2020/0236313 | A1 | 7/2020 | Lee et al. | |
| 2020/0357832 | A1 | 11/2020 | Shimotsusa | |
| 2021/0242254 | A1 | 8/2021 | Fukui | |
| 2021/0400224 | A1 | 12/2021 | Gocho et al. | |
| 2024/0038815 | A1 | 2/2024 | Yamashita et al. | |

FOREIGN PATENT DOCUMENTS

| | | | |
|---|---|---|---|
| JP | 2007-103590 | | 4/2007 |
| JP | 2011181595 | A | 9/2011 |
| JP | 2011-210837 | | 10/2011 |
| JP | 2012-531046 | | 12/2012 |
| JP | 2013-008989 | | 1/2013 |
| JP | 2013-062789 | | 4/2013 |
| JP | 2013-157883 | | 8/2013 |
| JP | 2014-086781 | | 5/2014 |
| JP | 2014-116472 | | 6/2014 |
| JP | 2015046477 | A | 3/2015 |
| JP | 2016-134396 | | 7/2016 |
| JP | 2016-136659 | | 7/2016 |
| JP | 2016-167773 | | 9/2016 |
| JP | 2017157816 | A | 9/2017 |
| JP | 2017-212351 | | 11/2017 |
| JP | 2018-014649 | | 1/2018 |
| JP | 2018-160558 | | 10/2018 |
| JP | 2018-201015 | | 12/2018 |
| JP | 2018-201078 | | 12/2018 |
| JP | 2019-029985 | | 2/2019 |
| JP | 2020194912 | A | 12/2020 |
| KR | 20110109862 | A | 10/2011 |
| KR | 20190110538 | A | 9/2019 |
| KR | 20200041144 | A | 4/2020 |
| TW | 202109863 | A | 3/2021 |
| WO | WO 2009/031301 | | 3/2009 |
| WO | WO 2016/006052 | | 1/2016 |
| WO | WO 2018/139279 | | 8/2018 |
| WO | WO 2018/207345 | | 11/2018 |
| WO | WO 2019/102887 | | 5/2019 |
| WO | WO 2019/220810 | | 11/2019 |
| WO | WO 2020/013130 | | 1/2020 |
| WO | WO 2020/095689 | | 5/2020 |
| WO | WO 2020/105713 | | 5/2020 |
| WO | WO-2020241717 | A1 | 12/2020 |

OTHER PUBLICATIONS

Official Action for U.S. Appl. No. 18/259,947, dated Dec. 15, 2023, 9 pages. Restriction Requirement.
Written Opinion of the International Preliminary Examining Authority for International (PCT) Patent Application No. PCT/JP2022/010411, dated Jan. 10, 2023, 12 pages.
Official Action for Japan Patent Application No. 2024-004108, dated Jan. 21, 2025, 4 pages.
Official Action for Japan Patent Application No. 2024-004109, dated Jan. 21, 2025, 5 pages.
Official Action for U.S. Appl. No. 18/259,947, dated Mar. 20, 2024, 9 pages.
Official Action for U.S. Appl. No. 18/259,947, dated Jun. 20, 2024, 7 pages.
Notice of Allowance for U.S. Appl. No. 18/259,947, dated Oct. 15, 2024, 9 pages.
Corrected Notice of Allowance for U.S. Appl. No. 18/259,947, dated Nov. 15, 2024, 5 pages.

* cited by examiner

LIGHT DETECTING DEVICE AND ELECTRONIC DEVICE

CROSS REFERENCE TO RELATED APPLICATIONS

This application is a division of U.S. patent application Ser. No. 18/259,947, filed on Jun. 29, 2023, which is a national stage application under 35 U.S.C. 371 and claims the benefit of PCT Application No. PCT/JP2022/010411, having an international filing date of Mar. 9, 2022, which designated the United States, which PCT application claimed the benefit of Japanese Patent Application No. 2021-062418, filed Mar. 31, 2021, the entire disclosures of each of which are incorporated herein by reference.

TECHNICAL FIELD

The present technology (the technology according to the present disclosure) relates to a light detecting device and an electronic device, and particularly relates to a technology effective for application to a light detecting device having a phase difference detection pixel and an electronic device.

BACKGROUND ART

As a light detecting device, a solid-state imaging device is known. In this individual imaging device, there is a method of performing pupil division by embedding a plurality of photoelectric conversion elements on a lower side of one on-chip lens. For example, the individual imaging device is employed in a light detecting device for a built-in camera of an electronic device such as a single-lens reflex camera or a smartphone. Furthermore, in a light detecting device, there is known a method of performing phase difference detection by reading signal charges photoelectrically converted by a plurality of photoelectric conversion elements arranged under one on-chip lens as independent signals at the time of phase difference detection.

This type of solid-state imaging device includes a photoelectric conversion cell in which a semiconductor layer is partitioned for each pixel in a pixel isolation region extending in a thickness direction of the semiconductor layer. Then, the photoelectric conversion cell is partitioned into a plurality of photoelectric conversion regions in an in-pixel isolation region extending in the thickness direction of the semiconductor layer, and a photoelectric conversion unit, a transfer transistor, and a charge holding region (floating diffusion) are arranged in each of the plurality of photoelectric conversion regions.

Meanwhile, an element formation region divided by an element isolation region is provided on an opposite side of a light incident surface side of the photoelectric conversion cell, and pixel transistors such as an amplification transistor, a transfer transistor, and a reset transistor included in a readout circuit are arranged in the element formation region.

Note that a solid-state imaging device including a pixel isolation region, an in-pixel isolation region, and an element isolation region is disclosed in Patent Document 1.

CITATION LIST

Patent Document

Patent Document 1: US Patent Application Publication No. 2017/0012066

SUMMARY OF THE INVENTION

Problems to be Solved by the Invention

By the way, in a solid-state imaging device, miniaturization of pixels is required due to an increase in the number of pixels associated with high image quality. However, with the miniaturization of pixels, it becomes difficult to arrange active elements such as transfer transistors and pixel transistors included in a readout circuit in a photoelectric conversion cell. In particular, in a photoelectric conversion cell including an in-pixel isolation region, it is difficult to arrange active elements in the in-pixel isolation region, and thus, a degree of freedom in arrangement of the active elements is lower.

An object of the present technology is to increase a degree of freedom in arrangement of active elements.

Solutions to Problems (1) A light detecting device according to one aspect of the present technology includes:

a semiconductor layer having a first surface and a second surface located on opposite sides to each other in a thickness direction; and a photoelectric conversion cell provided in the semiconductor layer and partitioned by a first isolation region extending in the thickness direction of the semiconductor layer.

Then, the photoelectric conversion cell includes a first photoelectric conversion region and a second photoelectric conversion region provided adjacent to each other in plan view in the semiconductor layer and each having a photoelectric conversion unit and a transfer transistor, a second isolation region arranged between the first photoelectric conversion region and the second photoelectric conversion region in plan view and extending in a thickness direction of the semiconductor layer, and an element formation region provided by being partitioned on the first surface side of the semiconductor layer by a third isolation region and provided with a pixel transistor, and the element formation region extends over the first and second photoelectric conversion regions in plan view.

(2) A photoelectric conversion device according to another aspect of the present technology includes:

a semiconductor layer having a first surface and a second surface located on opposite sides to each other in a thickness direction; and a photoelectric conversion cell provided in the semiconductor layer and partitioned by a first isolation region extending in the thickness direction of the semiconductor layer.

Then, the photoelectric conversion cell includes a first photoelectric conversion region and a second photoelectric conversion region provided adjacent to each other in plan view in the semiconductor layer and each of the first photoelectric conversion region and the second photoelectric conversion region having a photoelectric conversion unit and a transfer transistor, a second isolation region provided between the first photoelectric conversion region and the second photoelectric conversion region in plan view and extending in a thickness direction of the semiconductor layer, an element formation region partitioned by a third isolation region and provided on the first surface side of the semiconductor layer, and provided with a pixel transistor, a charge holding region provided on the first surface side of the semiconductor layer, a semiconductor region of a first conductivity type provided in the semiconductor layer over each of the element formation region, the first photoelectric conversion region, and the second photoelectric conversion region, and a contact region of the first conductivity type provided in the semiconductor region.

Then, at least one of the charge holding region or the contact region is shared by the first photoelectric conversion region and the second photoelectric conversion region, and is arranged between the first photoelectric conversion region and the second photoelectric conversion region in plan view.

(3) A light detecting device according to another aspect of the present technology includes:

a semiconductor layer including a plurality of photoelectric conversion cells arranged adjacent to each other via an isolation region in plan view, each of the photoelectric conversion cells being provided with a photoelectric conversion unit and a transfer transistor;

a semiconductor region provided on the isolation region side of each of the plurality of photoelectric conversion cells in plan view; and a conductive pad partially embedded in the isolation region and connected to the semiconductor region of each of the plurality of photoelectric conversion cells across the isolation region in plan view.

(4) A light detecting device according to another aspect of the present technology includes:

a semiconductor layer having a first surface and a second surface located on opposite sides to each other in a thickness direction; and a photoelectric conversion cell partitioned by an element isolation region and provided in the semiconductor layer, the photoelectric conversion cell includes a transfer transistor, a charge holding region, and a contact region on the first surface side of the semiconductor layer, and a photoelectric conversion unit on the second surface side, and the isolation region includes a first portion with which the charge holding region is in contact in plan view, and a second portion with which the contact region is in contact and which is narrower in width than the first portion.

(5) A light detecting device according to another aspect of the present technology includes:

a pixel unit including four pixels each having two photoelectric conversion regions, two transfer transistors, and two charge holding regions, and the charge holding regions of the respective pixels of the pixel unit are electrically connected to each other.

(6) A light detecting device according to another aspect of the present technology includes:

a plurality of pixels provided in a two-dimensional manner, and five semiconductor regions partitioned by an element isolation region are included in each pixel of the plurality of pixels.

(7) A light detecting device according to another aspect of the present technology includes:

a plurality of pixels provided in a two-dimensional manner; and five semiconductor regions partitioned by an element isolation region in the pixel, the five semiconductor regions include a first semiconductor region provided with a first transfer transistor, a second semiconductor region provided with a second transfer transistor, a third semiconductor region provided with a first pixel transistor other than the first and second transfer transistors, a fourth semiconductor region provided with a second pixel transistor other than the first and second transfer transistors, and a p-type semiconductor region.

(8) A light detecting device according to another aspect of the present technology includes:

a first pixel provided on a semiconductor substrate; and a trench including a first region that isolates the first pixel from an adjacent pixel and a second region in which a photoelectric conversion unit provided in the pixel is shielded in plan view, the second region has a first portion between a first floating diffusion region and a second floating diffusion region provided in the first pixel in plan view, the second region has a second portion between a first transistor and a second transistor provided in the first pixel in the plan view, and a contact region is provided between the first portion and the second portion in plan view.

(9) A light detecting device according to another aspect of the present technology includes:

a first pixel provided on a semiconductor substrate; and an isolation region that isolates the first pixel from an adjacent pixel, the first pixel is surrounded by first to fourth portions of the isolation region in plan view, a fifth portion and a sixth portion provided between the first portion and the third portion in plan view are included, a contact region is provided between the fifth portion and the sixth portion in plan view, and the fifth portion is in contact with the first portion, and the sixth portion is in contact with the third portion.

(10) An electronic device according to another aspect of the present technology includes: the light detecting device according to any one of (1) to (9) above; an optical lens that forms an image of image light from an object on an imaging surface of the light detecting device; and a signal processing circuit that performs signal processing for a signal output from the light detecting device.

MODE FOR CARRYING OUT THE INVENTION

Figure 1:
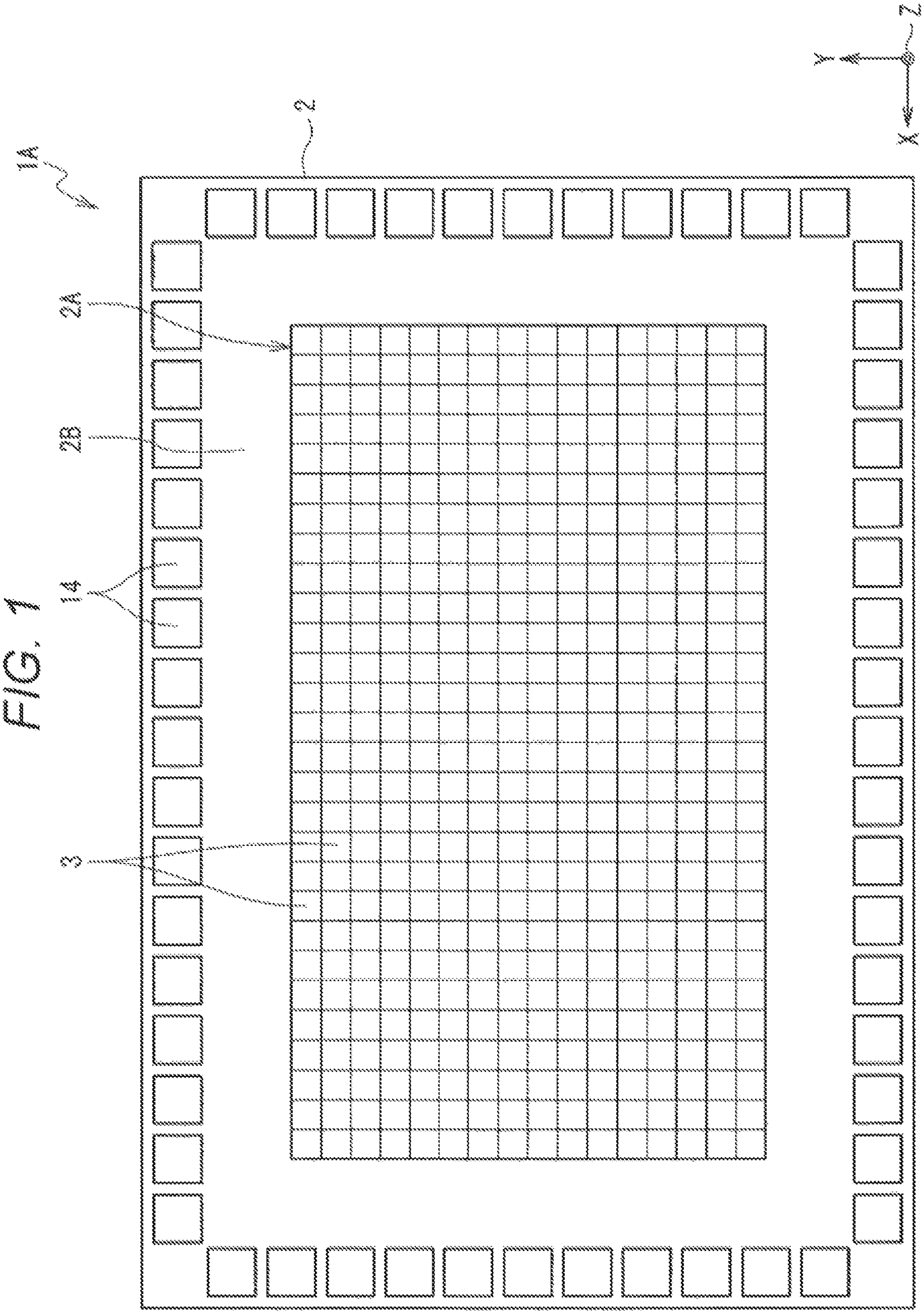
FIG. 1 is a chip layout diagram illustrating a configuration example of a solid-state imaging device according to a first embodiment of the present technology.

Hereinafter, embodiments of the present technology will be described in detail with reference to the drawings.

In the description of the drawings referred to in the following description, the same or similar parts are denoted by the same or similar reference numerals. However, it should be noted that the drawings are schematic, and a relationship between a thickness and a plane dimension, a ratio of the thickness of each layer, and the like are different from actual ones. Therefore, specific thicknesses and dimensions should be determined in consideration of the following description.

Furthermore, it is needless to say that dimensional relationships and ratios are different among the drawings. Furthermore, effects described in the present specification are merely examples and are not limited, and other effects may be exhibited.

Furthermore, the following embodiments illustrate devices and methods for embodying the technical idea of the present technology, and do not specify the configuration as follows. That is, various modifications can be added to the technical idea of the present technology within the technical scope described in the claims.

Furthermore, definitions of directions such as up and down in the following description are merely definitions for convenience of description, and do not limit the technical idea of the present technology. For example, it is a matter of course that when an object is rotated by 90° and observed, the up and down are converted into left and right and read, and when the object is rotated by 180° and observed, the up and down are inverted and read.

Furthermore, in the following embodiments, a case where a first conductivity type is p-type and a second conductivity type is n-type will be exemplarily described, but the conductivity types may be selected in an opposite relationship, and the first conductivity type may be n-type and the second conductivity type may be p-type.

Furthermore, in the following embodiments, in three directions orthogonal to one another in a space, a first direction and a second direction orthogonal to each other in the same plane are defined as an X direction and a Y direction, respectively, and a third direction orthogonal to the first direction and the second direction is defined as a Z direction. Then, in the following embodiments, a thickness direction of a semiconductor layer 21 to be described below will be described as the Z direction.

First Embodiment

In this first embodiment, an example in which the present technology is applied to a solid-state imaging device that is a back-illuminated complementary metal oxide semiconductor (CMOS) image sensor as a light detecting device will be described.

<<Overall Configuration of Solid-State Imaging Device>>

First, an overall configuration of a solid-state imaging device 1A will be described.

Figure 55:
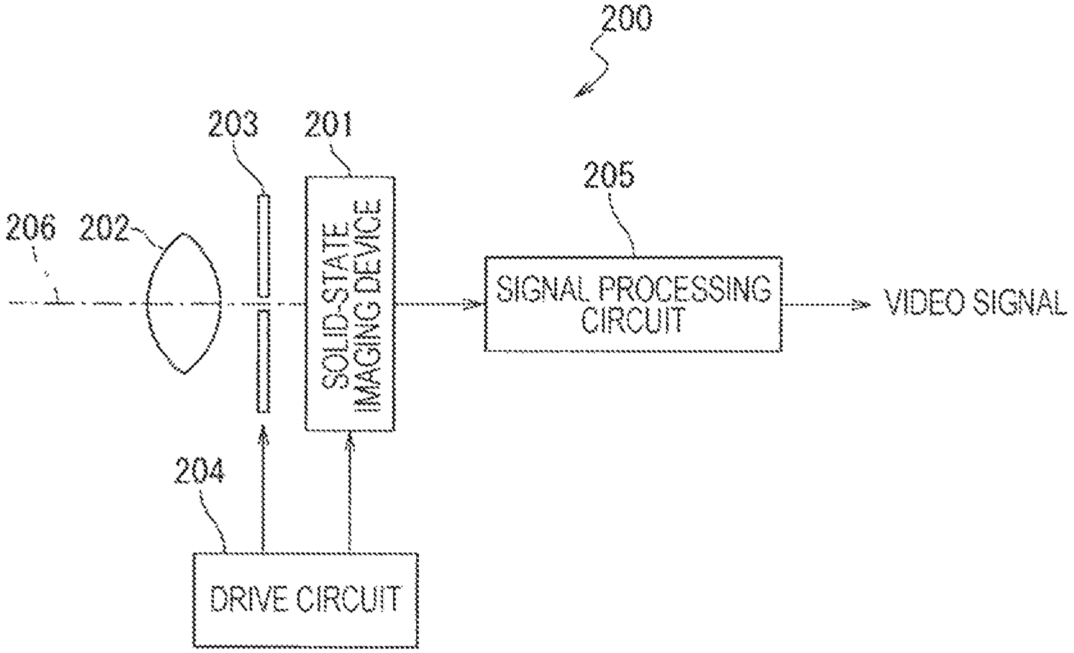
FIG. 55 is a diagram illustrating a schematic configuration of an electronic device according to a twenty-third embodiment of the present technology.

As illustrated in FIG. 1, the solid-state imaging device 1A according to the first embodiment of the present technology mainly includes a semiconductor chip 2 having a rectangular two-dimensional planar shape in plan view. That is, the solid-state imaging device 1A is mounted on the semiconductor chip 2. As illustrated in FIG. 55, the solid-state imaging device 1A (201) takes in image light (incident light 206) from an object via an optical lens 202, converts a light amount of the incident light 206 formed on an imaging surface into an electrical signal in units of pixels, and outputs the electrical signal as a pixel signal.

As illustrated in FIG. 1, the semiconductor chip 2 on which the solid-state imaging device 1A is mounted includes a rectangular pixel region 2A provided in a central portion and a peripheral region 2B provided outside the pixel region 2A so as to surround the pixel region 2A, in a two-dimensional plane including an X direction and a Y direction orthogonal to each other.

The pixel region 2A is, for example, a light receiving surface that receives light condensed by an optical lens (optical system) 202 illustrated in FIG. 55. Then, in the pixel region 2A, a plurality of pixels 3 is arranged in a matrix on the two-dimensional plane including the X direction and the Y direction. In other words, the pixels 3 are repeatedly arranged in each of the X direction and the Y direction orthogonal to each other in the two-dimensional plane.

As illustrated in FIG. 1, a plurality of bonding pads 14 is arranged in the peripheral region 2B. Each of the plurality of bonding pads 14 is arrayed along each of four sides in the two-dimensional plane of the semiconductor chip 2, for example. Each of the plurality of bonding pads 14 is an input/output terminal used when the semiconductor chip 2 is electrically connected to an external device.

<Logic Circuit>

Figure 2:
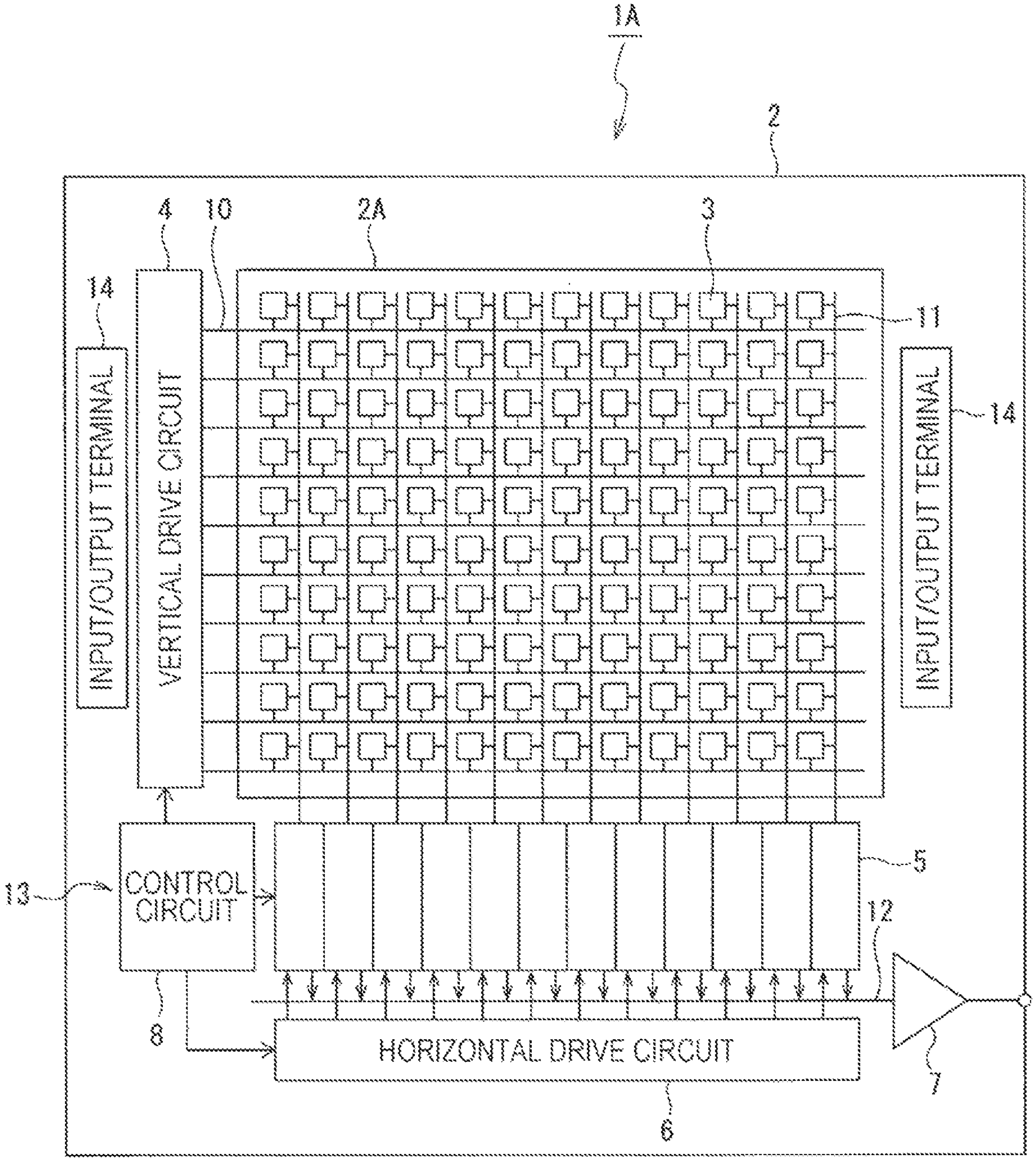
FIG. 2 is a block diagram illustrating a configuration example of the solid-state imaging device according to the first embodiment of the present technology.

As illustrated in FIG. 2, the semiconductor chip 2 includes a logic circuit 13 including a vertical drive circuit 4, a column signal processing circuit 5, a horizontal drive circuit 6, an output circuit 7, a control circuit 8, and the like. The logic circuit 13 includes, for example, a complementary MOS (CMOS) circuit including an n-channel conductive metal oxide semiconductor field effect transistor (MOSFET) and a p-channel conductive MOSFET as field effect transistors.

The vertical drive circuit 4 includes, for example, a shift register. The vertical drive circuit 4 sequentially selects a desired pixel drive line 10, and supplies a pulse for driving the pixel 3 to the selected pixel drive line 10 to drive each pixel 3 in units of rows. That is, the vertical drive circuit 4 selectively scans each pixel 3 in the pixel region 2A sequentially in a vertical direction in units of rows, and supplies a pixel signal from the pixel 3 based on a signal charge generated according to an amount of received light by a photoelectric conversion element of the each pixel 3 to the column signal processing circuit 5 through a vertical signal line 11.

The column signal processing circuit 5 is arranged, for example, for each column of the pixels 3, and performs signal processing such as noise removal for the signals output from the pixels 3 of one row for each pixel column. For example, the column signal processing circuit 5 performs signal processing such as correlated double sampling (CDS) for removing a fixed pattern noise unique to a pixel, and analog-digital (AD) conversion.

The horizontal drive circuit 6 includes, for example, a shift resistor. The horizontal drive circuit 6 sequentially outputs horizontal scanning pulses to the column signal processing circuits 5 to sequentially select each of the column signal processing circuits 5, and causes the each of the column signal processing circuits 5 to output the pixel signal for which the signal processing has been performed to a horizontal signal line 12.

The output circuit 7 performs signal processing for the pixel signals sequentially supplied from the respective column signal processing circuits 5 through the horizontal signal line 12, and outputs the pixel signals. As the signal processing, for example, buffering, black level adjustment, column variation correction, various types of digital signal processing, and the like can be used.

The control circuit 8 generates clock signals and control signals serving as references of operations of the vertical drive circuit 4, the column signal processing circuit 5, the horizontal drive circuit 6, and the like on the basis of a vertical synchronization signal, a horizontal synchronization signal, and a master clock signal. Then, the control circuit 8 outputs the generated clock signals and control signals to the vertical drive circuit 4, the column signal processing circuit 5, the horizontal drive circuit 6, and the like.

<Pixel>

Figure 3:
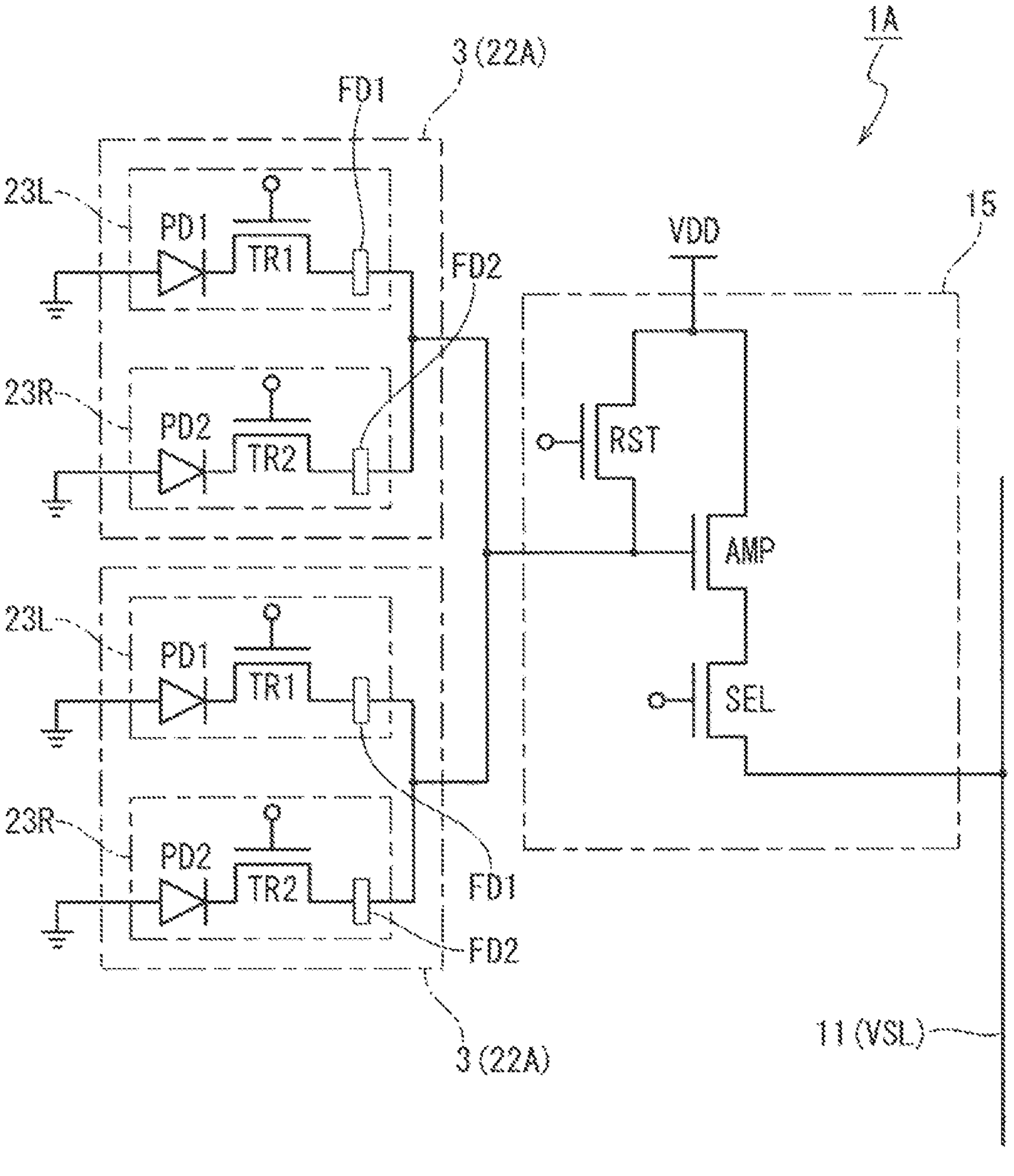
FIG. 3 is an equivalent circuit diagram illustrating a configuration example of a pixel and a readout circuit according to the first embodiment of the present technology.

As illustrated in FIG. 3, each pixel 3 of the plurality of pixels 3 includes a photoelectric conversion cell 22A. The photoelectric conversion cell 22A includes two photoelectric conversion regions 23L and 23R. The first photoelectric conversion region 23L includes a photoelectric conversion element PD1, a charge holding region (floating diffusion) FD1 that holds (accumulates) a signal charge photoelectrically converted by the photoelectric conversion element PD1, and a transfer transistor TR1 that transfers the signal charge photoelectrically converted by the photoelectric conversion element PD1 to the charge accumulation region FD1. Similarly, the second photoelectric conversion region 23R includes a photoelectric conversion element PD2, a charge holding region FD2 that holds (accumulates) the signal charge photoelectrically converted by the photoelectric conversion element PD2, and a transfer transistor TR2 that transfers the signal charge photoelectrically converted by the photoelectric conversion element PD2 to the charge accumulation region FD2.

Each of the two photoelectric conversion elements PD1 and PD2 generates the signal charge corresponding to the amount of received light. Furthermore, each of the two photoelectric conversion elements PD1 and PD2 temporarily holds (accumulates) the generated signal charge. In the photoelectric conversion element PD1, a cathode side is electrically connected to a source region of the transfer transistor TR1, and an anode side is electrically connected to a reference potential line (for example, ground). In the photoelectric conversion element PD2, a cathode side is electrically connected to a source region of the transfer transistor TR2, and an anode side is electrically connected to a reference potential line (for example, ground). As the photoelectric conversion elements PD1 and PD2, for example, photodiodes are used.

In the two transfer transistors TR1 and TR2, the source region of the transfer transistor TR1 is electrically connected to the cathode side of the photoelectric conversion element PD1, and a drain region is electrically connected to the charge holding region FD1. Then, a gate electrode of the transfer transistor TR1 is electrically connected to a transfer transistor drive line of the pixel drive line 10 (see FIG. 2). In the transfer transistor TR2, the source region is electrically connected to the cathode side of the photoelectric conversion element PD2, and a drain region is electrically connected to the charge holding region FD2. Then, a gate electrode of the transfer transistor TR2 is electrically connected to the transfer transistor drive line of the pixel drive line 10.

In the two charge holding regions FD1 and FD2, the charge holding region FD1 temporarily accumulates and holds the signal charge transferred from the photoelectric conversion element PD1 via the transfer transistor TR1. The charge holding region FD2 temporarily accumulates and holds the signal charge transferred from the photoelectric conversion element PD2 via the transfer transistor TR2.

As illustrated in FIG. 3, an input stage of a readout circuit 15 is connected to each of the two charge holding regions FD1 and FD2. The readout circuit 15 reads the signal charges held in the charge holding regions FD1 and FD2, and outputs pixel signals based on the signal charges. Although the readout circuit 15 is not limited thereto, the readout circuit 15 is shared by, for example, two pixels 3, in other words, the two photoelectric conversion cells 22A. Then, the readout circuit 15 includes an amplification transistor AMP, a selection transistor SEL, and a reset transistor RST. These transistors (AMP, SEL, and RST) include a pixel transistor Qt (see FIG. 4) to be described below.

In the amplification transistor AMP, a source region is electrically connected to a drain region of the selection transistor SEL, and a drain region is electrically connected to a power supply line VDD and a drain region of the reset transistor RST. Then, a gate electrode of the amplification transistor AMP is electrically connected to the charge holding regions FD1 and FD2 and a source region of the reset transistor RST of each of the two photoelectric conversion cells 22A.

In the selection transistor SEL, a source region is electrically connected to the vertical signal line 11 (VSL), and the drain region is electrically connected to the source region of the amplification transistor AMP. Then, a gate electrode of the selection transistor SEL is electrically connected to a selection transistor drive line of the pixel drive line 10 (see FIG. 2).

In the reset transistor RST, the source region is electrically connected to the charge holding regions FD1 and FD2 of the two photoelectric conversion cells 22A and the gate electrode of the amplification transistor AMP, and the drain region is electrically connected to the power supply line VDD and the drain region of the amplification transistor AMP. Then, a gate electrode of the reset transistor RST is electrically connected to the pixel drive line 10 (see FIG. 2).

When the transfer transistor TR1 is turned on, the transfer transistor TR1 transfers the signal charge generated by the photoelectric conversion element PD1 to the charge holding region FD1. When the transfer transistor TR2 is turned on, the transfer transistor TR2 transfers the signal charge generated by the photoelectric conversion element PD2 to the charge holding region FD2.

When the reset transistor RST is turned on, the reset transistor RST resets potentials (signal charges) of the charge holding regions FD1 and FD2 to the potential of the power supply line VDD. The selection transistor SEL controls output timing of the pixel signal from the readout circuit 15.

The amplification transistor AMP generates a signal of a voltage corresponding to a level of the signal charges held in the charge holding regions FD1 and FD2 as the pixel signal. The amplification transistor AMP constitutes a source-follower type amplifier, and outputs the pixel signal having the voltage corresponding to the level of the signal charges generated by the photoelectric conversion elements PD1 and PD2. When the selection transistor SEL is turned on, the amplification transistor AMP amplifies the potentials of the charge holding regions FD1 and FD2, and outputs the voltage corresponding to the potentials to the column signal processing circuit 5 via the vertical signal line 11 (VSL).

Here, in an electronic device including the solid-state imaging device 1A of the first embodiment, the signal charge is read from each of the two photoelectric conversion elements PD1 and PD2 for each pixel 3, and a phase difference of the read signal charges is detected. In a case of in focus, there is no difference in the amounts of signal charges accumulated in the photoelectric conversion element PD1 and the photoelectric conversion element PD2. In contrast, in a case of out of focus, there is a difference between an amount Q1 of the signal charge accumulated in the photoelectric conversion element PD1 and an amount Q2 of the signal charge accumulated in the photoelectric conversion element PD2. Then, in the case of out of focus, the electronic device performs an operation such as operating a target lens to cause Q1 and Q2 to coincide with each other. This is autofocus.

<<Specific Configuration of Solid-State Imaging Device>>

Figure 4:
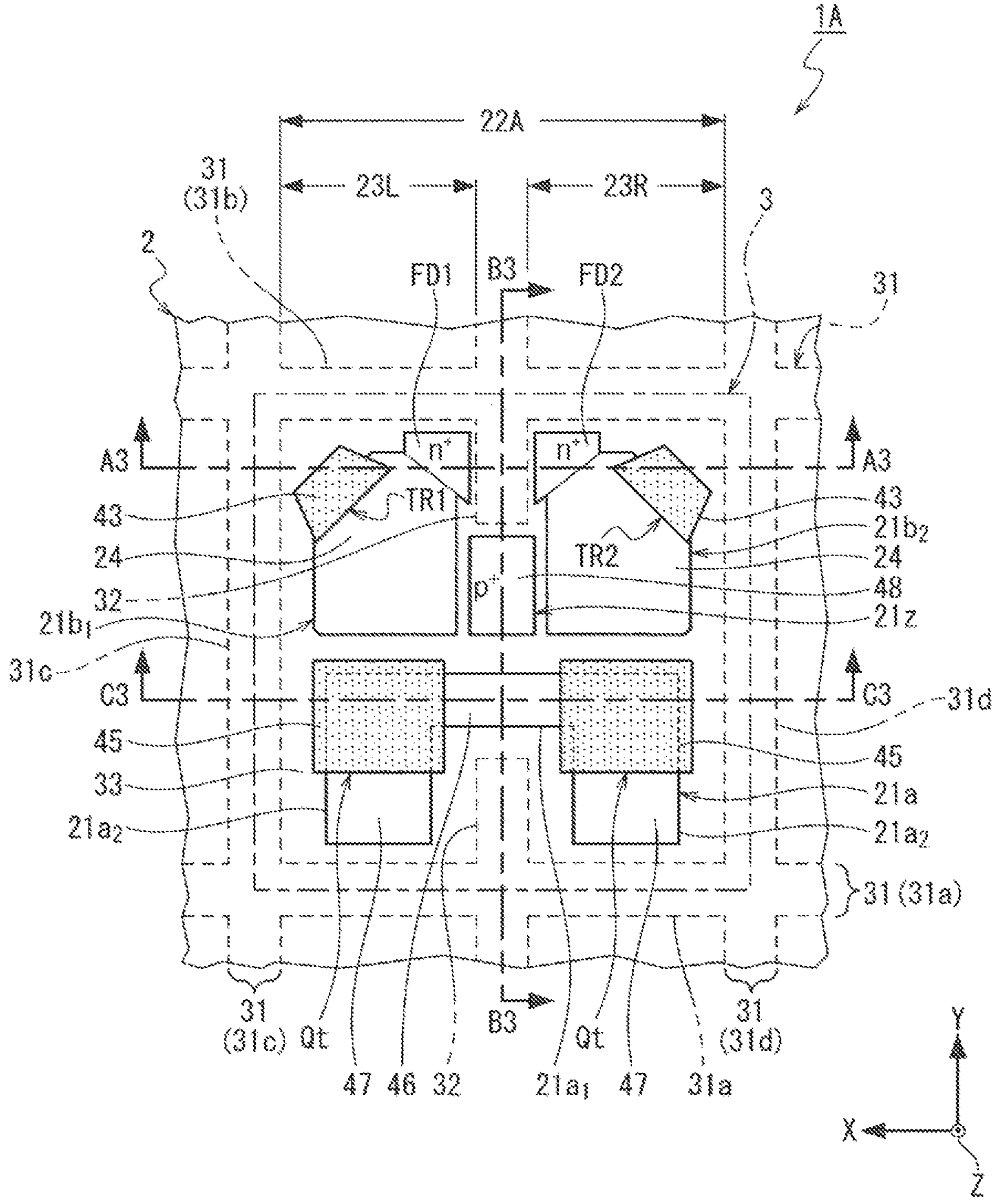
FIG. 4 is a schematic plan view illustrating a configuration example of a pixel according to the first embodiment of the present technology.

Next, a specific configuration of the semiconductor chip 2 (solid-state imaging device 1A) will be described with reference to FIGS. 4 to 7. Note that, to facilitate visualization of the drawings, illustration of a multilayer wiring layer to be described below is omitted in FIGS. 4 to 7. Furthermore, FIG. 4 is upside down with respect to FIG. 1. That is, while FIG. 1 illustrates a light incident surface side of the semiconductor chip 2, FIG. 4 is a plan view when viewed from a side (multilayer wiring layer side) opposite to the light incident surface side of the semiconductor chip 2 illustrated in FIG. 1.

<Semiconductor Chip>

As illustrated in FIGS. 4 to 7, the semiconductor chip 2 includes the semiconductor layer 21 having a first surface S1 and a second surface S2 located on opposite sides to each other in a thickness direction (Z direction), and the photoelectric conversion cell 22A provided in the semiconductor layer 21 and partitioned by a pixel isolation region 31 as a first isolation region extending in the thickness direction (Z direction) of the semiconductor layer 21. The photoelectric conversion cell 22A is provided for each pixel 3. That is, each of the plurality of pixels 3 includes the photoelectric conversion cell 22A. The semiconductor layer 21 includes, for example, single crystal silicon.

Furthermore, the semiconductor chip 2 further includes a color filter 51 and a microlens (on-chip lens) 52 sequentially laminated on the second surface S2 side of the semiconductor layer 21 from the second surface S2 side.

Furthermore, the semiconductor chip 2 further includes a multilayer wiring layer including an insulating layer and a wiring layer provided on the first surface S1 side of the semiconductor layer 21 although not illustrated.

The color filter 51 and the microlens 52 are provided for each pixel 3 (photoelectric conversion cell 22A). The color filter 51 separates colors of incident light incident from the light incident surface side of the semiconductor chip 2. The microlens 52 condenses irradiation light and allows the condensed light to efficiently enter the pixel 3 (photoelectric conversion cell 22A). Furthermore, one color filter 51 and one microlens 52 are provided so as to cover both a first photoelectric conversion region 23L and a second photoelectric conversion region 23R to be described below.

Here, the first surface S1 of the semiconductor layer 21 may be referred to as an element formation surface or a main surface, and the second surface S2 side may be referred to as the light incident surface or a back surface. The solid-state imaging device 1A of the first embodiment uses a photoelectric conversion unit 25 (photoelectric conversion element PD1) of the photoelectric conversion cell 22A provided in the semiconductor layer 21 to photoelectrically convert light incident from the second surface (light incident surface or back surface) S2 side of the semiconductor layer 21.

<Photoelectric Conversion Cell>

As illustrated in FIGS. 4 to 7, the photoelectric conversion cell 22A includes the first photoelectric conversion region 23L and the second photoelectric conversion region 23R arranged adjacent to each other in the X direction in plan view in the semiconductor layer 21. The first photoelectric conversion region 23L and the second photoelectric conversion region 23R include the photoelectric conversion units 25 and the transfer transistors TR1 and TR2, respectively.

Furthermore, the photoelectric conversion cell 22A further includes an in-pixel isolation region 32 as a second isolation region arranged between the first photoelectric conversion region 23L and the second photoelectric conversion region 23R in plan view and extending in the thickness direction (Z direction) of the semiconductor layer 21.

Furthermore, the photoelectric conversion cell 22A further includes an island-shaped element formation region (active region) 21*a* partitioned by an element isolation region (surface isolation region) 33 as a third isolation region and provided in a surface layer portion on the first surface S1 side of the semiconductor layer 21, and provided with the pixel transistor Qt.

Furthermore, the photoelectric conversion cell 22A further includes an island-shaped element formation region 21*b*$_1$ partitioned by the element isolation region 33 and provided in the surface layer portion on the first surface S1 side of the semiconductor layer 21 and provided with the transfer transistor TR1 in the first photoelectric conversion region 23L, and an island-shaped element formation region 21*b*$_2$ partitioned by the element isolation region 33 and provided in the surface layer portion on the first surface S1 side of the semiconductor layer 21 and provided with the transfer transistor TR2 in the second photoelectric conversion region 23R.

Furthermore, the photoelectric conversion cell 22A further includes an island-shaped feeding region 21*z* partitioned by the element isolation region 33 and provided in the surface layer portion on the first surface S1 side of the semiconductor layer 21.

Furthermore, the photoelectric conversion cell 22A further includes the charge holding regions FD1 and FD2 provided in the surface layer portion on the first surface S1 side of the semiconductor layer 21.

Furthermore, the photoelectric conversion cell 22A further includes a p-type (first conductivity type) semiconductor region 24 provided over each of the element formation regions 21*a*, 21*b*$_1$, and 21*b*$_2$, the first photoelectric conversion region 23L, and the second photoelectric conversion region 23R, and a p-type contact region 48 provided in the p-type semiconductor region 24.

As illustrated in FIG. 4, the photoelectric conversion cell 22A has a rectangular planar pattern having four sides. Then, although not illustrated in detail, the photoelectric conversion cell 22A is repeatedly arranged for each pixel 3 via the pixel isolation region 31 in each of the X direction and the Y direction in plan view.

<Pixel Isolation Region>

As illustrated in FIGS. 4 to 7, the pixel isolation region 31 extends from the second surface S2 side toward the first surface S1 side of the semiconductor layer 21, and electrically and optically isolates the pixels 3 and the photoelectric conversion cells 22A adjacent to each other in the two-dimensional plane. Although not limited thereto, the pixel isolation region 31 has, for example, a trench isolation structure in which an insulating film is embedded in a groove extending from the second surface S2 toward the first surface S1 of the semiconductor layer 21, and the pixel isolation region 31 is integrated with the element isolation region 33 on the first surface S1 side of the semiconductor layer 21.

As illustrated in FIG. 4, the pixel isolation region 31 corresponding to one photoelectric conversion cell 22A (pixel 3) has an annular planar pattern (ring-shaped planar pattern) having a rectangular planar shape in plan view. Then, the pixel isolation region 31 corresponding to the pixel region 2A in which the plurality of pixels 3 (photoelectric conversion cells 22A) is arranged has a composite planar pattern having a lattice-shaped planar pattern in the rectangular annular planar pattern. That is, the pixel isolation region 31 isolates the semiconductor layer 21 for each photoelectric conversion cell 22A (pixel 3). Then, the photoelectric conversion cell 22A is surrounded by the two pixel isolation regions 31 extending in an array direction (X direction) in which the first and second photoelectric conversion regions 23L and 23R are arranged, and the two pixel isolation regions 31 extending in the direction (Y direction) orthogonal to the array direction (X direction) of the first and second photoelectric conversion regions 23L and 23R. In other words, the photoelectric conversion cell 22A is surrounded by the two pixel isolation regions 31 located on opposite sides to each other in the array direction of the first and second photoelectric conversion regions 23L and 23R and the two pixel isolation regions 31 located on opposite sides to each other in the direction (Y direction) orthogonal to the array direction (X direction) of the first and second photoelectric conversion regions 23L and 23R.

Here, in the pixel isolation region 31 that partitions the photoelectric conversion cell 22A, the two pixel isolation regions 31 extending in the X direction across the photoelectric conversion cell 22A may be referred to as pixel isolation regions 31*a* and 31*b*. Furthermore, the two pixel isolation regions 31 extending in the Y direction across the photoelectric conversion cell 22A may be referred to as pixel isolation regions 31*c* and 31*d*.

<In-Pixel Isolation Region>

As illustrated in FIGS. 4 to 7, the in-pixel isolation regions 32 protrude inward (toward the photoelectric conversion cell 22A) from respective intermediate portions of the two pixel isolation regions 31*a* and 31*b* extending in the X direction across the photoelectric conversion cell 22A in plan view, and are separated from each other. That is, in the photoelectric conversion cell 22A, the first photoelectric conversion region 23L and the second photoelectric conversion region 23Lb adjacent to each other in the X direction are selectively partitioned by the two in-pixel isolation regions 32 protruding inward from the respective intermediate portions of the two pixel isolation regions 31*a* and 31*b* extending in the X direction.

Although not limited thereto, the two in-pixel isolation regions 32 have, for example, a trench isolation structure in which an insulating film is embedded in a groove extending from the second surface S2 toward the first surface S1 of the semiconductor layer 21, and the in-pixel isolation regions 32 are integrated with the element isolation region 33 on the first surface S1 side of the semiconductor layer 21, similarly to the pixel isolation region 31.

<Element Isolation Region>

As illustrated in FIGS. 4 to 7, the element isolation region 33 is provided over the first photoelectric conversion region 23L and the second photoelectric conversion region 23R in the surface layer portion on the first surface S1 side of the semiconductor layer 21. Furthermore, the element isolation region 33 is provided over the plurality of photoelectric conversion cells 22A. Then, the element isolation region 33 overlaps each of the pixel isolation region 31 and the in-pixel isolation region 32 in plan view. Then, the element isolation region 33 is in contact with and integrated with each of the pixel isolation region 31 and the in-pixel isolation region 32 in a depth direction of the semiconductor layer 21. Although not limited thereto, the element isolation region 33 has, for example, a shallow trench isolation (STI) structure in which an insulating film is embedded in a shallow groove recessed in the depth direction from the first surface S1 of the semiconductor layer 21.

<Photoelectric Conversion Unit>

Figure 5:
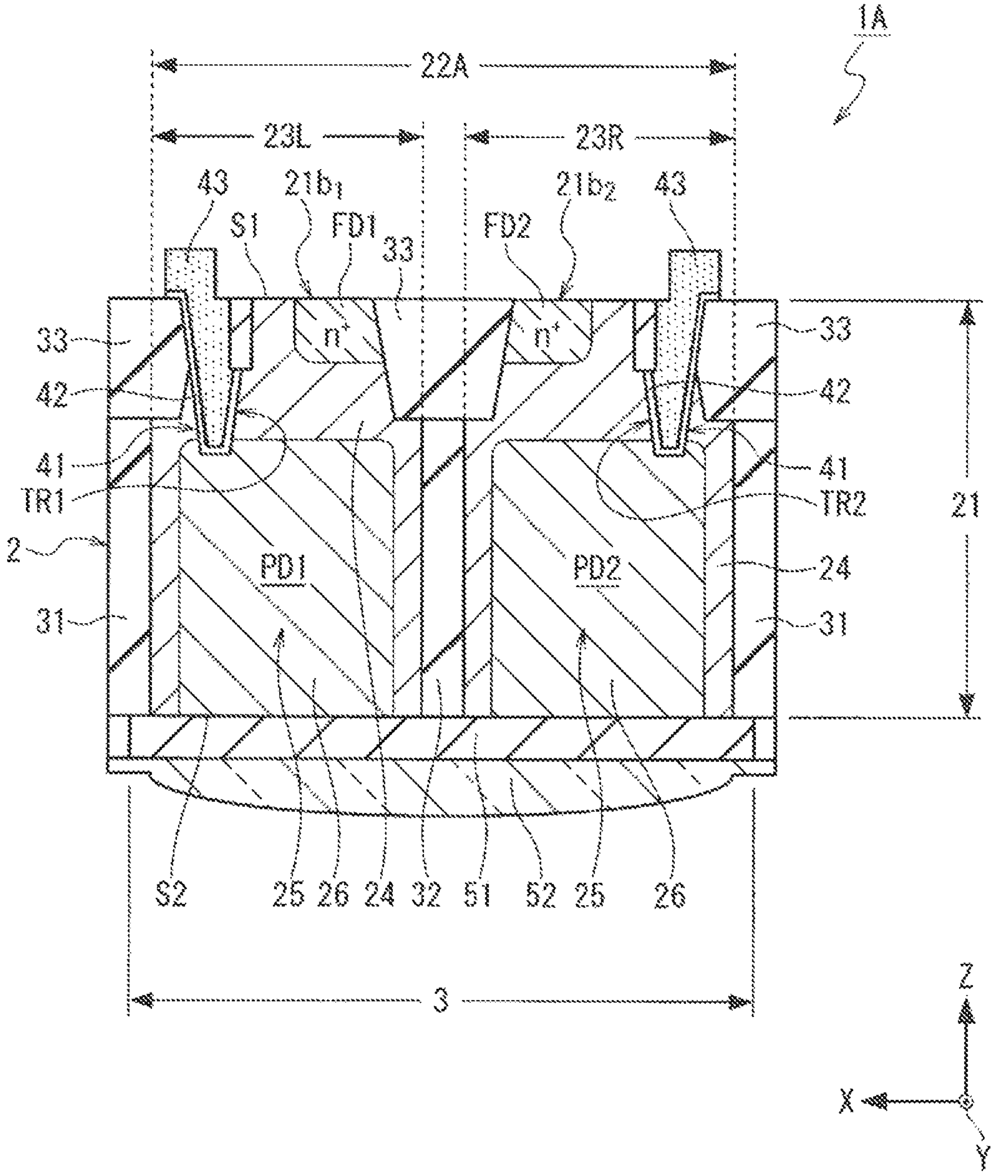
FIG. 5 is a schematic cross-sectional view illustrating a cross-sectional structure taken along line A3-A3 in FIG. 4.
Figure 6:
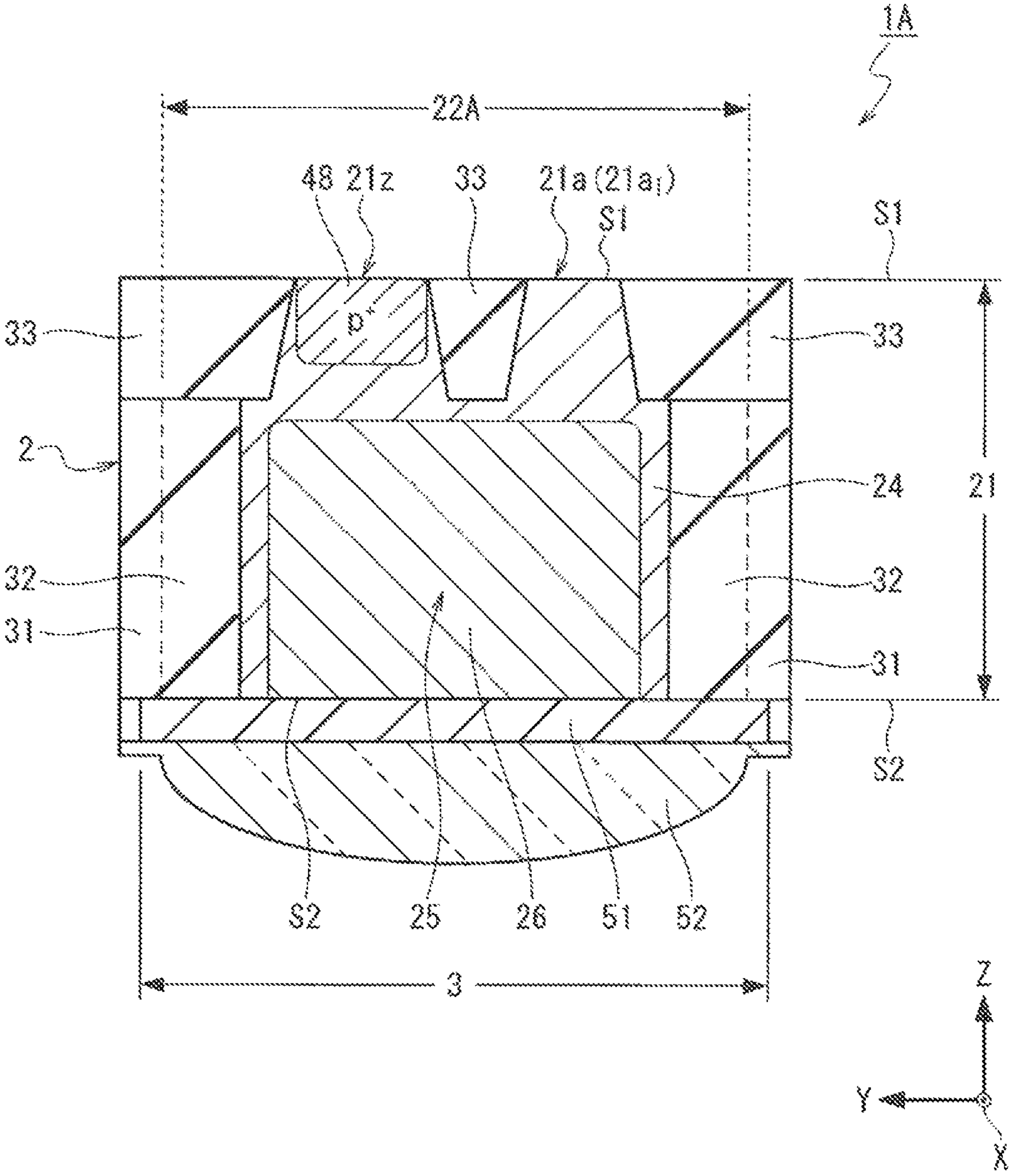
FIG. 6 is a schematic cross-sectional view illustrating a cross-sectional structure taken along line B3-B3 in FIG. 4.
Figure 7:
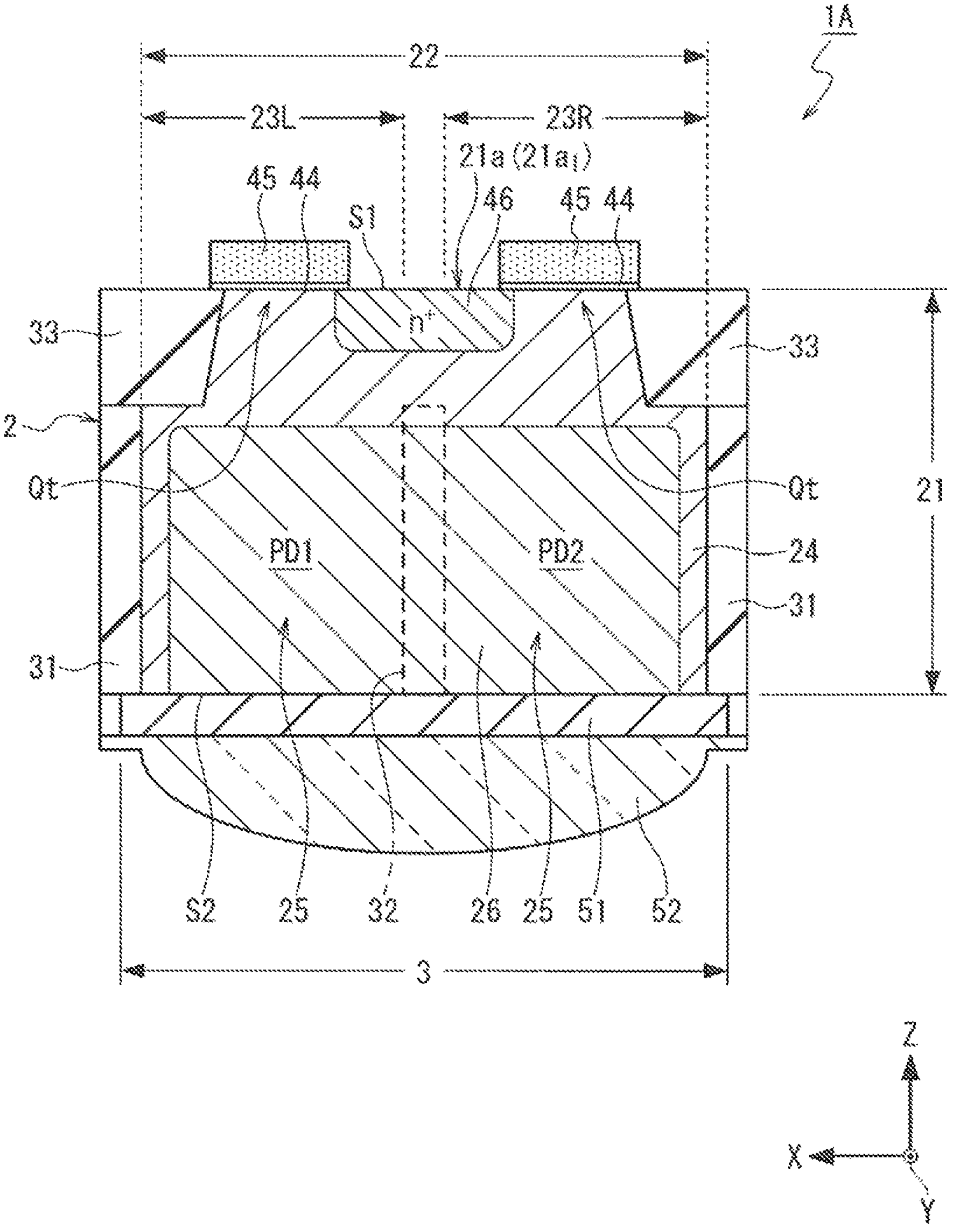
FIG. 7 is a schematic cross-sectional view illustrating a cross-sectional structure taken along line C3-C3 in FIG. 4.

As illustrated in FIGS. 5 to 7, each of the photoelectric conversion units 25 of the first and second photoelectric conversion regions 23L and 23R is separated from the first surface S1 of the semiconductor layer 21 in the thickness direction (Z direction), and is provided to be biased toward the second surface S2 side. Furthermore, as illustrated in FIGS. 4 and 5, both end sides in the Y direction of each of the photoelectric conversion units 25 of the first and second photoelectric conversion regions 23L and 23R are partitioned by the in-pixel isolation region 32 and the p-type semiconductor region 24. Furthermore, the respective photoelectric conversion units 25 of the first and second photoelectric conversion regions 23L and 23R are integrated between the two in-pixel isolation regions 32 as illustrated in FIGS. 6 and 7. Then, each of the photoelectric conversion units 25 includes an n-type (second conductivity type) semiconductor region 26, and constitutes the above-described photoelectric conversion element PD1 or PD2.

<p-Type Semiconductor Region>

As illustrated in FIGS. 4 to 7, the p-type semiconductor region 24 is provided for each photoelectric conversion cell 22A, and is electrically isolated from the p-type semiconductor region 24 of the adjacent photoelectric conversion cell 22A by the pixel isolation region 31 and the element isolation region 33.

As described above, the p-type semiconductor region 24 is provided over each of the element formation regions 21*a*, $21b_1$, and $21b_2$, the first photoelectric conversion region 23L, and the second photoelectric conversion region 23R. Specifically, as illustrated in FIGS. 5 to 7, the p-type semiconductor region 24 is provided in the surface layer portion of the first surface S1 of the semiconductor layer 21 including the element formation regions 21*a*, $21b_1$, and $21b_2$, and the feeding region 21*z*. Furthermore, as illustrated in FIGS. 6 and 7, the p-type semiconductor region 24 crosses the two in-pixel isolation regions 32 and is provided over each of the first and second photoelectric conversion regions 23L and 23R. Furthermore, the p-type semiconductor region 24 is provided between each of the photoelectric conversion units 25 of the first and second photoelectric conversion regions 23L and 23R, and the first surface S1 of the semiconductor layer 21. Then, the p-type semiconductor region 24 is also provided between each of the photoelectric conversion units 25 of the first and second photoelectric conversion regions 23L and 23R, and the pixel isolation region 31 and the in-pixel isolation region 32. The p-type semiconductor region 24 provided between each of the photoelectric conversion units 25 of the first and second photoelectric conversion regions 23L and 23R and each of the pixel isolation region 31 and the in-pixel isolation region 32 is provided from the first surface S1 side to the second surface S2 side of the semiconductor layer 21. That is, an upper surface on the element isolation region 33 side and a side surface on the pixel isolation region 31 side, of each of the photoelectric conversion units 25 of the first and second photoelectric conversion regions 23L and 23R, are covered with the p-type semiconductor region 24. Then, each of the photoelectric conversion units 25 is separated from each of the pixel isolation region 31, the in-pixel isolation region 32, and the element isolation region 33 via the p-type semiconductor region 24.

The p-type semiconductor region 24 includes one semiconductor region or a plurality of semiconductor regions. The p-type semiconductor region 24 and the n-type semiconductor region 26 of the photoelectric conversion unit 25 configure a pn junction for each photoelectric conversion cell 22A.

<Element Formation Regions $21b_1$ and $21b_2$>

As illustrated in FIG. 4, the element formation regions $21b_1$ and $21b_2$ are arranged adjacent to each other in the X direction in plan view. Then, each of the element formation regions $21b_1$ and $21b_2$ is arranged closer to the other pixel isolation region 31 of the two pixel isolation regions 31 extending in the X direction across the photoelectric conversion cell 22A than the element formation region 21*a*.

As illustrated in FIG. 5, the element formation region $21b_1$ overlaps the photoelectric conversion unit 25 in the first photoelectric conversion region 23L. The element formation region $21b_2$ overlaps the photoelectric conversion unit 25 in the second photoelectric conversion region 23R. Then, as illustrated in FIGS. 4 and 5, the transfer transistor TR1 and the charge holding region FD1 are provided in the element formation region $21b_1$. Similarly, the transfer transistor TR2 and the charge holding region FD2 are also provided in the element formation region $21b_2$.

<Charge Holding Region>

As illustrated in FIG. 5, each of the two charge holding regions FD1 and FD2 is provided on the first surface S1 side of the semiconductor layer 21 and overlaps the photoelectric conversion unit 25 via the p-type semiconductor region 24. Then, as illustrated in FIG. 4, in the first photoelectric conversion region 23L, the charge holding region FD1 is arranged on a corner side formed by the other pixel isolation region 31*b* of the two pixel isolation regions 31*a* and 31*b* extending in the X direction across the photoelectric conversion cell 22A and the in-pixel isolation region 32 protruding inward from the intermediate portion of the other pixel isolation region 31*b*. Furthermore, in the first photoelectric conversion region 23R, the charge holding region FD2 is arranged on a corner side formed by the other pixel isolation region 31*b* of the two pixel isolation regions 31 extending in the X direction across the photoelectric conversion cell 22A and the in-pixel isolation region 32 protruding inward from the intermediate portion of the other pixel isolation region 31*b*, similarly to the charge holding region FD1. The charge accumulation regions FD1 and FD2 include an n-type semiconductor region having an impurity concentration higher than the n-type semiconductor region 26.

<Transfer Transistor>

As illustrated in FIG. 5, each of the transfer transistors TR1 and TR2 includes a gate groove 41 provided on the first surface S1 side of the semiconductor layer 21, a gate insulating film 42 provided along a side wall and a bottom wall in the gate groove 41, and a gate electrode 43 provided in the gate groove 41 via the gate insulating film 42. Furthermore, the transfer transistors TR1 and TR2 include a channel formation region including the p-type semiconductor regions 24 arranged on a side wall of the gate electrode 43 via the gate insulating film 42, the photoelectric conversion units 25 functioning as a source region, and the charge holding regions FD1 and FD2 functioning as a drain region.

As illustrated in FIG. 5, the gate electrode 43 includes a first portion (vertical gate electrode portion) provided in the gate groove 41 via the gate insulating film 42, and a second portion formed integrally with the first portion and provided outside the gate groove 41. The gate insulating film 42 includes, for example, a silicon oxide film. The gate electrode 43 includes, for example, a polycrystalline silicon film into which an impurity for reducing a resistance value is introduced.

As illustrated in FIG. 5, in the transfer transistors TR1 and TR2, the charge holding regions FD1 and FD2 functioning as a drain region and the photoelectric conversion units 25 functioning as a source region are arranged along the depth direction of the semiconductor layer 21 via the p-type semiconductor regions 24 as the channel formation region. That is, the transfer transistors TR1 and TR2 of the first embodiment have a vertical structure in which the source region and the drain region are arranged in the depth direction of the semiconductor layer 21. The transfer transistors TR1 and TR2 having the vertical structure are useful for miniaturization of the photoelectric conversion cell 22A (pixel 3).

As illustrated in FIG. 4, the transfer transistor TR1 of the first photoelectric conversion region 23L is arranged on the corner side formed by the other pixel isolation region 31*b* of the two pixel isolation regions 31*a* and 31*b* extending in the X direction across the photoelectric conversion cell 22A and the one pixel isolation region 31*c* of the two pixel isolation regions 31*c* and 31*d* extending in the Y direction across the photoelectric conversion cell 22A in plan view. Then, the transfer transistor TR2 of the second photoelectric conversion region 23R is arranged on the corner side formed by the other pixel isolation region 31*b* of the two pixel isolation regions 31*a* and 31*b* extending in the X direction across the photoelectric conversion cell 22A and the other pixel isolation region 31*d* of the two pixel isolation regions 31*c* and 31*d* extending in the Y direction across the photoelectric conversion cell 22A in plan view.

<Element Formation Region 21*a*>

As illustrated in FIG. 4, the element formation region 21*a* is arranged closer to one pixel isolation region 31*a* side of the two pixel isolation regions 31*a* and 31*b* extending in the X direction across the photoelectric conversion cell 22A than the element formation regions $21b_1$ and $21b_2$. Then, the element formation region 21*a* extends over the first photoelectric conversion region 23L and the second photoelectric conversion region 23R in plan view.

As illustrated in FIGS. 4 and 7, the element formation region 21*a* includes a first portion $21a_1$ crossing a region between the two in-pixel isolation regions 32 along the X direction in plan view, and a pair of second portions $21a_2$ extending from one end side and the other end side in the X direction of the first portion $21a_1$ toward the transfer transistor TR side of the first portion $21a_1$, in other words, toward the opposite side to the element isolation regions $21b_1$ and $21b_2$ side of the first portion $21a_1$. That is, although not limited thereto, the element formation region 21*a* of the first embodiment has an inverted U-shaped planar pattern including two bent portions in plan view and having the two bent portions opened on the element formation regions $21b_1$ and $21b_2$ side, in other words, on one pixel isolation region 31*a* side of the two pixel isolation regions 31*a* and 31*b* extending in the X direction.

As illustrated in FIGS. 4 and 7, two pixel transistors Qt are provided in the element formation region 21*a*. One of the two pixel transistors Qt is arranged at one of two corners of the element formation region 21*a*. The other of the two pixel transistors Qt is arranged at the other of the two corners of the element formation region 21*a*. In other words, the one pixel transistor Qt is arranged over the first portion $21a_1$ and one second portion $21a_2$ of the element formation region 21*a*. Furthermore, the other pixel transistor Qt is arranged over the first portion $21a_1$ and the other second portion $21a_2$ of the element formation region 21*a*. That is, in the photoelectric conversion cell 22A, the pixel transistor Qt is provided in each of the first and second photoelectric conversion regions 23L and 23L.

As illustrated in FIGS. 4 and 7, each of the two pixel transistors Qt includes a gate insulating film 44 provided on the element formation region 21*a* on the first surface S1 side of the semiconductor layer 21, and a gate electrode 45 provided on the element formation region 21*a* via the gate insulating film 44. Furthermore, each of the two pixel transistors Qt further includes a channel formation region in which a channel (conduction path) is formed in the p-type semiconductor region 24 immediately below the gate electrode 45, and a pair of main electrode regions 46 and 47 provided in the p-type semiconductor region 24 to be separated from each other in a channel length direction (gate length direction) across the channel formation region and functioning as a source region and a drain region. Each of the two pixel transistors Q controls the channel formed in the channel formation region by a gate voltage applied to the gate electrode 45.

As illustrated in FIGS. 4 and 7, the two pixel transistors Qt share the one main electrode region 46 of the pixel transistors. That is, the two pixel transistors Qt are mounted in the element formation region 21*a* in series connection sharing the one main electrode region 46.

The one main electrode region 46 shared by the two pixel transistors Qt is formed in the first portion $21a_1$ of the element formation region 21*a* by self-alignment with respect to the respective gate electrodes 45 of the two pixel transistors Qt, and includes a semiconductor region having an impurity concentration higher than the n-type semiconductor region 26 of the photoelectric conversion unit 25. The other main electrode region 47 included in one pixel transistor Qt of the two pixel transistors Qt (on the first photoelectric conversion region 23L side) includes a semiconductor region formed in the one second portion $21a_2$ of the element formation regions 21*a* by self-alignment with respect to the gate electrode 45 of the one pixel transistor Qt and having an impurity concentration higher than the n-type semiconductor region 26 of the photoelectric conversion unit 25. The other main electrode region 47 included in the other pixel transistor Qt of the two pixel transistors Q (on the second photoelectric conversion region 23L side) includes a semiconductor region formed in the other second portion $21a_2$ of the element formation regions 21*a* by self-alignment with respect to the gate electrode 45 of the other pixel transistor Q and having an impurity concentration higher than the n-type semiconductor region 26 of the photoelectric conversion unit 25.

<Feeding Region>

As illustrated in FIGS. 4 and 6, the feeding region 21*z* is arranged between the element formation regions $21b_1$ and $21b_2$ in plan view. Furthermore, the feeding region 21*z* is arranged between the two in-pixel isolation regions 32 in plan view. Then, the p-type contact region 48 is provided in the feeding region 21*z*. That is, the p-type contact region 48 is arranged between the two in-pixel isolation regions 32 in plan view, and is shared by the first photoelectric conversion region 23L and the second photoelectric conversion region 23R.

The p-type contact region 48 includes a p-type semiconductor region (impurity region) having a higher impurity concentration than the p-type semiconductor region 24. A reference potential is applied to the p-type contact region 48 as a power supply potential. Then, the potential of the p-type semiconductor region 24 is fixed to the reference potential via the p-type contact region 48. In the first embodiment, for example, a Vss potential of 0 V is applied as the reference potential. That is, the p-type contact region 48 is shared by the first photoelectric conversion region 23L and the second photoelectric conversion region 23R. Then, in each of the first and second photoelectric conversion regions 23L and 23R, the reference potential is applied to the p-type semiconductor region 24 via the p-type contact region, and the potential is fixed to the reference potential.

<Flow of Signal Charges Between First Photoelectric Conversion Region and Second Photoelectric Conversion Region>

As illustrated in FIGS. 6 and 7, each of the p-type semiconductor region 24 and the n-type semiconductor region 26 extends over each of the first photoelectric conversion region 23L and the second photoelectric conversion region 23L, and crosses the two in-pixel isolation regions 32 in plan view. Then, a region between the two in-pixel isolation regions 32 functions as an overflow path.

A first potential barrier can be formed between the two in-pixel isolation regions 32. When the transfer transistor TR1 of the first photoelectric conversion region 23L does not transfer signal charges from the photoelectric conversion unit 25 to the charge holding region FD1, the transfer transistor TR1 can form a second potential barrier higher than the first potential barrier. Furthermore, when the transfer transistor TR2 of the second photoelectric conversion region 23R does not transfer signal charges from the photoelectric conversion unit 25 to the charge holding region FD2, the transfer transistor TR2 can form a second potential barrier higher than the first potential barrier.

The respective photoelectric conversion units 25 of the first and second photoelectric conversion regions 23L and 23R can independently store the signal charges up to the first potential barrier. Then, when the amount of stored signal charges exceeds the first potential barrier, the signal charges flow from one of the photoelectric conversion units 25 of the first and second photoelectric conversion regions 23L and 23R to the other via the overflow path between the two in-pixel isolation regions 32.

<Main Effects of First Embodiment>

Next, main effects of the first embodiment will be described.

As illustrated in FIG. 4, in the solid-state imaging device 1A according to the first embodiment, since the element formation region 21*a* partitioned by the element isolation region 33 extends over the first photoelectric conversion region 23L and the second photoelectric conversion region 23R, the region between the two in-pixel isolation regions 32 in plan view can be utilized as an arrangement region of the pixel transistors Qt. As a result, the degree of freedom in arrangement of the active elements including the pixel transistors Qt and the transfer transistors TR1 and TR2 in the photoelectric conversion cell 22 can be increased.

Furthermore, since the degree of freedom in arrangement of the active elements in the photoelectric conversion cell 22 can be increased, it is possible to miniaturize the pixel 3 including the photoelectric conversion cell 22.

Furthermore, as illustrated in FIG. 4, in the solid-state imaging device 1A according to the first embodiment, since the p-type contact region 48 shared by the first photoelectric conversion region 23L and the second photoelectric conversion region 23R is arranged between the two in-pixel isolation regions 32 in plan view, it is possible to increase the degree of freedom in arrangement of the active elements including the pixel transistors Qt and the transfer transistors TR1 and TR2 in the photoelectric conversion cell 22 as compared with a case of individually arranging the contact region 48 in each of the first and second photoelectric conversion regions 23L and 23R.

Furthermore, since the solid-state imaging device 1A according to the first embodiment adopts both the arrangement of the element formation region 21*a* and the arrangement of the contact region 48 in combination, it is possible to further increase the degree of freedom of arrangement of the active elements and to further miniaturize the pixel 3 including the photoelectric conversion cell 22 as compared with a case of adopting either the arrangement of the element formation region 21*a* or the arrangement of the contact region 48.

Furthermore, in the solid-state imaging device 1A according to the first embodiment, the one main electrode region 46 of the pixel transistor Qt arranged in the first photoelectric conversion region 23L and the one main electrode region 46 of the pixel transistor Qt arranged in the second photoelectric conversion region 23R are shared between the two in-pixel isolation regions 32 in plan view. Therefore, it is possible to further increase the degree of freedom in arrangement of the active elements in the photoelectric conversion cell 22A as compared with a case of individually providing the one main electrode region 46 of the pixel transistor Qt arranged in the first photoelectric conversion region 23L and the one main electrode region 46 of the pixel transistor Qt arranged in the second photoelectric conversion region 23R.

Furthermore, it is possible to increase a gate area (gate length Lg×gate width Wg) of the pixel transistor Qt without increasing a planar size of the photoelectric conversion cell 22A (pixel 3), and to reduce noise while suppressing an increase in the planar size of the pixel 3 including the photoelectric conversion cell 22A.

Second Embodiment

Figure 8:
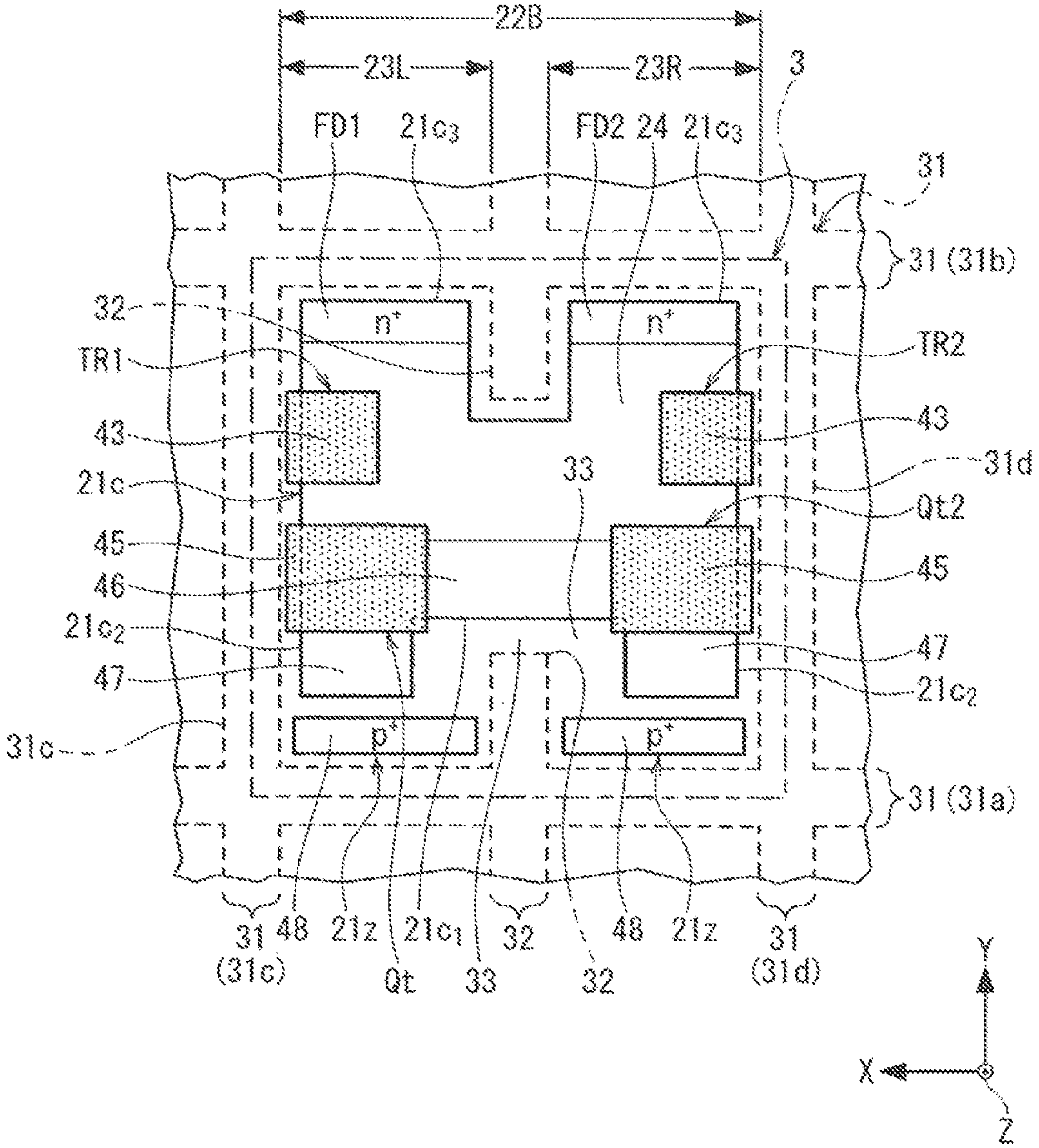
FIG. 8 is a schematic plan view illustrating a configuration example of a pixel according to a second embodiment of the present technology.

A solid-state imaging device according to a second embodiment includes a photoelectric conversion cell 22B illustrated in FIG. 8 instead of the photoelectric conversion cell 22A illustrated in FIG. 4 of the above-described first embodiment. The photoelectric conversion cell 22B illustrated in FIG. 8 of the second embodiment basically has a similar configuration to the photoelectric conversion cell 22A illustrated in FIG. 4 of the above-described first embodiment, and has a different planar pattern.

That is, as described above, the photoelectric conversion cell 22A of the first embodiment illustrated in FIG. 4 has the planar pattern including the element formation regions 21*a*, $21b_1$ and $21b_2$ partitioned by the element isolation region 33 and one feeding region 21*z* partitioned by the element isolation region 33. Then, the pixel transistor Qt is provided on each of one end side (first photoelectric conversion region 23L side) and the other end side (second photoelectric conversion region 23R side) of the element formation region 21*a*, and the transfer transistors TR1 and TR2 and the charge holding regions FD1 and FD2 are provided in the respective element formation regions $21b_1$ and $21b_2$. Then, the feeding region 21*z* is arranged between the two in-pixel isolation regions 32 in plan view, and the contact region 48 shared by the first and second photoelectric conversion regions 23L and 23R is provided in the feeding region 21*z*.

In contrast, as illustrated in FIG. 8, the photoelectric conversion cell 22B of the second embodiment has a planar pattern including one element formation region 21*c* partitioned by an element isolation region 33 and arranged over first and second photoelectric conversion regions 23L and 23R, and two feeding regions 21*z* partitioned by the element isolation region 33 and arranged in each of the first and second photoelectric conversion regions 23L and 23R. Then, in this one element formation region 21*c*, respective transfer transistors TR1 and TR2 and charge holding regions FD1 and FD2 of the first and second photoelectric conversion regions 23L and 23R, and two pixel transistors Qt are provided. Then, a p-type contact region 48 is provided in each of the two feeding regions 21z.

As illustrated in FIG. 8, the element formation region 21c includes a first portion $21c_1$ extending over the first and second photoelectric conversion regions 23L and 23R and crossing a region between two in-pixel isolation regions 32 in plan view, and a pair of second portions $21c_2$ protruding from one end side and the other end side in an X direction of the first portion $21c_1$ toward one pixel isolation region 31a side of two pixel isolation regions 31a and 31b extending in the X direction across the photoelectric conversion cell 22B. Furthermore, the element formation region 21c further includes a pair of third portions $21c_3$ protruding from each of one end side and the other end side in the X direction of the first portion $21c_1$ to the other pixel isolation region 31b side of the two pixel isolation regions 31 extending in the X direction across the photoelectric conversion cell 22B. The pair of second portions $21c_2$ is arranged on both sides of one in-pixel isolation region 32 (on a pixel isolation region 31a side) of two in-pixel isolation regions 32 in plan view. The pair of third portions $21c_3$ is arranged on both sides of the other in-pixel isolation region 32 (on a pixel isolation region 31b side) of the two in-pixel isolation regions 32 in plan view. That is, in a case of changing a point of view, the element formation region 21c of the second embodiment has an H-shaped planar pattern in which the element formation regions 21a, $21b_1$, and $21b_2$ of the first embodiment illustrated in FIG. 4 are integrated.

Although not illustrated in detail, the element formation region 21c is provided in a surface layer portion on a first surface S1 side of a semiconductor layer 21, and overlaps each of photoelectric conversion units 25 of the first and second photoelectric conversion regions 23L and 23R via a p-type semiconductor region 24 in a thickness direction (Z direction) of the semiconductor layer 21, similarly to the element formation regions 21a, $21b_1$, and $21b_2$ of the first embodiment illustrated in FIGS. 5 to 7

As illustrated in FIG. 8, in the two feeding regions 21z, one feeding region 21z (on the first photoelectric conversion region 23L side) is arranged between one second portion $21c_2$ (on the first photoelectric conversion region 23L side) of the pair of second portions $21c_2$ of the element formation region 21c, and the pixel isolation region 31 (31a). The other feeding region 21z (on the second photoelectric conversion region 23R side) is arranged between the other second portion $21c_2$ (on the second photoelectric conversion region 23R side) of the pair of second portions $21c_2$ of the element formation region 21c, and the pixel isolation region 31 (31a).

In the two pixel transistors Qt, one pixel transistor Qt (on the first photoelectric conversion region 23L side) is arranged over the first portion $21c_1$ and one second portion $21c_2$ of the element formation region 21c. The other pixel transistor Qt (on the second photoelectric conversion region 23R side) is arranged over the first portion $21c_1$ and the other second portion $21c_2$ of the element formation region 21c.

In the two charge holding regions FD1 and FD2, one charge holding region FD1 (on the first photoelectric conversion region 23L side) is arranged at a tip portion of one third portion $21c_3$ of the element formation region 21c. The other charge holding region FD2 (on the second photoelectric conversion region 23R side) is arranged at a tip portion of the other third portion $21c_3$ of the element formation region 21c.

In the two transfer transistors TR1 and TR2, one transfer transistor TR1 (on the first photoelectric conversion region 23L side) is arranged over the first portion $21c_1$ and the one third portion $21c_3$ of the element formation region 21c. The other pixel transistor Qt2 (on the second photoelectric conversion region 23R side) is arranged over the first portion $21c_1$ and the other third portion $21c_3$ of the element formation region 21c.

In the photoelectric conversion cell 22B of the second embodiment, the element formation region 21c extends over the first photoelectric conversion region 23L and the second photoelectric conversion region 23R, and crosses the two in-pixel isolation regions 32 in plan view. Therefore, in the solid-state imaging device according to the second embodiment, effects similar to those of the above-described solid-state imaging device 1A according to the first embodiment can be obtained.

Furthermore, since the transfer transistors TR1 and TR2 and the charge holding regions FD1 and FD2 are not isolated by the element isolation region 33, in other words, the element isolation region 33 is not provided between the transfer transistors TR1 and TR2 and the charge holding regions FD1 and FD2, transfer of signal charges by the transfer transistors TR1 and TR2 is facilitated.

Furthermore, in the photoelectric conversion cell 22B of the second embodiment, the transfer transistor TR1 and the charge holding region FD1 of the first photoelectric conversion region 23L, and the transfer transistor TR2 and the charge holding region FD2 of the second photoelectric conversion region 23R are arranged in one element formation region 21c partitioned by the element isolation region 33. Therefore, it is possible to further increase the degree of freedom of arrangement of active elements in the photoelectric conversion cell 22A as compared with the above-described photoelectric conversion cell 22A of the first embodiment.

Note that, in the photoelectric conversion cell 22B of the second embodiment, a region between the two in-pixel isolation regions 32 functions as an overflow path.

Furthermore, the photoelectric conversion cell 22B of the second embodiment also includes a p-type semiconductor region 24, a photoelectric conversion unit 25, and an n-type semiconductor region 26 illustrated in FIGS. 4 to 7, similarly to the above-described photoelectric conversion cell 22A of the first embodiment.

Third Embodiment

Figure 9:
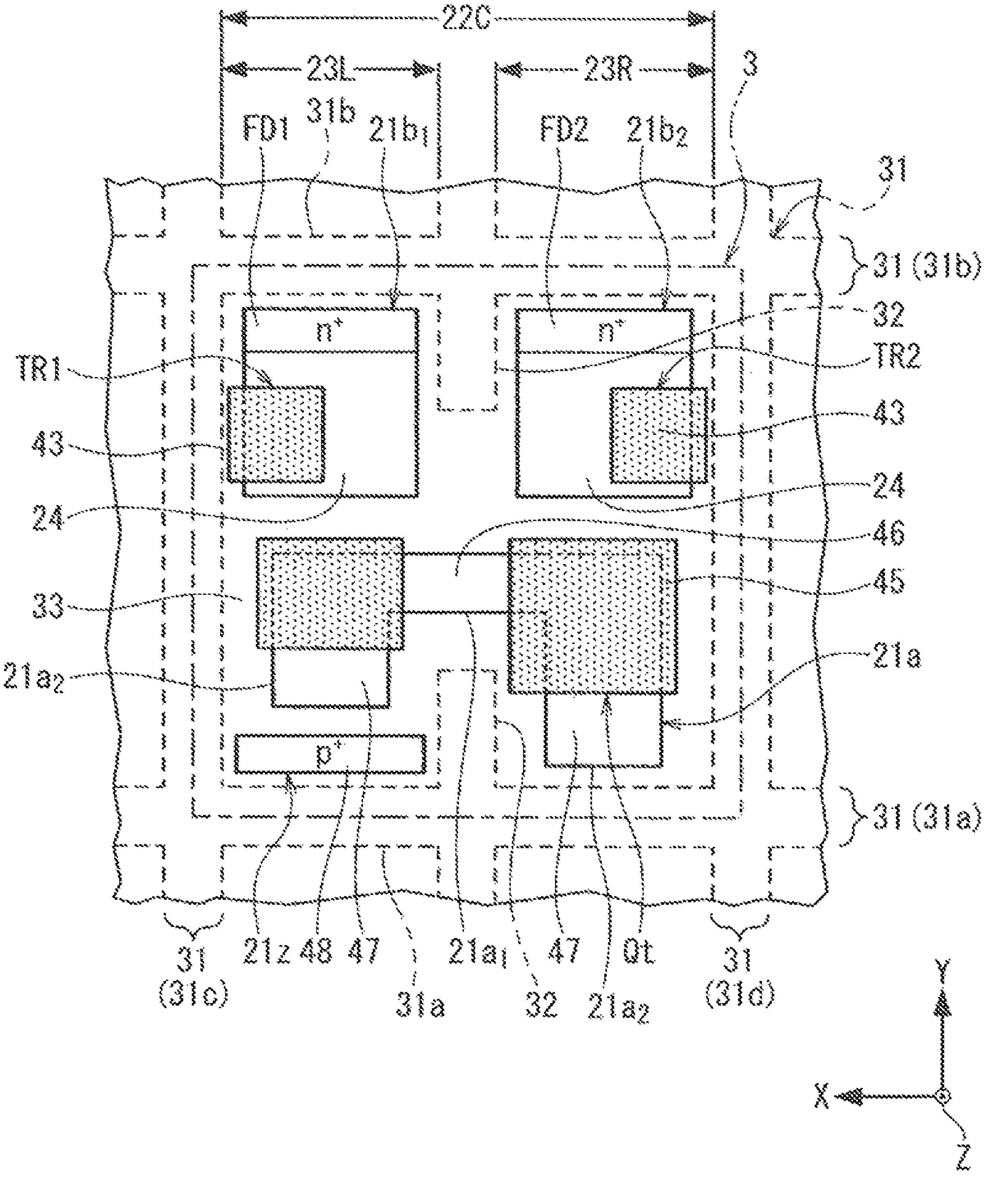
FIG. 9 is a schematic plan view illustrating a configuration example of a pixel according to a third embodiment of the present technology.

A solid-state imaging device according to a third embodiment includes a photoelectric conversion cell 22C illustrated in FIG. 9 instead of the photoelectric conversion cell 22A illustrated in FIG. 4 of the above-described first embodiment. The photoelectric conversion cell 22C of the third embodiment illustrated in FIG. 9 basically has a similar configuration to the photoelectric conversion cell 22A of the first embodiment, and has a different planar pattern.

That is, as illustrated in FIG. 9, in the photoelectric conversion cell 22C according to the third embodiment, in two second portions $21a_2$ of an element formation region 21a partitioned by an element isolation region 33, a length of one second portion $21a_2$ in a Y direction is shorter than a length of the other second portion $21a_2$ in the Y direction. Then, a feeding region 21z partitioned by the element isolation region 33 is provided between the one second portion $21a_2$ and one pixel isolation region 31a of two pixel isolation regions 31 extending in an X direction across the photoelectric conversion cell 22C in plan view Then, a p-type contact region 48 is provided in the feeding region 21z.

Furthermore, the photoelectric conversion cell 22C according to the third embodiment, each of two element formation regions 21$b_1$ and 21$b_2$ has a rectangular planar pattern. Then, in the first photoelectric conversion region 23L, a charge holding region FD1 is provided on a pixel isolation region 31*b* side of the element formation region 21$b_1$, and a transfer transistor TR1 is provided on a pixel isolation region 31*c* side of the element formation region 21$b_1$. Furthermore, in the second photoelectric conversion region 23R, a charge holding region FD2 is provided on the pixel isolation region 31*b* side of the element formation region 21$b_2$, and a transfer transistor TR2 is provided on a pixel isolation region 31*d* side of the element formation region 21$b_2$.

In the photoelectric conversion cell 22C of the third embodiment, the element formation region 21*a* extends over the first photoelectric conversion region 23L and the second photoelectric conversion region 23R, and crosses two in-pixel isolation regions 32 in plan view. Therefore, in the solid-state imaging device according to the third embodiment, effects similar to those of the above-described solid-state imaging device 1A according to the first embodiment can be obtained.

Furthermore, in the photoelectric conversion cell 22C according to the third embodiment, the p-type contact region 48 is provided only in the first photoelectric conversion region 23L. Therefore, it is possible to make a gate area (a gate length Lg×a gate width Wg) of a pixel transistor Qt in the second photoelectric conversion region 23R larger than a gate area of a pixel transistor Qt in the first photoelectric conversion region 23L, and to reduce noise. The noise reduction of the pixel transistor Qt is particularly useful in a case where the pixel transistor Qt having a larger gate area is used as an amplification transistor included in a readout circuit.

Note that, in the photoelectric conversion cell 22C of the third embodiment, a region between the two in-pixel isolation regions 32 functions as an overflow path.

Furthermore, the photoelectric conversion cell 22C of the third embodiment also includes a p-type semiconductor region 24, a photoelectric conversion unit 25, and an n-type semiconductor region 26 illustrated in FIGS. 4 to 7, similarly to the above-described photoelectric conversion cell 22A of the first embodiment.

Furthermore, in the third embodiment, a case in which the length in the Y direction of the second portion 21$a_2$ on the first photoelectric conversion region 23L side is made shorter than the length in the Y direction of the second portion 21$a_2$ on the second photoelectric conversion region 23R side in the pair of second portions 21$a_2$ of the element formation region 21*a* has been described. However, the present technology is not limited to the third embodiment. For example, in the pair of second portions 21$a_2$ of the element formation region 21*a*, the length in the Y direction of the second portion 21$a_2$ on the second photoelectric conversion region 23R side may be made shorter than the length in the Y direction of the second portion 21$a_2$ on the first photoelectric conversion region 23L side. In this case, the feeding region 21*z* and the contact region 48 are arranged between the second portion 21$a_2$ having a shorter length in the Y direction in plan view and the pixel isolation region 31*a*. In short, the length in the Y direction of one second portion 21$a_2$ of the pair of second portions 21$a_2$ of the element formation region 21*a* is made shorter than the length in the Y direction of the other second portion 21$a_2$, and the contact region 48 shared by the first and second photoelectric conversion regions 23L and 23R is arranged between the second portion 21$a_2$ having the shorter length in the Y direction and the pixel isolation region 31*a*.

Fourth Embodiment

Figure 10:
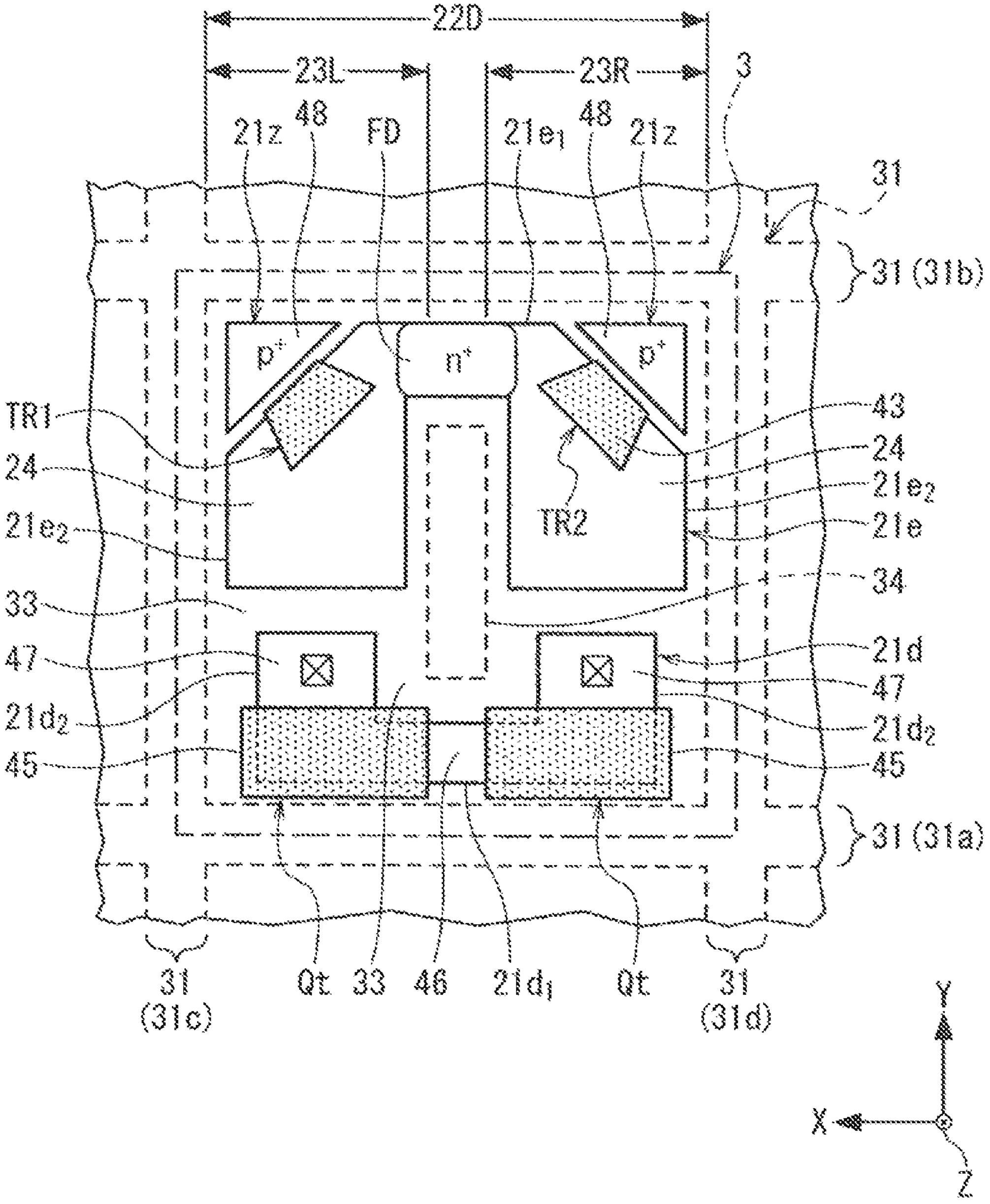
FIG. 10 is a schematic plan view illustrating a configuration example of a pixel according to a fourth embodiment of the present technology.

A solid-state imaging device according to a fourth embodiment includes a photoelectric conversion cell 22D illustrated in FIG. 10 instead of the photoelectric conversion cell 22A illustrated in FIG. 4 of the above-described first embodiment. The photoelectric conversion cell 22D illustrated in FIG. 10 of the fourth embodiment basically has a similar configuration to the photoelectric conversion cell 22A illustrated in FIG. 4 of the first embodiment, and has different configurations of a planar pattern and an in-pixel isolation region.

That is, as illustrated in FIG. 10, the photoelectric conversion cell 22D of the fourth embodiment has a planar pattern including element formation regions 21*d* and 21*e* partitioned by an element isolation region 33 and arranged over first and second photoelectric conversion regions 23L and 23R, and two feeding regions 21*z* partitioned by the element isolation region 33 and respectively arranged in the first and second photoelectric conversion regions 23L and 23R. Then, two pixel transistors Qt are provided in the element formation region 21*d*. Then, two transfer transistors TR1 and TR2 and one charge holding region FD are provided in the element formation region 21*e*. Then, a p-type contact region 48 is provided in each of the two feeding regions 21*z*.

Furthermore, as illustrated in FIG. 10, the photoelectric conversion cell 22D of the fourth embodiment includes an in-pixel isolation region 34 instead of the in-pixel isolation region 32 of the first embodiment illustrated in FIG. 4, as a second isolation region arranged between the first photoelectric conversion region 23L and the second photoelectric conversion region 23R and extending in a thickness direction of the semiconductor layer 21.

As illustrated in FIG. 10, the in-pixel isolation region 34 is arranged between the first photoelectric conversion region 23L and the second photoelectric conversion region 23R in plan view, and is separated from each of two pixel isolation regions 31*a* and 31*b* extending in an X direction across the photoelectric conversion cell 22D. That is, in the photoelectric conversion cell 22D of the fourth embodiment, the first photoelectric conversion region 23L and the second photoelectric conversion region 23Lb adjacent to each other in the X direction are selectively partitioned by the in-pixel isolation region 34 separated from each of the two pixel isolation regions 31*a* and 31*b* extending in the X direction.

Although not illustrated in detail, as will be described with reference to FIGS. 5 to 7 of the above-described first embodiment, the in-pixel isolation region 34 has, for example, a trench isolation structure in which an insulating film is embedded in a groove extending from a second surface S2 of a semiconductor layer 21 toward a first surface S1, and the in-pixel isolation region 34 is integrated with the element isolation region 33 on the first surface S1 side of the semiconductor layer 21, similarly to the in-pixel isolation region 32 of the first embodiment.

As illustrated in FIG. 10, the element formation region 21*d* is arranged closer to one pixel isolation region 31*a* side of the two pixel isolation regions 31*a* and 31*b* extending in the X direction across the photoelectric conversion cell 22D in plan view than the element formation region 21*e*. Then, the element formation regions 21*e* is arranged closer to the other pixel isolation region 31*b* of the two pixel isolation regions 31*a* and 31*b* extending in the X direction across the photoelectric conversion cell 22D in plan view than the element formation region 21*d*. Although not illustrated in detail, each of the element formation regions 21*d* and 21*e* is provided in a surface layer portion on a first surface S1 side of a semiconductor layer 21, and overlaps each of photoelectric conversion units 25 of the first and second photoelectric conversion regions 23L and 23R via a p-type semiconductor region 24 in a thickness direction (Z direction) of the semiconductor layer 21, similarly to the element formation regions 21*a*, $21b_1$, and $21b_2$ of the first embodiment illustrated in FIGS. 5 to 7

As illustrated in FIG. 10, the element formation region 21*d* includes a first portion 21*d*1 extending in the X direction over the first and second photoelectric conversion regions 23L and 23R and crossing a region between the in-pixel isolation region 34 and one pixel isolation region 31*a* of the two pixel isolation regions 31*a* and 31*b* extending in the X direction in plan view, and a pair of second portions $21d_2$ protruding from one end side and the other end side in the X direction of the first portion 21*d*1 to the side opposite to the one pixel isolation region 31*a* side, in other words, to the element formation region 21*e* side. Then, the pair of second portions $21d_2$ is respectively arranged on both sides of the in-pixel isolation region 34 via the element isolation region 33 in plan view. That is, the element formation region 21*d* has a U-shaped planar pattern in which the element formation region 21*e* side, in other words, the other pixel isolation region 31*b* side of the two pixel isolation regions 31*a* and 31*b* extending in the X direction, is opened in plan view.

As illustrated in FIG. 10, the two pixel transistors Qt are provided in the element formation region 21*d*. One of the two pixel transistors Qt is arranged at one of two corners of the element formation region 21*d*. The other of the two pixel transistors Qt is arranged at the other of the two corners of the element formation region 21*d*. In other words, the one pixel transistor Qt is arranged over the first portion 21*d*1 and one second portion $21d_2$ of the element formation region 21*d*. Furthermore, the other pixel transistor Qt is arranged over the first portion 21*d*1 and the other second portion $21d_2$ of the element formation region 21*d*. That is, in the photoelectric conversion cell 22A of the fourth embodiment, the pixel transistor Qt is provided in each of the first and second photoelectric conversion regions 23L and 23L.

As illustrated in FIG. 10, the element formation region 21*e* includes a first portion $21e_1$ extending over the first and second photoelectric conversion regions 23L and 23R and crossing a region between the in-pixel isolation region 34 and the other pixel isolation region 31*b* of the two pixel isolation regions 31*a* and 31*b* extending in the X direction across the photoelectric conversion cell 22D in plan view, and a pair of second portions $21e_2$ protruding from one end side and the other end side in the X direction of the first portion $21e_1$ to the side opposite to the other pixel isolation region 21*b* side, in other words, to the element formation region 21*d* side. Then, the pair of second portions $21e_2$ is respectively arranged on both sides of the in-pixel isolation region 34 via the element isolation region 33 in plan view. That is, the element formation region 21*e* has an inverted U-shaped planar pattern in which the element formation region 21*d* side, in other words, the one pixel isolation region 31 (31*a*) side of the two pixel isolation regions 31 extending in the X direction, is opened in plan view. Then, the pair of second portions $21e_2$ of the element formation region 21*e* is adjacent to the pair of second portions $21d_2$ of the element formation region 21*d* via the element isolation region 33 in plan view.

As illustrated in FIG. 10, the two transfer transistors Qt and the one charge holding region FD are provided in the element formation region 21*e*. One transfer transistor Qt of the two transfer transistors Qt is arranged in the first photoelectric conversion region 23L, and the other transfer transistor Qt is arranged in the second photoelectric conversion region 23R.

The one transfer transistor Qt (of the first photoelectric conversion region 23L) is arranged on the corner side formed by the other pixel isolation region 31*b* of the two pixel isolation regions 31*a* and 31*b* extending in the X direction across the photoelectric conversion cell 22D and the one pixel isolation region 31*c* of the two pixel isolation regions 31*c* and 31*d* extending in the Y direction across the photoelectric conversion cell 22D in plan view. Then, one feeding region 21*z* of the two feeding regions 21*z* is arranged between the corner and the one transfer transistor Qt. Then, the p-type contact region 48 is provided in the one feeding region 21*z*.

The other transfer transistor Qt (of the second photoelectric conversion region 23R) is arranged on the corner side formed by the other pixel isolation region 31*b* of the two pixel isolation regions 31*a* and 31*b* extending in the X direction across the photoelectric conversion cell 22D and the other pixel isolation region 31*d* of the two pixel isolation regions 31*c* and 31*d* extending in the Y direction across the photoelectric conversion cell 22D in plan view. Then, the other feeding region 21*z* of the two feeding regions is arranged between the corner and the other transfer transistor Qt. Then, a p-type contact region 48 is provided in the other feeding region 21*z*.

Although not illustrated in detail, in the photoelectric conversion cell 22D of the fourth embodiment, the p-type semiconductor region 24 is provided over the first photoelectric conversion region 23L and the second photoelectric conversion region 23R, similarly to the above-described photoelectric conversion cell 22A of the first embodiment illustrated in FIGS. 4 to 7. Then, the p-type semiconductor region of the fourth embodiment crosses a region between the two pixel isolation regions 31*a* and 31*b* extending in the X direction across the photoelectric conversion cell 22D and the in-pixel isolation region 34, unlike the above-described p-type semiconductor region 24 of the first embodiment. Then, the contact region (p-type semiconductor region) 48 of each of the two feeding regions 21*z* is provided in the p-type semiconductor region 24 on the first surface S1 side of the semiconductor layer.

As illustrated in FIG. 10, the n-type charge holding region FD is provided in the first portion $21e_1$ of the element formation region 21*e* and in a region between the other pixel isolation region 31*b* of the two pixel isolation regions 31*a* and 31*b* extending in the X direction across the photoelectric conversion cell 22 and the in-pixel isolation region 34. The n-type charge holding region FD is shared by the first and second photoelectric conversion regions 23L and 23R. Then, the charge holding region FD functions as a drain region of the respective transfer transistors TR1 and TR2 of the first and second photoelectric conversion regions 23L and 23R, and holds a signal charge transferred from each of the photoelectric conversion units 25 (see FIG. 5 of the first embodiment) via each of the transfer transistors TR1 and TR2. Then, in the photoelectric conversion cell 22D of the fourth embodiment, a region between each of the two pixel isolation regions 31 (31*a* and 31*b*) extending in the X direction and the in-pixel isolation region 34 functions as an overflow path.

In the photoelectric conversion cell 22D of the fourth embodiment, the element formation region 21*d* extends over the first photoelectric conversion region 23L and the second photoelectric conversion region 23R, and crosses a region between the pixel isolation region 31 (31*a* and 31*b*) and the in-pixel isolation region 34 in plan view, similarly to the above-described photoelectric conversion cell 22A of the first embodiment. Therefore, in the solid-state imaging device according to the fourth embodiment, effects similar to those of the above-described solid-state imaging device 1A according to the first embodiment can be obtained.

Furthermore, in the photoelectric conversion cell 22D of the fourth embodiment, the first photoelectric conversion region 23L and the second photoelectric conversion region 23R share one n-type charge holding region FD. Then, the n-type charge holding region FD is arranged between the pixel isolation region 31 (31*b*) and the in-pixel isolation region 34 in plan view. Therefore, the photoelectric conversion cell 22D of the fourth embodiment can increase the degree of freedom in arrangement of active elements including the pixel transistors Qt and the transfer transistors TR1 and TR2 in the photoelectric conversion cell 22 as compared with a case where the n-type charge accumulation region FD is arranged in each of the first and second photoelectric conversion regions 23L and 23R.

Furthermore, since the photoelectric conversion cell 22D of the fourth embodiment adopts both the arrangement of the element formation region 21*d* and the arrangement of the charge holding region FD in combination, it is possible to further increase the freedom in arrangement of the active elements including the pixel transistors Qt and the transfer transistors TR1 and TR2 in the photoelectric conversion cell 22 as compared with a case of adopting either the arrangement of the element formation region 21*d* or the arrangement of the charge holding region FD.

Note that, in the photoelectric conversion cell 22D of the fourth embodiment, the region between the in-pixel isolation region 34 and the pixel isolation region 31 (31*a* and 31*b*) functions as an overflow path.

Furthermore, the photoelectric conversion cell 22D of the fourth embodiment also includes a p-type semiconductor region 24, a photoelectric conversion unit 25, and an n-type semiconductor region 26 illustrated in FIGS. 4 to 7, similarly to the above-described photoelectric conversion cell 22A of the first embodiment.

Fifth Embodiment

A solid-state imaging device according to a fifth embodiment basically has a similar configuration to the above-described solid-state imaging device according to the fourth embodiment, and has a different planar pattern of a photoelectric conversion cell.

Figure 11:
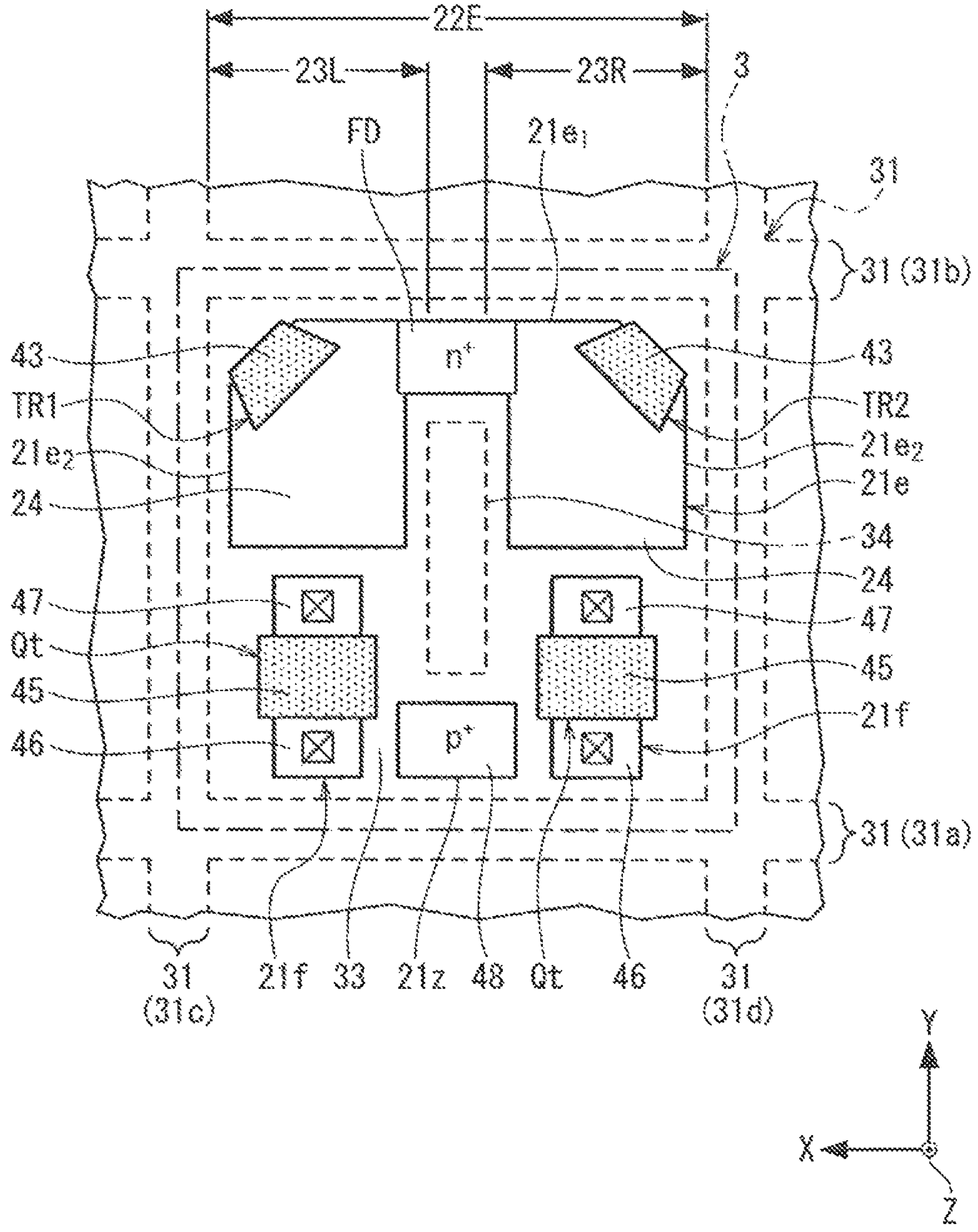
FIG. 11 is a schematic plan view illustrating a configuration example of a pixel according to a fifth embodiment of the present technology.

That is, the solid-state imaging device according to the fifth embodiment includes a photoelectric conversion cell 22E illustrated in FIG. 11 instead of the above-described photoelectric conversion cell 22D illustrated in FIG. 10 of the fourth embodiment. The photoelectric conversion cell 22E illustrated in FIG. 10 of the fifth embodiment basically has a similar configuration to the photoelectric conversion cell 22D illustrated in FIG. 10 of the above-described fourth embodiment, and has a different planar pattern.

That is, as illustrated in FIG. 11, the photoelectric conversion cell 22E of the fifth embodiment has a planar pattern including two element formation regions 21*f* partitioned by an element isolation region 33 and separately arranged from each other over first and second photoelectric conversion regions 23L and 23R, respectively, and an element formation region 21*e* partitioned by the element isolation region 33 and arranged over the first and second photoelectric conversion regions 23L and 23R. Furthermore, the photoelectric conversion cell 22E of the fifth embodiment has a planar pattern including a feeding region 21*z* arranged between one pixel isolation region 31 (31*a*) of two pixel isolation regions 31 (31*a* and 31*b*) extending in an X direction across the photoelectric conversion cell 22E and an in-pixel isolation region 34. Then, a pixel transistor Qt is provided in each of the two element formation regions 21*f*. Then, a p-type contact region (p-type semiconductor region) 48 is provided in the feeding region 21*z*.

As illustrated in FIG. 11, the two element formation regions 21*f* extend in a Y direction in plan view, and are arranged adjacent to each other across the in-pixel isolation region 34 and the feeding region 21*z*. Then, the pixel transistor Qt is provided in each of the two element formation regions 21*f* in a direction in which a source region and a drain region are aligned in the Y direction.

As illustrated in FIG. 11, the element formation region 21*e* of the fifth embodiment is slightly different in the planar pattern from the above-described element formation region 21*e* of the fourth embodiment illustrated in FIG. 10, but includes a first portion $21e_1$ and a pair of second portions $21e_2$, similarly to the element formation region 21*e* illustrated in FIG. 10. Then, in the element formation region 21*e* of the fifth embodiment, two transfer transistors TR1 and TR2 and one charge holding region FD are provided in similar arrangement to the element formation region 21*e* of the fourth embodiment illustrated in FIG. 10.

As illustrated in FIG. 11, the contact region 48 of the fifth embodiment is arranged between one pixel isolation region 31 (31*a*) of the two pixel isolation regions 31 (31*a* and 31*b*) extending in the X direction across the photoelectric conversion cell 22E in plan view, and the in-pixel isolation region 34, and is shared by the first and second photoelectric conversion regions 23L and 23R, unlike the above-described contact region 48 illustrated in FIG. 10 of the fourth embodiment.

Although not illustrated in detail, each of the element formation regions 21*f* and 21*e* is provided in a surface layer portion on a first surface S1 side of a semiconductor layer 21, and overlaps each of photoelectric conversion units 25 of the first and second photoelectric conversion regions 23L and 23R via a p-type semiconductor region 24 in a thickness direction (Z direction) of the semiconductor layer 21, similarly to the element formation regions 21*a*, $21b_1$, and $21b_2$ of the first embodiment illustrated in FIGS. 5 to 7

Note that, in the above-described fourth embodiment, as illustrated in FIG. 11, the feeding region 21*z* and the p-type contact region 48 are respectively arranged on the corner side formed by the pixel isolation region 31*b* and the pixel isolation region 31*c* and on the corner side formed by the pixel isolation region 31*b* and the pixel isolation region 31*d*, in plan view. In contrast, in the fifth embodiment, the feeding region 21*z* and the contact region 48 are not arranged on the respective corners, and the feeding region 21*z* and the contact region 48 shared by the first and second photoelectric conversion regions 23L and 23R are arranged between the in-pixel isolation region 34 and the pixel isolation region 31*a*.

In the photoelectric conversion cell 22E according to the fifth embodiment, since the n-type charge holding region FD shared by the first photoelectric conversion region 23L and the second photoelectric conversion region 23R is arranged between the pixel isolation region 31 (31*b*) and the in-pixel isolation region 34 in plan view, similarly to the above-described fourth embodiment, it is possible to increase the degree of freedom in arrangement of active elements including the pixel transistors Qt and the transfer transistors TR1 and TR2 in the photoelectric conversion cell 22 as compared with a case of arranging the n-type charge accumulation region FD in each of the first and second photoelectric conversion regions 23L and 23R.

Furthermore, in the photoelectric conversion cell 22E of the fifth embodiment, since the p-type contact region 48 shared by the first photoelectric conversion region 23L and the second photoelectric conversion region 23R is arranged between the pixel isolation region 31 (31*a*) and the in-pixel isolation region 34 in plan view, it is possible to increase the degree of freedom in arrangement of the active elements including the pixel transistors Qt and the transfer transistors TR1 and TR2 in the photoelectric conversion cell 22 as compared with a case of arranging the p-type contact region 48 in each of the first and second photoelectric conversion regions 23L and 23R.

Furthermore, since the photoelectric conversion cell 22E of the fifth embodiment adopts both the arrangement of the n-type charge holding region FD and the arrangement of the p-type contact region 48 in combination, it is possible to further increase the freedom in arrangement of the active elements including the pixel transistors Qt and the transfer transistors TR1 and TR2 in the photoelectric conversion cell 22 as compared with the case of adopting either the arrangement of the n-type charge holding region FD or the arrangement of the p-type contact region 48.

Note that, in the photoelectric conversion cell 22E of the fifth embodiment, a region between the in-pixel isolation region 34 and the pixel isolation regions 31*a* and 31*b* functions as an overflow path.

Furthermore, the photoelectric conversion cell 22E of the fifth embodiment also includes a p-type semiconductor region 24, a photoelectric conversion unit 25, and an n-type semiconductor region 26 illustrated in FIGS. 4 to 7, similarly to the above-described photoelectric conversion cell 22A of the first embodiment.

Sixth Embodiment

Figure 12:
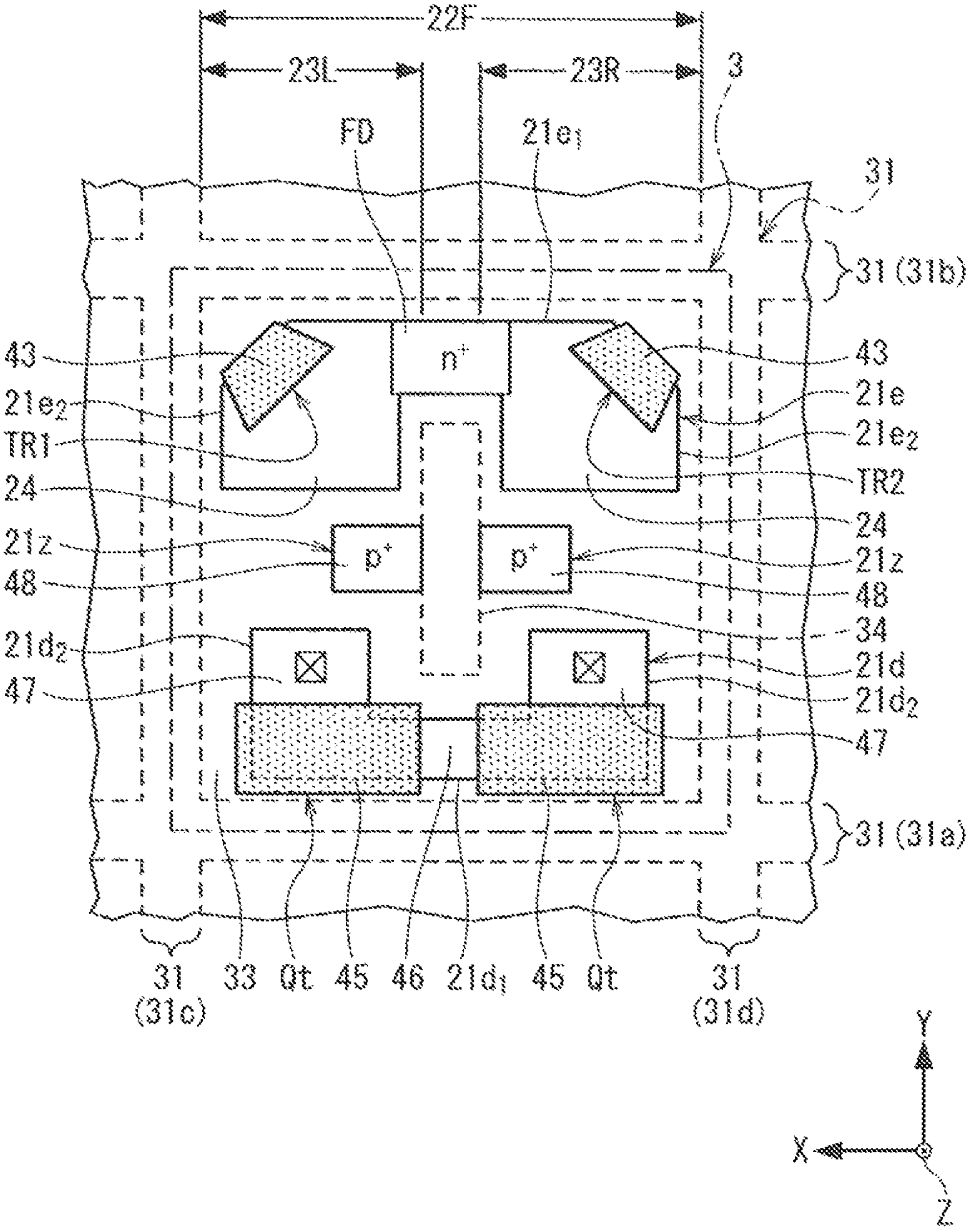
FIG. 12 is a schematic plan view illustrating a configuration example of a pixel according to a sixth embodiment of the present technology.

A solid-state imaging device according to a sixth embodiment includes a photoelectric conversion cell 22F illustrated in FIG. 12 instead of the photoelectric conversion cell 2D illustrated in FIG. 10 of the fourth embodiment. The photoelectric conversion cell 22F illustrated in FIG. 12 of the sixth embodiment basically has a similar configuration to the photoelectric conversion cell 22D illustrated in FIG. 10 of the fourth embodiment, and has a different planar pattern.

That is, the photoelectric conversion cell 22D of the fourth embodiment illustrated in FIG. 10 has the planar pattern in which the feeding region 21*z* and the p-type contact region 48 are arranged on each of the two corner sides on the pixel isolation region 31 (31*b*) side in plan view.

In contrast, as illustrated in FIG. 12, the photoelectric conversion cell 22F of the sixth embodiment is provided with a feeding region 21*z* partitioned by an element isolation region 33 in each of first and second photoelectric conversion regions 23L and 23R across an in-pixel isolation region 34 in plan view. Then, a p-type contact region 48 is provided in each of the two feeding regions 21*z*.

One p-type contact region 48 (on the first photoelectric conversion region 23L side) of the two p-type contact regions 48 is arranged between one second portion 21$d_2$ of an element formation region 21*d* and one second portion 21$e_2$ of an element formation region 21*e* in plan view in the first photoelectric conversion region 23L. Furthermore, the other p-type contact region 48 (on the second photoelectric conversion region 23R side) is arranged between the other second portion 21$d_2$ of the element formation region 21*d* and the other second portion 21$e_2$ of the element formation region 21*e* in plan view in the second photoelectric conversion region 23R.

In the photoelectric conversion cell 22F of the sixth embodiment, the element formation region 21*d* extends over the first photoelectric conversion region 23L and the second photoelectric conversion region 23R, and crosses a region between a pixel isolation region 31 (31*a* and 31*b*) and the in-pixel isolation region 34 in plan view, similarly to the above-described fourth embodiment.

Furthermore, in the photoelectric conversion cell 22F of the sixth embodiment, an n-type charge holding region FD shared by the first photoelectric conversion region 23L and the second photoelectric conversion region 23R is arranged between the pixel isolation region 31 (31*b*) and the in-pixel isolation region 34 in plan view, similarly to the above-described fourth embodiment.

Then, in the photoelectric conversion cell 22F of the sixth embodiment, both the arrangement of the element formation region 21*d* and the arrangement of the charge holding region FD are adopted in combination.

Therefore, in the photoelectric conversion cell 22F of the sixth embodiment, effects similar to those of the above-described photoelectric conversion cell 22D of the fourth embodiment can be obtained.

Note that, in the photoelectric conversion cell 22F of the sixth embodiment, a region between the in-pixel isolation region 34 and the pixel isolation region 31 (31*a* and 31*b*) functions as an overflow path.

Furthermore, the photoelectric conversion cell 22F of the sixth embodiment also includes a p-type semiconductor region 24, a photoelectric conversion unit 25, and an n-type semiconductor region 26 illustrated in FIGS. 4 to 7, similarly to the above-described photoelectric conversion cell 22A of the first embodiment.

Seventh Embodiment

Figure 13:
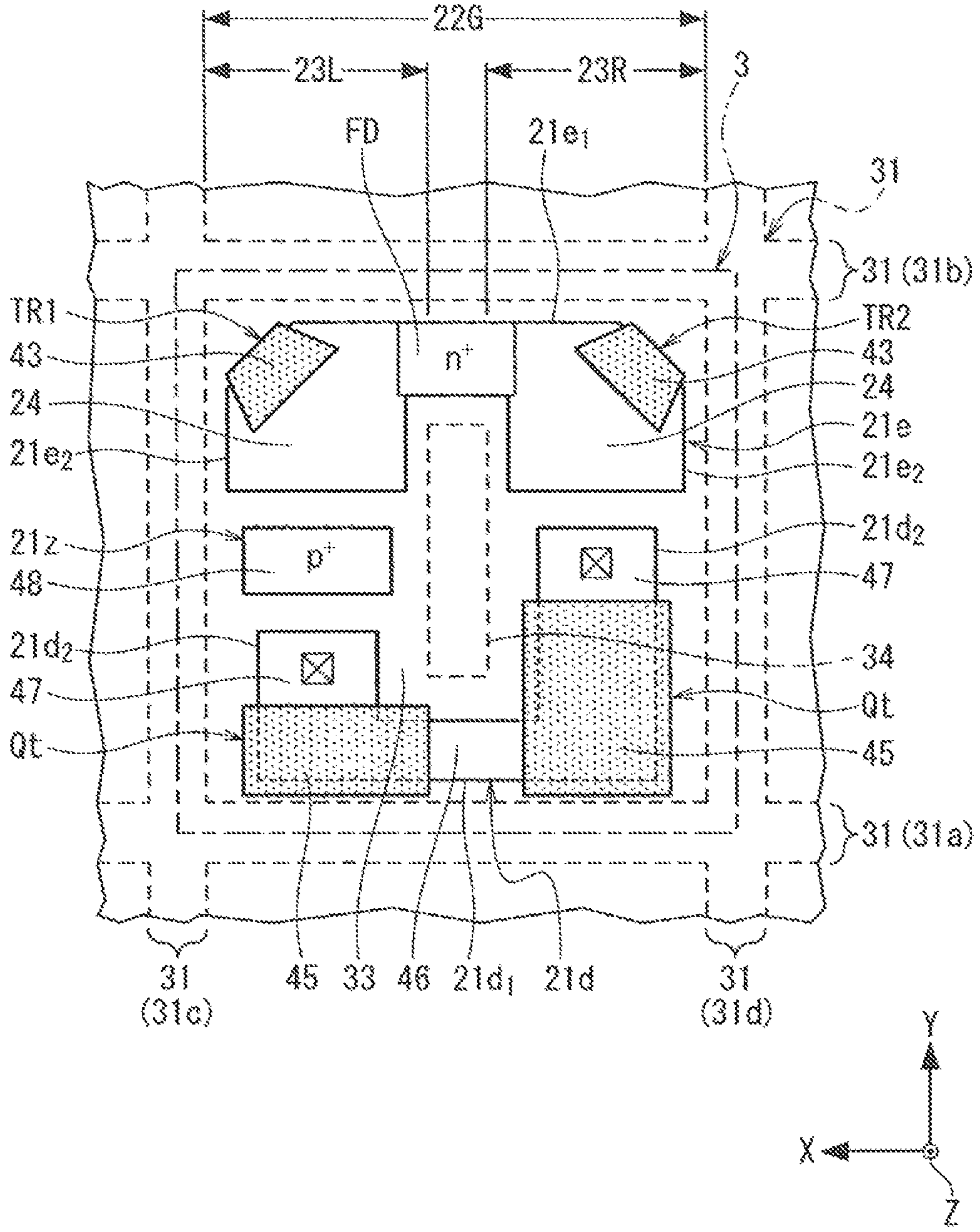
FIG. 13 is a schematic plan view illustrating a configuration example of a pixel according to a seventh embodiment of the present technology.

A solid-state imaging device according to a seventh embodiment includes a photoelectric conversion cell 22G illustrated in FIG. 13 instead of the photoelectric conversion cell 22F illustrated in FIG. 12 of the sixth embodiment. The photoelectric conversion cell 22G illustrated in FIG. 13 of the seventh embodiment basically has a similar configuration to the photoelectric conversion cell 22F illustrated in FIG. 12 of the sixth embodiment, and has a different planar pattern.

That is, as illustrated in FIG. 13, in the photoelectric conversion cell 22G according to the seventh embodiment, a length in a Y direction of the other second portion 21$a_2$ (on a second photoelectric conversion region 23R side) is longer than a length in the Y direction of one second portion 21$a_2$ (on a first photoelectric conversion region 23L side) in a pair of second portions 21$d_2$ of an element formation region 21*d* partitioned by an element isolation region 33. Then, a feeding region 21*z* partitioned by the element isolation region 33 is provided between the one second portion 21$a_2$ and one second portion 21$e_2$ of a pair of second portions 21$e_2$ of an element formation region 21*e* in plan view. Then, a p-type contact region 48 is provided in the feeding region 21*z*.

Furthermore, in the photoelectric conversion cell 22G according to the seventh embodiment, a gate area of a pixel transistor Qt arranged at a corner of the element formation region 22*d* on the second photoelectric conversion region 23R side is larger than a gate surface of a pixel transistor Qt arranged at a corner of the element formation region 22*d* on the first photoelectric conversion region 23L side.

In the photoelectric conversion cell 22G of the seventh embodiment, the element formation region 21*d* extends over the first photoelectric conversion region 23L and the second photoelectric conversion region 23R, and crosses a region between a pixel isolation region 31 (31*a*) and an in-pixel isolation region 34 in plan view. Therefore, in the photoelectric conversion cell 22G according to the seventh embodiment, effects similar to those of the above-described photoelectric conversion cell 22F of the sixth embodiment can be obtained.

Eighth Embodiment

Figure 14:
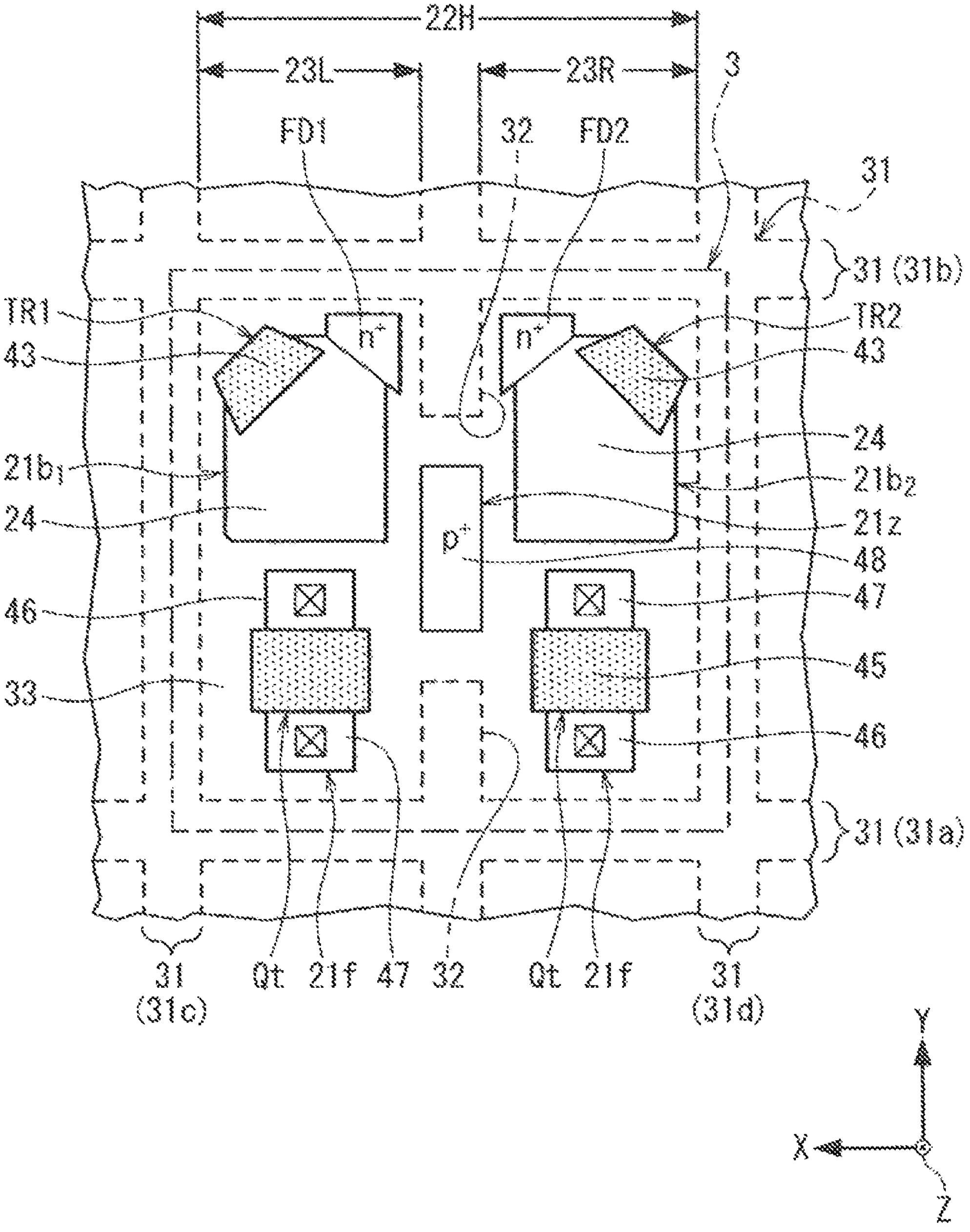
FIG. 14 is a schematic plan view illustrating a configuration example of a pixel according to an eighth embodiment of the present technology.

A solid-state imaging device according to an eighth embodiment includes a photoelectric conversion cell 22H illustrated in FIG. 14. The photoelectric conversion cell 22H of the eighth embodiment basically has a similar configuration to the photoelectric conversion cell 22A illustrated in FIG. 4 of the above-described first embodiment, and has a different planar pattern.

That is, as illustrated in FIG. 14, the photoelectric conversion cell 22H of the eighth embodiment includes two element formation regions $21b_1$ and $21b_2$ and one feeding region 21*z* illustrated in FIG. 4, and further includes two element formation regions 21*f* illustrated in FIG. 11 instead of the element formation region 21*a* illustrated in FIG. 4. Then, a p-type contact region 48 is provided in the feeding region 21*z*.

That is, the photoelectric conversion cell 22H of the eighth embodiment includes five semiconductor regions partitioned by an element isolation region 33. Specifically, the five semiconductor regions include two p-type semiconductor regions 24 and 24, two sets of a pair of main electrode regions (n-type semiconductor regions) 46 and 47, and one p-type contact region (p-type semiconductor region) 48.

Then, in other words, the five semiconductor regions include a first semiconductor region (p-type semiconductor region 24) in which a first transfer transistor (transfer transistor TR1) is provided and a second semiconductor region (p-type semiconductor region 24) in which a second transfer transistor (transfer transistor TR2) is provided. Furthermore, the five semiconductor regions include a third semiconductor region (the pair of main electrode regions (n-type semiconductor regions) 46 and 47) in which first pixel transistors (pixel transistors Qt) other than the first and second transfer transistors (transfer transistors TR1 and TR2) are provided, a fourth semiconductor region (the pair of main electrode regions (n-type semiconductor regions) 46 and 47) in which second pixel transistors (pixel transistors Qt) other than the first and second transfer transistors (transfer transistors TR1 and TR2) are provided, and the p-type semiconductor region (p-type contact region 48).

As illustrated in FIG. 14, the feeding region 21*z* and the contact region 48 of the eighth embodiment are arranged between two in-pixel isolation regions 32 in plan view, and have a longer length in a Y direction than the feeding region 21*z* and the p-type contact region 48 of the first embodiment illustrated in FIG. 4. Then, the two element formation regions 21*f* of the eighth embodiment are individually arranged in first and second photoelectric conversion regions 23L and 23R adjacently to each other in an X direction across the feeding region 21*z*, the contact region 48, and the in-pixel isolation region 32 on a pixel isolation region 31*a* side. Furthermore, the two element formation regions $21b_1$ and $21b_2$ of the eighth embodiment are individually arranged in the first and second photoelectric conversion regions 23L and 23R adjacently to each other in the X direction across the feeding region 21*z*, the contact region 48, and the in-pixel isolation region 32 on a pixel isolation region 31*b* side.

In the photoelectric conversion cell 22H of the eighth embodiment, the p-type contact region 48 shared by the first photoelectric conversion region 23L and the second photoelectric conversion region 23R is arranged between the two in-pixel isolation regions 32 in plan view, similarly to the above-described first embodiment. Therefore, it is possible to increase the degree of freedom in arrangement of active elements including the pixel transistors Qt and the transfer transistors TR1 and TR2 in the photoelectric conversion cell 22 as compared with a case of individually arranging the contact region 48 in each of the first and second photoelectric conversion regions 23L and 23R.

Note that the solid-state imaging device according to the eighth embodiment includes the following configuration in a case of changing a perspective (point of view), which will be described with reference to FIGS. 14 and 5 to 7.

That is, the solid-state imaging device according to the eighth embodiment includes a first pixel (pixel 3) provided in a semiconductor layer 21 as a semiconductor substrate, and a trench including a first region (pixel isolation region 31 having a quadrangular planar shape) that isolates other pixels 3 adjacent (adjacent) to the first pixel in plan view from each other and a second region (in-pixel isolation region 32 within the pixel) in which a photoelectric conversion unit 25 provided in the first pixel is shielded in plan view. Here, the trench includes a configuration in which the trench extends in a thickness direction of the semiconductor layer 21 illustrated in FIGS. 5 to 7 and penetrates a first surface S1 and a second surface S2 of the semiconductor layer 21, and a configuration in which the trench extends in the thickness direction of the semiconductor layer 21 and is separated from at least one of the first surface S1 or the second surface S2 of the semiconductor layer 21. In the eighth embodiment, the trench penetrates the semiconductor layer 21, for example, although not limited thereto.

Then, in plan view, the second region has a first portion (one in-pixel isolation region 32) between a first floating diffusion region (charge holding region FD1) and a second floating diffusion region (charge holding region FD2) provided in the first pixel (pixel 3). Furthermore, in plan view, the second region has a second portion (the other in-pixel isolation region 32) between a first transistor (one pixel transistor Qt) and a second transistor (the other pixel transistor Qt) provided in the first pixel (the pixel 3).

Then, the p-type contact region 48 is provided between the first portion (one in-pixel isolation region 32) of the second region and the second portion (the other in-pixel isolation region 32) of the second region in plan view.

The first portion (one in-pixel isolation region 32) of the second region, the contact region 48, and the second portion (the other in-pixel isolation region 32) of the second region are arranged in this order along the Y direction (first direction) in plan view.

One main electrode region (first contact) 46, a gate electrode 45, and the other main electrode region (second contact) 47 of the first transistor (one pixel transistor Qt) are arranged in this order along the Y direction (first direction).

One main electrode region (third contact) 46, a gate electrode 45, and the other main electrode region (fourth contact) 47 of the second transistor (the other pixel transistor Qt) are arranged in this order along the Y direction (first direction).

The contact region 48 is provided at a center of the pixel 3 and includes a p-type semiconductor region (impurity region).

In a case of further changing a perspective (point of view), the solid-state imaging device according to the eighth embodiment includes the first pixel (pixel 3) provided on the semiconductor substrate and an isolation region that isolates other pixels 3 adjacent (adjacent) to the first pixel from each other in plan view. The isolation region includes a first portion (pixel isolation region 31*a*) and a second portion (pixel isolation region 31*b*) located on opposite sides to each other in the Y direction, and a third portion (pixel isolation region 31*a*) and a fourth portion (pixel isolation region 31*b*) located on opposite sides to each other in the X direction, in plan view, and a fifth portion (one in-pixel isolation region 32) and a sixth portion (the other in-pixel isolation region 32) provided between the first portion (pixel isolation region 31*a*) and the second portion (pixel isolation region 31*b*) in plan view. The first portion (pixel isolation region 31*a*) and the second portion (pixel isolation region 31*b*) face each other, and the third portion (pixel isolation region 31*c*) and the fourth portion (pixel isolation region 31*d*) face each other.

Then, the first pixel (pixel 3) is surrounded by the first to fourth portions (pixel isolation regions 31*a* to 31*d*) of the isolation region in plan view.

Then, the p-type contact region 48 is provided between the fifth portion (one in-pixel isolation region 32) and the sixth portion (the other in-pixel isolation region 32) in plan view.

Then, the fifth portion (one in-pixel isolation region 32) is in contact with the first portion (pixel isolation region 31*a*), and the sixth portion (the other in-pixel isolation region 32) is in contact with the second portion (pixel isolation region 31*b*).

An angle (angle) formed by the first portion (pixel isolation region 31*a*) and the fifth portion (one in-pixel isolation region 32) is perpendicular in plan view, and an angle (angle) formed by the second portion (pixel isolation region 31*b*) and the sixth portion (the other in-pixel isolation region 32) is also perpendicular in plan view. In other words, the fifth portion (one in-pixel isolation region 32) protrudes perpendicularly to the first portion (the pixel isolation region 31*a*) in plan view, and the sixth portion (the other in-pixel isolation region 32) protrudes perpendicularly to the second portion (the other pixel isolation region 31*a*). The fifth portion (one in-pixel isolation region 32) and the sixth portion (the other in-pixel isolation region 32) function as a "protrusion" or a "projection", and can be expressed as a "protrusion" or a "protrusion".

The fifth portion (one in-pixel isolation region 32), the contact region 48, and the sixth portion (the other in-pixel isolation region 32) are arranged in this order along the Y direction (first direction) in plan view.

The first contact (main electrode region 4646), the gate electrode 45, and the second contact (main electrode region 47) of the first transistor (one pixel transistor Qt) are arranged in this order along the Y direction (first direction).

The third contact (main electrode region 46) of the second transistor (the other pixel transistor Qt), the gate electrode

45, and (the main electrode region 47 of) the fourth contact are arranged in this order along the Y direction (first direction) in plan view.

The contact region 48 is provided at a center of the pixel 3 and includes a p-type semiconductor region (impurity region).

Ninth Embodiment

Figure 15:
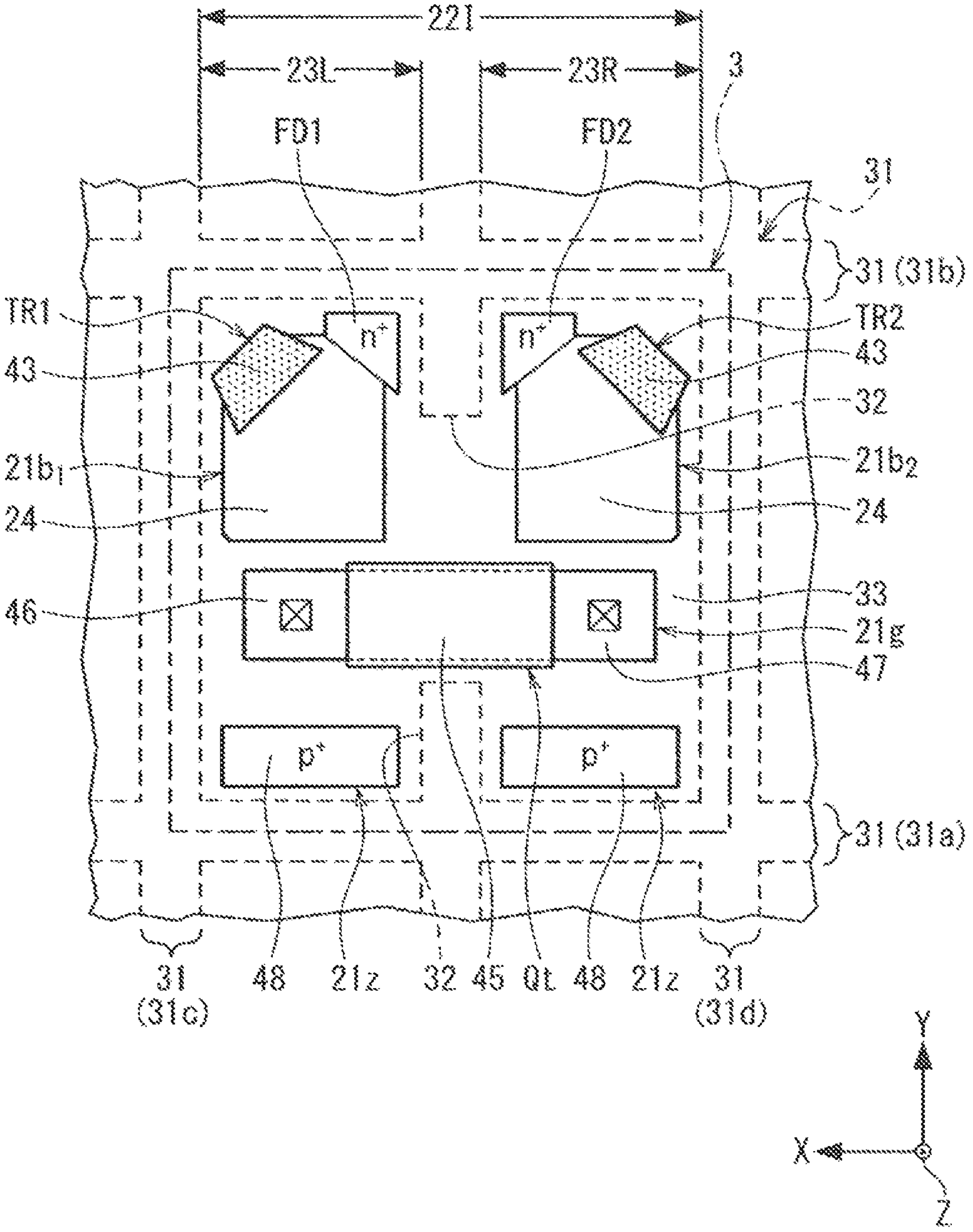
FIG. 15 is a schematic plan view illustrating a configuration example of a pixel according to a ninth embodiment of the present technology.

A solid-state imaging device according to a ninth embodiment includes a photoelectric conversion cell 22I illustrated in FIG. 15 instead of the above-described photoelectric conversion cell 22A illustrated in FIG. 4 of the first embodiment. The photoelectric conversion cell 22I illustrated in FIG. 15 of the ninth embodiment basically has a similar configuration to the above-described photoelectric conversion cell 22A illustrated in FIG. 4 of the first embodiment, and has a different planar pattern.

That is, as illustrated in FIG. 15, the photoelectric conversion cell 22I of the ninth embodiment includes two element formation regions 21*b*$_1$ and 21*b*$_2$ illustrated in FIG. 4 and two feeding regions 21*z* illustrated in FIG. 8 of the above-described second embodiment instead of the feeding region 21*z* illustrated in FIG. 4 of the first embodiment. Furthermore, the photoelectric conversion cell 22I according to the ninth embodiment includes an element formation region 21*g* partitioned by an element isolation region 33 as illustrated in FIG. 15 instead of the element formation region 21*a* illustrated in FIG. 4. Then, a p-type contact region 48 is provided in each of the two feeding regions 21*z*.

As illustrated in FIG. 15, the two element formation regions 21*b*$_1$ and 21*b*$_2$ of the ninth embodiment are individually arranged in first and second photoelectric conversion regions 23L and 23R adjacently to each other in an X direction across an in-pixel isolation region 32 on a pixel isolation region 31*b* side, similarly to the above-described first embodiment. Furthermore, the two feeding regions 21*z* of the ninth embodiment are individually arranged in the first and second photoelectric conversion regions 23L and 23R adjacently to each other in the X direction across the in-pixel isolation region 32 on a pixel isolation region 31*a* side, similarly to the above-described second embodiment.

As illustrated in FIG. 15, the element formation region 21*g* is arranged over between the element formation region 21*b*$_1$ of the first photoelectric conversion region 23L and the feeding region 21*z*, between the two in-pixel isolation regions 32, and between the element formation region 21*b*$_1$ of the second photoelectric conversion region 22R and the feeding region 21*z* in plan view. Then, one pixel transistor Qt is provided in the element formation region 21*g*. In the pixel transistor Qt, a gate electrode 45 crosses the two in-pixel isolation regions 32 in plan view, one main electrode region 47 is provided on the first photoelectric conversion region 23L side of the element formation region 21*g*, and the other main electrode region 47 is provided on the second photoelectric conversion region 23R side of the element formation region 21*g*.

In the photoelectric conversion cell 22I of the ninth embodiment, the element formation region 21*g* extends over the first photoelectric conversion region 23L and the second photoelectric conversion region 23R, and crosses a region between the in-pixel isolation regions 32 in plan view, similarly to the above-described photoelectric conversion cell 22A of the first embodiment. Therefore, in the solid-state imaging device according to the ninth embodiment, effects similar to those of the above-described solid-state imaging device 1A according to the first embodiment can be obtained.

Tenth Embodiment

Figure 16:
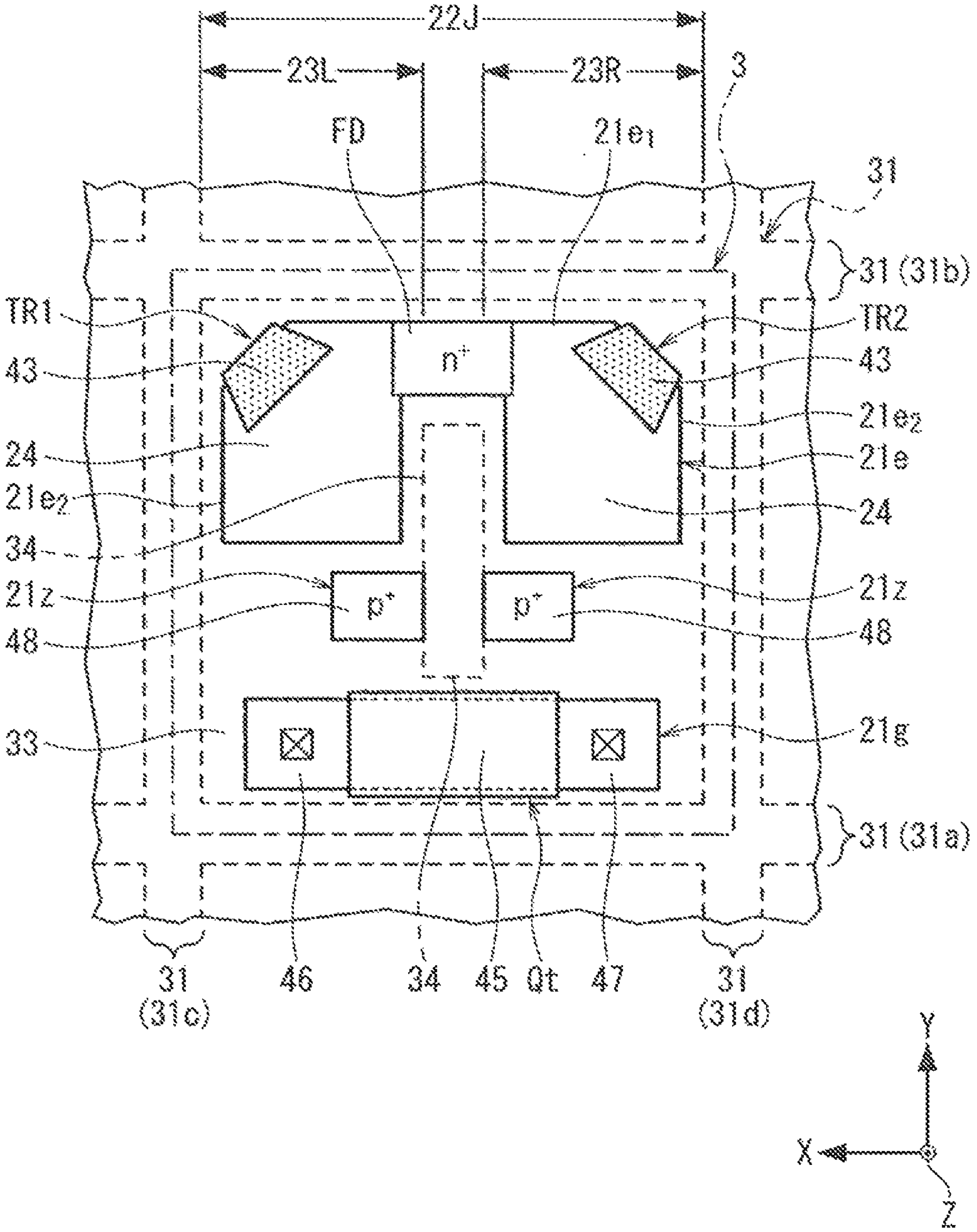
FIG. 16 is a schematic plan view illustrating a configuration example of a pixel according to a tenth embodiment of the present technology.

A solid-state imaging device according to a tenth embodiment includes a photoelectric conversion cell 22J illustrated in FIG. 16 instead of the above-described photoelectric conversion cell 22F illustrated in FIG. 12 of the sixth embodiment. The photoelectric conversion cell 22J illustrated in FIG. 16 of the tenth embodiment basically has a similar configuration to the photoelectric conversion cell 22F illustrated in FIG. 12 of the sixth embodiment, and has a different planar pattern.

That is, as illustrated in FIG. 16, the photoelectric conversion cell 22J of the tenth embodiment includes an element formation region 21*e* and two feeding regions 21*z* of the sixth embodiment illustrated in FIG. 12, and an element formation region 21*g* of the ninth embodiment illustrated in FIG. 15 instead of the element formation region 21*d* of the sixth embodiment illustrated in FIG. 12. Then, a length in a Y direction of a pair of second portions $\mathbf{21}e_2$ of the element formation region 21*e* of the tenth embodiment is longer than the length in the Y direction of the pair of second portions $\mathbf{21}e_2$ of the element formation region 21*e* of the sixth embodiment. Then, the two feeding regions 21*z* of the tenth embodiment are arranged closer to a pixel isolation region 31*a* side than the two feeding regions 21*z* of the sixth embodiment in plan view. Then, the element formation region 21*g* is arranged between an in-pixel isolation region 34 and one pixel isolation region 31 (31*a*) of two pixel isolation regions 31 extending in the X direction.

In the photoelectric conversion cell 22J of the tenth embodiment, the element formation region 21*g* extends over first photoelectric conversion region 23L and second photoelectric conversion region 23R, and crosses a region between the pixel isolation region 31 (31*a*) and the in-pixel isolation region 34 in plan view, similarly to the above-described sixth embodiment.

Furthermore, in the photoelectric conversion cell 22J of the tenth embodiment, an n-type charge holding region FD shared by the first photoelectric conversion region 23L and the second photoelectric conversion region 23R is arranged between the pixel isolation region 31*b* and the in-pixel isolation region 34 in plan view, similarly to the above-described sixth embodiment.

Then, in the photoelectric conversion cell 22J of the tenth embodiment, both the arrangement of the element formation region 21*g* and the arrangement of the charge holding region FD are adopted in combination.

Therefore, in the photoelectric conversion cell 22J according to the tenth embodiment, effects similar to those of the above-described photoelectric conversion cell 22F of the sixth embodiment can be obtained.

Eleventh Embodiment

Figure 17:
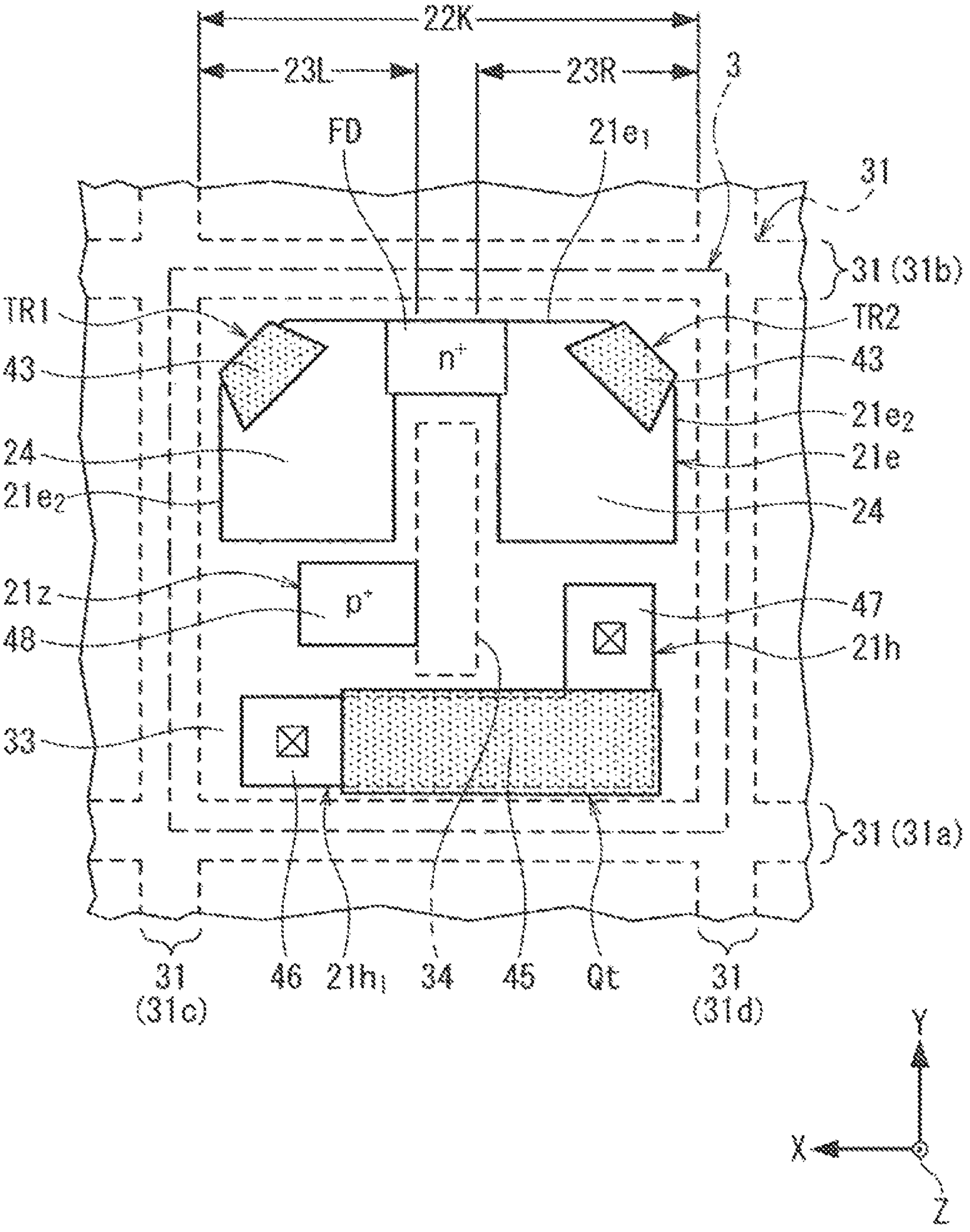
FIG. 17 is a schematic plan view illustrating a configuration example of a pixel according to an eleventh embodiment of the present technology.

A solid-state imaging device according to an eleventh embodiment includes a photoelectric conversion cell 22K illustrated in FIG. 17 instead of the above-described photoelectric conversion cell 22G illustrated in FIG. 13 of the seventh embodiment. The photoelectric conversion cell 22K illustrated in FIG. 17 of the eleventh embodiment basically has a similar configuration to the photoelectric conversion cell 22G illustrated in FIG. 13 of the seventh embodiment, and has a different planar pattern.

That is, as illustrated in FIG. 17, the photoelectric conversion cell 22K of the eleventh embodiment includes an element formation region 21*e* and a feeding region 21*z* of the seventh embodiment illustrated in FIG. 13, and an element formation region 21*h* partitioned by an element isolation region 33 instead of the element formation region 21*d* of the seventh embodiment illustrated in FIG. 13. Then, one pixel transistor Qt is provided in the element formation region 21*h*. Then, a p-type contact region 48 is provided in the feeding region 21*z*.

As illustrated in FIG. 17, the element formation region 21*h* of the eleventh embodiment extends over first and second photoelectric conversion regions 23L and 23R, and crosses a region between a pixel isolation region 31 (31*a*) and an in-pixel isolation region 34. The element formation region 21*h* includes a first portion 21*h*1 crossing a region between the pixel isolation region 31*a* and the in-pixel isolation region 34 in plan view, and a second portion 21*h*2 extending from one of one end side and the other end side of the first portion 21*h*1 toward a side opposite to the pixel isolation region 31*a* side, in other words, toward the element formation region 21*e* side. In the eleventh embodiment, the second portion 21*h*2 extends from the other end side (second photoelectric conversion region 23R side) of the first portion 21*h*1 toward the element formation region 21*e* side.

Although not illustrated in detail, the element formation region 21*h* is provided in a surface layer portion on a first surface S1 side of a semiconductor layer 21, and overlaps each of photoelectric conversion units 25 of the first and second photoelectric conversion regions 23L and 23R via a p-type semiconductor region 24 in a thickness direction (Z direction) of the semiconductor layer 21, similarly to the element formation regions 21*a*, $\mathbf{21}b_1$, and $\mathbf{21}b_2$ of the first embodiment illustrated in FIGS. 5 to 7

As illustrated in FIG. 17, in the pixel transistor Qt, a gate electrode 45 crosses a region between the pixel isolation region 31*a* and the in-pixel isolation region 34, one main electrode region 47 is provided on the first photoelectric conversion region 23L side of the element formation region 21*h*, and the other main electrode region 47 is provided on the second photoelectric conversion region 23R side of the element formation region 21*h*.

In the photoelectric conversion cell 22K of the eleventh embodiment, the element formation region 21*h* extends over the first photoelectric conversion region 23L and the second photoelectric conversion region 23R, and crosses a region between the pixel isolation region 31 (31*a*) and the in-pixel isolation region 34 in plan view, similarly to the above-described seventh embodiment.

Furthermore, in the photoelectric conversion cell 22K of the eleventh embodiment, an n-type charge holding region FD shared by the first photoelectric conversion region 23L and the second photoelectric conversion region 23R is arranged between the pixel isolation region 31 (31*b*) and the in-pixel isolation region 34 in plan view, similarly to the above-described seventh embodiment.

Then, in the photoelectric conversion cell 22K of the eleventh embodiment, both the arrangement of the element formation region 21*h* and the arrangement of the charge holding region FD are adopted in combination.

Therefore, in the photoelectric conversion cell 22K according to the eleventh embodiment, effects similar to those of the above-described photoelectric conversion cell 22G of the seventh embodiment can be obtained.

Twelfth Embodiment

Figure 18:
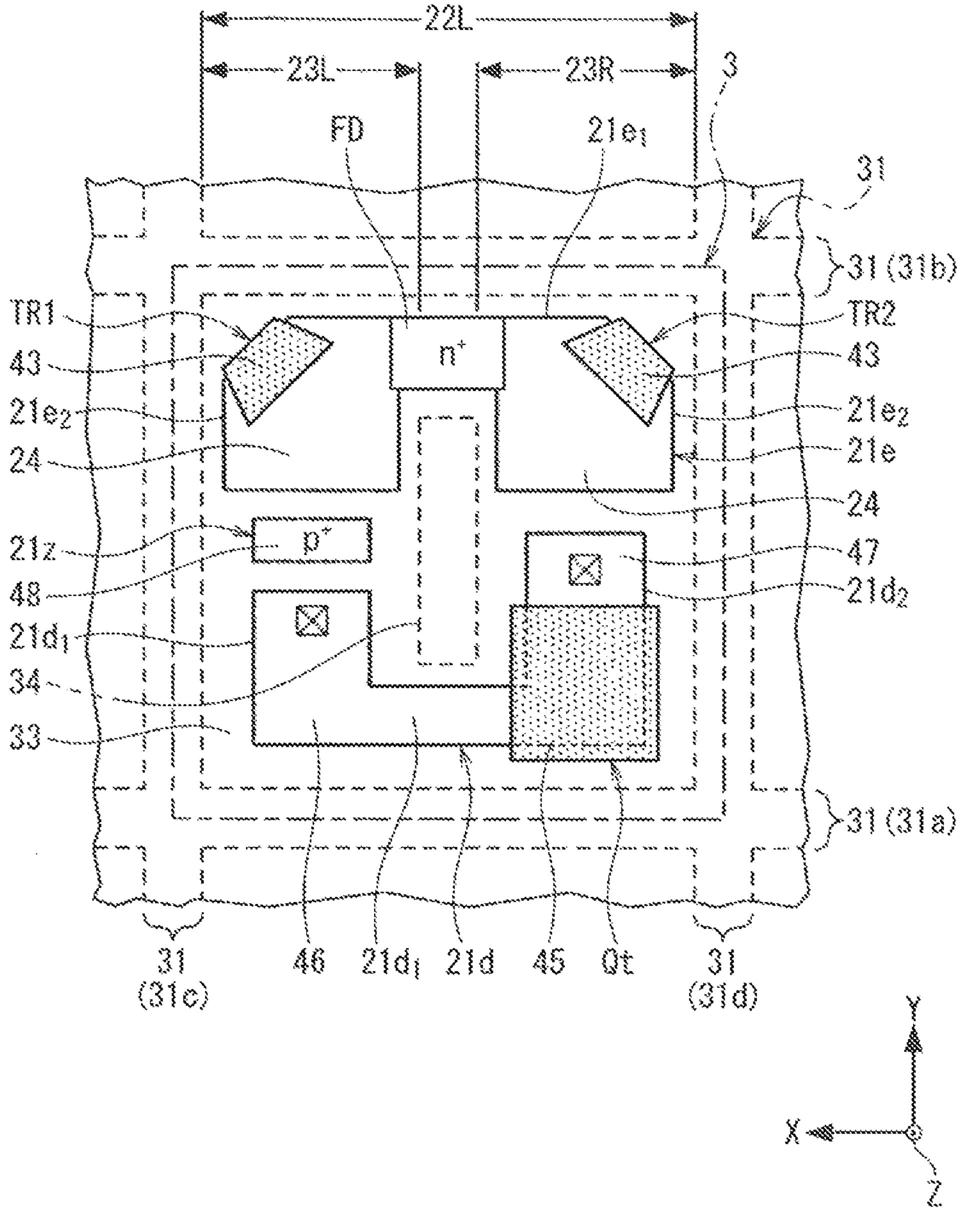
FIG. 18 is a schematic plan view illustrating a configuration example of a pixel according to a twelfth embodiment of the present technology.

A solid-state imaging device according to a twelfth embodiment includes a photoelectric conversion cell 22L illustrated in FIG. 18. The photoelectric conversion cell 22L illustrated in FIG. 18 of the twelfth embodiment basically has a similar configuration to the above-described photoelectric conversion cell 22G illustrated in FIG. 13 of the seventh embodiment, and the number of pixel transistors Qt provided in an element formation region 22*d* is different.

That is, the above-described photoelectric conversion cell 22G illustrated in FIG. 13 of the seventh embodiment is provided with the two pixel transistors Qt in the element formation region 21*d*.

In contrast, as illustrated in FIG. 18, the photoelectric conversion cell 22L of the twelfth embodiment has a pixel transistor Qt arranged at either one of two corners of an element formation region 21*d*. In the twelfth embodiment, the pixel transistor Qt is arranged at the corner of the element formation region 21*d* on the second photoelectric conversion region 23R side.

In the photoelectric conversion cell 22L according to the twelfth embodiment, effects similar to those of the above-described photoelectric conversion cell 22G of the seventh embodiment can be obtained.

Thirteenth Embodiment

In a thirteenth embodiment, a solid-state imaging device having a readout circuit provided for each pixel block (pixel unit) including four pixels will be described.

Figure 19:
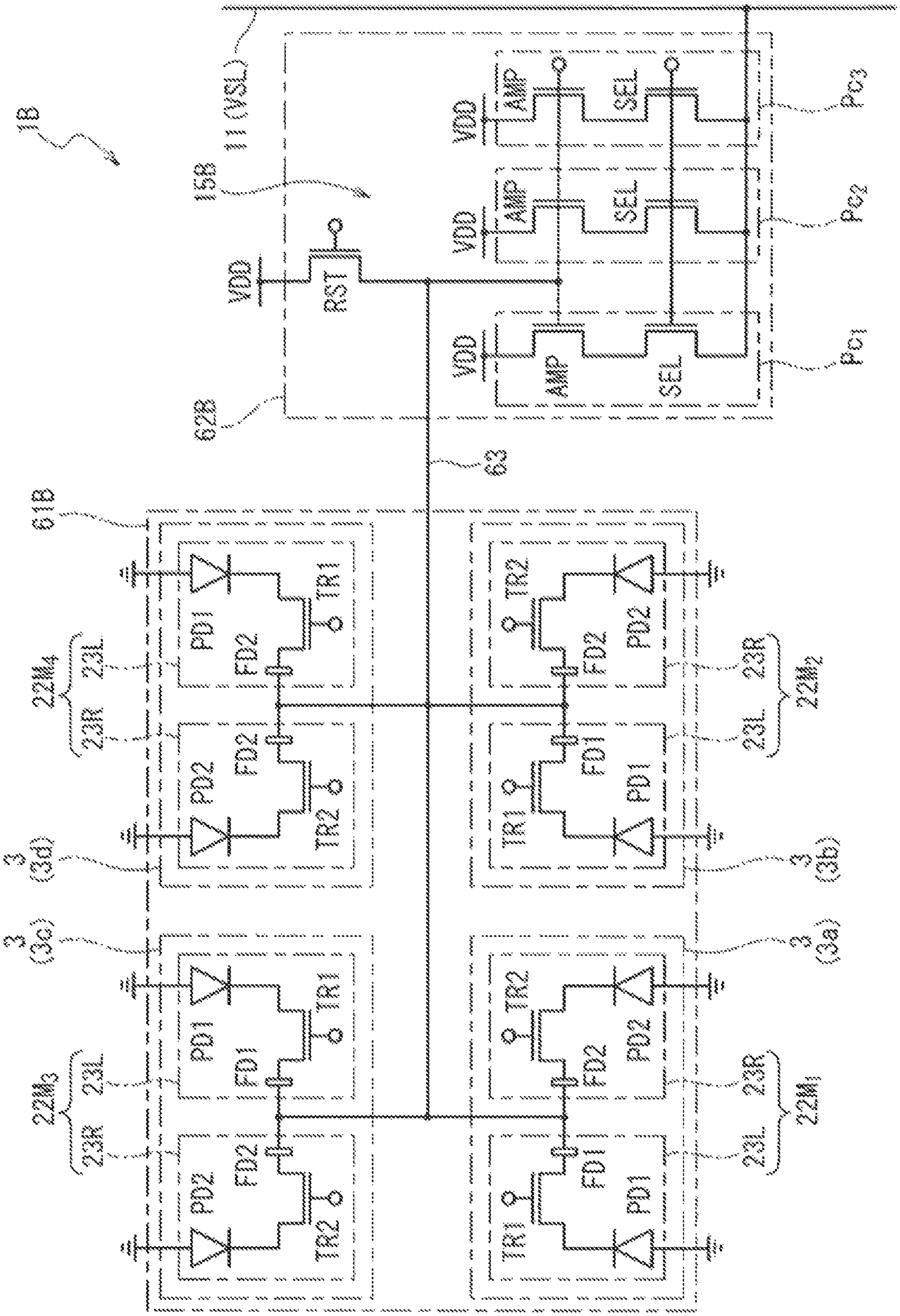
FIG. 19 is an equivalent circuit diagram illustrating a configuration example of a pixel block and a readout circuit of a solid-state imaging device according to a thirteenth embodiment of the present technology.

A solid-state imaging device 1B according to the thirteenth embodiment includes a pixel block (pixel unit) 61B and a readout circuit 15B illustrated in FIG. 19.

Figure 20:
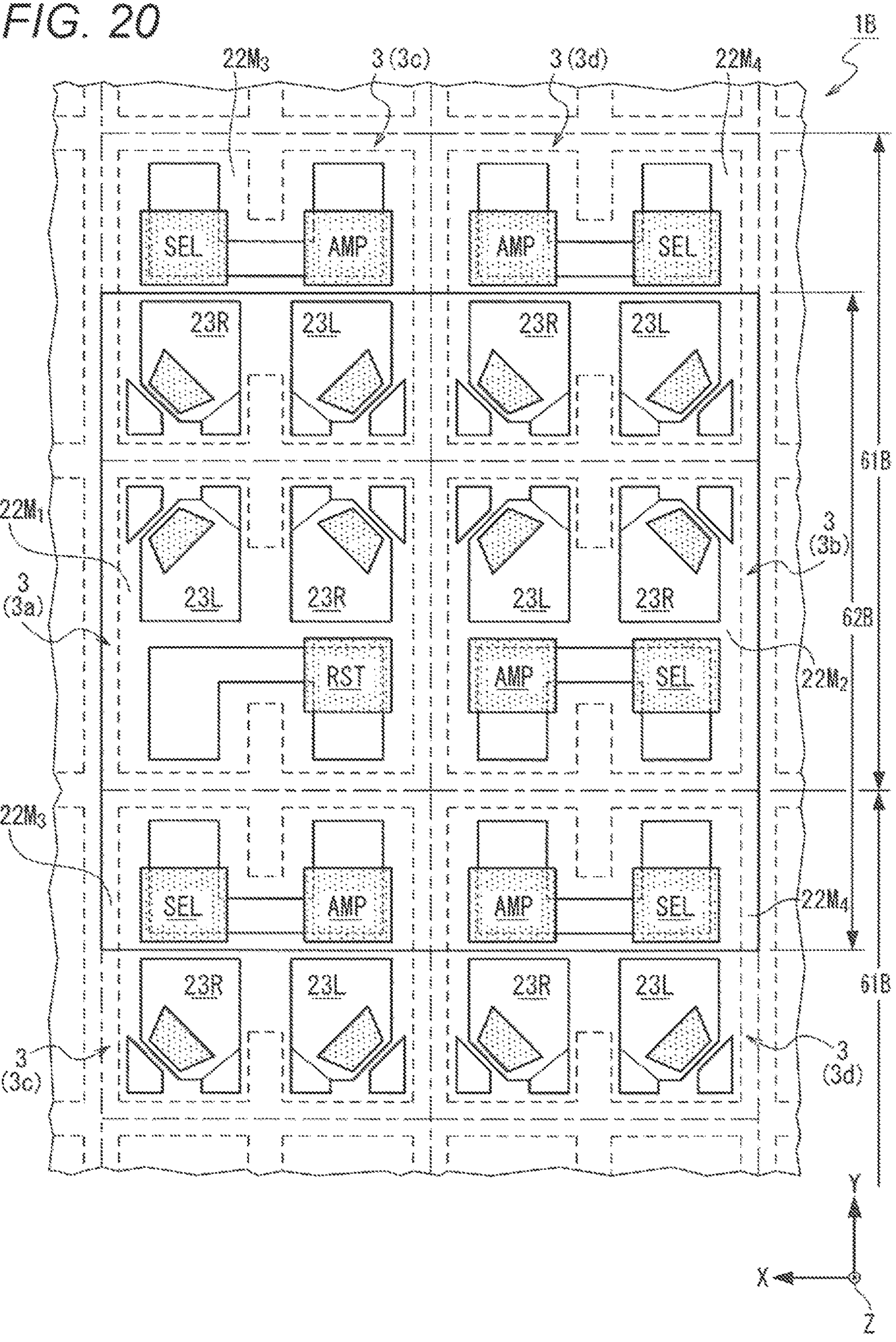
FIG. 20 is a schematic plan view of a pixel block of the solid-state imaging device according to the thirteenth embodiment of the present technology.

As illustrated in FIGS. 19 and 20, the pixel block 61B includes a plurality of pixels 3. In the thirteenth embodiment, the pixel block 61B includes, but is not limited to, four pixels 3 (3*a*, 3*b*, 3*c*, and 3*d*) arranged in a 2×2 array of two in an X direction and two in a Y direction in plan view, for example. Although FIGS. 19 and 20 mainly illustrate one pixel block 61B, the pixel block 61B is repeatedly arranged in each of the X direction and the Y direction.

Figure 21A:
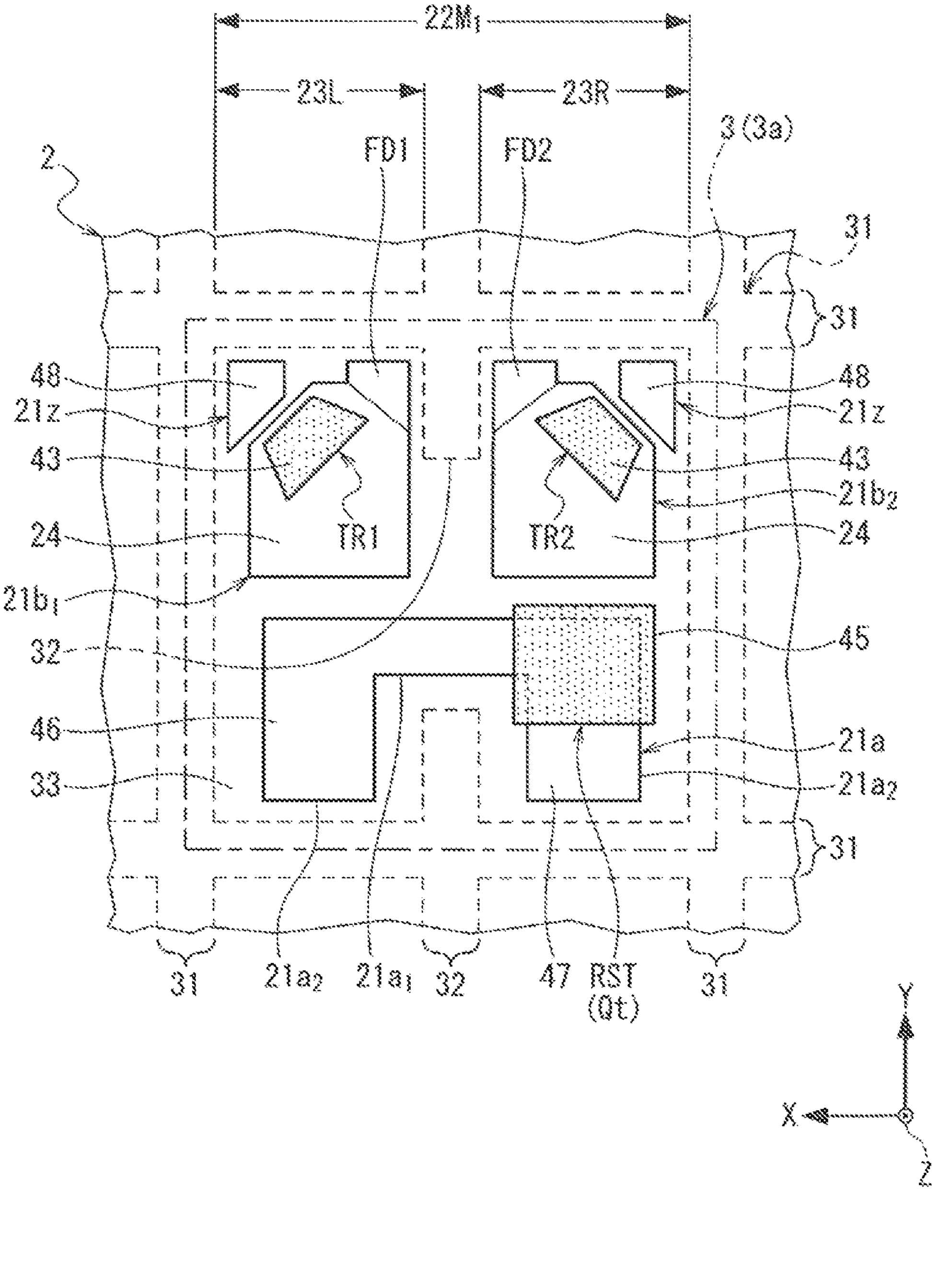
FIG. 21A is a schematic plan view of a pixel included in the pixel block illustrated in FIG. 20.

Among the four pixels 3 (3*a*, 3*b*, 3*c*, and 3*d*), the pixel 3*a* includes a photoelectric conversion cell 22$M_1$ illustrated in FIG. 21A. The pixel 3*b* includes a photoelectric conversion cell 22$M_2$ illustrated in FIG. 21B. The pixel 3*c* includes a photoelectric conversion cell 22$M_3$ illustrated in FIG. 21C. The pixel 3*d* includes a photoelectric conversion cell 22$M_4$ illustrated in FIG. 22D. Each of the photoelectric conversion cells 22$M_1$, 22$M_2$ 22$M_3$, and 22$M_4$ basically has a similar configuration to that of the above-described photoelectric conversion cell 22A illustrated in FIG. 4 of the first embodiment, and arrangement of a feeding region 21*z* is different. Furthermore, in the photoelectric conversion cell 22$M_1$, one reset transistor RST is arranged as a pixel transistor Qt in an element formation region 21*a*, whereas in each of the photoelectric conversion cells 22$M_2$, 22$M_3$, and 22$M_4$, an amplification transistor AMP and a selection transistor SEL are arranged as pixel transistors Qt in an element formation region 21*a*, similarly to the above-described photoelectric conversion cell 22A illustrated in FIG. 4 of the first embodiment. That is, the photoelectric conversion cell 22$M_1$ includes the reset transistor RST as an active element, and each of the photoelectric conversion cells 22$M_2$, 22$M_3$, and 22$M_4$ includes the amplification transistor AMP and the selection transistor SEL as active elements. Then, these transistors (AMP, SEL, and RST) have similar configurations to the above-described pixel transistors Qt illustrated in FIG. 7 of the first embodiment.

As illustrated in FIGS. 21A to 21D, in each of the photoelectric conversion cells 22$M_1$, 22$M_2$ 22$M_3$, and 22$M_4$, the feeding regions 21*z* are respectively arranged on element formation regions 21*b*$_1$ and 21*b*$_2$ side and on two corner sides in plan view. Then, a p-type contact region 48 is provided in each of the feeding regions 21*z*. That is, in each of the photoelectric conversion cells 22$M_1$, 22$M_2$, 22$M_3$, and 22$M_4$, the feeding region 21*z* and the contact region 48 are arranged in each of first photoelectric conversion region 23L and second photoelectric conversion region 23R.

As illustrated in FIG. 21A, the photoelectric conversion cell 22$M_1$ of the pixel 3*a* is not limited thereto, but for example, the reset transistor RST (Qt) is arranged on the second photoelectric conversion region 23R side, and arrangement of a pixel transistor is omitted on the first photoelectric conversion region 23L side.

As illustrated in FIG. 22B, the photoelectric conversion cell 22$M_2$ of the pixel 3*b* is not limited thereto, but for example, the amplification transistor AMP is arranged on the first photoelectric conversion region 23L side, and the selection transistor SEL is arranged on the second photoelectric conversion region 23R side.

As illustrated in FIG. 22C, the photoelectric conversion cell 22$M_3$ of the pixel 3*c* is not limited thereto, but for example, the amplification transistor AMP is arranged on the first photoelectric conversion region 23L side, and the selection transistor SEL is arranged on the second photoelectric conversion region 23R side.

As illustrated in FIG. 22D, the photoelectric conversion cell 22$M_4$ of the pixel 3*d* is not limited thereto, but for example, the selection transistor SEL is arranged on the first photoelectric conversion region 23L side, and the amplification transistor AMP is arranged on the second photoelectric conversion region 23R side.

That is, between the photoelectric conversion cells 22$M_2$ and 22$M_3$, and the photoelectric conversion cell 22$M_4$, the amplification transistor AMP and the selection transistor SEL arranged in the first and second photoelectric conversion regions 23L and 23R are reversed.

<Direction of Photoelectric Conversion Cells>

As illustrated in FIG. 20, in the photoelectric conversion cell 22$M_1$ of the pixel 3*a* and the photoelectric conversion cell 22$M_2$ of the pixel 3*b*, the second photoelectric conversion region 23R of the pixel 3*a* and the first photoelectric conversion region 23L of the pixel 3*b* are arranged adjacent to each other in the X direction. That is, the reset transistor RST of the pixel 3*a* and the amplification transistor AMP of the pixel 3*b* are adjacent to each other in the X direction.

Furthermore, as illustrated in FIG. 20, in the photoelectric conversion cell 22$M_3$ of the pixel 3*c* and the photoelectric conversion cell 22$M_4$ of the pixel 3*d*, the first photoelectric conversion region 23L of the pixel 3*c* and the second photoelectric conversion region 23R of the pixel 3*d* are adjacent to each other in the X direction. That is, the amplification transistor AMP of the pixel 3*c* and the amplification transistor AMP of the pixel 3*d* are adjacent to each other in the X direction.

Figure 23:
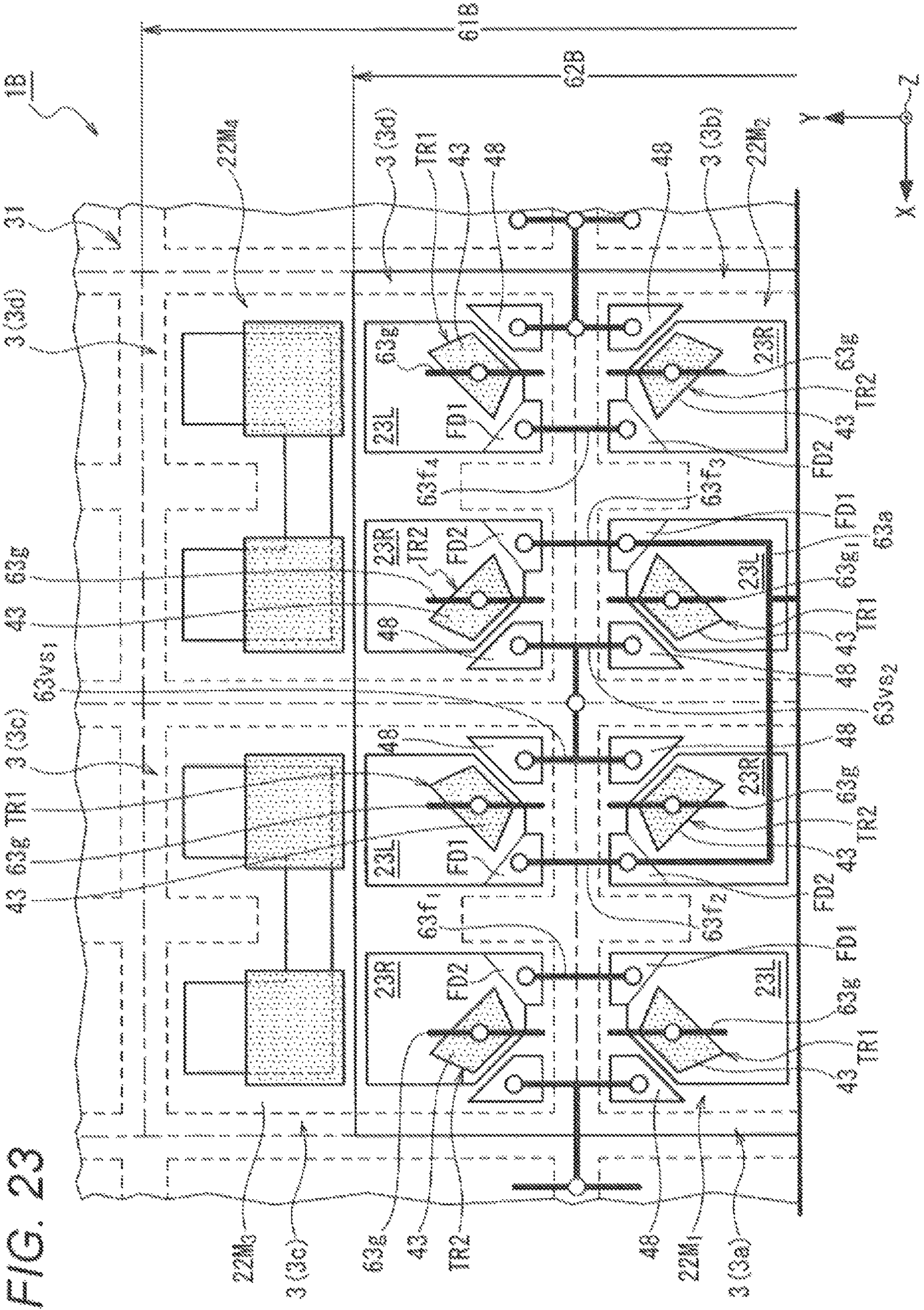
FIG. 23 is a schematic plan view in which a part of FIG. 22 is enlarged.

Furthermore, in the photoelectric conversion cell 22$M_1$ of the pixel 3*a* and the photoelectric conversion cell 22$M_3$ of the pixel 3*c*, the first photoelectric conversion region 23L of the pixel 3*a* and the second photoelectric conversion region 23R of the pixel 3*c* are adjacent to each other, and the second photoelectric conversion region 23R of the pixel 3*a* and the first photoelectric conversion region 23L of the pixel 3*c* are adjacent to each other, in the Y direction. That is, as illustrated in FIG. 23, charge holding regions FD1 and FD2 and the two contact regions 48 of the pixel 3*a* and charge holding regions FD1 and FD2 and the two contact regions 48 of the pixel 3*c* are adjacent to each other in the Y direction.

Furthermore, as illustrated in FIG. 20, in the photoelectric conversion cell $22M_2$ of the pixel 3*b* and the photoelectric conversion cell $22M_4$ of the pixel 3*d*, the first photoelectric conversion region 23L of the pixel 3*b* and the second photoelectric conversion region 23R of the pixel 3*d* are adjacent to each other, and the second photoelectric conversion region 23R of the pixel 3*a* and the first photoelectric conversion region 23L of the pixel 3*c* are adjacent to each other, in the Y direction. That is, as illustrated in FIG. 23, the charge holding regions FD1 and FD2 and the two contact regions 48 of the pixel 3*b* and the charge holding regions FD1 and FD2 and the two contact regions 48 of the pixel 3*d* are adjacent to each other in the Y direction via a pixel isolation region 31.

<Readout Circuit>

As illustrated in FIG. 19, an input stage of the readout circuit 15B is connected to the charge holding regions FD1 and FD2 of each of the four pixels 3*a*, 3*b*, 3*c*, and 3*d* via a conductive path 63. The readout circuit 15B reads the signal charges held in the charge holding regions FD1 and FD2 of each of the four pixels 3*a*, 3*b*, 3*c*, and 3*d*, and outputs pixel signals based on the signal charges. The readout circuit 15B is shared by the four pixels 3*a*, 3*b*, 3*c*, and 3*d* (eight photoelectric conversion regions), and is provided for each pixel block 61B.

The readout circuit 15B includes, but is not limited to, a reset transistor RST and three amplification stage cells $Pc_1$, $Pc_2$, and $Pc_3$. Each of the three amplification stage cells $Pc_1$, $Pc_2$, and $Pc_3$ includes an amplification transistor AMP and a selection transistor SEL connected in series.

The readout circuit 15B includes pixel transistors Qt included in a circuit block 62B illustrated in FIG. 20. The circuit block 62B includes, but is not limited to, in the two pixel blocks 61B arranged adjacent to each other in the Y direction, the reset transistor TST, the amplification transistor AMP, and the selection transistor SEL arranged in the pixel 3*a* and the pixel 3*b* of one pixel block 61B, and the two amplification transistors AMP and the two selection transistors SEL arranged in the pixel 3*c* and the pixel 3*d* of the other pixel block 61B. That is, the circuit block 62B is arranged over two pixel blocks 61B adjacent to each other in the Y direction.

Figure 21B:
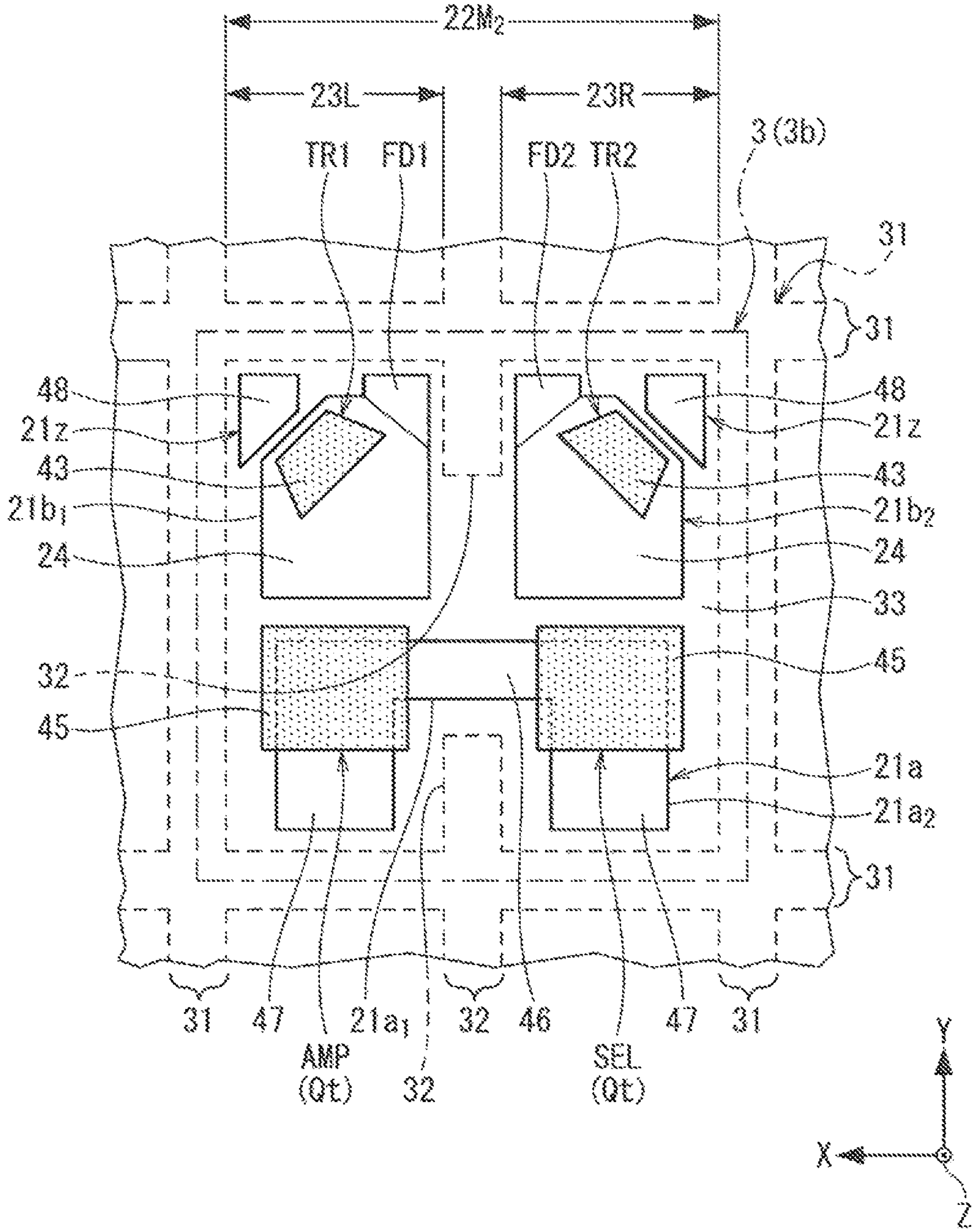
FIG. 21B is a schematic plan view of a pixel included in the pixel block illustrated in FIG. 20.
Figure 21C:
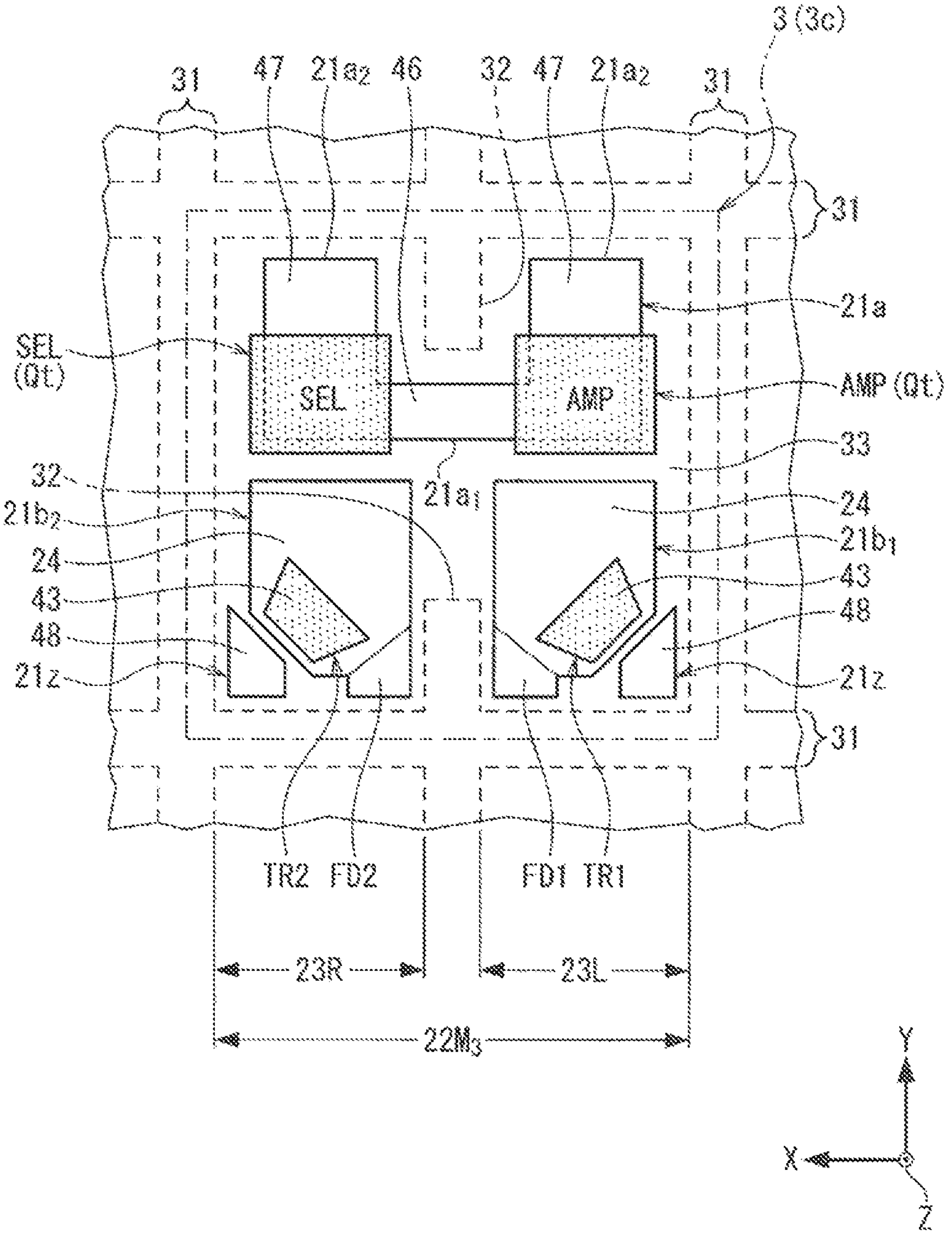
FIG. 21C is a schematic plan view of a pixel included in the pixel block illustrated in FIG. 20.
Figure 21D:
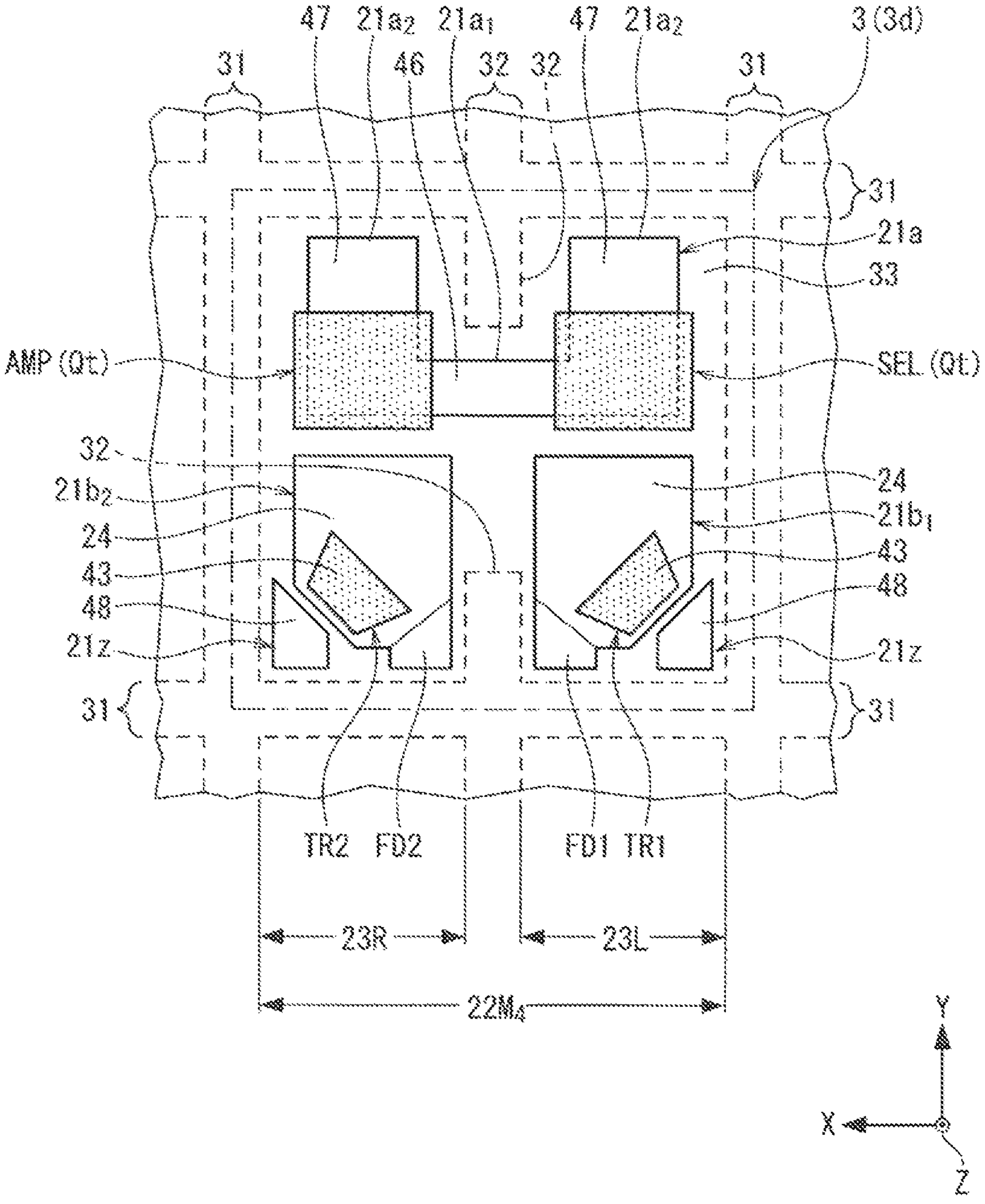
FIG. 21D is a schematic plan view of a pixel included in the pixel block illustrated in FIG. 20.

Among the three amplification stage cells $Pc_1$, $Pc_2$, and $Pc_3$ illustrated in FIG. 19, one amplification stage cell $Pc_1$ includes, for example, as illustrated in FIGS. 19 and 21B, the amplification transistor AMP and the selection transistor SEL arranged in the element formation region 21*a* of the pixel 3*b* of one pixel block 61B while sharing one main electrode region 46. Then, the remaining two amplification stage cells $Pc_2$ and $Pc_3$ includes, as illustrated in FIGS. 19, 21C, and 21D, the amplification transistor AMP and the selection transistor SEL arranged in each of the pixel 3*c* and pixel 3*d* of the other pixel block 61B while sharing one main electrode region 46.

In the readout circuit 15B of the thirteenth embodiment, in the amplification transistor AMP of each of the three amplification stage cells $Pc_1$, $Pc_1$, and $Pc_3$, a source region is electrically connected to a drain region of each selection transistor SEL, and a drain region is electrically connected to a power supply line VDD and a drain region of the reset transistor RST, as illustrated in FIG. 19. Then, a gate electrode of the amplification transistor AMP of each of the three amplification stage cells $Pc_1$, $Pc_1$, and $Pc_3$ is electrically connected to the charge holding regions FD1 and FD2 and a source region of the reset transistor RST of each of the photoelectric conversion cells $22M_1$, $22M_2$, $22M_3$, and $22M_4$ of the four pixel 3*a*, 3*b*, 3*c*, and 3*d*.

Furthermore, in the selection transistor SEL of each of the three amplification stage cells $Pc_1$, $Pc_1$, and $Pc_3$, each source region is electrically connected to a vertical signal line 11 (VSL), and respective gate electrodes are electrically connected to one another.

That is, in the pixel block (pixel unit) 61B, the charge holding regions FD1 and FD2 of the four pixels 3 (3*a*, 3*b*, 3*c*, and 3*d*) are electrically connected to one another. Then, in the pixel block 61B, the eight charge holding regions FD1 and FD2 are electrically connected to one another. Then, each of the eight charge holding regions FD1 and FD2 is electrically connected to the gate electrode of the amplification transistor AMP (first amplification transistor) of the amplification stage cell $Pc_1$. Then, each of the eight charge holding regions FD1 and FD2 is electrically connected to the gate electrode of each of the amplification transistor AMP (first amplification transistor) of the amplification stage cell $Pc_1$, the amplification transistor AMP (second amplification transistor) of the amplification stage cell $Pc_2$, and the amplification transistor AMP (third amplification transistor) of the amplification stage cell $Pc_3$.

<Connection State>

Figure 22:
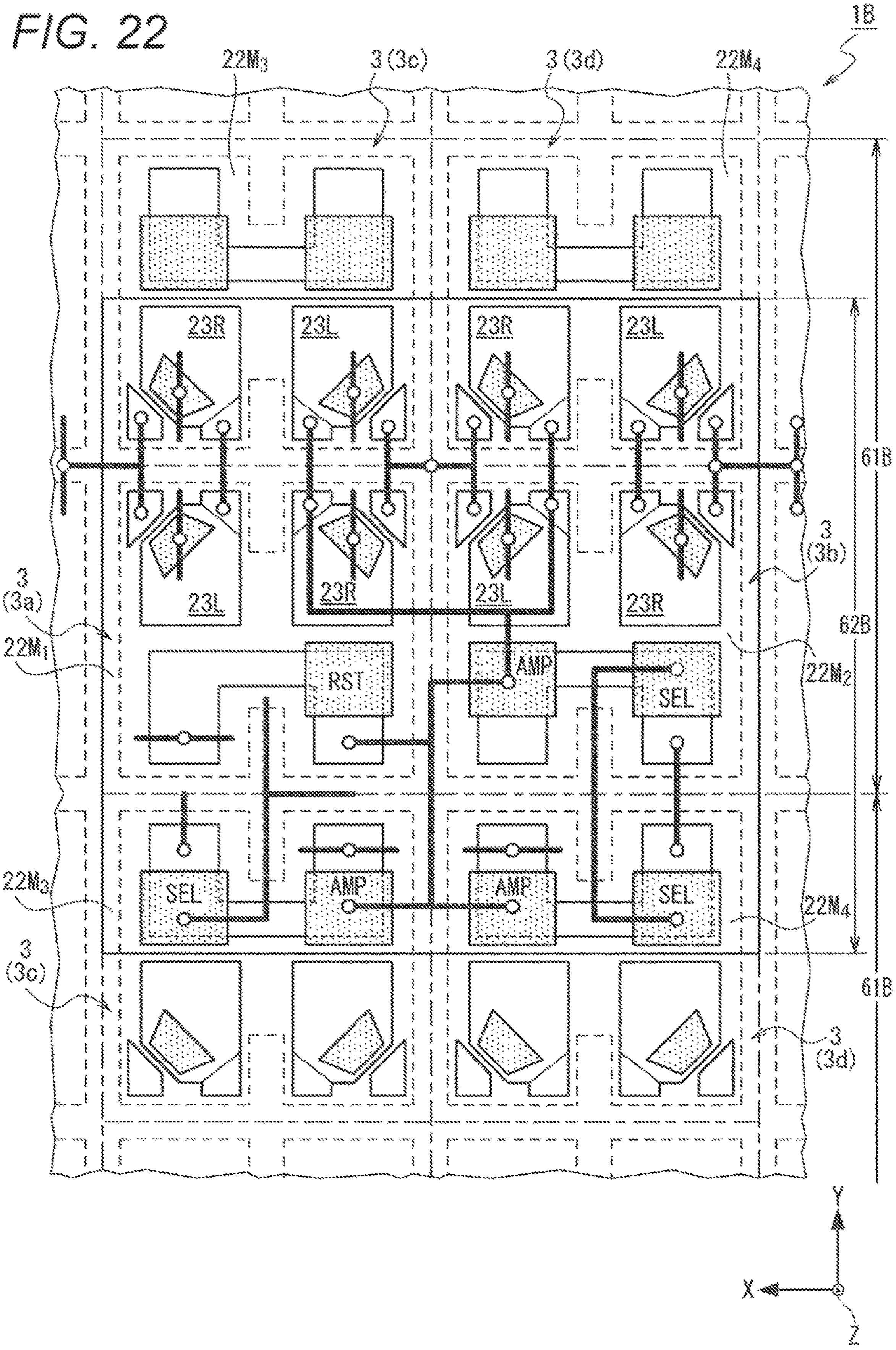
FIG. 22 is a schematic plan view illustrating a connection state of the pixel blocks illustrated in FIG. 20.
Figure 24:
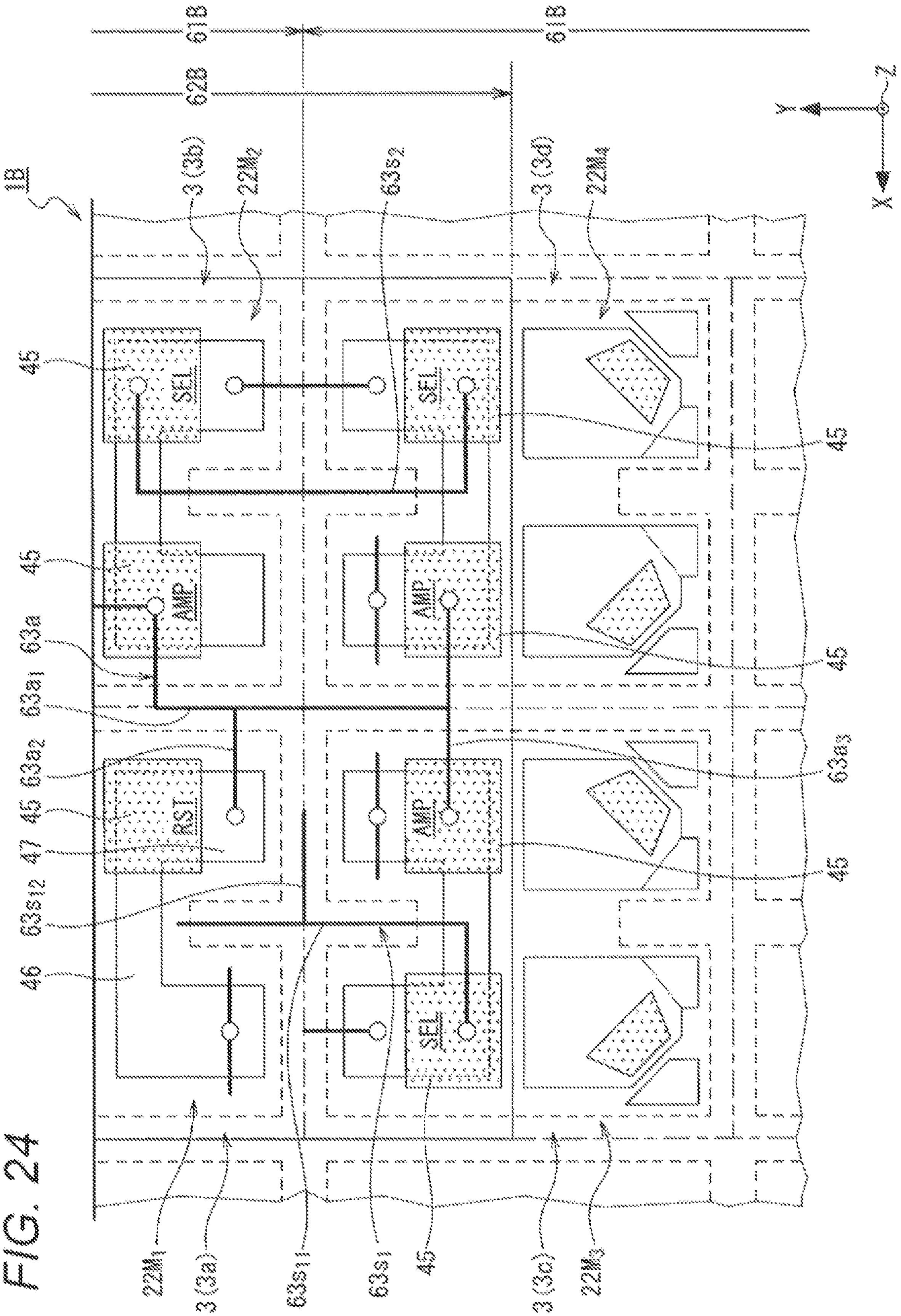
FIG. 24 is a schematic plan view in which a part of FIG. 22 is enlarged.

Next, a connection state of the pixel block 51B will be described with reference to FIGS. 22 to 24. FIGS. 23 and 24 are partially enlarged diagrams of FIG. 22, and the following description will be given mainly with reference to FIGS. 23 and 24.

As illustrated in FIG. 23, wiring 63*f*1 is electrically connected to the charge holding region FD1 of the first photoelectric conversion region 23L of the pixel 3*a* and the charge holding region FD2 of the second photoelectric conversion region 23R of the pixel 3*c*. Furthermore, wiring 63*f*2 is electrically connected to the charge holding region FD2 of the second photoelectric conversion region 23R of the pixel 3*a* and the charge holding region FD1 of the first photoelectric conversion region 23L of the pixel 3*c*. Then, in each of the first and second photoelectric conversion regions 23L and 23R of the pixel 3*a* and the pixel 3*c*, wiring 63*g* is electrically connected to a gate electrode 43 of each of the transfer transistors TR1 and TR2.

Furthermore, wiring 63*f*3 is electrically connected to the charge holding region FD1 of the first photoelectric conversion region 23L of the pixel 3*b* and the charge holding region FD2 of the second photoelectric conversion region 23R of the pixel 3*d*. Furthermore, wiring 63*f*4 is electrically connected to the charge holding region FD2 of the second photoelectric conversion region 23R of the pixel 3*b* and the charge holding region FD1 of the first photoelectric conversion region 23L of the pixel 3*d*. Then, in each of the first and second photoelectric conversion regions 23L and 23R of the pixel 3*c* and the pixel 3*d*, the wiring 63*g* is electrically connected to a gate electrode 43 of each of the transfer transistors TR1 and TR2.

Then, the wiring $63f_1$, $63f_2$, $63f_3$, and $63f_4$ and each wiring 63*g* run in parallel with, in other words, are provided in parallel with, for example, a first metal wiring layer. Then, the wiring $63f_1$, $63f_2$, $63f_3$, and $63f_4$ and each wiring 63*g* are covered with an interlayer insulating film. Therefore, in the pixels 3*a* to 3*d*, capacitance between the gate electrode 43 of each of the transfer transistors TR1 and TR2 and the charge holding regions FD1 and FD2 is increased, and the charge holding regions FD1 and FD2 can be boosted.

As illustrated in FIG. 23, wiring $63vs_1$ is electrically connected to the contact region 48 of each of the second photoelectric conversion region 23R of the pixel 3*a* and the first photoelectric conversion region 23L of the pixel 3*c*. Furthermore, wiring 63*vs*$_2$ is electrically connected to the contact region 48 of each of the first photoelectric conversion region 23L of the pixel 3*b* and the first photoelectric conversion region 23L of the pixel 3*d*.

Then, the wiring 63*vs*$_1$ and 63*vs*$_2$ extend in the Y direction, and are arranged in the X direction and, for example, provided in the first metal wiring layer of a multilayer wiring layer. Then, the wiring is integrated with an intersection between the pixel isolation region 31 extending in the X direction and the pixel isolation region 31 extending in the Y direction in plan view. Then, the wiring 63*vs*$_1$ and 63*vs*$_2$ are covered with the interlayer insulating film. Then, for example, 0 V is applied as a first reference potential to the wiring 63*vs*$_1$ and 63*vs*$_2$.

As illustrated in FIG. 23, in the pixel 3*a* and the pixel 3*b* adjacent to each other in the X direction, the wiring 63*vs*$_1$ and 63*vs*$_2$ are arranged between the charge holding regions FD1 and FD2 of one pixel 3*a* and the charge holding regions FD1 and FD2 of the other pixel 3*b* in plan view. Furthermore, in the pixel 3*c* and the pixel 3*d* adjacent to each other in the X direction, the wiring 63*vs*$_1$ and 63*vs*$_2$ are arranged between the charge holding regions FD1 and FD2 of one pixel 3*c* and the charge holding regions FD1 and FD2 of the other pixel 3*d* in plan view. Therefore, regions between the charge holding regions FD1 and FD2 of the one pixels 3*a* and 3*c* and the charge holding regions FD1 and FD2 of the other pixels 3*b* and 3*d*, which are adjacent to each other in the X direction, can be shielded by the wiring 63*vs*$_1$ and 63*vs*$_2$.

As illustrated in FIG. 24, in the two pixel blocks 61B adjacent to each other in the Y direction, wiring 63*s*$_1$ is electrically connected to the gate electrode 45 of the selection transistor SEL of the pixel 3*c* of the other pixel block 61B in one circuit block 62B. Furthermore, wiring 63*s*$_2$ is electrically connected to the gate electrode 45 of the selection transistor SEL of each of the pixel 3*d* of the other pixel block 61B and the pixel 3*b* of the one pixel block 61B. Furthermore, wiring 63*a* is electrically connected to the gate electrode 45 of each of the three amplification transistors AMP. Then, the wiring 63*s*$_1$, the wiring 63*s*$_2$, and the wiring 63*a* are provided in, for example, the first metal wiring layer of the multilayer wiring layer and extend in the Y direction.

As illustrated in FIG. 24, the wiring 63*a* is arranged between the wiring 63*s*$_1$ and the wiring 63*s*$_2$ in plan view. In other words, the wiring 63*s*$_1$ and the wiring 63*s*$_2$ are arranged so as to sandwich the wiring 63*a* in plan view. Therefore, signal interference between the charge holding regions FD1 and FD2 of the pixels 3*a* and 3*c* and the charge holding regions FD1 and FD2 of the pixels 3*b* and 3*d* can be reduced.

As illustrated in FIG. 24, the wiring 63*a* includes a main line portion 63*a*$_1$ extending in the Y direction between the pixel 3*a* and the pixel 3*b* in plan view, a main line portion 63*a*$_2$ extending from the main line portion 63*a*$_1$ toward the pixel 3*a* and electrically connected to the main electrode region 47 of the reset transistor RST of the pixel 3*a*, and a main line portion 63*a*$_3$ extending from the main line portion 63*a*$_1$ toward the pixel 3*c* and electrically connected to the gate electrode 45 of the amplification transistor AMP of the pixel 3*c*. Then, the wiring 63*a* is integrated with the wiring 63*f*$_2$ and 63*f*$_3$, as illustrated in FIG. 23. That is, the wiring 63*a* is included in the conductive path 63 illustrated in FIG. 19 and is electrically connected to the charge holding regions FD1 and FD2 of each of the four pixels 3*a*, 3*b*, 3*c*, and 3*d*, and is further electrically connected to the gate electrode of the amplification transistor AMP of each of the three amplification stage cells Pc$_1$, Pc$_2$, and Pc$_3$ of the readout circuit 15B and the source region of the reset transistor RST.

Meanwhile, as illustrated in FIG. 24, the wiring 63*s*$_1$ includes a main line portion 63*s*$_{11}$ extending in the Y direction over the pixel 3*a* and the pixel 3*c* in plan view, and a main line portion 63*s*$_{12}$ extending between the two main line portions 63*a*$_2$ and 63*a*$_3$ of the wiring 63*a* from the main line portion 63*s*$_{11}$ toward the pixel 3*b* and pixel 3*d* side in plan view. As described above, since the wiring 63*s*$_1$ (the main line portion 63*s*$_{12}$) extends between the wiring 63*a* (the two main line portions 63*a*$_2$) in plan view, parasitic capacitance is added to each of the wiring 63*a* and the boosting wiring 63*s*. Therefore, it becomes possible to increase the capacitance between the selection transistor SEL and the amplification transistor AMP, and to boost the charge holding regions FD1 and FD2.

In the solid-state imaging device 1B of the thirteenth embodiment, the element formation region 21*a* of each of the photoelectric conversion cells 22M$_1$, 22M$_2$, 22M$_3$, and 22M$_4$ extends over the first photoelectric conversion region 23L and the second photoelectric conversion region 23R, and crosses a region between the two in-pixel isolation regions 32 in plan view. Therefore, in the solid-state imaging device 1B according to the thirteenth embodiment, effects similar to those of the above-described solid-state imaging device 1A according to the first embodiment can be obtained.

Fourteenth Embodiment

A solid-state imaging device 1C according to a fourteenth embodiment of the present technology basically has a similar configuration to the above-described solid-state imaging device 1B according to the thirteenth embodiment, and the following configuration is different.

Figure 25:
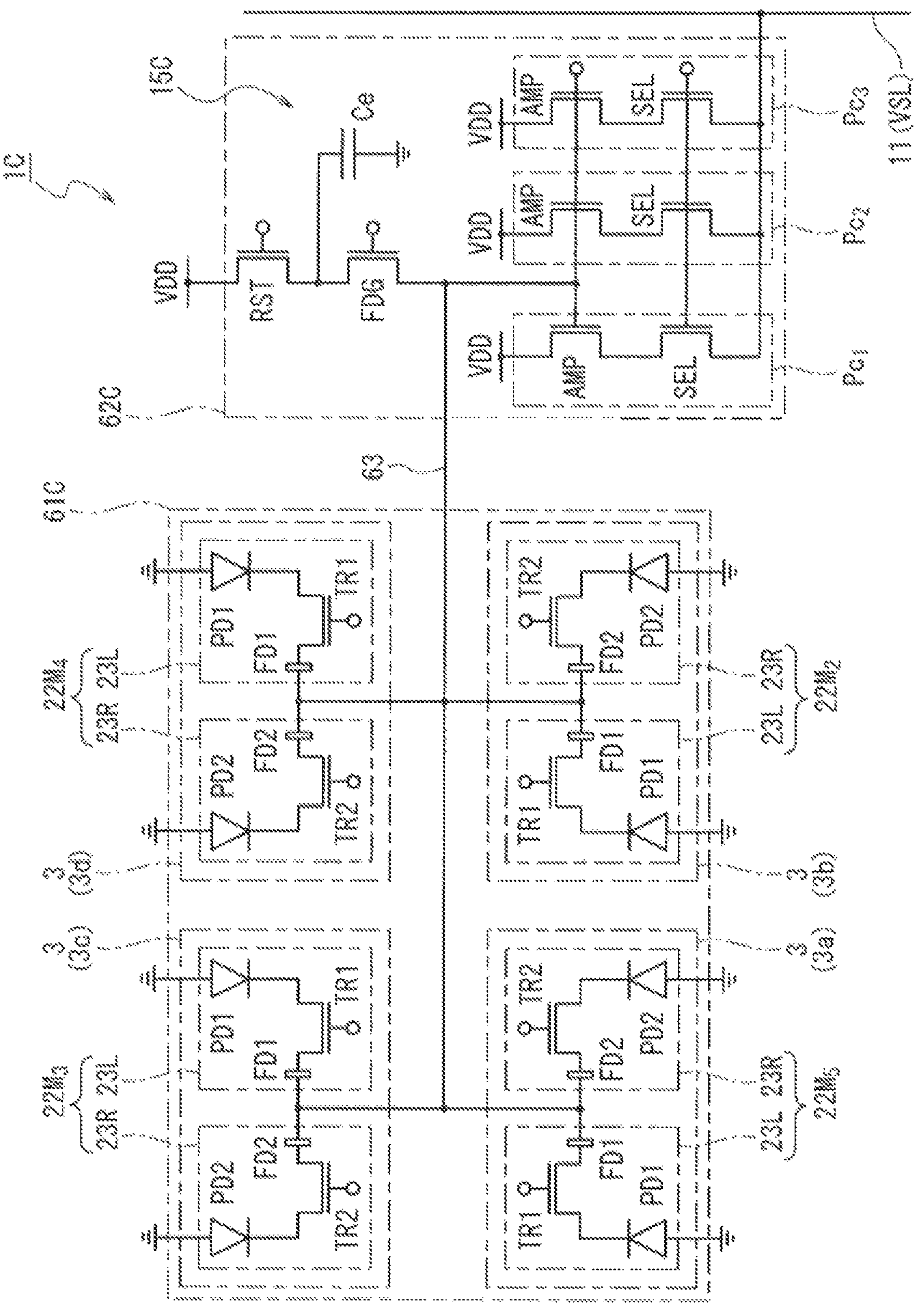
FIG. 25 is an equivalent circuit diagram illustrating a configuration example of a pixel block and a readout circuit of a solid-state imaging device according to a fourteenth embodiment of the present technology.

That is, the solid-state imaging device 1C according to the fourteenth embodiment of the present technology includes a readout circuit 15C, a pixel block (pixel unit) 61C, and a circuit block 62C illustrated in FIG. 25 instead of the readout circuit 15B, the pixel block 61B, and the circuit block 62B illustrated in FIG. 19 of the above-described thirteenth embodiment.

Figure 26:
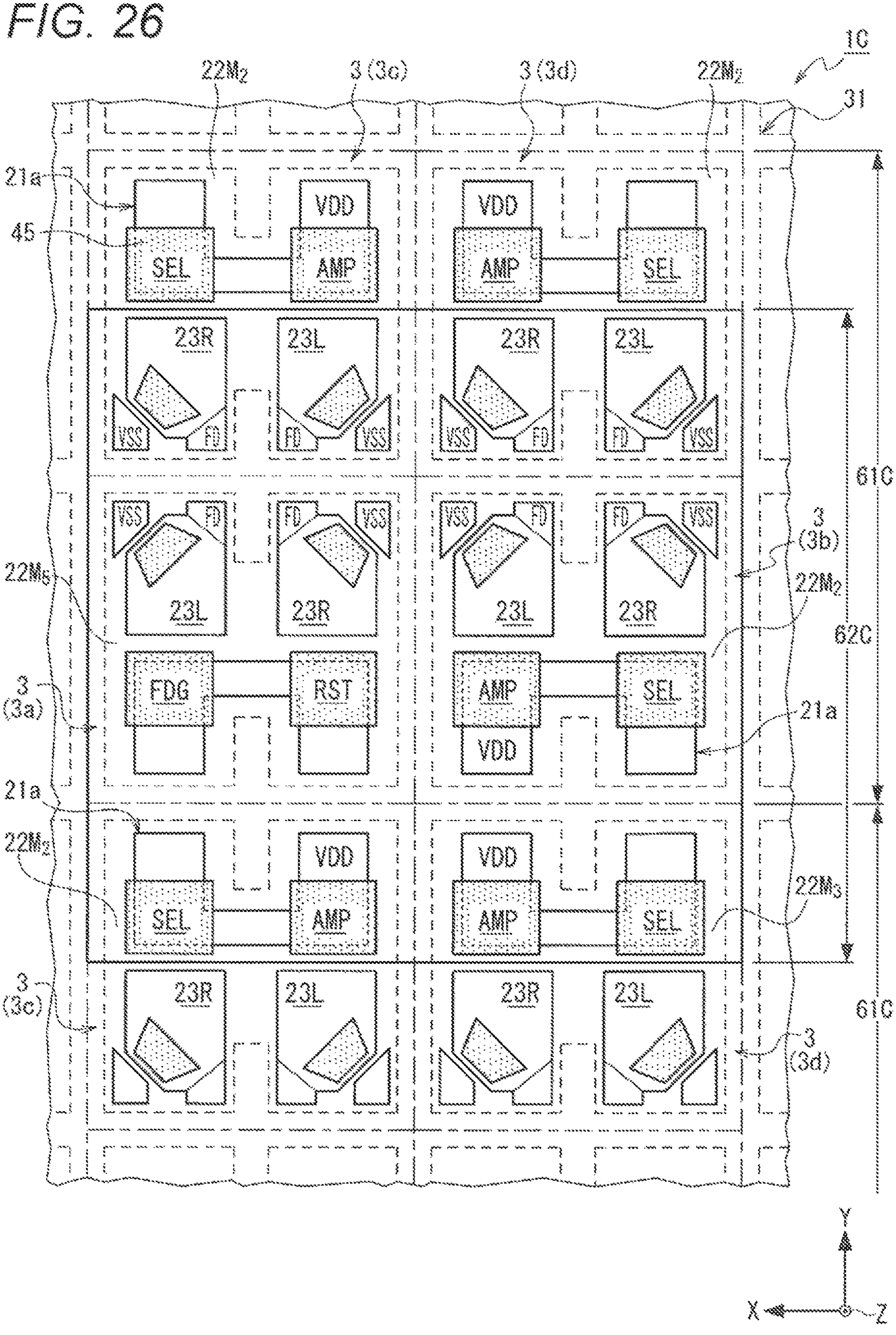
FIG. 26 is a schematic plan view of a pixel block of the solid-state imaging device according to the fourteenth embodiment of the present technology.
Figure 27:
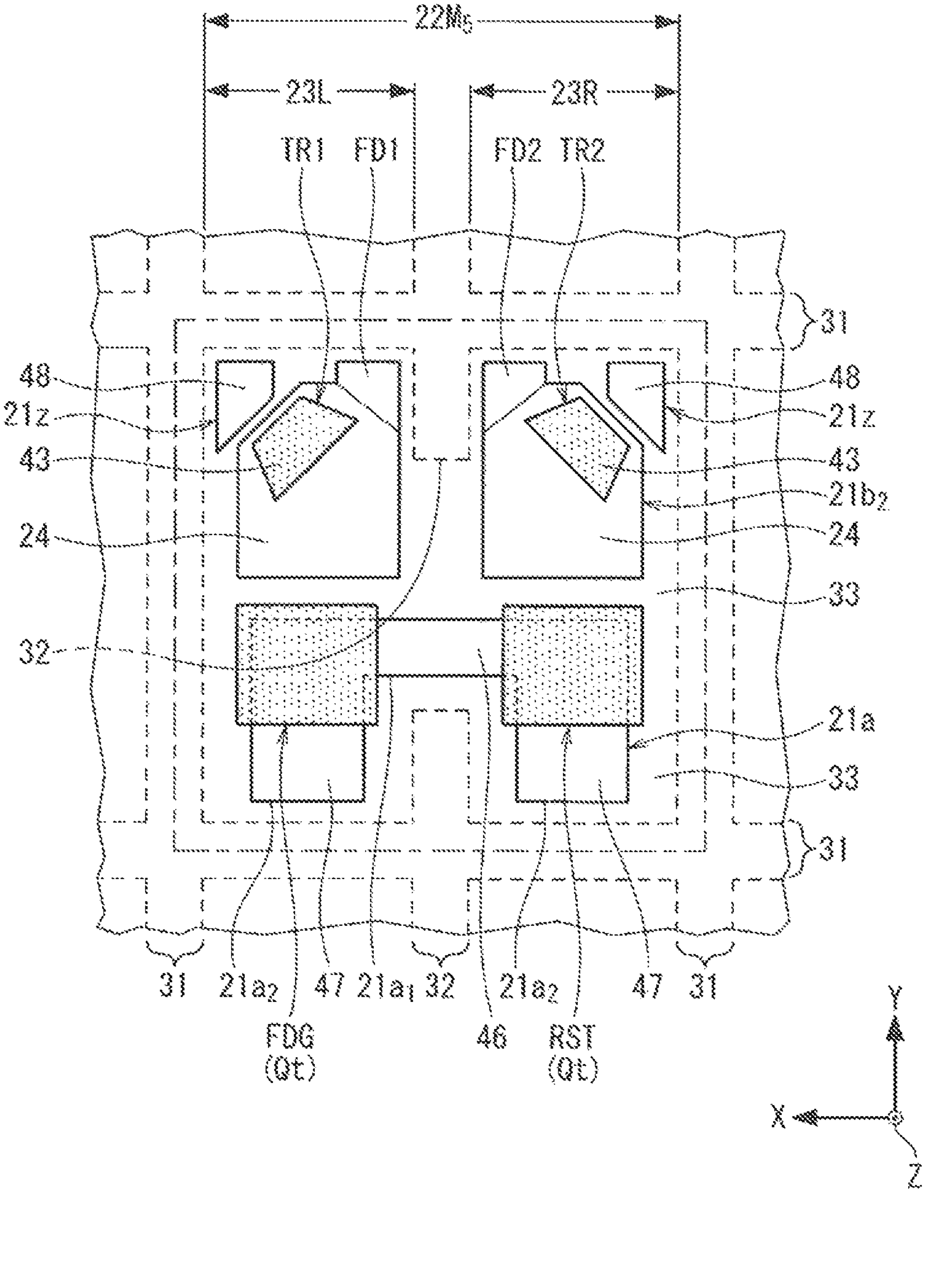
FIG. 27 is a schematic plan view of a pixel included in the pixel block illustrated in FIG. 26.

As illustrated in FIGS. 25 and 26, in the pixel block 61C of the fourteenth embodiment, a pixel 3*a* includes a photoelectric conversion cell 22M$_5$. The photoelectric conversion cell 22M$_5$ basically has a similar configuration to the photoelectric conversion cell 22M$_2$ of the pixel 3*b*, and pixel transistors arranged in an element formation region 21*a* are different. That is, as illustrated in FIG. 27, in the photoelectric conversion cell 22M$_5$, a switching transistor FDG is arranged as a pixel transistor Qt on a first photoelectric conversion region 23L side, and a reset transistor RST is arranged as a pixel transistor Qt on a second photoelectric conversion region 23R side.

As illustrated in FIG. 26, in the photoelectric conversion cell 22M$_5$ of the pixel 3*a* and the photoelectric conversion cell 22M$_2$ of the pixel 3*c*, the second photoelectric conversion region 23R of the pixel 3*a* and the first photoelectric conversion region 23L of the pixel 3*b* are arranged adjacent to each other in the X direction. Furthermore, in the photoelectric conversion cell 22M$_5$ of the pixel 3*a* and the photoelectric conversion cell 22M$_2$ of the pixel 3*c*, the first photoelectric conversion region 23L of the pixel 3*a* and the second photoelectric conversion region 23R of the pixel 3*c* are adjacent to each other, and the second photoelectric conversion 23R of the pixel 3*a* and the first photoelectric conversion region 23L of the pixel 3*c* are adjacent to each other, in the Y direction.

As illustrated in FIG. 25, an input stage of the readout circuit 15C is connected to the charge holding regions FD1 and FD2 of each of the four pixels 3*a*, 3*b*, 3*c*, and 3*d* via a conductive path 63. The readout circuit 15C reads signal charges held in the charge holding regions FD1 and FD2 of each of the four pixels 3*a*, 3*b*, 3*c*, and 3*d*, and outputs pixel signals based on the signal charges. The readout circuit 15C is shared by the four pixels 3*a*, 3*b*, 3*c*, and 3*d* and is provided for each pixel block 61C.

The readout circuit 15C includes, but is not limited to, a switching transistor FDG, a reset transistor RST, and three amplification stage cells $Pc_1$, $Pc_2$, and $Pc_3$. Each of the three amplification stage cells $Pc_1$, $Pc_2$, and $Pc_3$ includes an amplification transistor AMP and a selection transistor SEL connected in series.

The readout circuit 15C includes a transistor included in the circuit block 62C illustrated in FIG. 26. The circuit block 62C includes, but is not limited to, in the two pixel blocks 61C arranged adjacent to each other in the Y direction, the switching transistor FDG, the reset transistor RST, the amplification transistor AMP, and the selection transistor SEL arranged in the pixel 3*a* and the pixel 3*b* of one pixel block 61C, and the two amplification transistors AMP and the two selection transistors SEL arranged in the pixel 3*c* and the pixel 3*d* of the other pixel block 61C. That is, the circuit block 62C is arranged over the two pixel blocks 61C adjacent to each other in the Y direction. Among the three amplification stage cells $Pc_1$, $Pc_2$, and $Pc_3$, one amplification stage cell $Pc_1$ includes the amplification transistor AMP and the selection transistor SEL arranged in series in the pixel 3*b* of one pixel block 61C, and the remaining two amplification stage cells $Pc_2$ and $Pc_3$ include the amplification transistor AMP and the selection transistor SEL arranged in series in each of the pixel 3*c* and the pixel 3*d* of the other pixel block 61C.

As illustrated in FIG. 25, a source region of the switching transistor FDG is electrically connected to the charge holding regions FD1 and FD2 of each of the photoelectric conversion cells $22M_2$ to $22M_4$ and $22M_5$, and is electrically connected to a gate electrodes of the amplification transistors AMP of each of the amplification stage cells $Pc_1$ to $Pc_3$. Then, a drain region of the switching transistor FDG is electrically connected to a source region of the reset transistor RST. Then, a gate electrode of the switching transistor FDG is electrically connected to a switching transistor drive line of a pixel drive line 10, as described with reference to FIG. 2. The switching transistor FDG controls charge holding by the charge holding regions FD1 and FD2, in other words, charge holding by the conductive path 63, and adjusts a multiplication factor of a voltage according to a potential amplified by the amplification transistor AMP.

That is, each of the eight charge holding regions DF1 and FD2 of the pixel block 61C is electrically connected to the switching transistor FDG, and is electrically connected to the reset transistor RST via the switching transistor FDG.

Note that, as illustrated in FIG. 25, capacitance Ce is connected to a connection node between the switching transistor FDG and the reset transistor RST. The capacitance Ce includes capacitance formed by a capacitive element as a passive element and wiring capacitance formed by wirings adjacent to each other.

In the solid-state imaging device 1C of the fourteenth embodiment, the element formation region 21*a* of each of the photoelectric conversion cells $22M_2$ to $22M_5$ extends over the first photoelectric conversion region 23L and the second photoelectric conversion region 23R, and crosses a region between the two in-pixel isolation regions 32 (see FIG. 22) in plan view. Therefore, in the solid-state imaging device 1C according to the fourteenth embodiment, effects similar to those of the above-described solid-state imaging device 1A according to the first embodiment can be obtained.

Fifteenth Embodiment

A solid-state imaging device 1D according to a fifteenth embodiment of the present technology basically has a similar configuration to the above-described solid-state imaging device 1B according to the thirteenth embodiment, and the following configuration is different.

Figure 28:
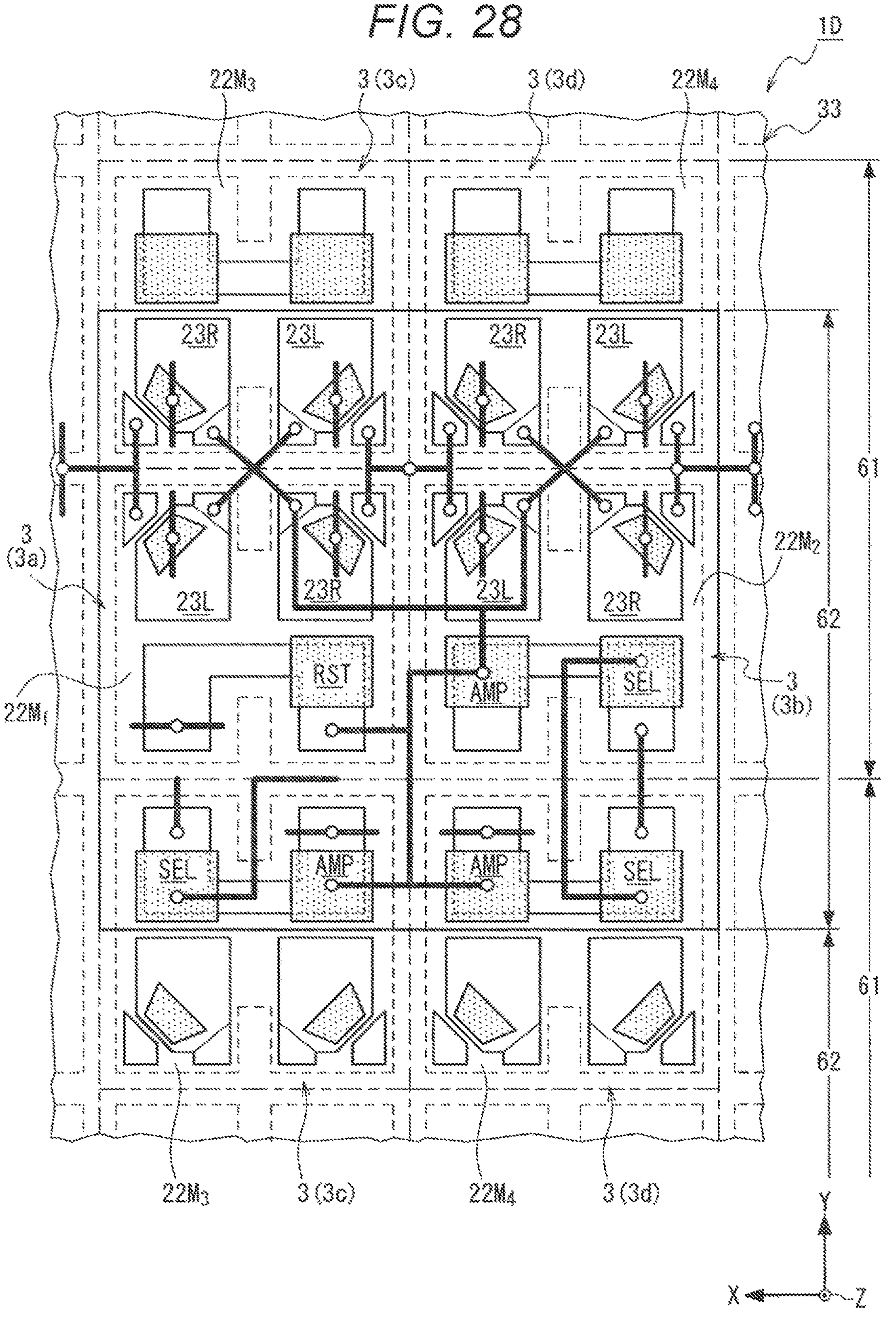
FIG. 28 is a schematic plan view illustrating a connection state of pixel blocks of a solid-state imaging device according to a fifteenth embodiment of the present technology.
Figure 29:
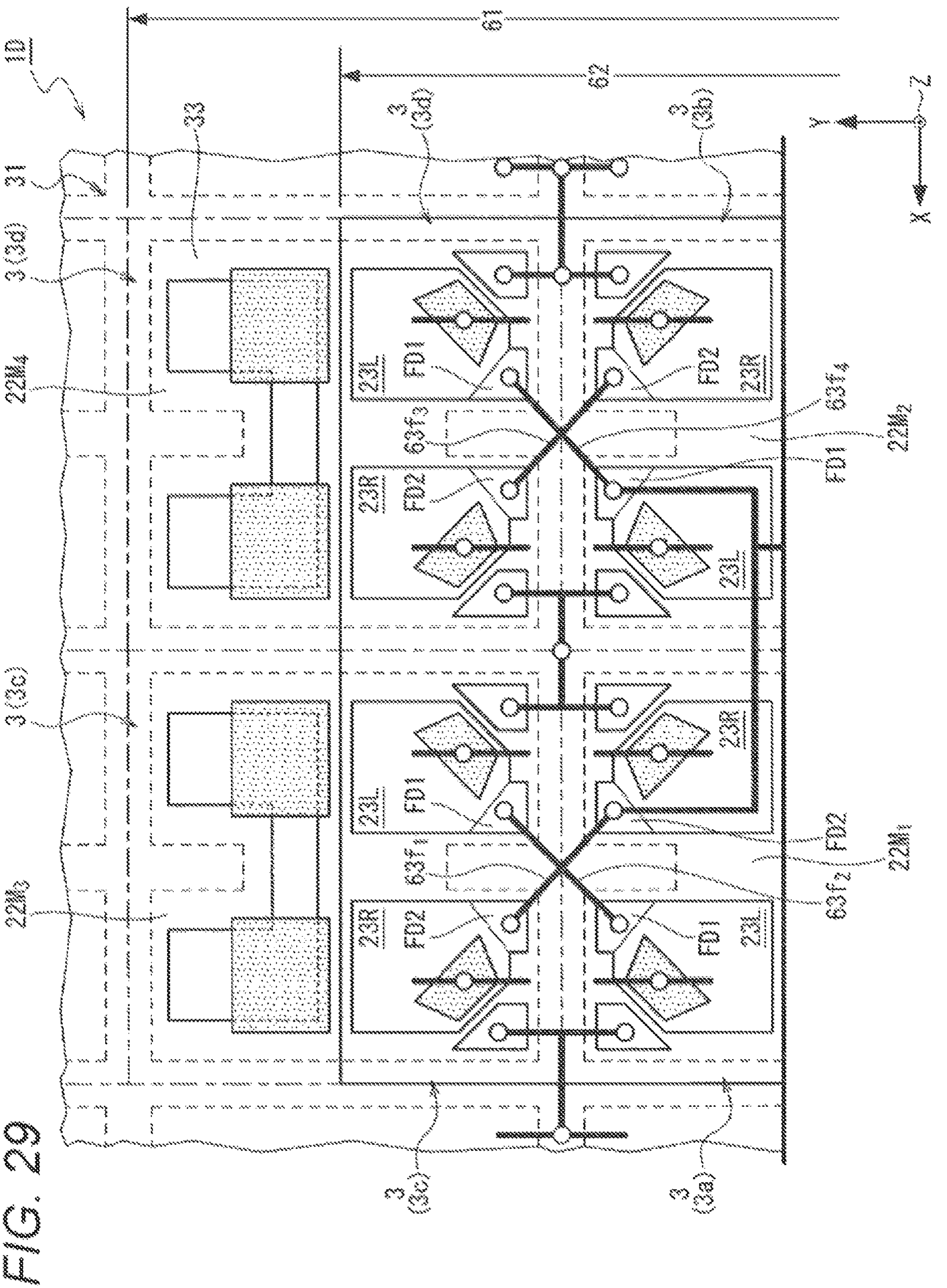
FIG. 29 is a schematic plan view in which a part of FIG. 28 is enlarged.

That is, as illustrated in FIGS. 28 and 29, the solid-state imaging device 1D according to the fifteenth embodiment is different in connection forms of wiring $63f_1$, wiring $63f_2$, wiring $63f_3$, and wiring $63f_4$. Other configurations are similar to those of the above-described first embodiment.

In a pixel 3*a* and a pixel 3*c* facing each other in a Y direction among four pixels 3*a*, 3*b*, 3*c*, and 3*d* in a 2×2 array illustrated in FIGS. 28 and 29, a first photoelectric conversion region 23L of the pixel 3*a* and a first photoelectric conversion region 23R of the pixel 3*c* are diagonal in plan view. Then, as illustrated in FIG. 29, the wiring $63f_1$ electrically connects a charge holding region FD1 of the first photoelectric conversion region 23L of the pixel 3*a* and a charge holding region FD1 of the first photoelectric conversion region 23L of the pixel 3*c*. Furthermore, the wiring $63f_2$ electrically connects a charge holding region FD2 of a second photoelectric conversion region 23R of the pixel 3*a* and a charge holding region FD2 of a second photoelectric conversion region 23R of the pixel 3*c*. Then, the wiring $63f_1$ and the wiring $63f_2$ intersect in an X shape in a two-dimensional plane, and are electrically connected to the respective charge holding regions FD1 and FD2 of the pixels 3*a* and 3*c*.

Furthermore, in the pixel 3*b* and the pixel 3*d* facing each other in the Y direction among the four pixels 3*a*, 3*b*, 3*c*, and 3*d* in the 2×2 array illustrated in FIGS. 28 and 29, a first photoelectric conversion region 23L of the pixel 3*b* and a first photoelectric conversion region 23R of the pixel 3*d* are diagonal in plan view. Then, as illustrated in FIG. 29, the wiring $63f_3$ electrically connects a charge holding region FD1 of the first photoelectric conversion region 23L of the pixel 3*b* and a charge holding region FD1 of the first photoelectric conversion region 23L of the pixel 3*d*. Furthermore, the wiring $63f_4$ electrically connects a charge holding region FD2 of a second photoelectric conversion region 23R of the pixel 3*a* and a charge holding region FD2 of a second photoelectric conversion region 23R of the pixel 3*d*. Then, the wiring $63f_3$ and the wiring $63f_4$ intersect in an X shape in a two-dimensional plane, and are electrically connected to the respective charge holding regions FD1 and FT2 of the pixels 3*b* and 3*d*.

By crossing the wiring $63f_1$ and the wiring $63f_2$ in this manner, it is possible to electrically connect the charge holding regions FD1 and FD2 of each of the pixel 3*a* and the pixel 3*c* adjacent to each other in the Y direction with a shortest wiring length, and to reduce parasitic capacitance between transfer transistors TR1 and TR2 and the charge holding regions FD1 and FD2. Furthermore, by crossing the wiring $63f_3$ and the wiring $63f_4$, it is possible to electrically connect the charge holding regions FD1 and FD2 of each of the pixel 3*b* and the pixel 3*d* adjacent to each other in the Y direction with a shortest wiring length, and to reduce parasitic capacitance between transfer transistors TR1 and TR2 and the charge holding regions FD1 and FD2. Thereby, it becomes possible to increase photoelectric conversion efficiency.

Note that, in this embodiment, the case where the pixel 3*a* includes a photoelectric conversion cell 22$M_1$ illustrated in FIG. 21A has been described. However, the technology of crossing the wiring 63$f_1$ and 63$f_3$ and the wiring 63$f_2$ and 63$f_4$ can also be applied to a case where the pixel 3*a* includes the photoelectric conversion cell 22$M_2$ illustrated in FIG. 21B as in the above-described fourteenth embodiment.

Sixteenth Embodiment

A solid-state imaging device 1E according to a sixteenth embodiment of the present technology basically has a similar configuration to the above-described solid-state imaging device 1C according to the fourteenth embodiment, and has different configurations of a pixel block and a readout circuit.

Figure 30:
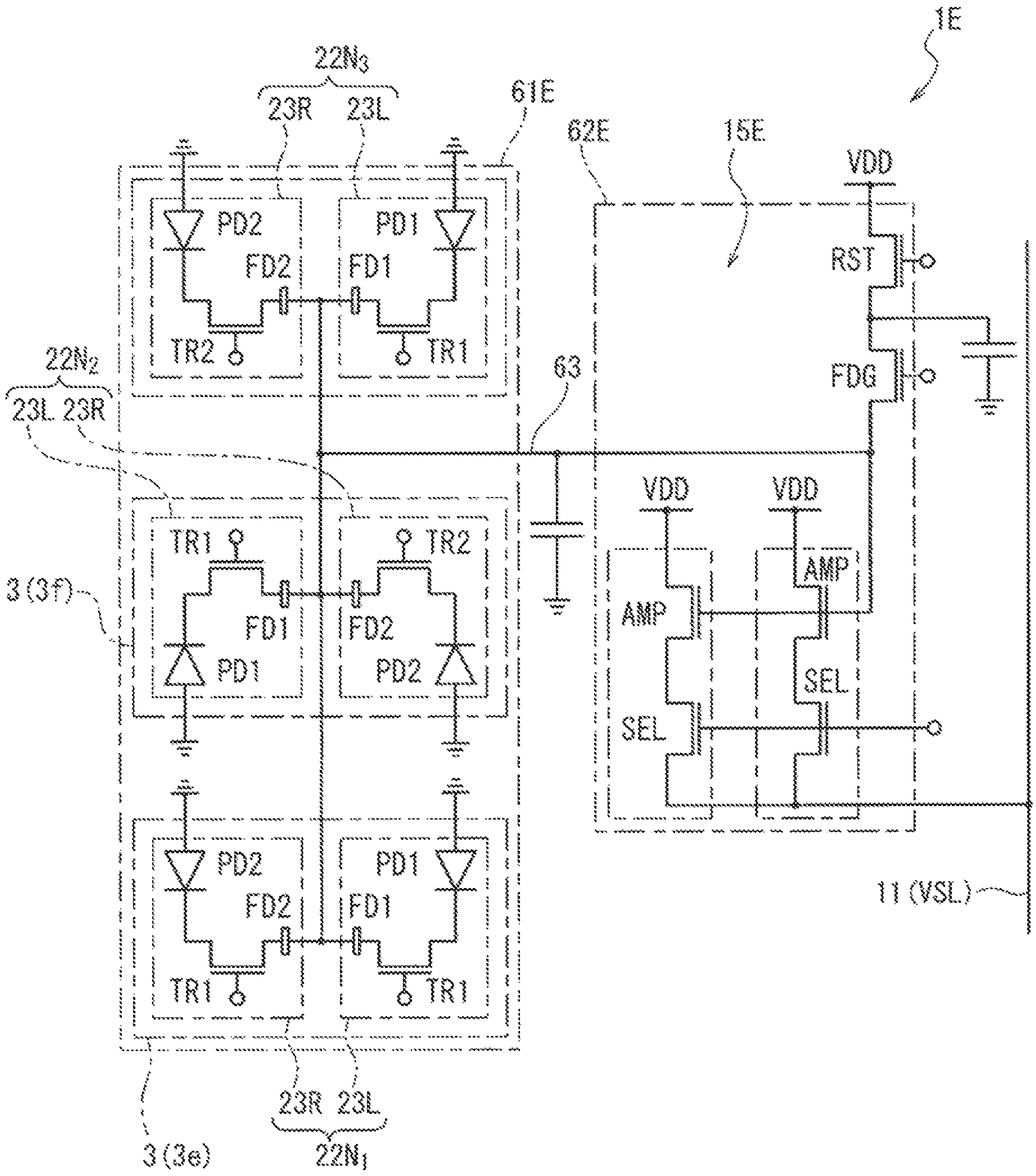
FIG. 30 is an equivalent circuit diagram illustrating a configuration example of a pixel block and a readout circuit of a solid-state imaging device according to a sixteenth embodiment of the present technology.
Figure 31:
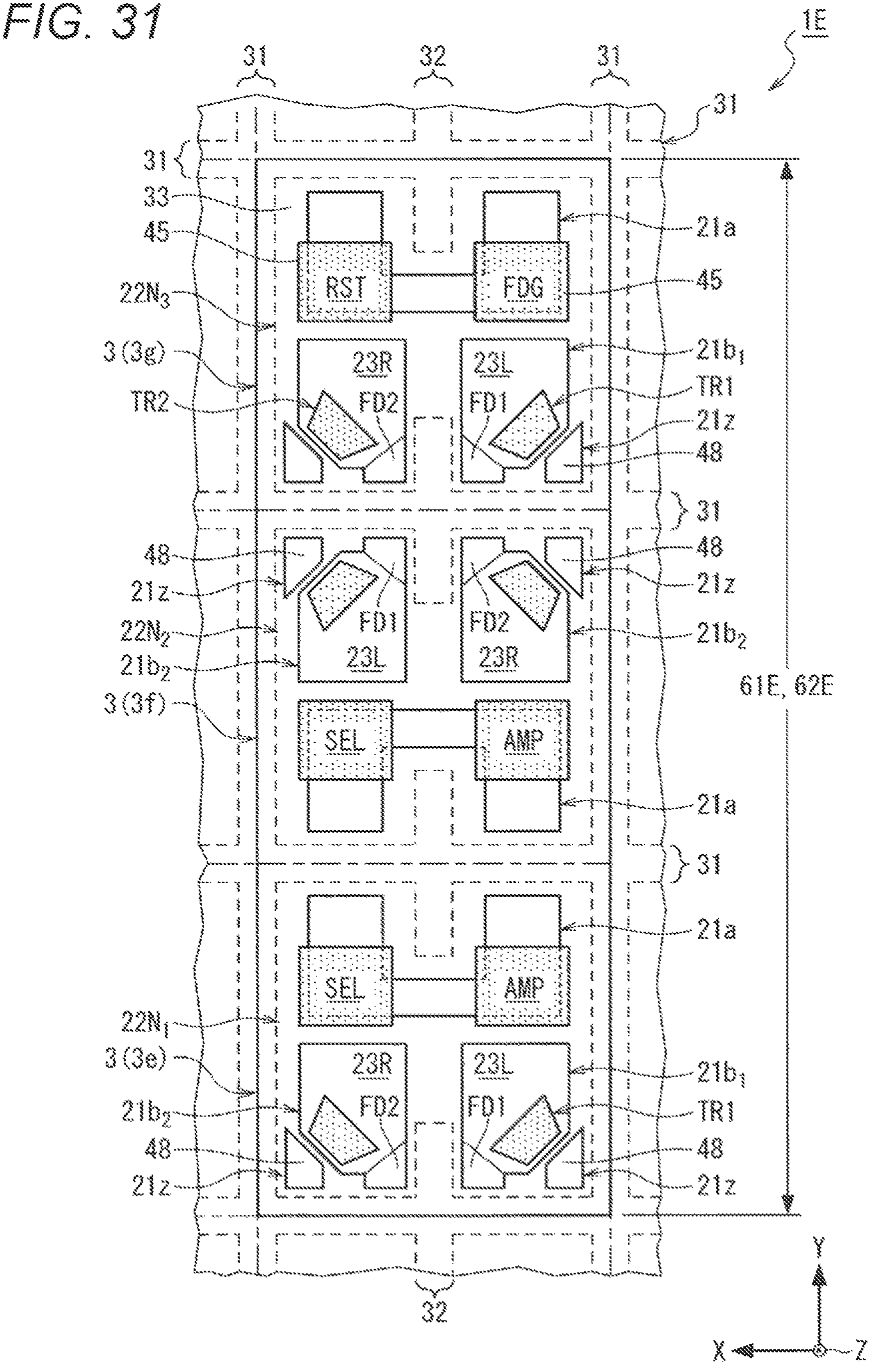
FIG. 31 is a schematic plan view of a pixel block of the solid-state imaging device according to the sixteenth embodiment of the present technology.

That is, the solid-state imaging device 1E according to the sixteenth embodiment includes a pixel block 61E, a readout circuit 15E, and a circuit block 62E illustrated in FIGS. 30 and 31 instead of the pixel block 61C, the readout circuit 15C, and the circuit block 62C illustrated in FIG. 25 of the above-described fourteenth embodiment.

As illustrated in FIG. 31, the pixel block 61E of the sixteenth embodiment includes three pixels 3 (3*e*, 3*f*, and 3*g*) arrayed along a Y direction. Although FIG. 31 illustrates one pixel block 61E, the pixel block 61E is repeatedly arranged in each of an X direction and the Y direction in a pixel region 2A as described with reference to FIG. 2.

As illustrated in FIG. 31, the pixel 3*e* includes a photoelectric conversion cell 22$N_1$, the pixel 3*f* includes a photoelectric conversion cell 22$N_2$, and the pixel 3*g* includes a photoelectric conversion cell 22$N_3$. Each of the photoelectric conversion cells 22$N_1$, 22$N_2$, and 22$N_3$ basically has a similar configuration to the above-described photoelectric conversion cell 22$M_5$ illustrated in FIG. 27 of the fourteenth embodiment, and type and arrangement direction of pixel transistors arranged in an element formation region 21*a* are different.

As illustrated in FIG. 31, the photoelectric conversion cell 22$N_1$ of the pixel 3*e* includes, as pixel transistors, an amplification transistor AMP arranged on the first photoelectric conversion region 23L side of the element formation region 21*a*, and a selection transistor SEL arranged on the second photoelectric conversion region 23R side of the element formation region 21*a*.

As illustrated in FIG. 31, the photoelectric conversion cell 22$N_2$ of the pixel 3*f* includes, as pixel transistors, a selection transistor SEL arranged on the first photoelectric conversion region 23L side of the element formation region 21*a*, and an amplification transistor AMP arranged on the second photoelectric conversion region 23R side of the element formation region 21*a*.

As illustrated in FIG. 31, the photoelectric conversion cell 22$N_3$ of the pixel 3*g* includes, as pixel transistors, a switching transistor FDG arranged on the first photoelectric conversion region 23L side of the element formation region 21*a*, and a reset transistor RST arranged on the second photoelectric conversion region 23R side of the element formation region 21*a*.

The photoelectric conversion cell 22$N_1$ of the pixel 3*e* and the photoelectric conversion cell 22$N_2$ of the pixel 3*f* are arranged in a direction in which the amplification transistors AMP face each other and the selection transistors SEL face each other in plan view in a Y direction.

In the photoelectric conversion cell 22$N_2$ of the pixel 3*f* and the photoelectric conversion cell 22$N_3$ of the pixel 3*g*, the first photoelectric conversion region 23L of the pixel 3*f* and the second photoelectric conversion region 23R of the pixel 3*g* are adjacent to each other, and the second photoelectric conversion 23R of the pixel 3*f* and the first photoelectric conversion region 23L of the pixel 3*g* are adjacent to each other, in the Y direction. That is, charge holding regions FD1 and FD2 and two contact regions 48 of the pixel 3*f* and charge holding regions FD1 and FD2 and two contact regions 48 of the pixel 3*g* are adjacent to each other in the Y direction.

<Readout Circuit>

As illustrated in FIG. 30, an input stage of the readout circuit 15E is connected to the charge holding regions FD1 and FD2 of each of the three pixels 3*e*, 3*f*, and 3*g* via a conductive path 63. The readout circuit 15E reads signal charges held in the charge holding regions FD1 and FD2 of each of the three pixels 3*e*, 3*f*, and 3*g*, and outputs pixel signals based on the signal charges. The readout circuit 15E is shared by the three pixels 3*e*, 3*f*, and 3*g* (six photoelectric conversion regions), and is provided for each pixel block 61E.

The readout circuit 15E includes, but is not limited to, the switching transistor FDG, the reset transistor RST, and two amplification stage cells $Pc_1$ and $Pc_2$. The readout circuit 15E basically has a similar configuration to the above-described readout circuit 15C illustrated in FIG. 25 of the fourteenth embodiment, and the number of amplification stage cells is different.

The readout circuit 15E includes the pixel transistors included in the circuit block 62E illustrated in FIG. 31. The circuit block 62E includes the switching transistor FDG, the reset transistor RST, the two amplification transistors AMP, and the two selection transistors SEL arranged in the pixels 3*e*, 3*f*, and 3*g* in one pixel block 61E, unlike the above-described circuit block 62C illustrated in FIG. 26 of the fourteenth embodiment.

<Connection State>

Next, a connection state of the pixel block will be described with reference to FIG. 32.

Figure 32:
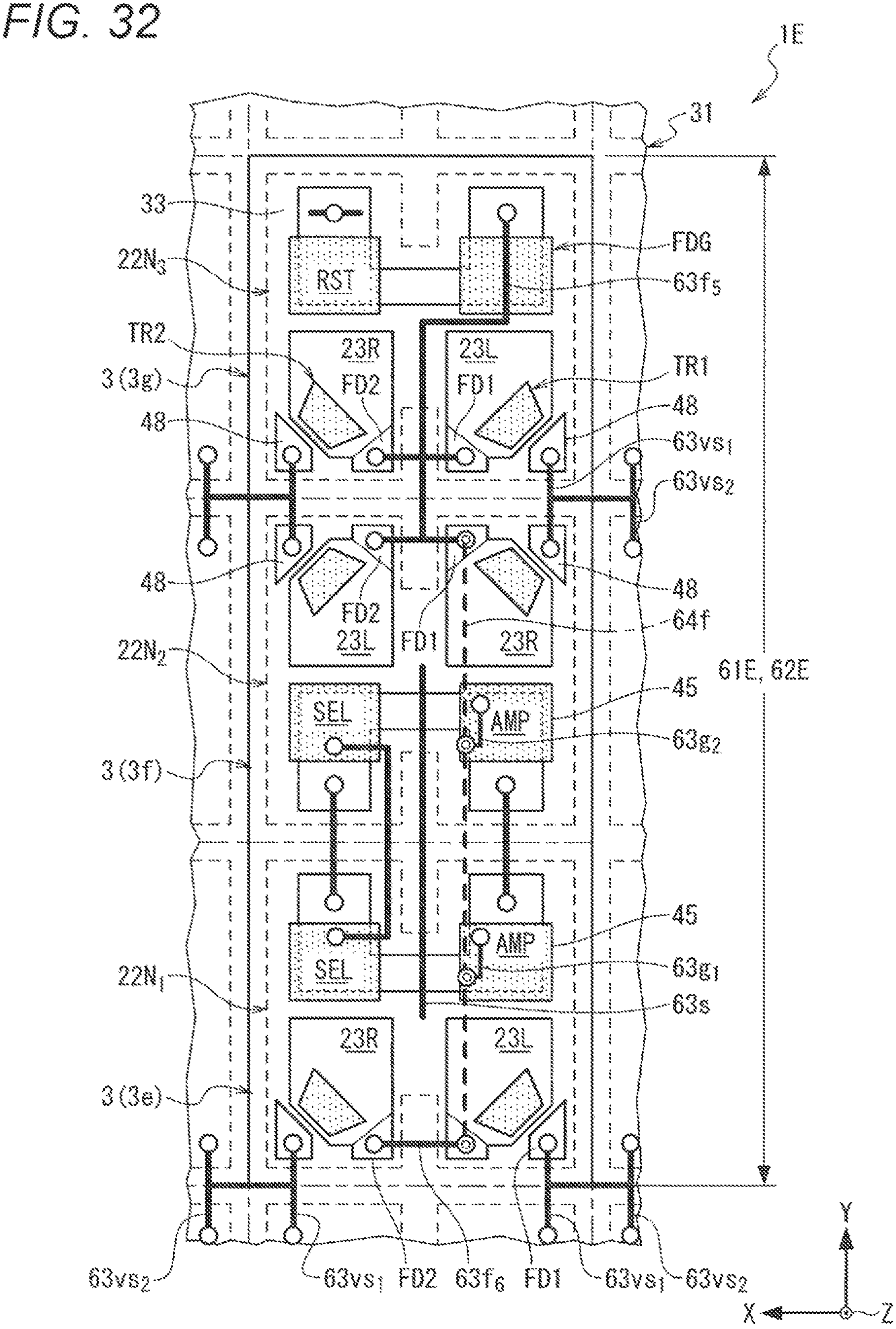
FIG. 32 is a schematic plan view illustrating a connection state of the pixel blocks of the solid-state imaging device according to the sixteenth embodiment of the present technology.

As illustrated in FIG. 32, wiring 63$f_5$ is electrically connected to the two charge holding regions FD1 and FD2 of the photoelectric conversion cell 22$N_2$ of the pixel 3*f* and the two charge holding regions FD1 and FD2 of the photoelectric conversion cell 22$N_3$ of the pixel 3*g*. Furthermore, wiring 63$f_6$ is electrically connected to the two charge holding regions FD1 and FD2 of the photoelectric conversion cell 22$N_2$ of the pixel 3*e*. The wiring 63$f_5$ and the wiring 63$f_6$ are provided in a first metal wiring layer of a multilayer wiring layer, for example, and is covered with an interlayer insulating film.

The wiring 63$f_5$ and the wiring 63$f_6$ are electrically connected via, for example, 64*f* provided in a second metal wiring layer of the multilayer wiring layer. In the fine pixel 3, a width of a two-dimensional plane of a shared region is narrow and routing wiring is difficult. Therefore, it is favorable to electrically connect the wiring 64$f_5$ and the wiring 64$f_6$ separated in the Y direction using the wiring 64*f* of the second layer.

As illustrated in FIG. 32, wiring 63$g_1$, wiring 63$g_2$, and boosting wiring 63*s* are arranged in the pixel block 61E. The wiring 63$g_1$ is electrically connected to a gate electrode 45 of the amplification transistor AMP of the pixel 3*e*. The wiring 63$g_2$ is electrically connected to a gate electrode 45 of the amplification transistor AMP of the pixel 3*f*. Although not illustrated in detail, the boosting wiring 63*s* is electrically connected to the wiring $63f_5$ and the wiring $63f_6$. Then, the wiring $63g_1$, the wiring $63g_2$, and the boosting wiring 63*s* are provided to run in parallel with the first metal wiring layer of the multilayer wiring layer, for example. Then, the wiring $63g_1$, the wiring $63g_2$, and the boosting wiring 63*s* are covered with an interlayer insulating film. Therefore, capacitance added to the conductive path 63 illustrated in FIG. 30 increases, and the charge holding regions FD1 and FD2 can be boosted.

As illustrated in FIG. 32, wirings $63vs_1$ and $63vs_2$ are also provided in this embodiment. Although not illustrated in detail, the wirings $63vs_1$ and $63vs_2$ are arranged between the charge holding regions FD1 and FD2 of one pixel block 61E and the charge holding regions FD1 and FD2 of the other pixel block 61E between the pixel blocks 61E adjacent to each other in the X direction. Therefore, the charge holding regions FD1 and FD2 of one pixel block 61E and the charge holding regions FD1 and FD2 of the other pixel block 61E can be shielded by the wiring $63vs_1$ and $63vs_2$ between the pixel blocks 61E adjacent to each other in the X direction.

In the solid-state imaging device 1E of the sixteenth embodiment, the element formation region 21*a* of each of the photoelectric conversion cells $22N_1$, $22N_2$, and $22N_3$ extends over the first photoelectric conversion region 23L and the second photoelectric conversion region 23R, and crosses a region between two in-pixel isolation regions 32 in plan view. Therefore, in the solid-state imaging device 1E according to the sixteenth embodiment, effects similar to those of the above-described solid-state imaging device 1A according to the first embodiment can be obtained.

Seventeenth Embodiment

A solid-state imaging device 1F according to a seventeenth embodiment of the present technology basically has a similar configuration to the above-described thirteenth embodiment, and has a different configuration of a photoelectric conversion cell of a pixel.

Figure 33:
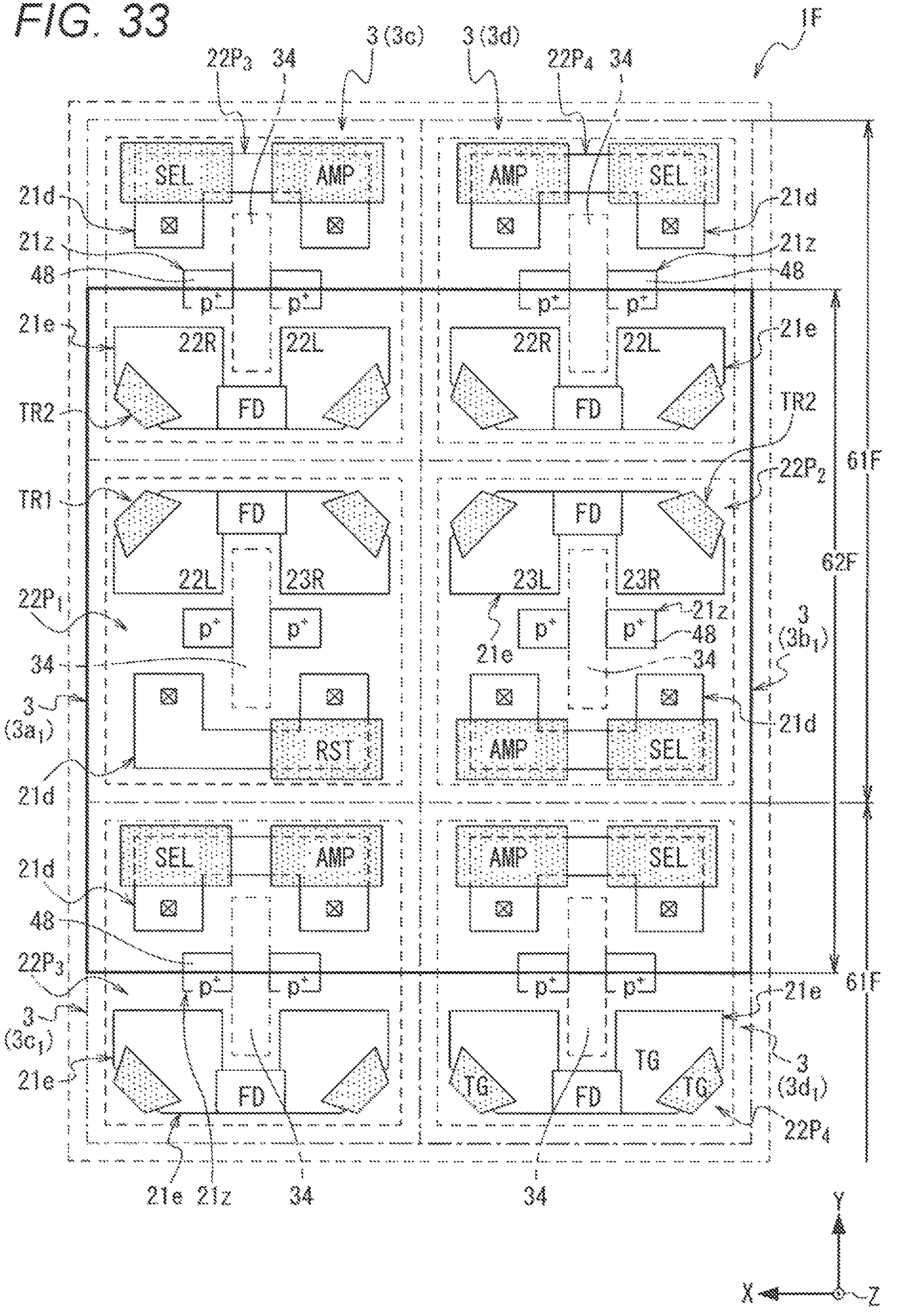
FIG. 33 is a schematic plan view illustrating a configuration example of a pixel block of a solid-state imaging device according to a seventeenth embodiment of the present technology.

That is, the solid-state imaging device 1F according to the seventeenth embodiment includes a pixel block 61F illustrated in FIG. 33 instead of the pixel block 61B illustrated in FIG. 20.

A pixel block 62F includes, for example, four pixels 3 ($3a_1$, $3b_1$, $3c_1$, and $3d_1$) arranged in a 2×2 array of two in an X direction and two in a Y direction in plan view. Although FIG. 33 mainly illustrate one pixel block 61F, the pixel block 61F is repeatedly arranged in each of the X direction and the Y direction.

As illustrated in FIG. 33, among the four pixels 3 ($3a_1$, $3b_1$, $3c_1$, and $3d_1$), the pixel $3a_1$ includes a photoelectric conversion cell $22P_1$. The pixel $3b_1$ includes a photoelectric conversion cell $22P_2$. The pixel 3*c* includes a photoelectric conversion cell $22P_3$. The pixel 3*d* includes a photoelectric conversion cell $22P_4$. Each of the photoelectric conversion cells $22P_1$, $22P_2$, $22P_3$, and $22P_4$ basically has a similar configuration to the above-described photoelectric conversion cell 22F illustrated in FIG. 12 of the sixth embodiment, and type and arrangement direction of pixel transistors arranged in an element formation region 21*d* are different. Other configurations are similar to those of the above-described thirteenth embodiment.

As illustrated in FIG. 33, the photoelectric conversion cell $22P_1$ of the pixel $3a_1$ includes, as pixel transistors, an amplification transistor AMP arranged on a second photoelectric conversion region 23R side of the element formation region 21*d*, and no pixel transistors are arranged on a first photoelectric conversion region 23L side of the element formation region 21*d*.

As illustrated in FIG. 33, the photoelectric conversion cell $22P_2$ of the pixel $3b_2$ includes, as pixel transistors, an amplification transistor AMP arranged on the first photoelectric conversion region 23L side of the element formation region 21*d*, and a selection transistor SEL arranged on the second photoelectric conversion region 23R side of the element formation region 21*d*.

As illustrated in FIG. 33, the photoelectric conversion cell $22P_3$ of the pixel $3c_1$ includes, as pixel transistors, the amplification transistor AMP arranged on the first photoelectric conversion region 23L side of the element formation region 21*d*, and the selection transistor SEL arranged on the second photoelectric conversion region 23R side of the element formation region 21*d*.

As illustrated in FIG. 33, the photoelectric conversion cell $22P_4$ of the pixel $3d_1$ includes, as pixel transistors, the selection transistor SEL arranged on the first photoelectric conversion region 23L side of the element formation region 21*d*, and the amplification transistor AMP arranged on the second photoelectric conversion region 23R side of the element formation region 21*d*.

As illustrated in FIG. 33, in the photoelectric conversion cell $22P_1$ of the pixel $3a_1$ and the photoelectric conversion cell $22P_2$ of the pixel $3b_1$, the second photoelectric conversion region 23R of the pixel $3a_1$ and the first photoelectric conversion region 23L of the pixel $3b_1$ are arranged adjacent to each other in the X direction. That is, the reset transistor RST of the pixel $3a_1$ and the amplification transistor AMP of the pixel $3b_1$ are adjacent to each other in the X direction.

Furthermore, as illustrated in FIG. 33, in the photoelectric conversion cell $22P_3$ of the pixel $3c_1$ and the photoelectric conversion cell $22P_4$ of the pixel $3d_1$, the first photoelectric conversion region 23L of the pixel $3c_1$ and the second photoelectric conversion region 23R of the pixel $3d_1$ are adjacent to each other in the X direction. That is, the amplification transistor AMP of the pixel $3c_1$ and the amplification transistor AMP of the pixel $3d_1$ are adjacent to each other in the X direction.

Furthermore, in the photoelectric conversion cell $22P_1$ of the pixel $3a_1$ and the photoelectric conversion cell $22P_3$ of the pixel $3c_1$, the first photoelectric conversion region 23L of the pixel $3a_1$ and the second photoelectric conversion region 23R of the pixel $3c_1$ are adjacent to each other, and the second photoelectric conversion 23R of the pixel $3a_1$ and the first photoelectric conversion region 23L of the pixel $3c_1$ are adjacent to each other, in the Y direction. That is, as illustrated in FIG. 33, a charge holding region FD of the pixel $3a_1$ and a charge holding region FD of the pixel $3c_1$ are adjacent to each other in the Y direction.

Furthermore, as illustrated in FIG. 33, in the photoelectric conversion cell $22P_2$ of the pixel $3b_1$ and the photoelectric conversion cell $22P_4$ of the pixel $3d_1$, the first photoelectric conversion region 23L of the pixel $3b_1$ and the second photoelectric conversion region 23R of the pixel $3d_1$ are adjacent to each other, and the second photoelectric conversion region 23R of the pixel $3a_1$ and the first photoelectric conversion region 23L of the pixel $3c_1$ are adjacent to each other, in the Y direction. That is, as illustrated in FIG. 33, the charge holding region FD of the pixel $3b_1$ and the charge holding region FD of the pixel $3d_1$ are adjacent to each other in the Y direction via a pixel isolation region 31.

In the solid-state imaging device 1F of the seventeenth embodiment, the element formation region 21*d* of each of the photoelectric conversion cells $22P_1$, $22P_2$, $22P_3$, and $22P_4$ extends over the first photoelectric conversion region 23L and the second photoelectric conversion region 23R, and crosses a region between a pixel isolation region 31 and an in-pixel isolation region 32 in plan view. Therefore, in the solid-state imaging device 1F according to the seventeenth embodiment, effects similar to those of the above-described solid-state imaging device 1A according to the first embodiment can be obtained.

Eighteenth Embodiment

A solid-state imaging device 1G according to an eighteenth embodiment of the present technology basically has a similar configuration to the above-described solid-state imaging device 1E according to the sixteenth embodiment, and has a different configuration of a photoelectric conversion cell of a pixel.

Figure 34:
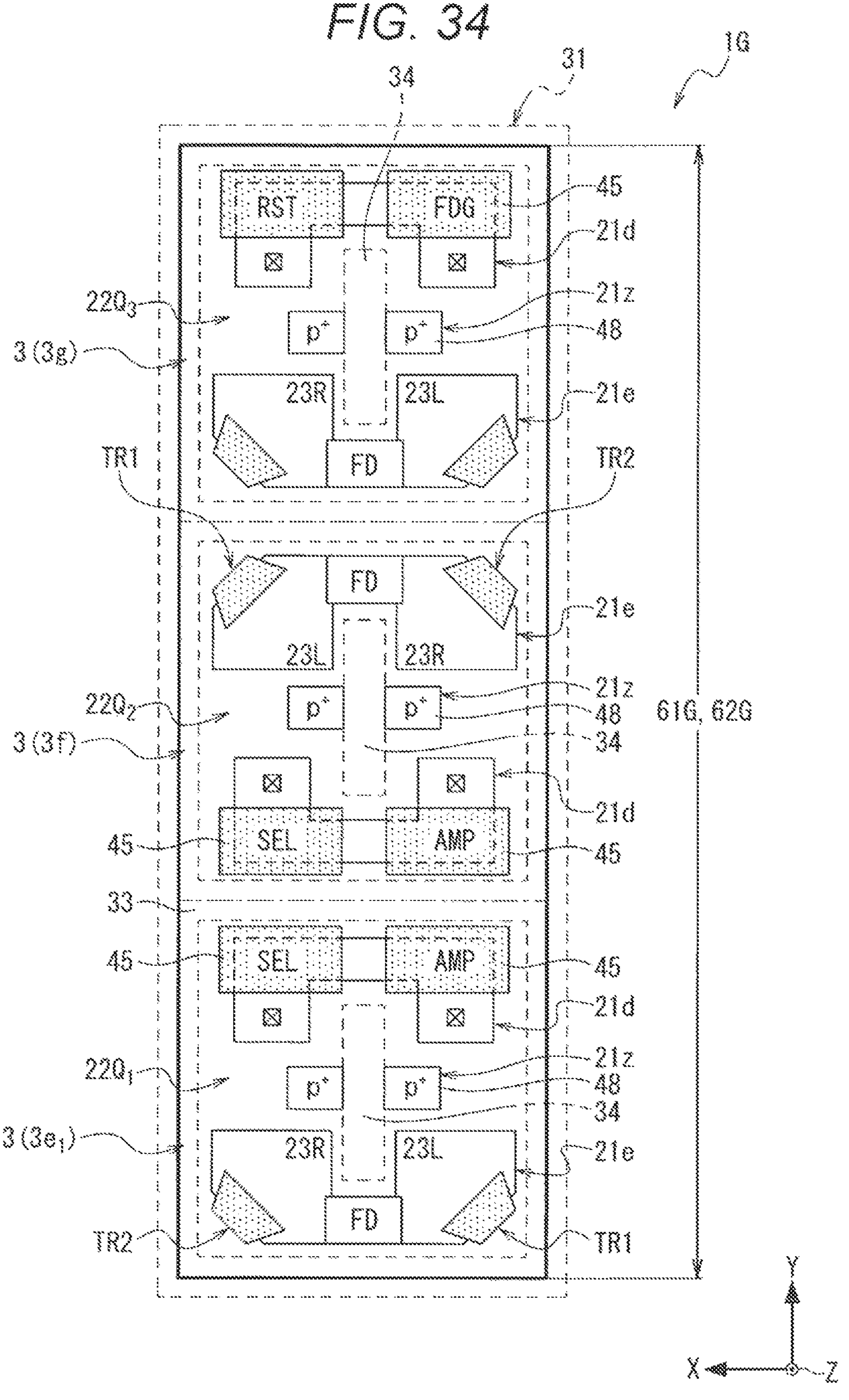
FIG. 34 is a schematic plan view illustrating a configuration example of a pixel block of a solid-state imaging device according to an eighteenth embodiment of the present technology.

That is, the solid-state imaging device 1G according to the eighteenth embodiment includes a pixel block 61G illustrated in FIG. 34 instead of the pixel block 61E illustrated in FIG. 31.

As illustrated in FIG. 34, the pixel block 61G of the eighteenth embodiment includes three pixels 3 ($3e_1$, $3f_1$, and $3g_1$) arrayed along a Y direction. Although FIG. 34 illustrates one pixel block 61G, the pixel block 61G is repeatedly arranged in each of an X direction and the Y direction in a pixel region 2A as described with reference to FIG. 2.

As illustrated in FIG. 34, the pixel $3e_1$ includes a photoelectric conversion cell $22Q_1$, the pixel $3f_1$ includes a photoelectric conversion cell $22Q_2$, and the pixel $3g_1$ includes a photoelectric conversion cell $22Q_3$. Each of the photoelectric conversion cells $22Q_1$, $22Q_2$, and $22Q_3$ basically has a similar configuration to the above-described photoelectric conversion cell 22F illustrated in FIG. 12 of the sixth embodiment, and type and arrangement direction of pixel transistors arranged in an element formation region 21*d* are different.

As illustrated in FIG. 34, the photoelectric conversion cell $22Q_1$ of the pixel $3e_1$ includes, as pixel transistors, an amplification transistor AMP arranged on a first photoelectric conversion region 23L side of the element formation region 21*d*, and a selection transistor SEL arranged on a second photoelectric conversion region 23R side of the element formation region 21*a*.

As illustrated in FIG. 31, the photoelectric conversion cell $22Q_2$ of the pixel $3f_1$ includes, as pixel transistors, a selection transistor SEL arranged on the first photoelectric conversion region 23L side of the element formation region 21*d*, and an amplification transistor AMP arranged on the second photoelectric conversion region 23R side of the element formation region 21*d*.

As illustrated in FIG. 31, the photoelectric conversion cell $22Q_3$ of the pixel $3g_1$ includes, as pixel transistors, a switching transistor FDG arranged on the first photoelectric conversion region 23L side of the element formation region 21*d*, and a reset transistor RST arranged on the second photoelectric conversion region 23R side of the element formation region 21*d*.

The photoelectric conversion cell $22Q_1$ of the pixel $3e_1$ and the photoelectric conversion cell $22Q_2$ of the pixel $3f_1$ are arranged in a direction in which the amplification transistors AMP face each other and the selection transistors SEL face each other in plan view in the Y direction.

In the photoelectric conversion cell $22Q_2$ of the pixel $3f_1$ and the photoelectric conversion cell $22Q_3$ of the pixel $3g_1$, the first photoelectric conversion region 23L of the pixel $3f_1$ and the second photoelectric conversion region 23R of the pixel $3g_1$ are adjacent to each other, and the second photoelectric conversion 23R of the pixel $3f_1$ and the first photoelectric conversion region 23L of the pixel $3g_1$ are adjacent to each other, in the Y direction. That is, the charge holding region FD and the two transfer transistors TR1 and TR2 of the pixel $3f_1$, and the charge holding region FD and the two transfer transistors TR1 and TR2 of the pixel $3g_1$ are adjacent to each other in the Y direction.

In the solid-state imaging device 1G of the eighteenth embodiment, the element formation region 21*d* of each of the photoelectric conversion cells $22Q_1$, $22Q_2$, $22Q_3$, and $22Q_4$ extends over the first photoelectric conversion region 23L and the second photoelectric conversion region 23R, and crosses a region between a pixel isolation region 31 and an in-pixel isolation region 32 in plan view. Therefore, in the solid-state imaging device 1G according to the eighteenth embodiment, effects similar to those of the above-described solid-state imaging device 1A according to the first embodiment can be obtained.

Nineteenth Embodiment

A solid-state imaging device 1H according to a nineteenth embodiment of the present technology basically has a similar configuration to the above-described solid-state imaging device 1B according to the thirteenth embodiment, and the following configuration is different.

Figure 35:
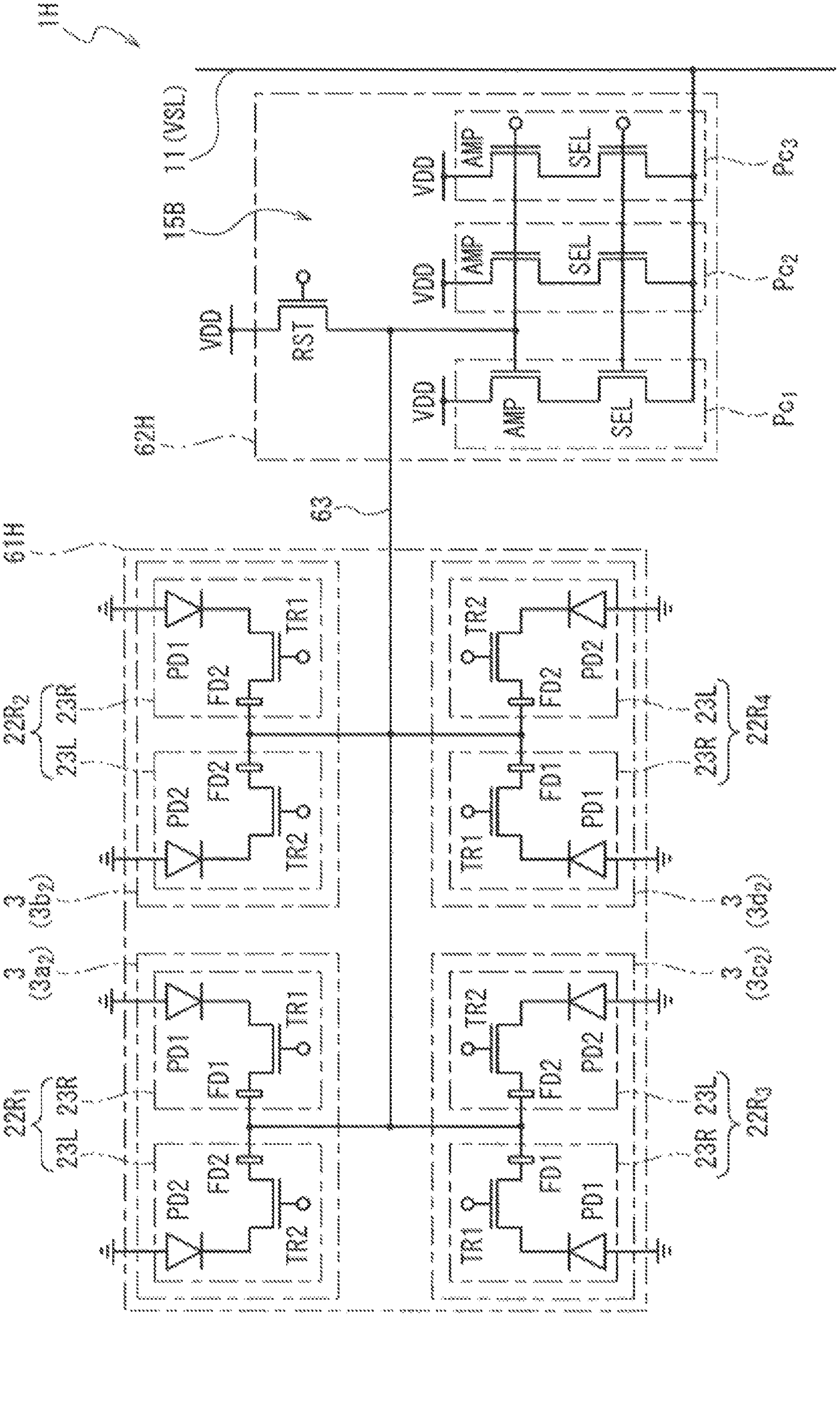
FIG. 35 is an equivalent circuit diagram illustrating a configuration example of a pixel block and a readout circuit of a solid-state imaging device according to a nineteenth embodiment of the present technology.
Figure 36:
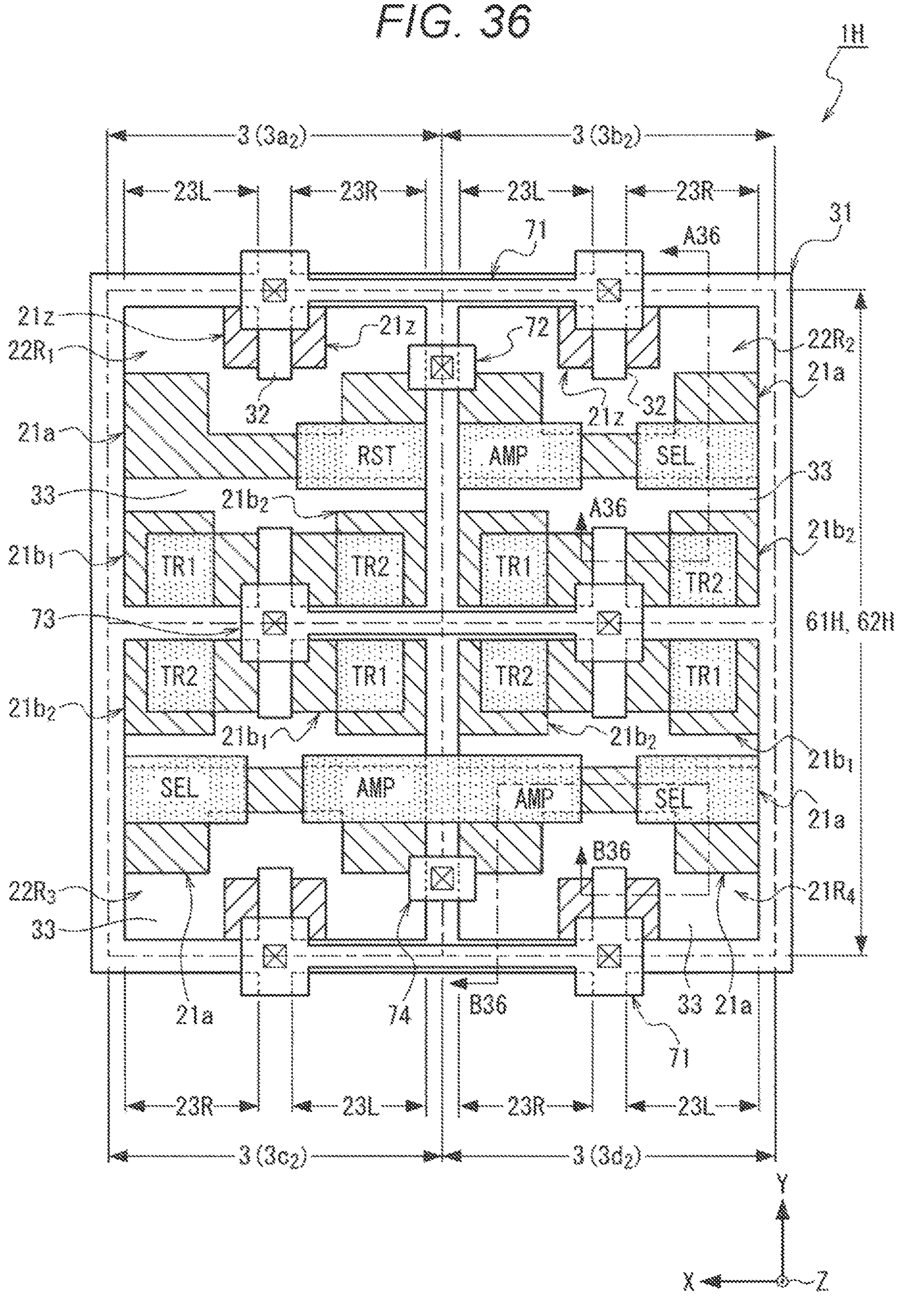
FIG. 36 is a schematic plan view illustrating a configuration example of a pixel block of the solid-state imaging device according to the nineteenth embodiment of the present technology.

That is, the solid-state imaging device 1H according to the nineteenth embodiment of the present technology includes a pixel block 61H and a circuit block 62H illustrated in FIGS. 35 and 36 instead of the pixel block 61B and the circuit block 62B illustrated in FIGS. 19 and 20 of the above-described thirteenth embodiment.

Furthermore, as illustrated in FIGS. 36 to 39, the solid-state imaging device 1H according to the nineteenth embodiment of the present technology includes relay wiring 71, a conductive pad 72, relay wiring 73, and a conductive pad 74.

As illustrated in FIG. 35, the pixel block 61H includes a plurality of pixels 3. In the nineteenth embodiment, the pixel block 61H includes, but is not limited to, four pixels 3 ($3a_2$, $3b_2$, $3c_2$, and $3d_2$) arranged in a 2×2 array of two in an X direction and two in a Y direction in plan view, for example. Although FIG. 36 mainly illustrate one pixel block 61H, the pixel block 61H is repeatedly arranged in each of the X direction and the Y direction.

As illustrated in FIGS. 36 to 39, among the four pixels 3 ($3a_2$, $3b_2$, $3c_2$, and $3d_2$), the pixel $3a_2$ includes a photoelectric conversion cell $22R_1$. The pixel $3b_2$ includes a photoelectric conversion cell $22R_2$. The pixel $3c_2$ includes a photoelectric conversion cell $22R_3$. The pixel $3d_2$ includes a photoelectric conversion cell $22R_4$. Each of the photoelectric conversion cells $22R_1$, $22R_2$, $22R_3$, and $22R_4$ basically has a similar configuration to the above-described photoelectric conversion cells $22M_1$, $22M_2$, $22M_3$, and $22M_4$ illustrated in FIGS. 21A to 21D of the thirteenth embodiment, planar patterns of element formation regions $21b_1$ and $21b_2$ are different, and arrangement of transfer transistors TR1 and TR2, charge holding regions FD1 and FD2, and a feeding region 21*z* is different.

Figure 37:
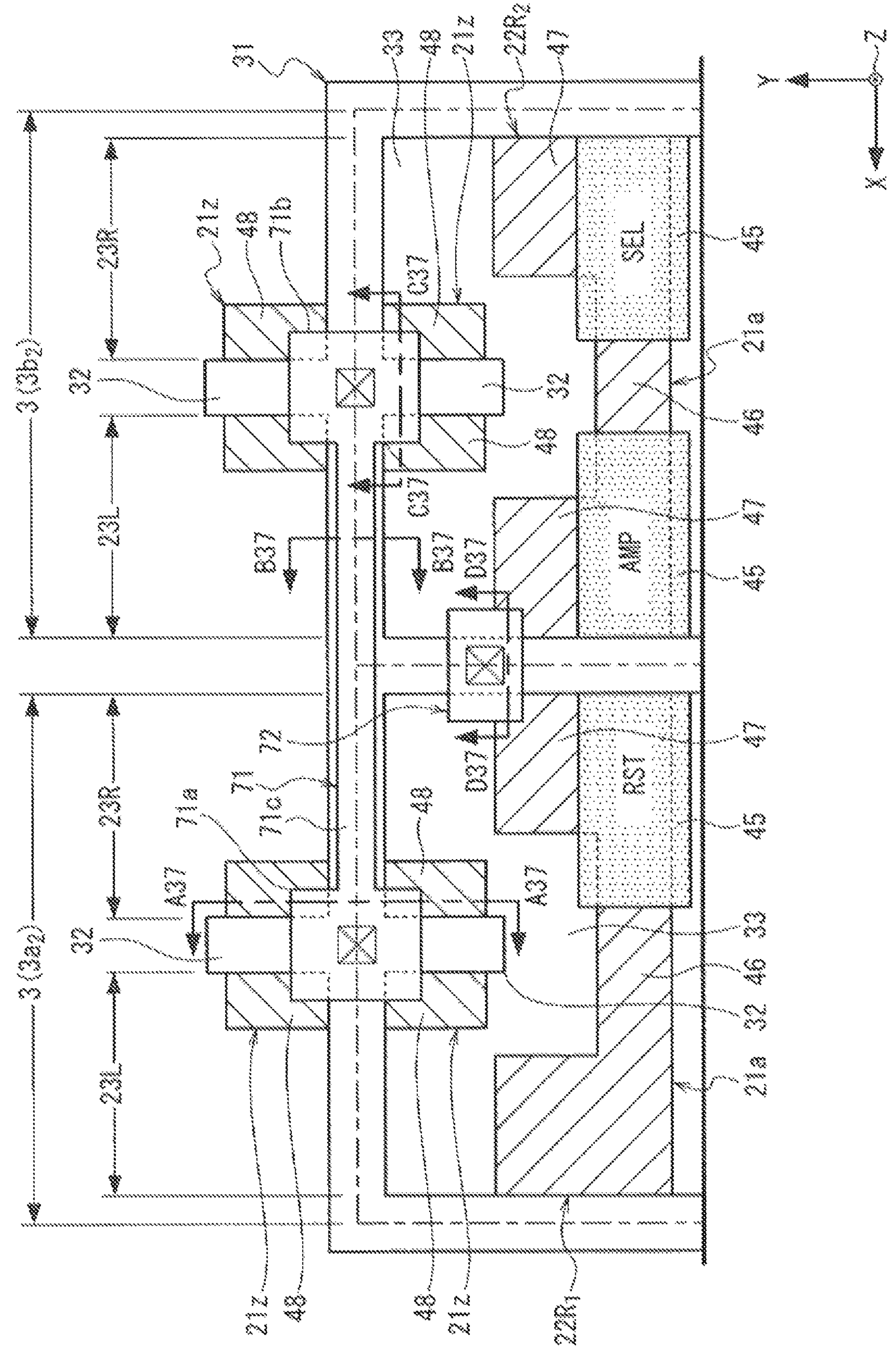
FIG. 37 is a schematic plan view of an enlarged first portion in FIG. 35.
Figure 39:
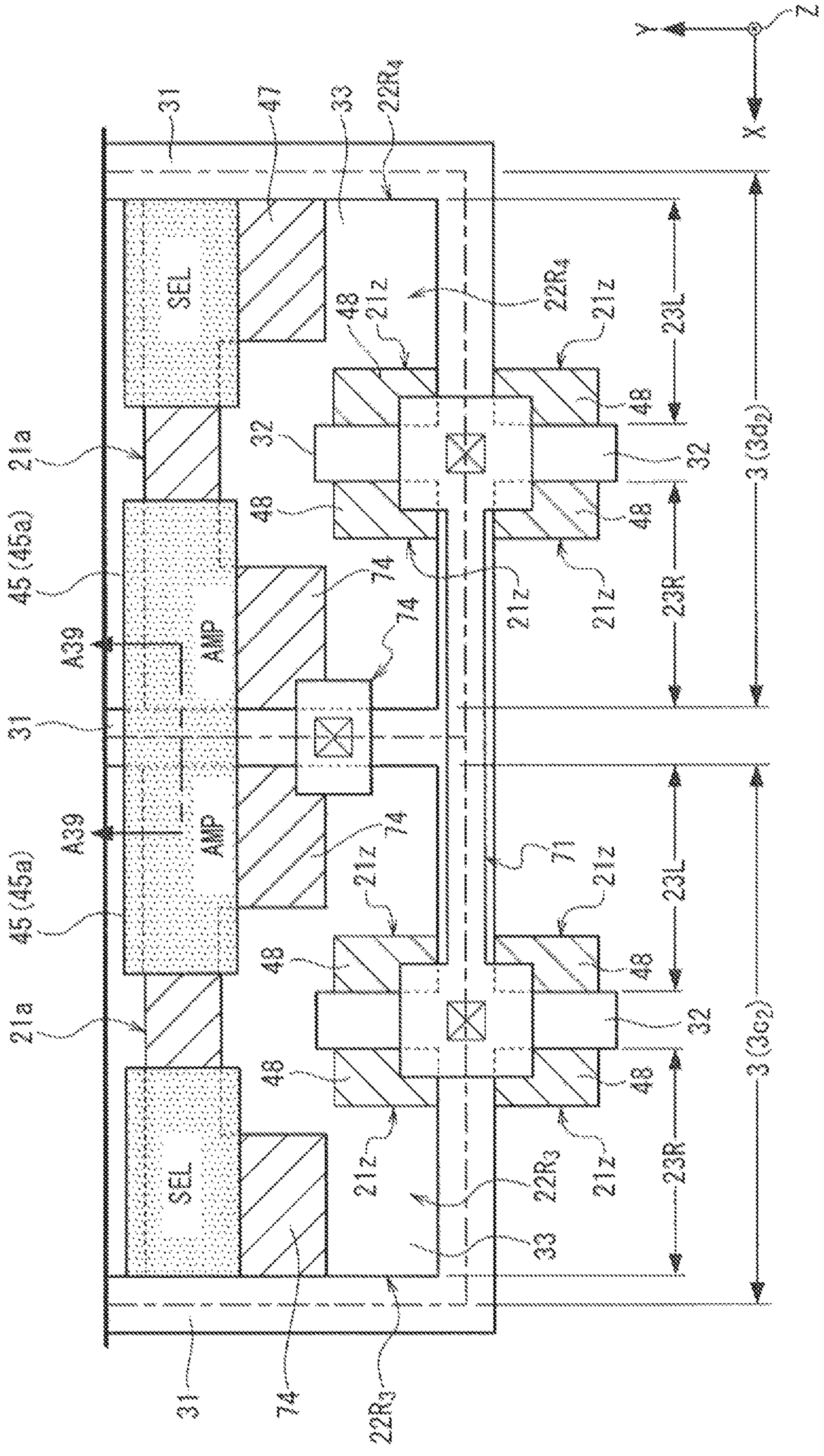
FIG. 39 is a schematic plan view of an enlarged third portion in FIG. 35.

As illustrated in FIGS. 36, 37, and 39, in each of the photoelectric conversion cells $22R_1$, $22R_2$, $22R_3$, and $22R_4$, the feeding region 21*z* is arranged on the element formation region 21*a* side in plan view and on both sides of an in-pixel isolation region 32. Then, a p-type contact region 48 is provided in each of the feeding regions 21*z*. That is, in each of the photoelectric conversion cells $22R_1$, $22R_2$, $22R_3$, and $22R_4$, the feeding region 21*z* and a contact region 48 are arranged in each of first photoelectric conversion region 23L and second photoelectric conversion region 23R.

Figure 38:
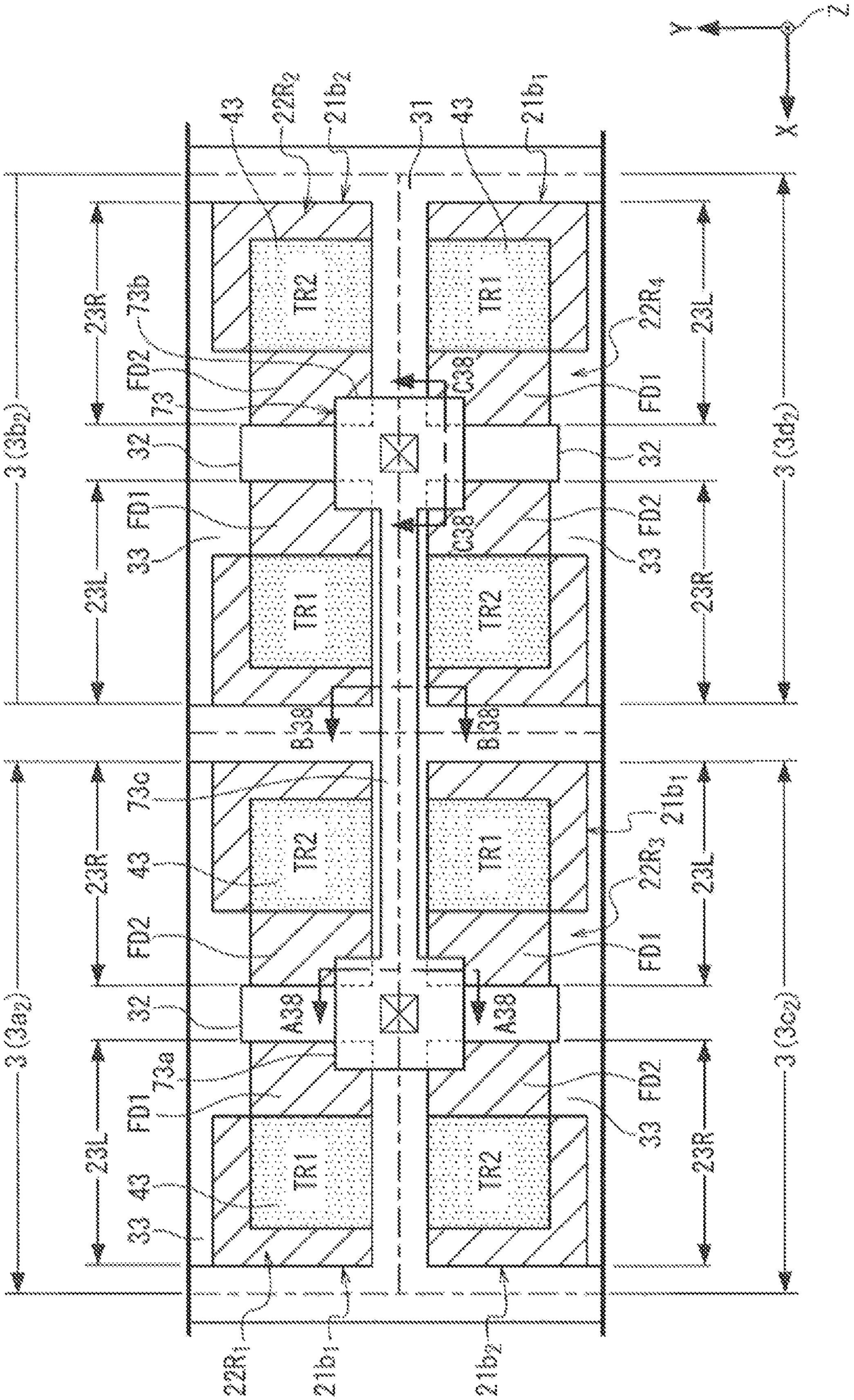
FIG. 38 is a schematic plan view of an enlarged second portion in FIG. 35.

Furthermore, as illustrated in FIGS. 36 and 38, in each of the photoelectric conversion cells $22R_1$, $22R_2$, $22R_3$, and $22R_4$, the charge holding regions FD1 and FD2 are arranged between gate electrodes 43 of the transfer transistors TR1 and TR2 and an in-pixel isolation region 32 in plan view.

Furthermore, as illustrated in FIGS. 36 and 38, the transfer transistors TR1 and TR2 of the photoelectric conversion cells $22R_1$ and $22R_3$ are arranged adjacent to (facing) each other so as to sandwich a pixel isolation region 31 between the photoelectric conversion cell $22R_1$ and the photoelectric conversion cell $22R_3$ in plan view. Similarly, the transfer transistors TR1 and TR2 of the photoelectric conversion cells $22R_2$ and $22R_4$ are also arranged adjacent to (facing) each other so as to sandwich the pixel isolation region 31 between the photoelectric conversion cell $22R_2$ and the photoelectric conversion cell $22R_4$ in plan view.

As illustrated in FIG. 37, the photoelectric conversion cell $22R_1$ of the pixel $3a_2$ is not limited thereto, but for example, a selection transistor SEL (Qt) is arranged on the second photoelectric conversion region 23R side, and arrangement of pixel transistors is omitted on the first photoelectric conversion region 23L side.

As illustrated in FIG. 37, the photoelectric conversion cell $22R_2$ of the pixel $3b_2$ is not limited thereto, but for example, an amplification transistor AMP is arranged on the first photoelectric conversion region 23L side, and the selection transistor SEL is arranged on the second photoelectric conversion region 23R side.

As illustrated in FIG. 39, the photoelectric conversion cell $22R_3$ of the pixel $3c_2$ is not limited thereto, but for example, the amplification transistor AMP is arranged on the first photoelectric conversion region 23L side, and the selection transistor SEL is arranged on the second photoelectric conversion region 23R side.

As illustrated in FIG. 39, the photoelectric conversion cell $22R_4$ of the pixel $3d_2$ is not limited thereto, but for example, the selection transistor SEL is arranged on the first photoelectric conversion region 23L side, and the amplification transistor AMP is arranged on the second photoelectric conversion region 23R side.

<Direction of Photoelectric Conversion Cells>

As illustrated in FIGS. 36 and 37, in the photoelectric conversion cell $22R_1$ of the pixel $3a_2$ and the photoelectric conversion cell $22R_2$ of the pixel $3b_2$, the second photoelectric conversion region 23R of the pixel $3a_2$ and the first photoelectric conversion region 23L of the pixel $3b_2$ are arranged adjacent to each other in the X direction. That is, a reset transistor RST of the pixel $3a_2$ and the amplification transistor AMP of the pixel $3b_2$ are adjacent to each other in the X direction.

Furthermore, as illustrated in FIGS. 36 and 39, in the photoelectric conversion cell $22R_3$ of the pixel $3c_2$ and the photoelectric conversion cell $22R_4$ of the pixel $3d_2$, the first photoelectric conversion region 23L of the pixel $3c_2$ and the second photoelectric conversion region 23R of the pixel $3d_2$ are adjacent to each other in the X direction. That is, the amplification transistor AMP of the pixel $3c_2$ and the amplification transistor AMP of the pixel $3d_2$ are adjacent to each other in the X direction.

Furthermore, as illustrated in FIGS. 36 and 38, in the photoelectric conversion cell $22R_1$ of the pixel $3a_2$ and the photoelectric conversion cell $22R_3$ of the pixel $3c_2$, the first photoelectric conversion region 23L of the pixel $3a_2$ and the second photoelectric conversion region 23R of the pixel $3c_2$ are adjacent to each other, and the second photoelectric conversion 23R of the pixel $3a_2$ and the first photoelectric conversion region 23L of the pixel $3c_2$ are adjacent to each other, in the Y direction. That is, as illustrated in FIG. 38, the charge holding regions FD1 and FD2 of the pixel $3a_2$ and the charge holding regions FD1 and FD2 of the pixel $3c_2$ are adjacent to each other in the Y direction via the pixel isolation region 31 in plan view.

Furthermore, as illustrated in FIGS. 36 and 38, in the photoelectric conversion cell $22R_2$ of the pixel $3b_2$ and the photoelectric conversion cell $22R_4$ of the pixel $3d_2$, the first photoelectric conversion region 23L of the pixel $3b_2$ and the second photoelectric conversion region 23R of the pixel $3d_2$ are adjacent to each other, and the second photoelectric conversion 23R of the pixel $3a_2$ and the first photoelectric conversion region 23L of the pixel $3c_2$ are adjacent to each other, in the Y direction. That is, as illustrated in FIG. 38, the charge holding regions FD1 and FD2 of the pixel $3b_2$ and the charge holding regions FD1 and FD2 of the pixel $3d_2$ are adjacent to each other in the Y direction via the pixel isolation region 31 in plan view.

Note that, as will be described with reference to FIGS. 37 and 39 although not illustrated in detail, in the two pixel blocks 61H arrayed in the Y direction, the feeding region 21z of the pixel $3a_2$ and the feeding region 21z of the pixel $3c_2$ adjacent to each other in the Y direction are adjacent to each other via the pixel isolation region 31 in plan view. Furthermore, in the two pixel blocks 61H arrayed in the Y direction, the feeding region 21z of the pixel $3b_2$ and the feeding region 21z of the pixel $3d_2$ adjacent to each other in the Y direction are adjacent to each other via the pixel isolation region 31 in plan view. FIGS. 37 and 39 illustrate a state in which the feeding region 21z is arranged at each of four corners surrounding an intersection where the pixel isolation region 31 and the in-pixel isolation region 32 intersect. Then, the p-type contact region 48 is provided in each of the four feeding regions 21z. That is, four contact regions 48 are arranged so as to surround the intersection between the pixel isolation region 31 and the in-pixel isolation region 32.

<Readout Circuit>

As illustrated in FIG. 35, an input stage of a readout circuit 15B is connected to the charge holding regions FD1 and FD2 of each of the four pixels $3a_2$, $3b_2$, $3c_2$, and $3d_2$ via a conductive path 63. The readout circuit 15B reads signal charges held in the charge holding regions FD1 and FD2 of each of the four pixels $3a_2$, $3b_2$, $3c_2$, and $3d_2$, and outputs pixel signals based on the signal charges. The readout circuit 15B is shared by the four pixels $3a_2$, $3b_2$, $3c_2$, and $3d_2$ (eight photoelectric conversion regions), and is provided for each pixel block 61H.

The readout circuit 15B has a configuration similar to that of the above-described reading circuit 15B illustrated in FIG. 19 of the thirteenth embodiment. The readout circuit 15B of the nineteenth embodiment includes the pixel transistors included in the circuit block 62E illustrated in FIG. 35. The circuit block 62H includes a switching transistor FDG, the reset transistor RST, the two amplification transistors AMP, and the two selection transistors SEL arranged in the pixels $3a_2$, $3b_2$, $3c_2$, and $3d_2$ in one pixel block 61H, unlike the above-described circuit block 62B illustrated in FIG. 20 of the thirteenth embodiment.

Figure 40:
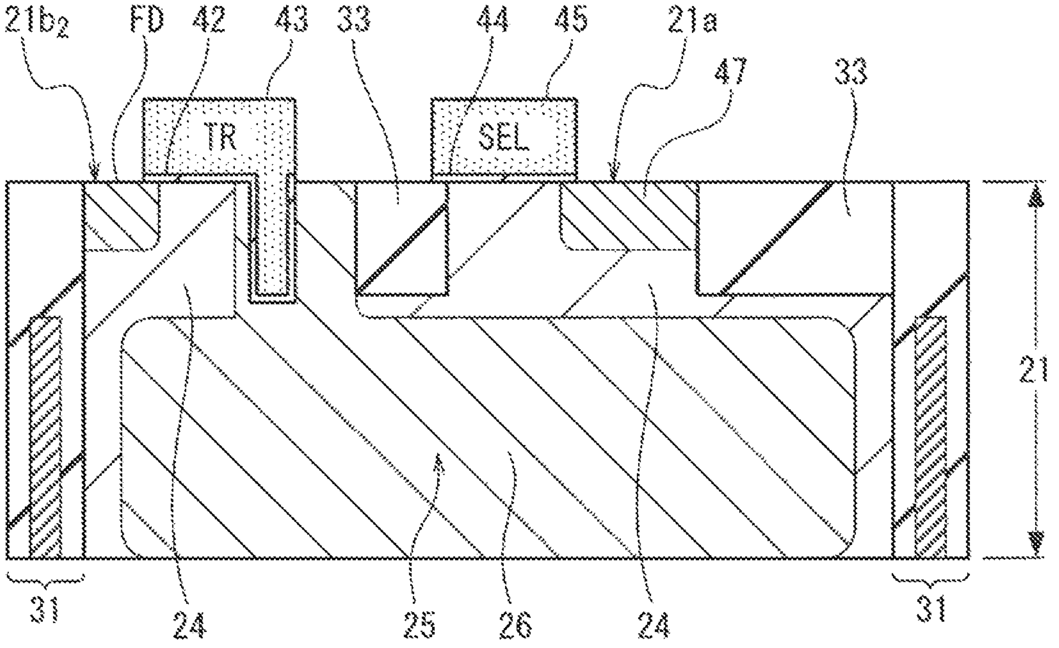
FIG. 40 is a schematic cross-sectional view illustrating a cross-sectional structure taken along line A36-A36 in FIG. 36.
Figure 41:
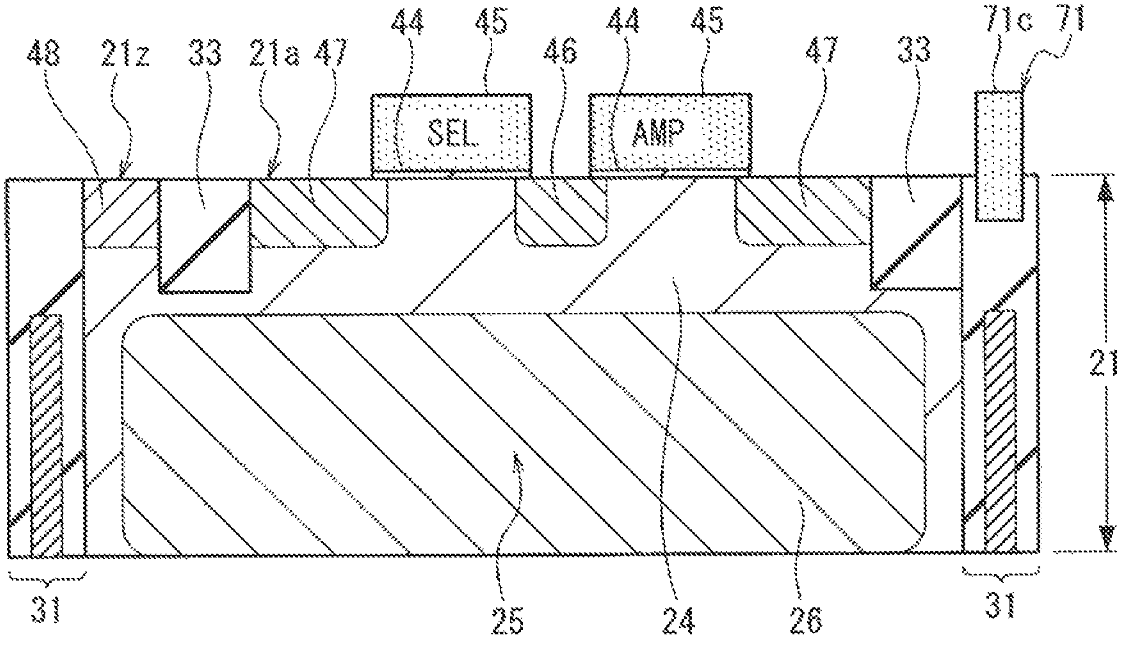
FIG. 41 is a schematic cross-sectional view illustrating a cross-sectional structure taken along line B36-B36 in FIG. 36.

As illustrated in FIGS. 40 and 41, the pixel isolation region 31 of the nineteenth embodiment is not limited thereto, and penetrates an element isolation region 33 in a thickness direction (Z direction) of a semiconductor layer 21, unlike the above-described pixel isolation region 31 illustrated in FIGS. 5 to 7 of the first embodiment. Furthermore, the pixel isolation region 31 according to the nineteenth embodiment has a three-layer structure in which both sides of a conductive film extending in a depth direction of the semiconductor layer 21 are sandwiched between insulating films although the present embodiment is not limited thereto. Although not illustrated, the in-pixel isolation region 32 of the nineteenth embodiment also penetrates the element isolation region 33 in the thickness direction of the semiconductor layer 21. The in-pixel isolation region 32 according to the nineteenth embodiment may have a three-layer structure in which both sides of a conductive film extending in the depth direction of the semiconductor layer 21 are sandwiched between insulating films although the present embodiment is not limited thereto.

Note that, as illustrated in FIGS. 40 and 41, also in this embodiment, the element formation regions 21*a* and $21b_2$ and the feeding regions 21*z* overlap a photoelectric conversion unit 25 via a p-type semiconductor region 24 in plan view. Although not illustrated, the element formation region $21b_1$ also overlaps the photoelectric conversion unit 25 via the p-type semiconductor region 24 in plan view.

<Relay Wiring and Conductive Pad>

As illustrated in FIG. 37, the relay wiring 71 includes two conductive pads 71*a* and 71*b* and a coupling portion 71*c* that couples the two conductive pads 71*a* and 71*b*. The conductive pad 71*a* is coupled to one end side of the coupling portion, and the conductive pad 71*b* is coupled to the other end side of the coupling portion 71*c*. The relay wiring 71 overlaps the pixel isolation region 31 in plan view and extends along the X direction.

As illustrated in FIG. 37, the conductive pad 71*a* is arranged at a portion where the pixel isolation region 31 and the in-pixel isolation region 32 intersect on the element formation region 21*a* side of the photoelectric conversion cell $22R_1$ (pixel $3a_2$) in plan view. Then, the conductive pad 71*a* overlaps and is electrically and mechanically connected to the two p-type contact regions 48 arranged on both sides of the in-pixel isolation region 32 across the in-pixel isolation region 32 in the X direction. Furthermore, in the photoelectric conversion cell (the photoelectric conversion cell $22R_3$ of another pixel block adjacent in the Y direction) on the opposite side to the photoelectric conversion cell $22R_1$ side of the pixel isolation region 31, the conductive pad 71*a* overlaps and is electrically and mechanically connected to the two p-type contact regions 48 arranged on both sides of the in-pixel isolation region 32 adjacent to the in-pixel isolation region 32 of the photoelectric conversion cell $22R_1$ across the in-pixel isolation region 32. Then, the conductive pad 71*a* overlaps and is electrically and mechanically connected to a plurality of p-type contact regions 48 arranged on both sides of an isolation region including the pixel isolation region 31 and the in-pixel isolation region 32 across the isolation region in each of the X direction and Y direction. In this embodiment, the conductive pad 71*a* is electrically and mechanically connected to each of the four contact regions 48 arranged to surround the intersection where the pixel isolation region 31 extending in the X direction and the in-pixel isolation region 32 extending in the Y direction intersect across the pixel isolation region 31 and the in-pixel isolation region 32.

Figure 42A:
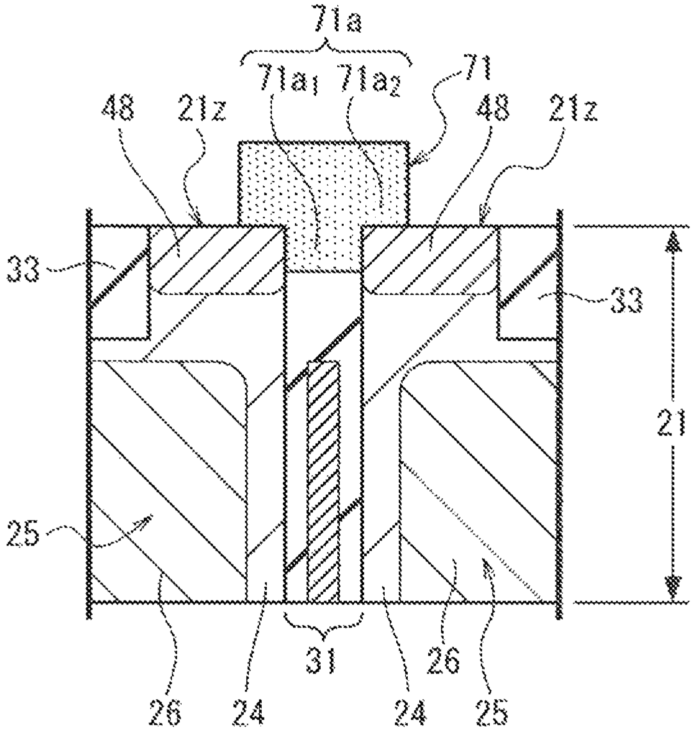
FIG. 42A is a schematic cross-sectional view illustrating a cross-sectional structure taken along line A37-A37 in FIG. 37.

As illustrated in FIG. 42A, the conductive pad 71*a* includes a body $71a_1$ located in the pixel isolation region 31, and a head $71a_2$ protruding from the body $71a_1$ to an outside of the pixel isolation region 31 and having a larger width than the body $71a_1$. The body $71a_1$ is in contact with and is electrically and mechanically connected to side walls of the contact regions 48. The head $71a_2$ is in contact with and is electrically and mechanically connected to upper surfaces (front layer surfaces) of the contact regions 48. That is, the conductive pad 71*a* is formed in a shape having the body $71a_1$ and the head $71a_2$ wider than the body $71a_1$, and the body $71a_1$ is arranged in the pixel isolation region 31 such that the body $71a_1$ and the head $71a_2$ are in contact with the contact region 48, whereby a contact area between the contact region 48 and the conductive pad 71*a* increases.

Figure 42B:
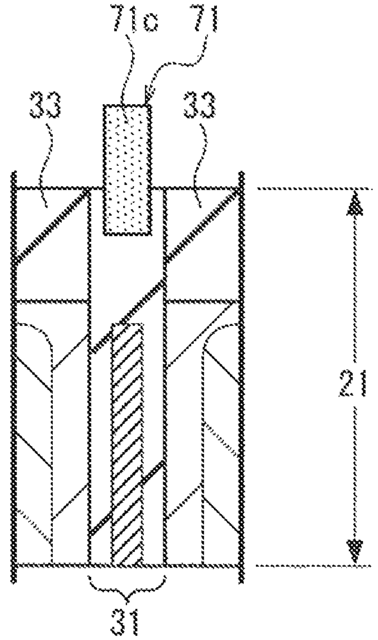
FIG. 42B is a schematic cross-sectional view illustrating a cross-sectional structure taken along line B37-B37 in FIG. 37.

As illustrated in FIG. 37, the coupling portion 71*c* extends over the pixel $3a_2$ and the pixel $3b_2$ on the pixel isolation region 31. As illustrated in FIG. 42B, the coupling portion 71*c* extends from the inside to the outside of the pixel isolation region 31 in the thickness direction of the semiconductor layer 21. Then, the width of a portion of the coupling portion 71*c*, the portion being located inside the pixel isolation region 31, is smaller than the width of the pixel isolation region 31, and the coupling portion 71*c* is insulated and isolated from a semiconductor of the semiconductor layer 21 by an insulating film of the pixel isolation region 31.

As illustrated in FIG. 37, the conductive pad 71*b* is arranged at a portion where the pixel isolation region 31 and the in-pixel isolation region 32 intersect on the element formation region 21*a* side of the photoelectric conversion cell $22R_2$ (pixel $3a_2$) in plan view. Then, the conductive pad 71*b* overlaps and is electrically and mechanically connected to the two p-type contact regions 48 arranged on both sides of the in-pixel isolation region 32 across the in-pixel isolation region 32 in the X direction. Furthermore, in the photoelectric conversion cell (the photoelectric conversion cell $22R_4$ of another pixel block adjacent in the Y direction) on the opposite side to the photoelectric conversion cell $22R_2$ side of the pixel isolation region 31, the conductive pad 71*b* overlaps and is electrically and mechanically connected to the two p-type contact regions 48 arranged on both sides of the in-pixel isolation region 32 adjacent to the in-pixel isolation region 32 of the photoelectric conversion cell $22R_2$ across the in-pixel isolation region 32. Then, the conductive pad 71*b* overlaps and is electrically and mechanically connected to a plurality of p-type contact regions 48 arranged on both sides of an isolation region including the pixel isolation region 31 and the in-pixel isolation region 32 across the isolation region in each of the X direction and Y direction. In this embodiment, the conductive pad 71*b* is electrically and mechanically connected to each of the four contact regions 48 arranged to surround the intersection where the pixel isolation region 31 extending in the X direction and the in-pixel isolation region 32 extending in the Y direction intersect across the pixel isolation region 31 and the in-pixel isolation region 32.

Figure 42C:
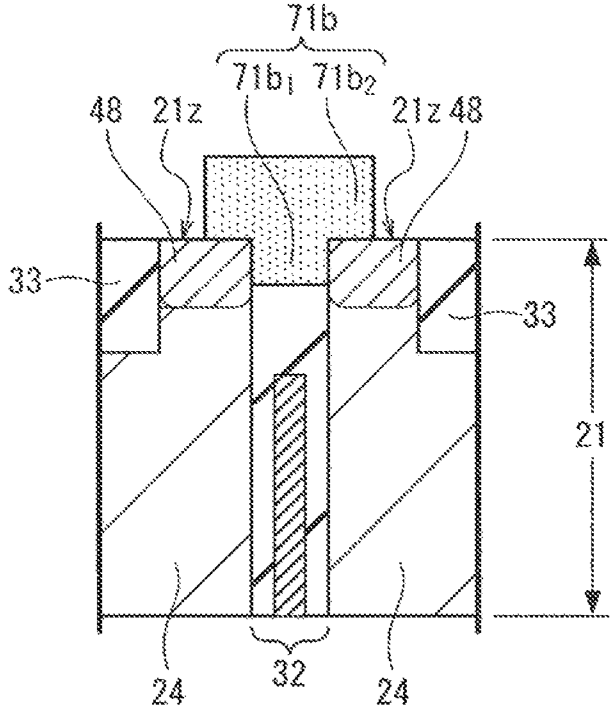
FIG. 42C is a schematic cross-sectional view illustrating a cross-sectional structure taken along line C37-C37 in FIG. 37.

As illustrated in FIG. 42C, the conductive pad 71*b* includes a body $71b_1$ located in the pixel isolation region 31, and a head $71b_2$ protruding from the body $71b_1$ to an outside of the pixel isolation region 31 and having a larger width than the body $71b_1$. The body $71b_1$ is in contact with and is electrically and mechanically connected to side walls of the contact regions 48. The head $71b_2$ is in contact with and is electrically and mechanically connected to upper surfaces (front layer surfaces) of the contact regions 48. That is, in the conductive pad 71*b*, the body $71b_1$ is arranged in the pixel isolation region 31 such that the body $71b_1$ and the head $71b_2$ are in contact with the contact region 48, whereby the contact area between the contact region 48 and the conductive pad 71*b* increases, similarly to the above-described conductive pad 71*a*.

Although not illustrated, at least one of the conductive pad 71*a* or 71*b* of the relay wiring 71 is electrically connected to wiring on an interlayer insulating film via a contact electrode embedded in the upper interlayer insulating film. Then, a first reference potential is applied to the wiring as a power supply potential. Then, the first reference potential is supplied from the wiring to the relay wiring 71 via a conductive plug, and the potential of the plurality of contact regions 48 (p-type semiconductor regions) connected to the respective conductive pads 71$a$ and 71$b$ of the relay wiring 71 are fixed to the first reference potential. As the first reference potential, for example, a VSS potential of 0 V is applied.

As illustrated in FIG. 37, the conductive pad 72 is electrically and mechanically connected to the semiconductor regions arranged on both sides of the pixel isolation region 31 across the pixel isolation region 31 between the photoelectric conversion cell 22$R_1$ of the pixel 3$a_2$ and the photoelectric conversion cell 22$R_2$ of the pixel 3$b_2$ in the X direction. Specifically, the conductive pad 72 overlaps and is electrically and mechanically connected to the main electrode region 47 of the reset transistor RST arranged on the photoelectric conversion cell 22$R_1$ side of the pixel isolation region 31 and the main electrode region 47 of the amplification transistor AMP arranged on the photoelectric conversion cell 22$R_2$ side of the pixel isolation region 31.

Figure 42D:
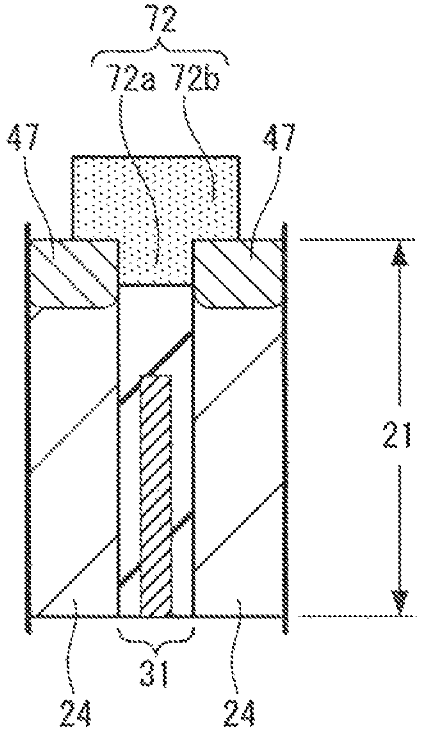
FIG. 42D is a schematic cross-sectional view illustrating a cross-sectional structure taken along line D37-D37 in FIG. 37.

As illustrated in FIG. 42D, the conductive pad 72 includes a body 72$a$ located in the pixel isolation region 31, and a head 72$b$ protruding from the body 72$a$ to an outside of the pixel isolation region 31 and having a larger width than the body 72$a$. The body 72$a$ is in contact with and is electrically and mechanically connected to side walls of the main electrode regions 47 (n-type semiconductor regions. The head 72$b$ is in contact with and is electrically and mechanically connected to upper surfaces (front layer surfaces) of the main electrode regions 47. That is, in the conductive pad 72, the body 72$a$ is arranged in the pixel isolation region 31 such that the body 72$a$ and the head 72$b$ are in contact with the main electrode region 47, whereby the contact area between the main electrode region 47 and the conductive pad 72 increases, similarly to the above-described conductive pad 71$a$.

Although not illustrated, the conductive pad 72 is electrically connected to the wiring on the interlayer insulating film via the contact electrode embedded in the upper interlayer insulating film. Then, a second reference potential different from the first reference potential is applied to the wiring as a power supply potential. Then, the second reference potential is supplied from the wiring to the conductive pad 72 via a conductive plug, and the potential of the plurality of main electrode regions 47 (n-type semiconductor regions) connected to the conductive pad 72 is fixed to the second reference potential. As the second reference potential, for example, a VDD potential of 3.0 V is applied.

As illustrated in FIG. 38, the relay wiring 73 includes two conductive pads 73$a$ and 73$b$ and a coupling portion 73$c$ that couples the two conductive pads 73$a$ and 73$b$. The conductive pad 73$a$ is coupled to one end side of the coupling portion 73$c$, and the conductive pad 73$b$ is coupled to the other end side of the coupling portion 73$c$. The conductive pad 73$a$ and the conductive pad 73$b$ are electrically and mechanically connected via the coupling portion. The relay wiring 73 overlaps the pixel isolation region 31 in plan view and extends along the X direction.

As illustrated in FIG. 38, the conductive pad 73$a$ is arranged at a portion where the pixel isolation region 31 and the in-pixel isolation region 32 intersect on the element formation regions 21$b_1$ and 21$b_2$ side of the photoelectric conversion cell 22$R_1$ (pixel 3$a_2$) in plan view. Then, the conductive pad 73$a$ overlaps and is electrically and mechanically connected to the two n-type charge holding regions FD1 and FD2 arranged on both sides of the in-pixel isolation region 32 across the in-pixel isolation region 32 in the X direction. Furthermore, the conductive pad 73$a$ is arranged at a portion where the pixel isolation region 31 and the in-pixel isolation region 32 intersect on the element formation regions 21$b_1$ and 21$b_2$ side of the photoelectric conversion cell 22$R_3$ (pixel 3$c_2$) in plan view. Then, the conductive pad 73$a$ overlaps and is electrically and mechanically connected to the two n-type charge holding regions FD1 and FD2 arranged on both sides of the in-pixel isolation region 32 across the in-pixel isolation region 32 in the X direction. Then, the conductive pad 73$a$ overlaps and is electrically and mechanically connected to a plurality of n-type charge holding regions FD1 and FD2 arranged on both sides of an isolation region including the pixel isolation region 31 and the in-pixel isolation region 32 across the isolation region in each of the X direction and Y direction. In this embodiment, the conductive pad 73$a$ is electrically and mechanically connected to each of the four charge holding regions FD1 and FD2 arranged to surround the intersection where the pixel isolation region 31 extending in the X direction and the in-pixel isolation region 32 extending in the Y direction intersect across the pixel isolation region 31 and the in-pixel isolation region 32.

Figure 43A:
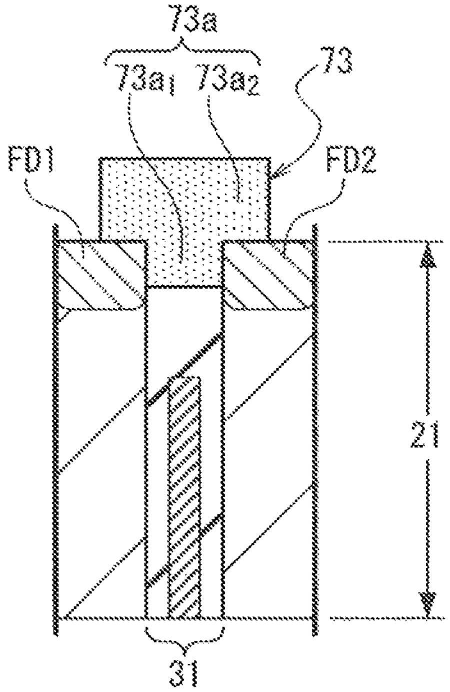
FIG. 43A is a schematic cross-sectional view illustrating a cross-sectional structure taken along line A38-A38 in FIG. 38.

As illustrated in FIG. 43A, the conductive pad 73$a$ includes a body 73$a_1$ located in the pixel isolation region 31, and a head 73$a_2$ protruding from the body 73$a_1$ to an outside of the pixel isolation region 31 and having a larger width than the body 73$a_1$. The body 73$a_1$ is in contact with and is electrically and mechanically connected to side walls of the charge holding regions FD1 and FD2. The head 73$a_2$ is in contact with and is electrically and mechanically connected to upper surfaces (front layer surfaces) of the charge holding regions FD1 and FD2. That is, in the conductive pad 73$a$, the body 73$a_1$ is arranged in the pixel isolation region 31 such that the body 73$a_1$ and the head 73$a_2$ are in contact with the charge holding regions FD1 and FD2, whereby the contact area between the charge holding regions FD1 and FD2 and the conductive pad 73$a$ increases, similarly to the above-described conductive pad 71$a$.

Figure 43B:
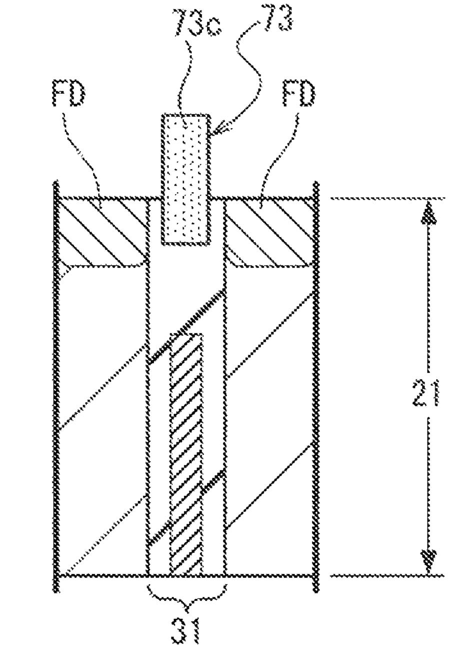
FIG. 43B is a schematic cross-sectional view illustrating a cross-sectional structure taken along line B38-B38 in FIG. 38.

As illustrated in FIG. 38, the coupling portion 73$c$ extends over the pixels 3$a_2$ and 3$c_2$ and the pixels 3$b_2$ and 3$d_2$ on the pixel isolation region 31. As illustrated in FIG. 43B, the coupling portion 73$c$ extends from the inside to the outside of the pixel isolation region 31 in the thickness direction of the semiconductor layer 21. Then, the width of a portion of the coupling portion 73$c$, the portion being located inside the pixel isolation region 31, is smaller than the width of the pixel isolation region 31, and the coupling portion 73$c$ is insulated and isolated from the semiconductor of the semiconductor layer 21 by an insulating film of the pixel isolation region 31.

As illustrated in FIG. 38, the conductive pad 73$b$ is arranged at a portion where the pixel isolation region 31 and the in-pixel isolation region 32 intersect on the element formation regions 21$b_1$ and 21$b_2$ side of the photoelectric conversion cell 22$R_2$ (pixel 3$b_2$) in plan view. Then, the conductive pad 73$b$ overlaps and is electrically and mechanically connected to the two n-type charge holding regions FD1 and FD2 arranged on both sides of the in-pixel isolation region 32 across the in-pixel isolation region 32 in the X direction. Furthermore, the conductive pad 73$b$ is arranged at a portion where the pixel isolation region 31 and the in-pixel isolation region 32 intersect on the element formation regions 21$b_1$ and 21$b_2$ side of the photoelectric conversion cell 22$R_4$ (pixel 3$d_2$) in plan view. Then, the conductive pad 73$b$ overlaps and is electrically and mechanically connected to the two n-type charge holding regions FD1 and FD2 arranged on both sides of the in-pixel isolation region 32 across the in-pixel isolation region 32 in the X direction. Then, the conductive pad 73*b* overlaps and is electrically and mechanically connected to a plurality of n-type charge holding regions FD1 and FD2 arranged on both sides of an isolation region including the pixel isolation region 31 and the in-pixel isolation region 32 across the isolation region in each of the X direction and Y direction. In this embodiment, the conductive pad 73*b* is electrically and mechanically connected to each of the four charge holding regions FD1 and FD2 arranged to surround the intersection where the pixel isolation region 31 extending in the X direction and the in-pixel isolation region 32 extending in the Y direction intersect across the pixel isolation region 31 and the in-pixel isolation region 32.

Figure 43C:
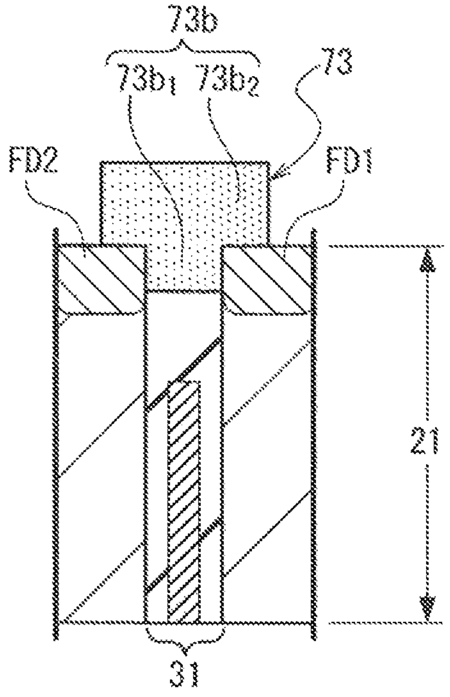
FIG. 43C is a schematic cross-sectional view illustrating a cross-sectional structure taken along line C38-C38 in FIG. 38.

As illustrated in FIG. 43C, the conductive pad 73*b* includes a body 73*b*$_1$ located in the pixel isolation region 31, and a head 73*b*$_2$ protruding from the body 73*b*$_1$ to an outside of the pixel isolation region 31 and having a larger width than the body 73*b*$_1$. The body 73*b*$_1$ is in contact with and is electrically and mechanically connected to side walls of the charge holding regions FD1 and FD2. The head 73*b*$_2$ is in contact with and is electrically and mechanically connected to upper surfaces (front layer surfaces) of the charge holding regions FD1 and FD2. That is, in the conductive pad 73*b*, the body 73*b*$_1$ is arranged in the pixel isolation region 31 such that the body 73*b*$_1$ and the head 73*b*$_2$ are in contact with the charge holding regions FD1 and FD2, whereby the contact area between the charge holding regions FD1 and FD2 and the conductive pad 73*b* increases, similarly to the above-described conductive pad 71*a*.

Although not illustrated, at least one of the conductive pad 73*a* or 73*b* is electrically connected to the wiring on the interlayer insulating film via the contact electrode embedded in the upper interlayer insulating film. Then, the contact electrode, the wiring, and the relay wiring 73 are included in the conductive path 63 illustrated in FIG. 35. Then, the plurality of charge holding regions FD1 and FD2 connected to the conductive pads 73*a* and 73*b* of the relay wiring is electrically connected to the readout circuit 15 illustrated in FIG. 35 via the conductive path 63 including the relay wiring 73, the contact electrode, and the wiring.

Each of the relay wiring 71, the conductive pad 72, the relay wiring 73, and the conductive pad 74 is not limited thereto, but includes, for example, a polycrystalline silicon film into which an impurity for reducing a resistance value is introduced.

As illustrated in FIG. 39, the conductive pad 74 is electrically and mechanically connected to the semiconductor regions arranged on both sides of the pixel isolation region 31 across the pixel isolation region 31 between the photoelectric conversion cell 22R$_3$ of the pixel 3*c*$_2$ and the photoelectric conversion cell 22R$_4$ of the pixel 3*d*$_2$ in the X direction. Specifically, the conductive pad 74 overlaps and is electrically and mechanically connected to the main electrode region 47 of the amplification transistor AMP arranged on the photoelectric conversion cell 22R$_3$ side of the pixel isolation region 31 and the main electrode region 47 of the amplification transistor AMP arranged on the photoelectric conversion cell 22R$_4$ side of the pixel isolation region 31.

Although not illustrated, the conductive pad 74 has a similar configuration to the above-described conductive pad 72. Then, in the conductive pad 74, the second reference potential is supplied from upper layer wiring to the conductive pad 72 via a contact electrode (conductive plug), and the potential of the plurality of main electrode regions 47 (n-type semiconductor regions) connected to the conductive pad 72 is fixed to the second reference potential, similarly to the conductive pad 72. In the conductive pad 74, the contact area between the main electrode region 47 and the conductive pad 72 increases, similarly to the above-described conductive pad 72.

As illustrated in FIG. 39, the amplification transistor AMP of the photoelectric conversion cell 22R$_3$ (pixel 3*c*$_2$) and the amplification transistor AMP of the photoelectric conversion cell 224 (pixel 3*d*$_2$) share the gate electrode 45*a* arranged over the photoelectric conversion cell 22R$_3$ and the photoelectric conversion cell 224 across the pixel isolation region 31 between the photoelectric conversion cell 22R$_3$ and the photoelectric conversion cell 224 in the X direction.

Figure 44:
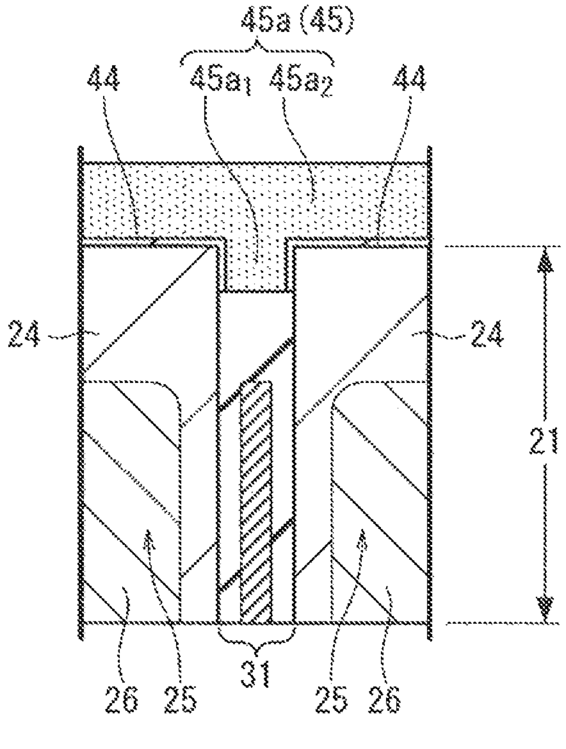
FIG. 44 is a schematic cross-sectional view illustrating a cross-sectional structure taken along line A39-A39 in FIG. 39.

As illustrated in FIG. 44, the gate electrode 45*a* includes a body 45*a*$_1$ adjacent to the p-type semiconductor region 24 via the gate insulating film 44 in the pixel isolation region 31, and a head 45*a*$_2$ protruding from the body 45*b*$_1$ to the outside of the pixel isolation region 31, adjacent to the p-type semiconductor region 24 via the gate insulating film 44, and wider than the body 45*a*$_1$.

<Main Effects of Nineteenth Embodiment>

Next, main effects of the nineteenth embodiment will be described.

In the solid-state imaging device 1H of the nineteenth embodiment, the element formation region 21*a* of each of the photoelectric conversion cells 22R$_1$, 22R$_2$, 22R$_3$, and 22R$_4$ extends over the first photoelectric conversion region 23L and the second photoelectric conversion region 23R, and crosses a region between the two in-pixel isolation regions 32 in plan view. Therefore, in the solid-state imaging device 1H according to the nineteenth embodiment, effects similar to those of the above-described solid-state imaging device 1A according to the nineteenth embodiment can be obtained.

Furthermore, in the solid-state imaging device 1H according to the present embodiment, the conductive pads 71*a* and 71*b* are electrically connected to the plurality of contact regions (p-type semiconductor regions) 48 arranged on both sides of the isolation region including the pixel isolation region 31 and the in-pixel isolation region 32 across the isolation region in each of the X direction and Y direction. In this case, by connecting one contact electrode to the conductive pads 71*a* and 71*b*, it is possible to supply a potential to the plurality of contact regions 48 connected to the conductive pads 71*a* and 71*b*. Thereby, it is not necessary to consider misalignment between the contact region 48 and a contact electrode for each contact region 48 as compared with a case where the contact electrode is connected for each of the plurality of contact regions 48. Therefore, it becomes possible to reduce a planar size (occupied area) of the contact region 48, and to increase the degree of freedom in arrangement of active elements including the pixel transistors Qt (AMP, SEL, and RST) and the transfer transistors TR1 and TR2 in the photoelectric conversion cells 22R$_1$, 22R$_2$, 22R$_3$, and 22R$_4$ (pixels 3*a*$_2$, 3*b*$_2$, 3*c*$_2$, and 3*d*$_2$).

Furthermore, since it is possible to increase the degree of freedom in arrangement of the active elements in the photoelectric conversion cells 22R$_1$, 22R$_2$, 22R$_3$, and 22R$_4$, it is possible to miniaturize the pixels 3*a*$_2$, 3*b*$_2$, 3*c*$_2$, and 3*d*$_2$ including the photoelectric conversion cells 22R$_1$, 22R$_2$, 22R$_3$, and 22R$_4$.

Furthermore, in the conductive pad 71*a*, the body 71*a*$_1$ is arranged in the pixel isolation region 31 such that the body 71*a*$_1$ and the head 71*a*$_2$ are in contact with the contact region 48, whereby the contact area between the contact electrode 48 and the conductive pad 71$a$ increases. Therefore, it becomes possible to reduce the contact resistance between the contact electrode and the conductive pad 71$a$, and to reduce the planar size of the contact region while ensuring the contact resistance between the contact electrode and the conductive pad 71$a$. Similarly, in the conductive pad 71$b$, it becomes possible to reduce the planar size of the contact region 48 while ensuring the contact resistance between the contact electrode and the conductive pad 71$b$.

Furthermore, the conductive pad 71$a$ and the conductive pad 71$b$ are electrically and mechanically connected via the coupling portion. Therefore, by connecting the contact electrode to one of the conductive pad 71$a$ and the conductive pad 71$b$, it is possible to supply a potential to the plurality of contact regions connected to the conductive pad 71$a$, and to supply a potential to the plurality of conductive pads connected to the conductive pad 71$b$. This increases the degree of freedom in routing the wiring in an upper wiring layer.

Furthermore, the conductive pad 72 is connected to the main electrode regions (semiconductor regions) 47 arranged on both sides of the pixel isolation region 31 across the pixel isolation region 31 between the photoelectric conversion cell 22$R_1$ of the pixel 3$a_2$ and the photoelectric conversion cell 22$R_2$ of the pixel 3$b_2$ in the Y direction. Thereby, in the conductive pad 72, it is not necessary to consider misalignment between the main electrode region 47 and the contact electrode for each main electrode region 47 as compared with a case where the contact electrode is connected for each main electrode region 47. Therefore, it becomes possible to reduce the planar size (occupied area) of the main electrode region 47, and to increase the degree of freedom in arrangement of active elements including the pixel transistors Qt (AMP, SEL, and RST) and the transfer transistors TR1 and TR2 in the photoelectric conversion cells 22$R_1$, 22$R_2$, 22$R_3$, and 22$R_4$ (pixels 3$a_2$, 3$b_2$, 3$c_2$, and 3$d_2$).

The conductive pad 72 has a shape having the body 72$a$ and the head 72$b$ with a wide width, similarly to the above-described conductive pads 71$a$ and 71$b$. Therefore, the body 72$a$ is arranged in the pixel isolation region 31 such that the body 72$a$ and the head 72$b$ are in contact with the main electrode region 47, whereby the contact area between the main electrode region 47 and the conductive pad 72 increases. Therefore, it becomes possible to reduce the contact resistance between the main electrode region 47 and the conductive pad 72, and to reduce the planar size of the main electrode region 47 while ensuring the contact resistance between the main electrode region 47 and the conductive pad 72.

Furthermore, the conductive pads 73$a$ and 73$b$ are connected to the plurality of charge holding regions (n-type semiconductor regions) FD1 and FD2 arranged on both sides of the isolation region including the pixel isolation region 31 and the in-pixel isolation region 32 across the isolation region in each of the X direction and Y direction. Thereby, in the conductive pads 73$a$ and 73$b$, it is not necessary to consider misalignment between the charge holding regions FD1 and FD2 and the contact electrode for each of the charge holding regions FD1 and FD2 as compared with a case where the contact electrode is connected for each of the plurality of charge holding regions FD1 and FD2, similarly to the above-described conductive pads 71$a$ and 71$b$. Therefore, it becomes possible to reduce the planar size (occupied area) of the charge holding regions FD1 and FD2, and to increase the degree of freedom in arrangement of active elements including the pixel transistors Qt (AMP, SEL, and RST) and the transfer transistors TR1 and TR2 in the photoelectric conversion cells 22$R_1$, 22$R_2$, 22$R_3$, and 22$R_4$ (pixels 3$a_2$, 3$b_2$, 3$c_2$, and 3$d_2$). Furthermore, since it is possible to increase the degree of freedom in arrangement of the active elements in the photoelectric conversion cells 22$R_1$, 22$R_2$, 22$R_3$, and 22$R_4$, it is possible to miniaturize the pixels 3$a_2$, 3$b_2$, 3$c_2$, and 3$d_2$ including the photoelectric conversion cells 22$R_1$, 22$R_2$, 22$R_3$, and 22$R_4$.

That is, since the conductive pad 73$a$ has a shape having the body 73$a_1$ and the head 7$a_2$ with a wide width, similarly to the above-described conductive pads 71$a$ and 71$b$, the body 73$a_1$ is arranged in the pixel isolation region 31 such that the body 73$a_1$ and the head 73$a_2$ are in contact with the charge holding regions FD1 and FD2, whereby the contact area between the charge holding regions FD1 and FD2 and the conductive pad 73$a$ increases. Therefore, it becomes possible to reduce the contact resistance between the charge holding regions FD1 and FD2 and the conductive pad 73$a$, and to reduce the planar size of the charge holding regions FD1 and FD2 while ensuring the contact resistance between the contact electrode and the conductive pad 73$a$. Similarly, in the conductive pad 73$b$, it becomes possible to reduce the planar size of the contact region 48 while ensuring the contact resistance between the charge holding regions FD1 and FD2 and the conductive pad 73$a$.

Furthermore, the conductive pad 73$a$ and the conductive pad 73$b$ are electrically connected via the coupling portion 73$c$. Therefore, by connecting the contact electrode to one of the conductive pad 73$a$ and the conductive pad 73$b$, it is possible to supply a potential to the plurality of charge holding regions FD1 and FD2 connected to the conductive pad 73$a$, and to supply a potential to the plurality of charge holding regions FD1 and FD2 connected to the conductive pad 73$b$. This increases the degree of freedom in routing the wiring in an upper wiring layer.

Furthermore, the amplification transistor AMP of the photoelectric conversion cell 22$R_3$ (pixel 3$c_2$) and the amplification transistor AMP of the photoelectric conversion cell 224 (pixel 3$d_2$) share the gate electrode 45$a$ across the pixel isolation region 31 in the X direction. Therefore, the contact electrode can be connected to the gate electrode 45$a$ on the pixel isolation region 31, and the degree of freedom in wiring in an upper wiring layer is increased.

Furthermore, the gate electrode 45$a$ has a shape having the body 72$a$ and the head 72$b$ with a wide width. Therefore, by arranging the body 72$a$ in the pixel isolation region 31 such that the body 72$a$ and the head 72$b$ face the p-type semiconductor region via the gate insulating film, it becomes possible to increase a gate width Wg of the amplification transistor AMP, and to reduce noise without increasing the planar size of the amplification transistor AMP.

Furthermore, by combining the arrangement of the element formation region 21$a$ and the connection form of any one of the conductive pads 71$a$, 71$b$, 72, 73$a$, and 73$b$, it becomes possible to further increase the degree of freedom in arrangement of the active elements and to further miniaturize the pixel 3 including the photoelectric conversion cell.

Furthermore, by increasing the degree of freedom in arrangement of the active elements in the photoelectric conversion cell, it becomes possible to increase a volume of the photoelectric conversion unit in the plane size of the same pixel 3, and to improve a saturation signal amount Qs.

Figure 45:
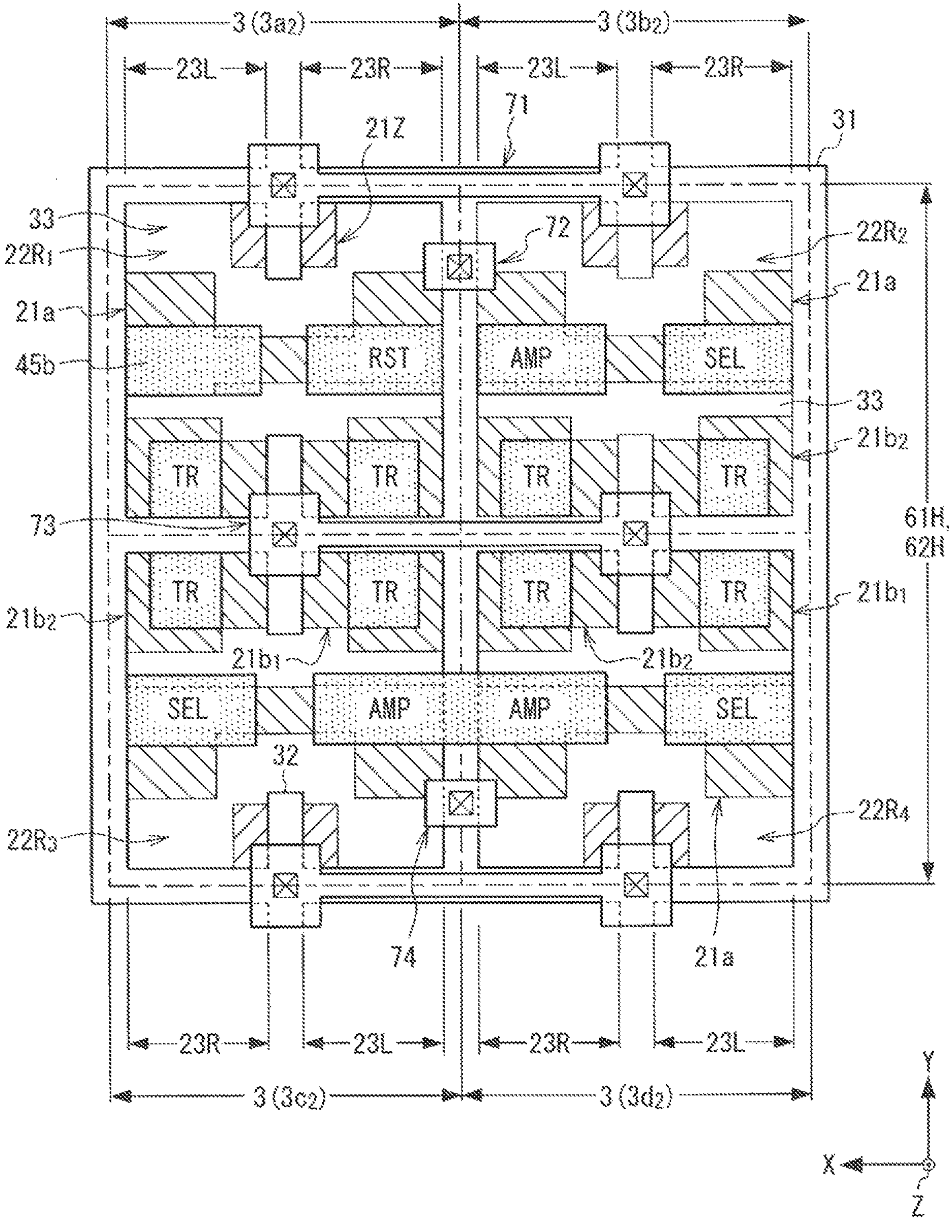
FIG. 45 is a schematic plan view of a pixel block illustrating a modification according to the nineteenth embodiment of the present technology.

Note that, in the above-described nineteenth embodiment, the arrangement of the pixel transistors on the first photoelectric conversion region 23L side is omitted in the photoelectric conversion cell 22$R_1$ of the pixel 3$a_2$, but in order to ensure layout symmetry, a dummy gate electrode 45$b$ may be provided on the first photoelectric conversion region 23L side of the photoelectric conversion cell 22$R_1$, as illustrated in FIG. 45 of the modification.

Furthermore, a switching transistor may be arranged on the first photoelectric conversion region 23L side of the photoelectric conversion cell 22$R_1$ depending on the element configuration of the readout circuit.

Twentieth Embodiment

In a twentieth embodiment, a connection state between wiring of a first wiring layer and conductive pads will be described.

Figure 46:
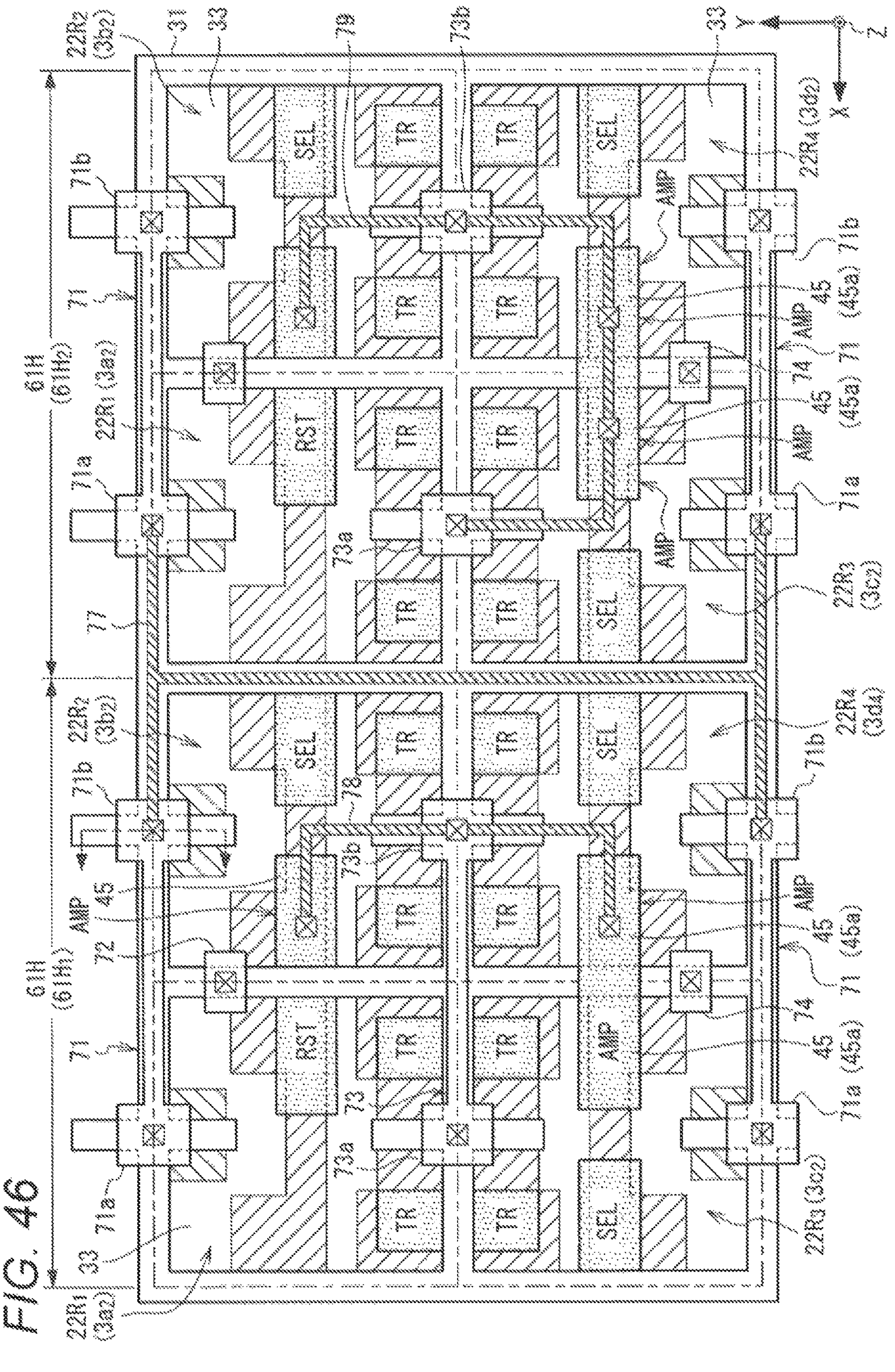
FIG. 46 is a schematic plan view of a pixel block of a solid-state imaging device according to a twentieth embodiment of the present technology.

FIG. 46 is a diagram in which two pixel blocks 61H illustrated in FIG. 36 are arranged in an X direction. Note that relay wiring 73 is provided in one pixel block 61$H_1$, whereas conductive pads 73*a* and 73*b* are independently provided in the other pixel block 51$H_2$ instead of the relay wiring 73, of the two pixel blocks 61H.

Figure 47:
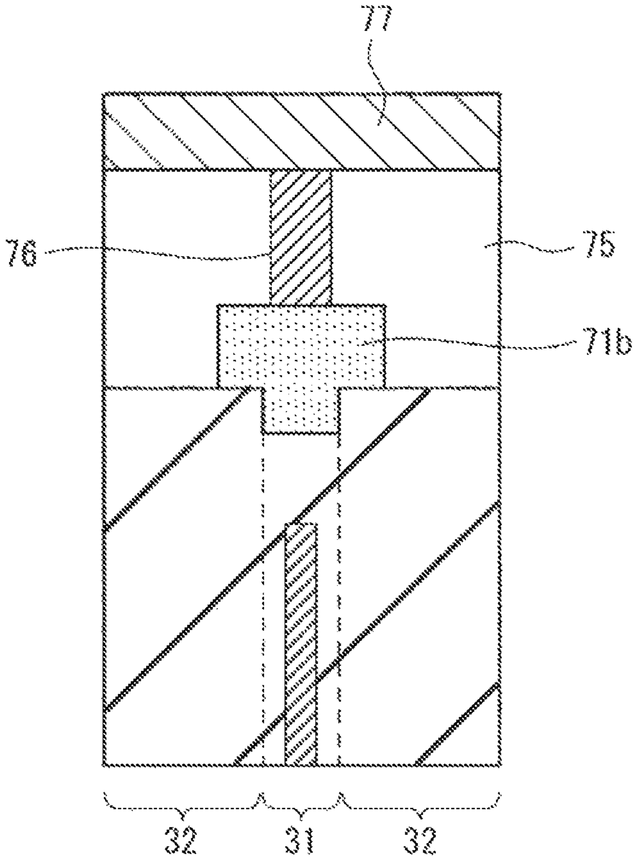
FIG. 47 is a schematic cross-sectional view illustrating a cross-sectional structure taken along line A46-A46 in FIG. 46.

As illustrated in FIG. 46, wiring 77, wiring 78, and wiring 79 are routed to the two pixel blocks 61$H_1$ and 61$H_2$. As illustrated in FIG. 47, the wiring 77 is provided on a first wiring layer on an interlayer insulating film 75. Although not illustrated, similarly, the wiring 78 and the wiring 79 are also provided in the first wiring layer.

As illustrated in FIG. 46, the wiring 77 extends along a Y direction on a pixel isolation region 31 between the pixel block 61$H_1$ and the pixel block 61$H_2$. Furthermore, the wiring 77 extends along the X direction on the pixel isolation region 31 extending in the X direction across the two pixel blocks 61H (61$H_1$ and 61$H_2$).

Then, as illustrated in FIG. 47, the wiring 77 is electrically and mechanically connected to a conductive pad 71*b* via a contact electrode (conductive plug) 76 embedded in the interlayer insulating film 75 on the pixel isolation region 31. Furthermore, although not illustrated in detail, the wiring 77 is electrically connected to the conductive pad 71*b* via a contact electrode 76 embedded in the interlayer insulating film 75 on the pixel isolation region 31. The contact electrode 76 is favorably connected to the conductive pad 71*b* at a position where at least a part of the contact electrode overlaps the pixel isolation region 31 on a plane, as illustrated in FIG. 47. As described above, the wiring 77 is connected to the conductive pad 71*b* via the contact electrode 76 on the pixel isolation region 31 that is originally a dead space, so that the degree of freedom in wiring routing is increased.

As illustrated in FIG. 46, the wiring 78 is arranged in one pixel block 61$H_1$. The wiring 78 crosses a conductive pad 73*b* in the Y direction in plan view, and extends on two photoelectric conversion cells 22$R_2$ and 22$R_4$ (on pixels 3$b_2$ and 3$d_2$) arrayed in the Y direction. Then, the wiring 78 is electrically connected to the conductive pad 73*b* via the contact electrode 76 on the pixel isolation region 31, similarly to the conductive pad 71*b*, although not illustrated in detail. Then, the wiring 78 is bent from one end on the photoelectric conversion cell 22$R_2$ side of a portion extending in the Y direction toward a photoelectric conversion cell 22$R_1$ side, and extends on a gate electrode 45 of an amplification transistor AMP in the photoelectric conversion cell 22$R_2$. Then, the wiring 78 is electrically connected to the gate electrode 45 of the amplification transistor AMP arranged in the photoelectric conversion cell 22$R_2$ via a contact electrode, although not illustrated. Furthermore, the wiring 78 is bent from the other end on the photoelectric conversion cell 22$R_4$ side of a portion extending in the Y direction toward a photoelectric conversion cell 22$R_3$ side, and extends on the gate electrode 45 of the amplification transistor AMP in the photoelectric conversion cell 22$R_4$. Then, the wiring 78 is electrically connected to the gate electrode 45 of the amplification transistor AMP arranged in the photoelectric conversion cell 22$R_4$ via a contact electrode, although not illustrated.

As described above, the wiring 78 is connected to the conductive pad 73*b* via the contact electrode on the pixel isolation region 31 that is originally a dead space, so that the degree of freedom in routing the wiring 78 is increased.

As illustrated in FIG. 46, the wiring 79 is arranged in the other pixel block 61$H_2$. The wiring 79 crosses the pad 73*b* in plan view, and extends on the two photoelectric conversion cells 22$R_2$ and 22$R_4$ (on pixels 3$b_2$ and 3$d_2$) arrayed in the Y direction. Then, the wiring 79 is electrically and mechanically connected to the conductive pad 73*b* via the contact electrode 76 on the pixel isolation region 31, similarly to the conductive pad 71*b*, although not illustrated in detail. Then, the wiring 79 is bent from one end on the photoelectric conversion cell 22$R_2$ side of a portion extending in the Y direction toward the photoelectric conversion cell 22$R_1$ side, and extends on the gate electrode 45 of the amplification transistor AMP in the photoelectric conversion cell 22$R_2$. Then, the wiring 79 is electrically connected to the gate electrode 45 of the amplification transistor AMP arranged in the photoelectric conversion cell 22$R_2$ via a contact electrode, although not illustrated. Furthermore, the wiring 79 is bent from the other end on the photoelectric conversion cell 22$R_4$ side of a portion extending in the Y direction toward the photoelectric conversion cell 22$R_3$ side, and extends on the gate electrode 45 of the amplification transistor AMP of each of the photoelectric conversion cells 22$R_4$ and 22$R_3$. Then, the wiring 79 is electrically connected to the gate electrode 45 of the amplification transistor AMP arranged in each of the photoelectric conversion cells 22$R_4$ and 22$R_3$ via a contact electrode, although not illustrated.

Furthermore, the wiring 79 is bent from one end on the photoelectric conversion cell 22$R_3$ side of a portion extending over the photoelectric conversion cells 22$R_3$ and 22$R_4$ toward the photoelectric conversion cell 22$R_1$ side, and is terminated on the conductive pad 73*a*. Then, the wiring 79 is electrically connected to the conductive pad 73*a* via the contact electrode 76 on the pixel isolation region 31, similarly to the conductive pad 71*b*, although not illustrated in detail.

As described above, the wiring 79 is connected to the conductive pad 73*b* via the contact electrode on the pixel isolation region 31, which is originally a dead space, and the wiring 79 is connected to the conductive pad 73*a* via the contact electrode on the pixel isolation region 31, so that the degree of freedom in routing the wiring 79 is increased.

Twenty-First Embodiment

Figure 48:
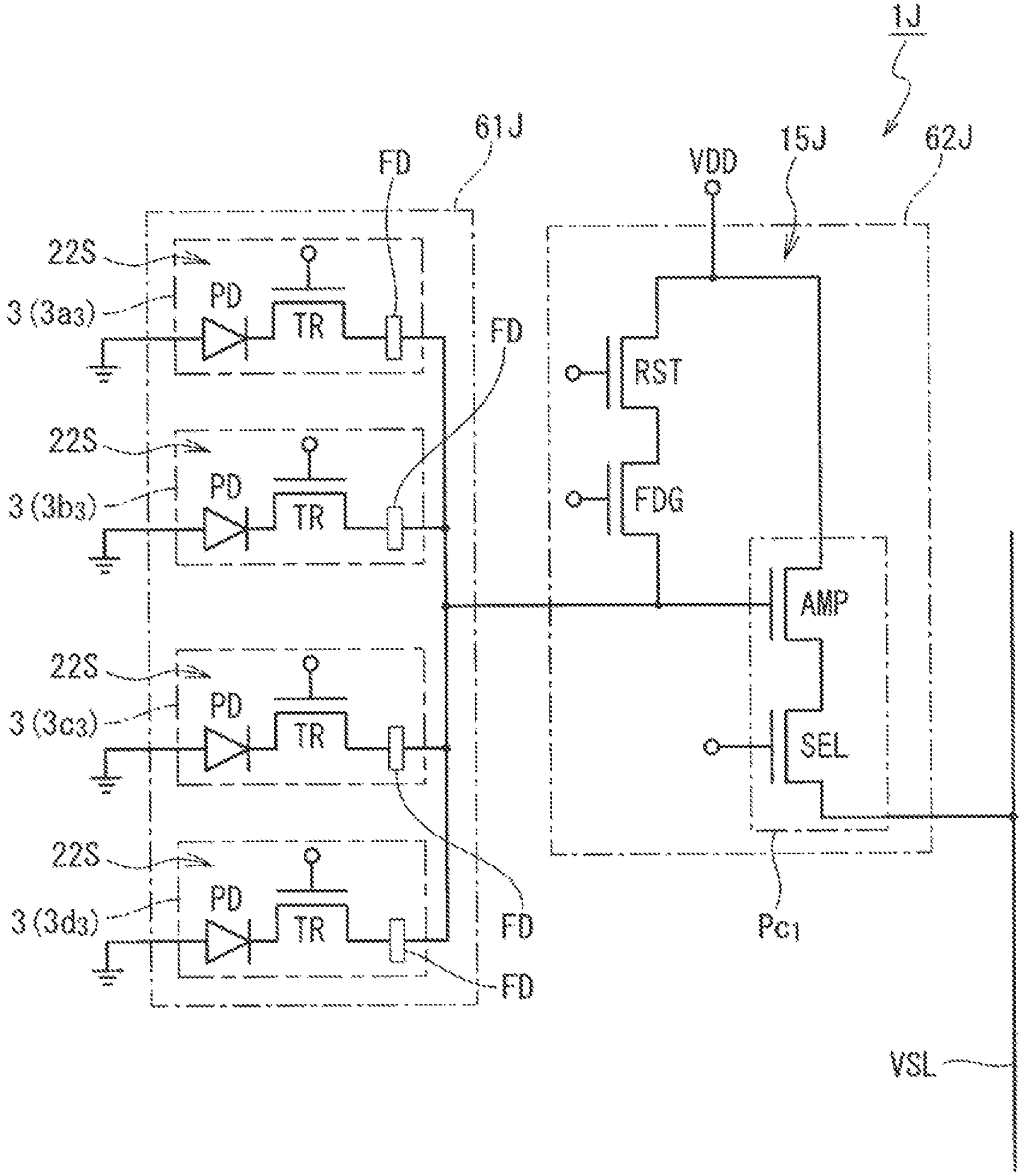
FIG. 48 is an equivalent circuit diagram illustrating a configuration example of a pixel block and a readout circuit of a solid-state imaging device according to a twenty-first embodiment of the present technology.
Figure 49:
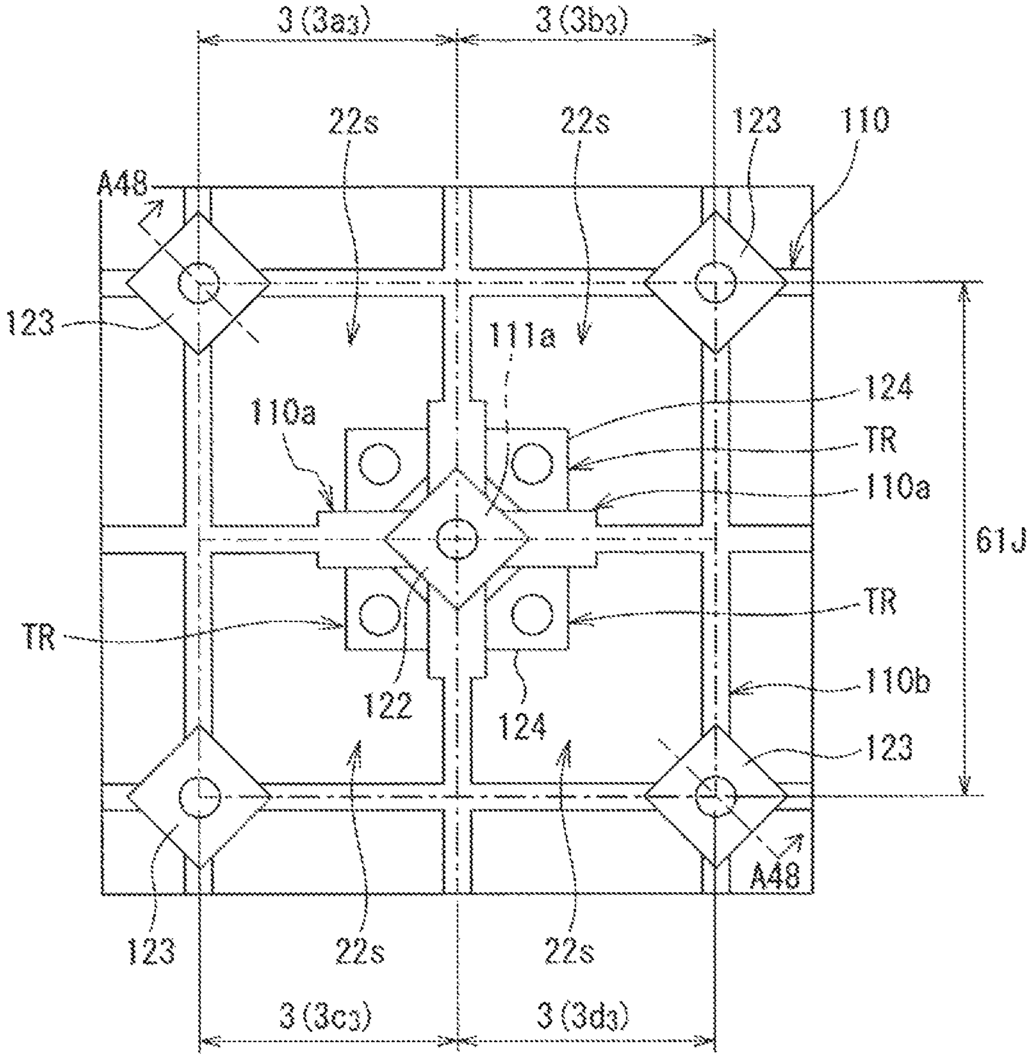
FIG. 49 is a schematic plan view of a pixel block of the solid-state imaging device according to the twenty-first embodiment of the present technology.

A solid-state imaging device 1J according to a twenty-first embodiment of the present technology includes a pixel block 61J and a readout circuit 15J illustrated in FIGS. 48 and 49. As illustrated in FIG. 49, the pixel block 61J includes a plurality of pixels 3. In the twenty-first embodiment, the pixel block 61J includes, but is not limited to, four pixels 3 (3$a_3$, 3$b_3$, 3$c_3$, and 3$d_3$) arranged in a 2×2 array of two in an X direction and two in a Y direction in plan view, for example. Although FIG. 49 mainly illustrate one pixel block 61J, the pixel block 61J is repeatedly arranged in each of the X direction and the Y direction.

As illustrated in FIG. 48, each of the four pixels 3$a_3$, 3$b_3$, 3$c_3$, and 3$d_3$ includes a photoelectric conversion cell 22S.

The photoelectric conversion cell 22S includes a photoelectric conversion element PD, a charge holding region (floating diffusion) FD that holds (accumulates) a signal charge photoelectrically converted by the photoelectric conversion element PD, and a transfer transistor TR that transfers the signal charge photoelectrically converted by the photoelectric conversion element PD to the charge holding region FD. The photoelectric conversion cell 22S of the embodiment includes one photoelectric conversion region 22S unlike the above-described photoelectric conversion cell 22A of the first embodiment.

The photoelectric conversion element PD generates the signal charge corresponding to an amount of received light. In the photoelectric conversion element PD, a cathode side is electrically connected to a source region of the transfer transistor TR, and an anode side is electrically connected to a reference potential line (for example, ground). As the photoelectric conversion element PD, for example, a photodiode is used.

A drain region of the transfer transistor TR is electrically connected to the charge accumulation region FD. A gate electrode of the transfer transistor TR is electrically connected to a transfer transistor drive line of a pixel drive line 10 (see FIG. 2). The charge accumulation region FD temporarily accumulates and holds the signal charge transferred from the photoelectric conversion element PD via the transfer transistor TR.

As illustrated in FIG. 48, an input stage of the readout circuit 15J is connected to the charge holding region FD of each of the four pixels $3a_3$, $3b_3$, $3c_3$, and $3d_3$. The readout circuit 15J reads the signal charge held in the charge holding region FD of each of the four pixels $3a_3$, $3b_3$, $3c_3$, and $3d_3$, and outputs a pixel signal based on the signal charge. The readout circuit 15J is shared by the four pixels $3a_3$, $3b_3$, $3c_3$, and $3d_3$ (four photoelectric conversion cells 22S) included in one pixel block 61J, and is provided for each pixel block 61J.

The readout circuit 15J includes, but is not limited to, a switching transistor FDG, a reset transistor RST, and one amplification stage cell $Pc_1$. The readout circuit 15J basically has a similar configuration to the above-described readout circuit 15C illustrated in FIG. 25 of the fourteenth embodiment, and the number of amplification stage cells is different.

Figure 50:
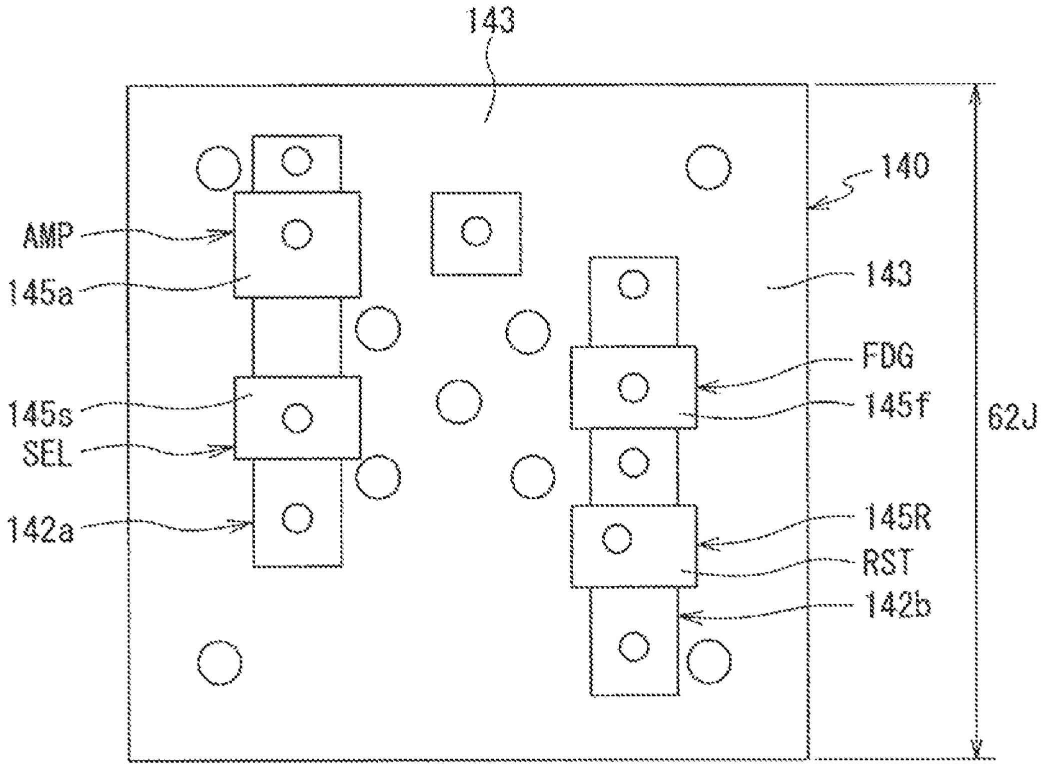
FIG. 50 is a schematic plan view of a circuit block of the solid-state imaging device according to the twenty-first embodiment of the present technology.

The readout circuit 15J includes pixel transistors included in the circuit block 62J illustrated in FIG. 50. The circuit block 62J includes the switching transistor FDG, the reset transistor RST, an amplification transistors AMP, and a selection transistors SEL arranged for one pixel block 61J, unlike the above-described circuit block 62C illustrated in FIG. 25 of the fourteenth embodiment. Then, as will be described in detail below, these pixel transistors (FDG, RST, AMP, and SEL) are provided in a semiconductor layer 140 laminated on a semiconductor layer 101 including the photoelectric conversion element PD and the transfer transistor TR via an insulating layer 130.

<<Specific Configuration of Solid-State Imaging Device>>

Next, a specific configuration of the solid-state imaging device 1J of the embodiment will be described.

Figure 52:
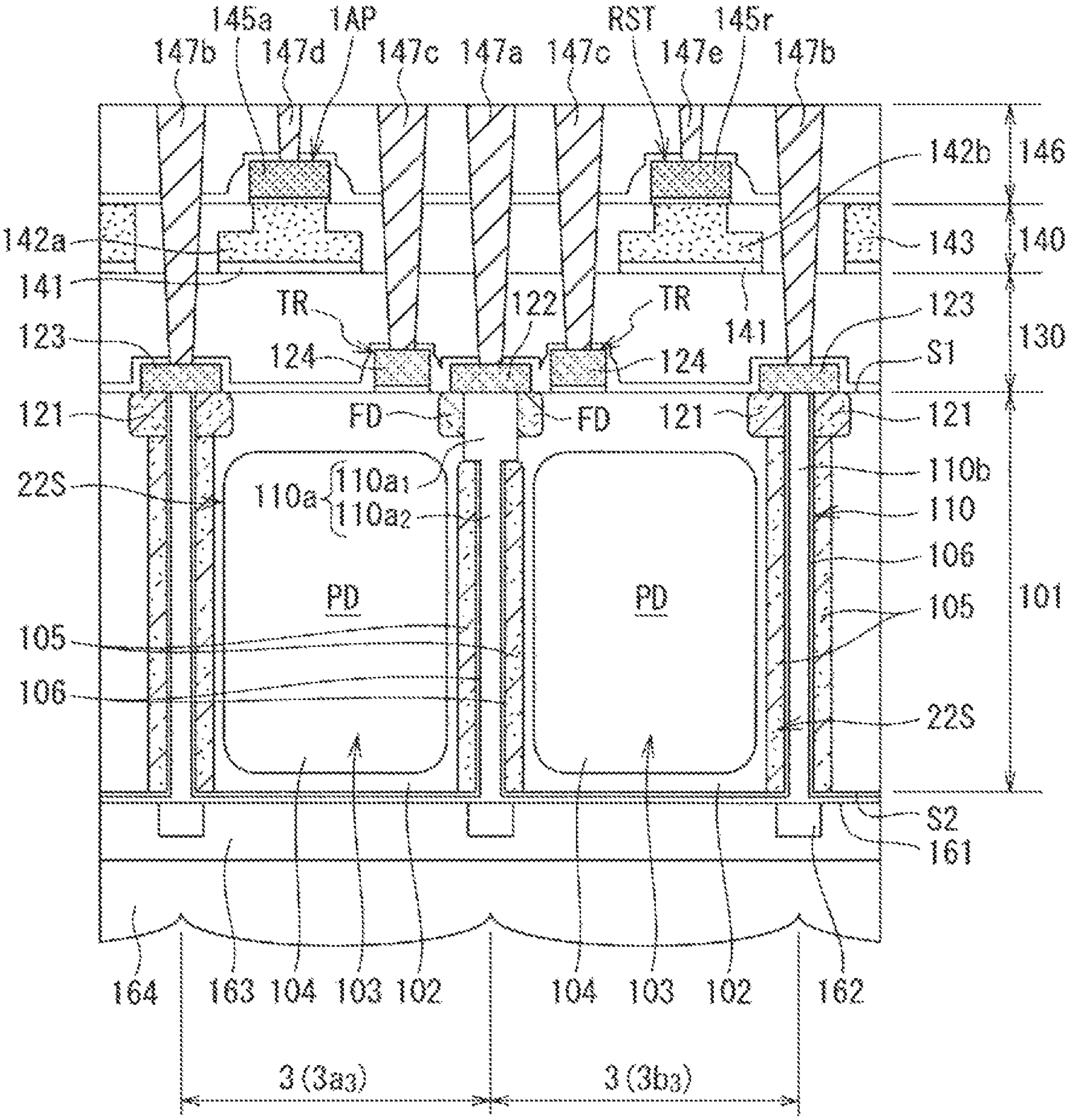
FIG. 52 is a schematic cross-sectional view illustrating a cross-sectional structure taken along line A49-A49 in FIG. 49.

As illustrated in FIG. 52, the solid-state imaging device 1J includes the semiconductor layer 101 having a first surface S1 and a second surface S2 located on opposite sides in a thickness direction, and a photoelectric conversion cell 22S partitioned by an isolation region 110 and provided in the semiconductor layer 101.

Furthermore, the solid-state imaging device 1J includes the semiconductor layer 140 laminated on the first surface S1 side of the semiconductor layer 101 via the insulating layer 1300. Furthermore, the solid-state imaging device 1J includes, on the second surface S2 side of the semiconductor layer 101, a planarization film 161, a light-shielding film 162, a color filter 163, and a microlens 164 sequentially laminated from the second surface S2 side.

The planarization film 161 is provided on the second surface S2 side of the semiconductor layer 101 so as to cover the second surface S2 of the semiconductor layer 101, and planarizes the second surface S2 side of the semiconductor layer 101. In the light-shielding film 162, a planar pattern in plan view is a lattice-shaped planar pattern so as to partition adjacent pixels 3.

The color filter 163 and the microlens 164 are provided for each pixel 3. The color filter 163 separates colors of incident light incident from the light incident surface side of the semiconductor layer 101. The microlens 164 condenses irradiation light and allows the condensed light to efficiently enter the pixel 3.

Here, the first surface S1 of the semiconductor layer 101 may be referred to as an element formation surface or a main surface, and the second surface S2 side may be referred to as the light incident surface or a back surface. The solid-state imaging device 1J of the embodiment uses a photoelectric conversion unit 103 (photoelectric conversion element PD) provided in the semiconductor layer 101 to photoelectrically convert light incident from the second surface (light incident surface or back surface) S2 side of the semiconductor layer 101. The semiconductor layer 101 includes, for example, a p-type semiconductor substrate containing single crystal silicon.

<Isolation Region>

As illustrated in FIG. 52, the isolation region 110 extends from the first surface S1 side toward the second surface S2 side of the semiconductor layer 101, and electrically and optically isolates the pixels 3 adjacent to each other in a two-dimensional plane. Although not limited thereto, the isolation region 110 has, for example, a trench isolation structure in which an insulating film is embedded in a groove extending from the first surface S1 toward the second surface S2 of the semiconductor layer 101. In the embodiment, the isolation region 110 extends over, for example, but not limited to, the first surface S1 and the second surface S2 of the semiconductor layer 101.

As illustrated in FIG. 49, the isolation region 110 corresponding to one pixel 3 (one photoelectric conversion cell 22S) has an annular planar pattern (ring-shaped planar pattern) having a rectangular planar shape in plan view. Then, the isolation region 110 corresponding to the four pixels 3 ($3a_3$, $3b_3$, $3c_3$, and $3d_3$) of the pixel block 61J has a composite planar pattern having a lattice-shaped planar pattern in a rectangular annular planar pattern surrounding a periphery of the four pixels 3 in plan view.

As illustrated in FIG. 52, the photoelectric conversion cell 22S is provided for each pixel 3. FIG. 52 illustrates the two pixels $3a_3$ and $3b_3$ among the four pixels $3a_3$, $3b_3$, $3c_3$, and $3d_3$ included in one pixel block 61J illustrated in FIG. 49.

As illustrated in FIG. 52, the photoelectric conversion cell 22S has a p-type semiconductor region 102. Furthermore, the photoelectric conversion cell 22S includes the transfer transistor TR, the charge holding region FD, and a contact region 121 on the first surface S1 side of the semiconductor layer 101, and includes the photoelectric conversion unit 103 on the second surface S2 side of the semiconductor layer 101. Furthermore, the photoelectric conversion cell 22S includes a p-type semiconductor region 105 and a pinning film 106.

<Photoelectric Conversion Unit>

The photoelectric conversion unit 103 is surrounded by the p-type semiconductor region 102. The photoelectric conversion unit 103 includes an n-type semiconductor region 104. Then, the photoelectric conversion unit 103 constitutes the above-described photoelectric conversion element PD.

<p-Type Semiconductor Region>

As illustrated in FIG. 52, the p-type semiconductor region 102 is provided between the photoelectric conversion unit 103 and the first surface S1 of the semiconductor layer 101, and between the photoelectric conversion unit 103 and the second surface S2 of the semiconductor layer 101. Furthermore, the p-type semiconductor region 102 is also provided between the photoelectric conversion unit 103 and the isolation region 110.

<Transfer Transistor>

As illustrated in FIG. 52, the transfer transistor TR includes a gate electrode 124 provided on the first surface S1 side of the semiconductor layer 101 via a gate insulating film, a channel formation region in which a channel is formed in the p-type semiconductor region 102 immediately below the gate electrode 124, the photoelectric conversion unit 103 that functions as a source region, and the charge holding region FD that functions as a drain region. The gate insulating film includes, for example, a silicon oxide film. The gate electrode 124 includes, for example, a polycrystalline silicon film into which an impurity for reducing a resistance value is introduced. The transfer transistor TR is a field effect transistor, and includes, for example, a MOSFET. The transfer transistor TR may include a MISFET.

As illustrated in FIG. 49, the transfer transistor TR of each of the four photoelectric conversion cells 22S (pixels $3a_3$, $3b_3$, $3c_3$, and $3d_3$) included in the pixel block 61J is arranged to be biased toward a corner side from a center of each of the photoelectric conversion cells 22S (pixels $3a_3$, $3b_3$, $3c_3$, and $3d_3$) in plan view. Then, the respective transfer transistors TR of the four photoelectric conversion cells 22S are arranged to be biased toward a central portion side surrounded by the four photoelectric conversion cells 22S (four pixels $3a_3$, $3b_3$, $3c_3$, and $3d_3$) in a 2×2 array. That is, the gate electrodes 124 of the transfer transistors TR of the four pixels 3 (the four pixels $3a_3$, $3b_3$, $3c_3$, and $3d_3$) are adjacent to each other in the X direction and the Y direction.

<Charge Holding Region>

As illustrated in FIG. 52, the charge holding region FD is provided in the p-type semiconductor region 102 on the first surface S1 side of the semiconductor layer 101, and is separated from the photoelectric conversion unit 103 via the p-type semiconductor region 102. The charge holding region FD includes, for example, an n-type semiconductor region having an impurity concentration higher than the photoelectric conversion unit 103. The charge holding region FD holds charges and reduces ohmic contact resistance with a conductive pad 122 to be described below.

Figure 51:
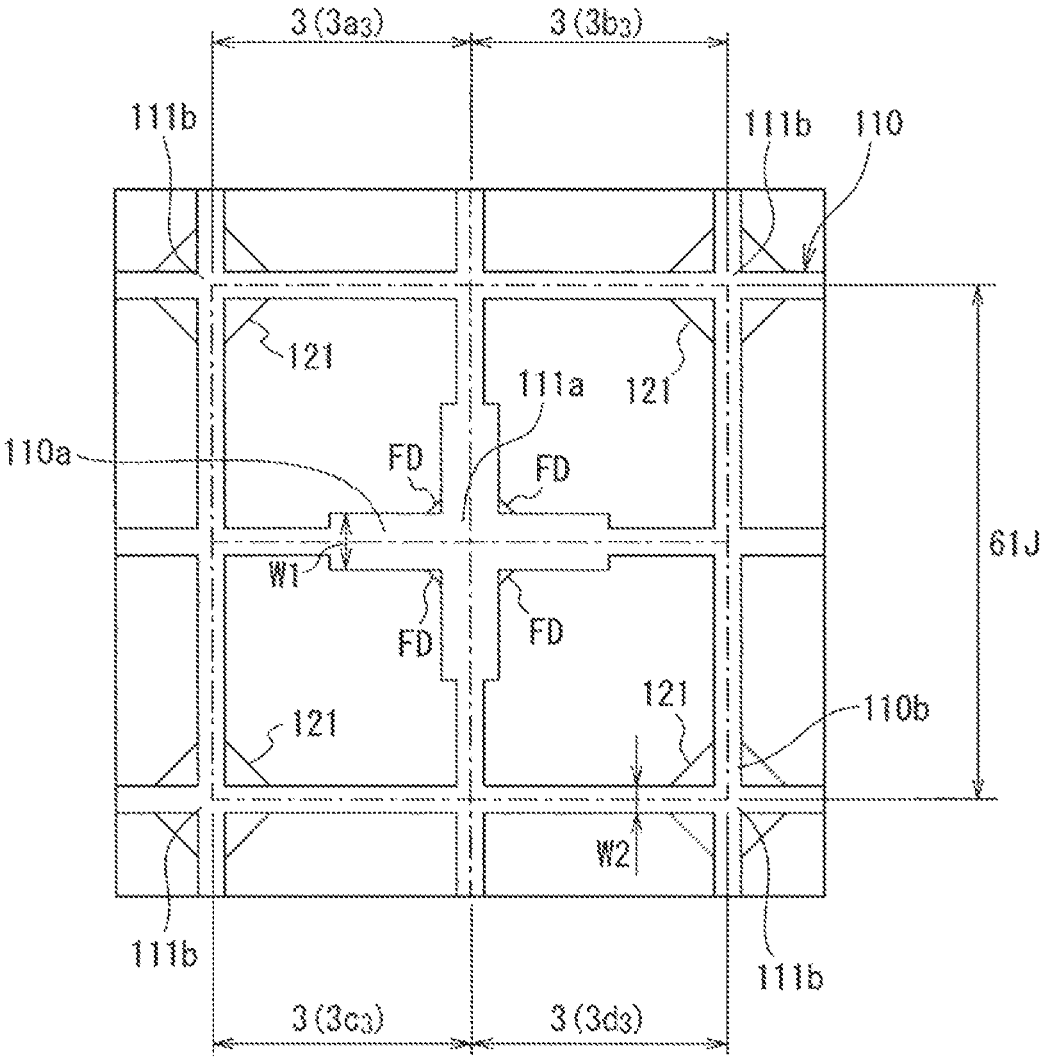
FIG. 51 is a schematic plan view illustrating arrangement of a charge holding region and a contact region of the circuit block of the solid-state imaging device according to the twenty-first embodiment of the present technology.

As illustrated in FIG. 51, the charge holding region FD is provided in contact with a first intersection 111*a* located in the central portion of the pixel block 61J having the four pixels 3 (four photoelectric conversion cells 22S) as one unit among intersections where the isolation region 110 extending in the X direction and the isolation region 110 extending in the Y direction intersect. That is, the respective charge holding regions FD of the four pixels 3 included in the pixel block 61J are arranged so as to surround the first intersection 111*a*, and are adjacent to one another via the isolation region 110 in plan view.

<Contact Region>

As illustrated in FIG. 52, the p-type contact region 121 is provided in the p-type semiconductor region 102 on the first surface S1 side of the semiconductor layer 101, and is electrically connected to the p-type semiconductor region 102. The contact region 121 includes a p-type semiconductor region having a higher impurity concentration than the p-type semiconductor region 102, and reduces ohmic contact resistance with a conductive pad 123 to be described below.

As illustrated in FIG. 51, the p-type contact region 121 is provided in contact with a second intersection 111*b* located at the corner portion of the pixel block 61J having the four pixels 3 (four photoelectric conversion cells 22S) as one unit among the intersections where the isolation region 110 extending in the X direction and the isolation region 110 extending in the Y direction intersect. That is, the respective contact regions 121 of the four pixels 3 included in the pixel block 61J are arranged so as to surround the second intersection 111*b*, and are adjacent to one another via the isolation region 110 in plan view.

As illustrated in FIGS. 49 and 52, in the pixel block 61J, the above-described conductive pad 122 is electrically and mechanically connected to, across the first intersection 111*a* of the isolation region 110, the respective charge holding region FD of the four photoelectric conversion cells 22S arranged via the first intersection 111*a* of the isolation region 110. Furthermore, at corners of in the pixel block 61J, the above-described conductive pad 123 is electrically and mechanically connected to, across the second intersection 111*b* of the isolation region 110, the respective contact regions 121 of the four photoelectric conversion cells 22S arranged via the second intersection 111*b* of the isolation region 110. Each of the conductive pads 122 and 123 includes, for example, a polycrystalline silicon film into which an impurity for reducing a resistance value is introduced.

As illustrated in FIG. 51, the isolation region 110 has a first portion 110*a* that includes contact with the charge holding region FD in plan view, and a second portion 110*b* that includes contact with the contact region 121 and has a width W2 narrower than a width W1 of the first portion 110*a*. The first portion 110*a* of the isolation region 110 is configured to be longer than a portion in contact with the charge holding region FD in plan view, and protrudes in an extending direction than the portion in contact with the charge holding region FD. A ratio between the first portion 110*a* and the second portion 110*b* of the isolation region 110 is larger in the second portion 110*b* in a circulation planar pattern surrounding one photoelectric conversion cell 22S.

Figure 53:
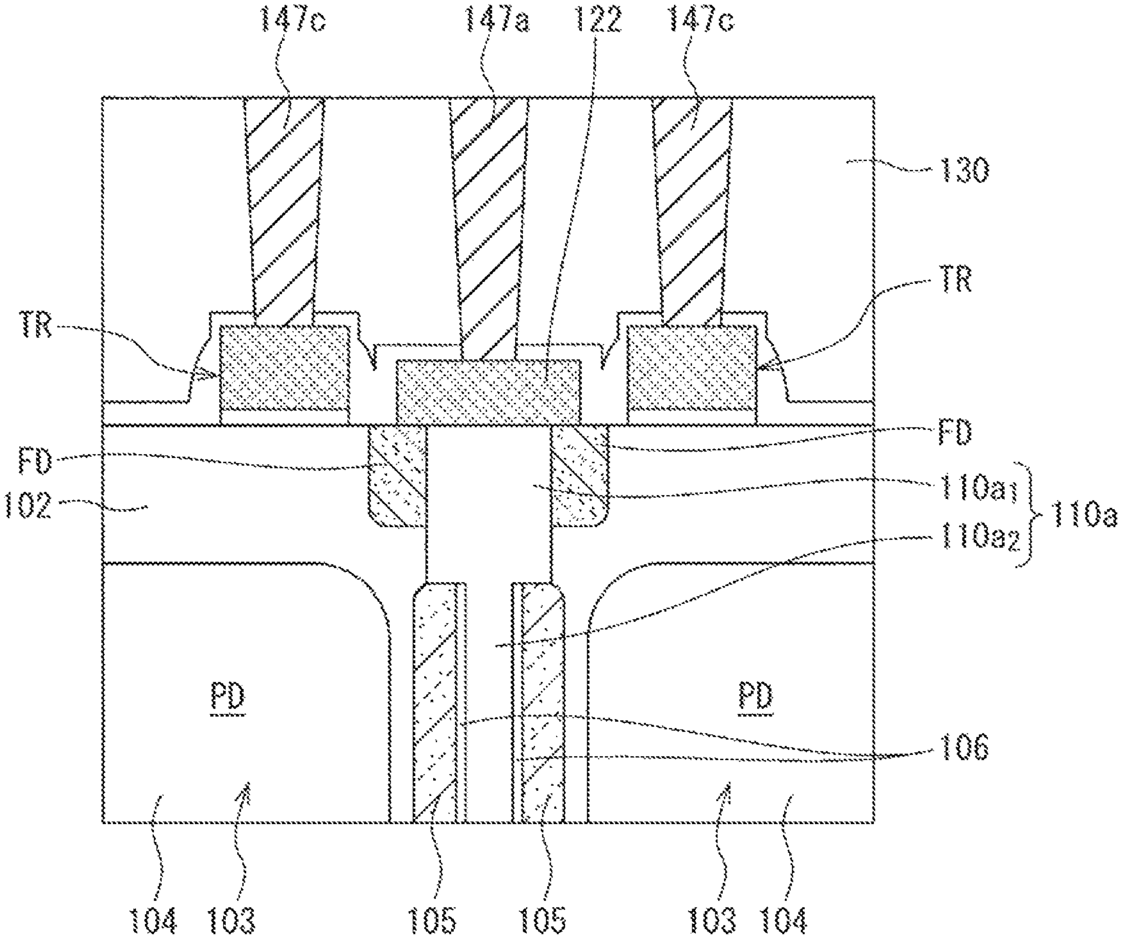
FIG. 53 is a schematic cross-sectional view in which a part of FIG. 52 is enlarged.

As illustrated in FIG. 53, the first portion 110*a* of the isolation region 110 includes a head (surface portion) $110a_1$ provided on the first surface S1 side of the semiconductor layer 101 and a body (deep layer portion) $110a_2$ provided in contact with the head $110a_1$ at a position deeper than the head $110a_1$ in the thickness direction (Z direction) of the semiconductor layer 101 and narrower in width than the head $110a_1$. The head $110a_1$ is longer, that is, deeper than the charge holding region FD in a depth direction of the semiconductor layer 101.

As illustrated in FIG. 52, the p-type semiconductor region 105 extends along a sidewall of the isolation region 110 in the depth direction of the semiconductor layer 101 and is in contact with the p-type semiconductor region 102. Then, in the first portion 110*a* of the isolation region 110, the p-type semiconductor region 105 extends from a step portion between the head $110a_1$ and the body $110a_2$ toward the second surface S2 of the semiconductor layer 101, and in the second portion 110*b*, the p-type semiconductor region 105 is in contact with the contact region 121 and extends from the contact region 121 toward the second surface S2 of the semiconductor layer 101. That is, the p-type semiconductor region 105 extends in the depth direction of the semiconductor layer 101 while being adjacent to each of the body 110*a*$_2$ of the first portion 110*a* and the second portion 110*b*. The p-type semiconductor region 105 surrounds the photoelectric conversion unit 103 in plan view and functions as a pinning layer that controls generation of dark current. The p-type semiconductor region 105 has a higher impurity concentration than the p-type semiconductor region 102 and has a lower impurity concentration than the p-type contact region 121.

As illustrated in FIGS. 52 and 53, the pinning film 106 is interposed between the isolation region 110, and the p-type semiconductor region and the p-type contact region, and controls generation of dark current. As the pinning film 106, for example, hafnium oxide ($HfO_2$), tantalum oxide ($Ta_2O_5$), or the like can be used.

Note that the pinning film 106 is provided in the embodiment, but in a case where the pinning film 106 is not provided, the p-type semiconductor region 105 is extends in the thickness direction of the semiconductor layer 101 while being in contact with each of the body 110*a*$_2$ of the first portion 110*a* and the second portion 110*b* of the isolation region 110.

As illustrated in FIG. 52, the insulating layer 130 covers the conductive pads 122 and 123 and the gate electrode 124 of the transfer transistor TR. The insulating layer 130 includes, for example, one of a silicon oxide (SiO) film, a silicon nitride (SiN) film, or a silicon carbonitride (SiON) film, or a laminated film obtained by laminating two or more of these films.

As illustrated in FIG. 52, the semiconductor layer 140 includes island-shaped element formation regions 142*a* and 142*b* including a semiconductor, an insulating film 143 provided so as to fill a space between the element formation region 142*a* and the element formation region 142*b*, and an insulating film 141 provided on the insulating layer 130 side of each of the element formation regions 142*a* and 142*b*. The element formation regions 142*a* and 142*b* are provided for each pixel block 61J.

As illustrated in FIGS. 50 and 52, the amplification transistor AMP and the selection transistor SEL are arranged in series in the element formation region 142*a*. The switching transistor FDG and the reset transistor RST are arranged in series in the element formation region 142*b*. One of a pair of main electrode regions functioning as a source region and a drain region is shared by the amplification transistor AMP and the selection transistor SEL. Furthermore, one of a pair of main electrode regions functioning as the source region and the drain region is shared by the switching transistor FDG and the reset transistor RST. Note that FIG. 50 illustrates respective gate electrodes 145*a*, 145*s*, 145*f*, and 145*r* of the amplification transistor AMP, the selection transistor SEL, the switching transistor FDG, and the reset transistor and RST. Furthermore, FIG. 52 illustrates the respective gate electrodes 145*a* and 145*r* of the amplification transistor AMP and the reset transistor RST.

As illustrated in FIG. 52, the semiconductor layer 140 is covered with an insulating layer 146.

A contact electrode 147*a* embedded in a connection hole reaching the surface of the conductive pad 122 from the surface of the insulating layer 146 is electrically and mechanically connected to the conductive pad 122. A contact electrode 147*b* embedded in a connection hole reaching the surface of the conductive pad 123 from the surface of the insulating layer 146 is electrically and mechanically connected to the conductive pad 123. The contact electrode 147*a* embedded in a connection hole reaching the surface of the conductive pad 122 from the surface of the insulating layer 146 is electrically and mechanically connected to the gate electrode 124 of the transfer transistor TR.

As illustrated in FIG. 52, a contact electrode embedded in a connection hole reaching the gate electrode 145*a* from the surface of the insulating layer 146 is connected to the gate electrode 145*a* of the amplification transistor AMP. A contact electrode 147*e* embedded in a connection hole reaching the gate electrode 145*r* from the surface of the insulating layer 146 is connected to the gate electrode 145*r* of the reset transistor RST. Although not illustrated, contact electrodes embedded in connection holes reaching the respective gate electrodes from the surface of the insulating layer 146 are also similarly connected to the gate electrodes of the selection transistor SEL and the switching transistor FDG.

A reference potential is applied to the contact electrode 147*b* as a power supply potential. Then, the potential of the p-type semiconductor region 102 of each pixel 3 is fixed to the reference potential via the contact electrode 147*b*, the conductive pad 123, and the contact region 121. In the first embodiment, for example, a Vss potential of 0 V is applied as the reference potential.

<Effects of Twenty-First Embodiment>

In the solid-state imaging device 1J of the twenty-first embodiment, the isolation region 110 has the first portion 110*a* that includes contact with the charge holding region in plan view, and the second portion 110*b* that includes contact with the contact region 121 and has the width W2 narrower than the width W1 of the first portion 110*a*. Thereby, it becomes possible to maximize an area of the photoelectric conversion unit 103 (photoelectric conversion element PD) while suppressing dark current. Furthermore, as compared with a case where the photoelectric conversion cell 22S is surrounded by the first portion, a planar area of the photoelectric conversion cell 22S increases by an amount corresponding to a length of the second portion in plan view. Therefore, it becomes possible to increase the degree of freedom in arrangement of active elements including the transfer transistor TR in the photoelectric conversion cell 22S.

In this embodiment, the solid-state imaging device 1J in which the photoelectric conversion cell, the transfer transistor, and the pixel transistor constituting the readout circuit are provided in different semiconductor layers has been described. However, in the solid-state imaging device in which the photoelectric conversion cell, the transfer transistor, and the pixel transistor are provided in one semiconductor layer as in the above-described embodiment, the active elements are densely disposed. Therefore, it is particularly effective to make the width of the second portion including the contact with the contact region narrower than the first portion including the contact with the charge holding region as in this embodiment.

Furthermore, it is possible to increase a volume of the photoelectric conversion unit in the same plane size, and to improve a saturation signal amount.

Furthermore, a ground contact area between the conductive pad 123 and the contact region 121 increases, and it becomes possible to reduce the resistance of the conductive path using the conductive pad 123.

Furthermore, since the first portion 110*a* of the isolation region 110 has the width of the body 110*a*$_2$ narrower than the width of the head $110a_1$ including the contact with the charge holding region FD in the thickness direction of the semiconductor layer 101, it is possible to increase the volume of the photoelectric conversion unit 103 as compared with a case where the isolation region is configured in the thickness direction of the semiconductor layer with the width of the head portion 110*a*1, and to further improve a saturation signal amount Qs.

Twenty-Second Embodiment

Figure 54:
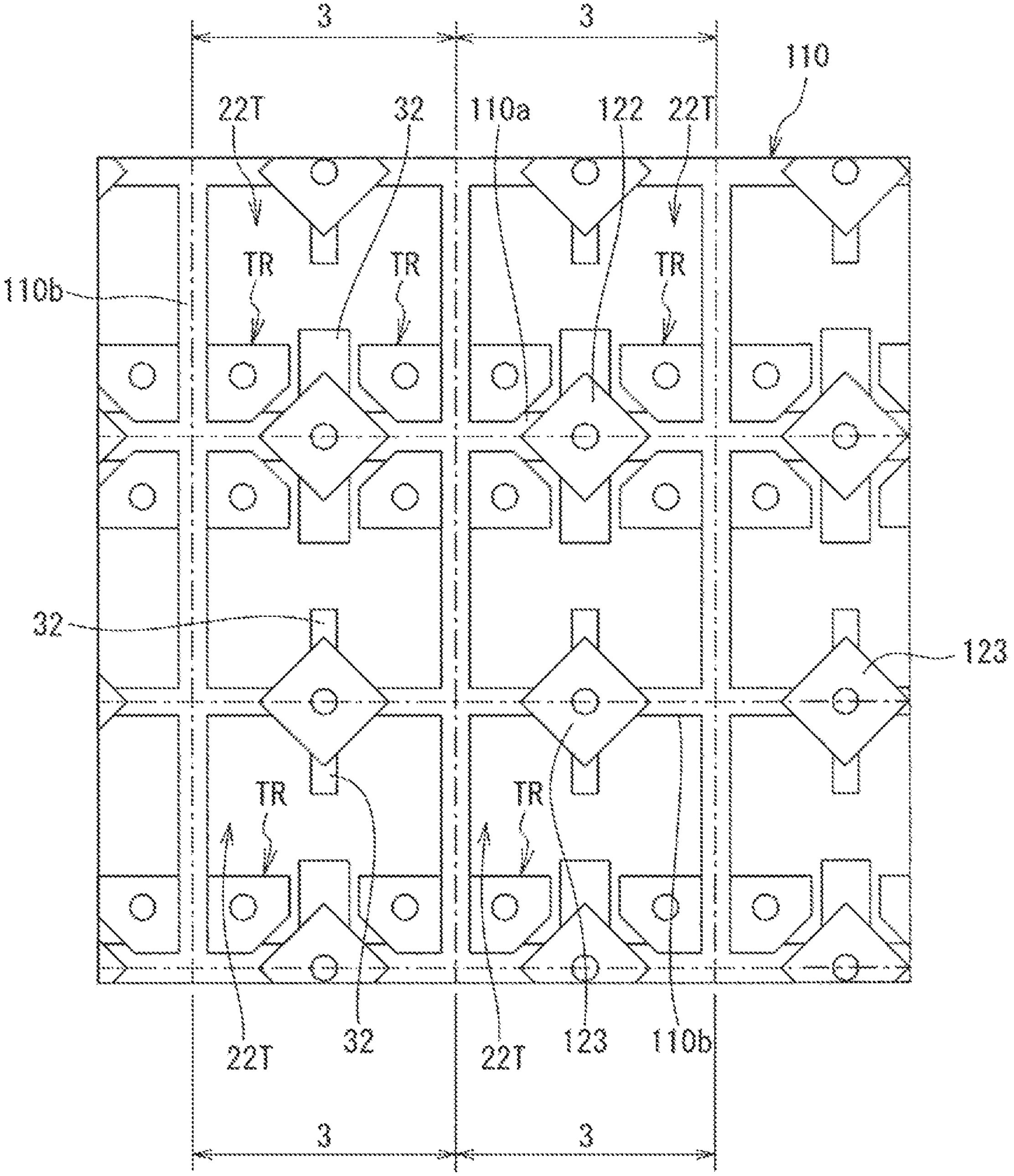
FIG. 54 is a schematic plan view illustrating a configuration example of a pixel block of a solid-state imaging device according to a twenty-second embodiment of the present technology.

In a solid-state imaging device 1K according to a twenty-second embodiment, as illustrated in FIG. 54, a photoelectric conversion cell 22T included in a pixel 3 is divided into two regions by an in-pixel isolation region. Then, the photoelectric conversion cell 22T is partitioned by an isolation region 110 having a first portion and a second portion similarly to the above-described photoelectric conversion cell 22S of the twenty-first embodiment illustrated in FIG. 51.

In the solid-state imaging device 1K according to the second embodiment, effects similar to those of the above-described twenty-first embodiment can be obtained.

Twenty-Third Embodiment

Application Example to Electronic Device

The present technology (technology according to the present disclosure) can be applied to various electronic devices such as imaging devices such as a digital still camera and a digital video camera, a mobile telephone device having an imaging function, and another device having the imaging function, for example.

FIG. 55 is a diagram illustrating a schematic configuration of an electronic device (for example, a camera) according to the twenty-third embodiment of the present technology.

As illustrated in FIG. 55, an electronic device 200 includes a solid-state imaging device 201, an optical lens 202, a shutter device 203, a drive circuit 204, and a signal processing circuit 205. The electronic device 200 illustrates an embodiment in a case of using the solid-state imaging device 1A, 1B, 1C, 1D, 1E, 1F, 1G, 1H, 1H, or 1J according to the first to twenty-second embodiments of the present technology as the solid-state imaging device 201 for an electronic device (for example, a camera).

The optical lens 202 forms an image of image light (incident light 206) from an object on an imaging surface of the solid-state imaging device 201. Thereby, signal charges are accumulated in the solid-state imaging device 201 over a certain period. The shutter device 203 controls a light irradiation period and a light-shielding period for the solid-state imaging device 201. The drive circuit 204 supplies a drive signal that controls a transfer operation of the solid-state imaging device 201 and a shutter operation of the shutter device 203. Signal transfer of the solid-state imaging device 201 is performed by the drive signal (timing signal) supplied from the drive circuit 204. The signal processing circuit 205 performs various types of signal processing for a signal (pixel signal) output from the solid-state imaging device 201. A video signal for which the signal processing has been performed is stored in a storage medium such as a memory or is output to a monitor.

With such a configuration, in the electronic device 200 according to the twenty-third embodiment, light reflection at the light-shielding film or the insulating film in contact with an air layer is suppressed by a light reflection suppression unit in the solid-state imaging device 201, so that it is possible to suppress flare and to improve image quality.

Note that the electronic device 200 to which the solid-state imaging devices 1A to 1J can be applied is not limited to a camera, and can also be applied to other electronic devices. For example, the electronic device 200 may be applied to an imaging device such as a camera module for a mobile device, such as a mobile phone or a tablet terminal.

Furthermore, the present technology can be applied to all light detecting devices including a distance measuring sensor that is called a time of flight (ToF) sensor and measures a distance, in addition to the solid-state imaging device as the above-described image sensor. The distance measuring sensor is a sensor that emits irradiation light toward an object, detects reflected light obtained by reflecting the irradiation light on a surface of the object, and calculates a distance to the object on the basis of a flight time from emission of the irradiation light to reception of the reflected light. The above-described structure of the element isolation region can be adopted as a structure of an element isolation region of the distance measuring sensor.

Modification of Fourteenth Embodiment

As illustrated in FIG. 45, in the modification of the above-described nineteenth embodiment, the dummy gate electrode 45*b* is provided in the element formation region 21*a* of the pixel $3a_2$. It is a matter of course that the technology of providing the dummy gate electrode 45*b*, that is, the technology of providing a dummy transistor can also be applied to the above-described fourteenth embodiment illustrated in FIGS. 25 to 27.

Figure 56:
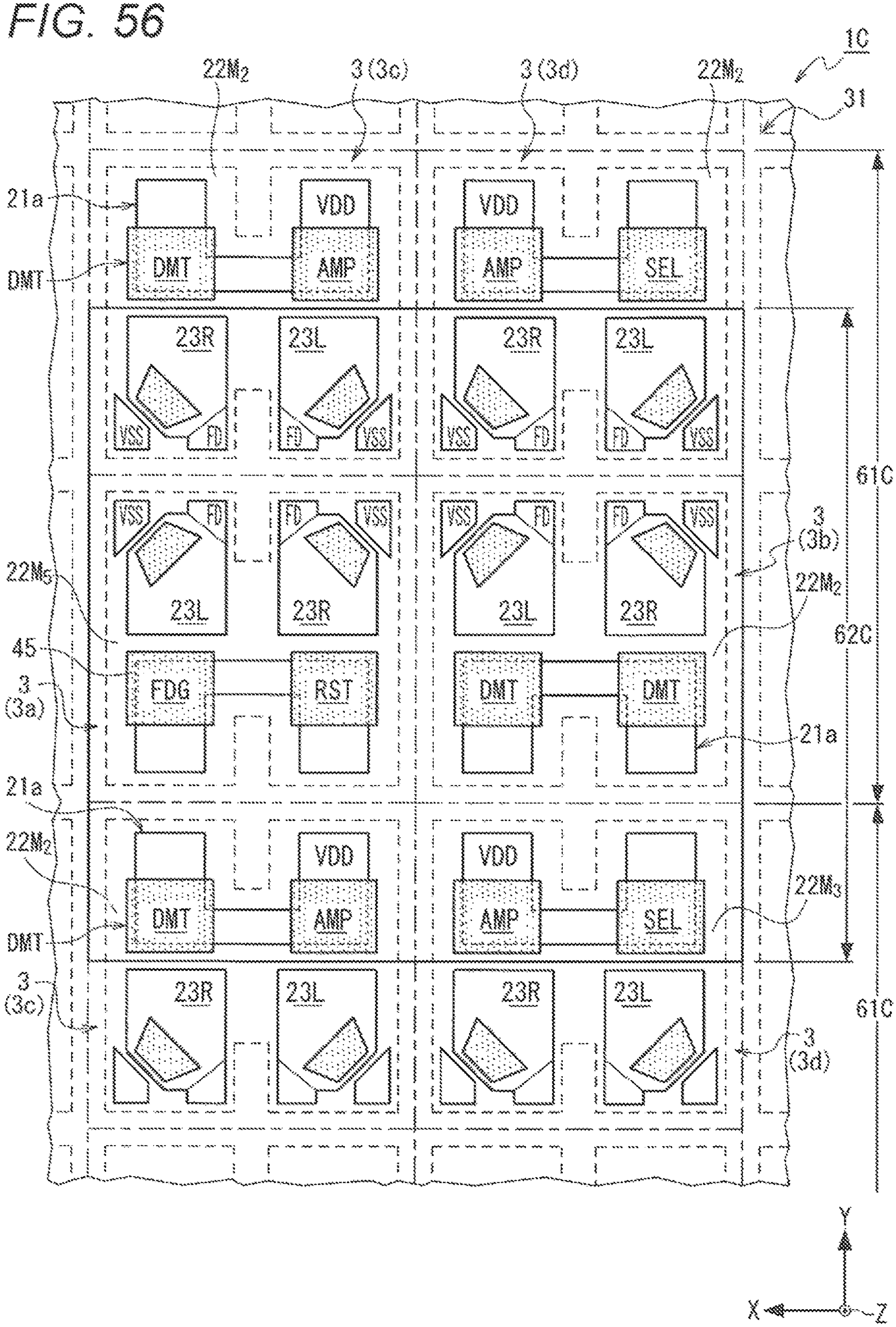
FIG. 56 is a schematic plan view of a pixel block illustrating a first modification according to the fourteenth embodiment of the present technology.

For example, as a first modification of the above-described fourteenth embodiment, as illustrated in FIG. 56, a dummy transistor DMT may be provided in place of the selection transistor SEL in FIG. 26 in the element formation region 21*a* of the pixel 3*c*, and two dummy transistors DMT may be provided in place of the amplification transistor AMP and the selection transistor SEL in FIG. 26 in the element formation region 21*a* of the pixel 3*b*.

Figure 57:
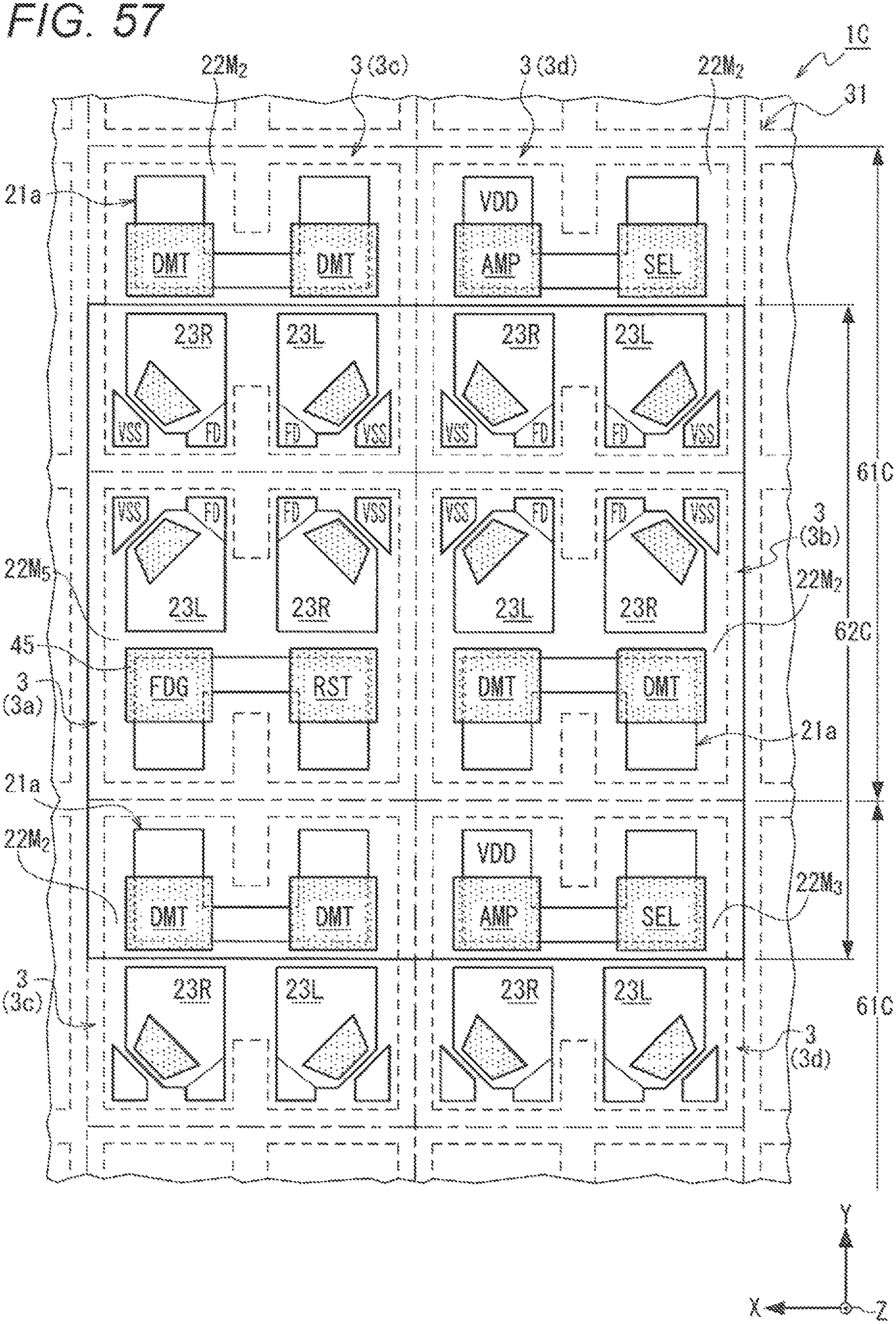
FIG. 57 is a schematic plan view of a pixel block illustrating a second modification according to the fourteenth embodiment of the present technology.

Furthermore, as a second modification of the above-described fourteenth embodiment, as illustrated in FIG. 57, two dummy transistors DMT may be provided in place of the amplification transistor AMP and the selection transistor SEL in FIG. 26 in the element formation region 21*a* of the pixel 3*c*, and two dummy transistors DMT may be provided in place of the amplification transistor AMP and the selection transistor SEL in FIG. 26 in the element formation region 21*a* of the pixel 3*b*.

Figure 58:
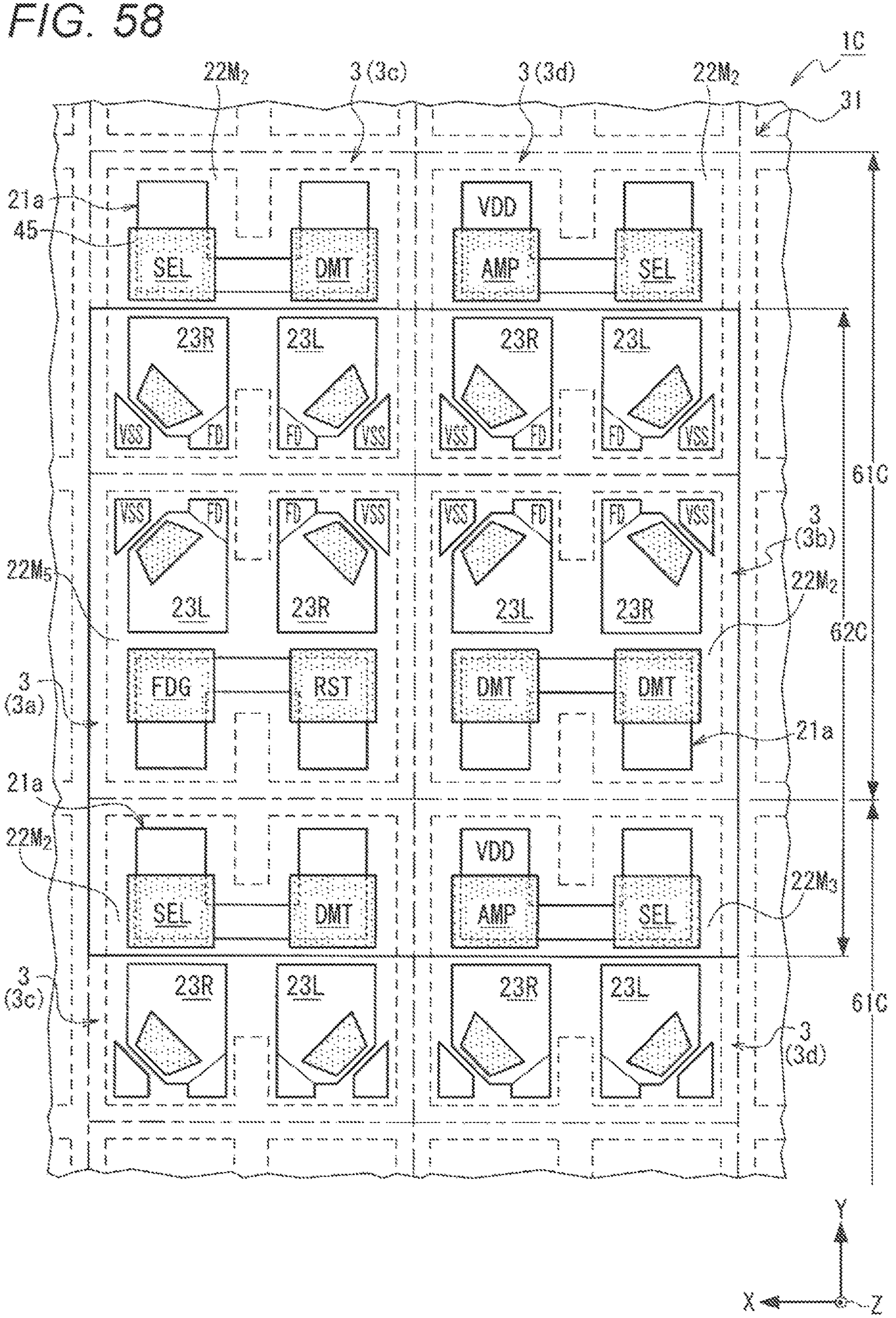
FIG. 58 is a schematic plan view of a pixel block illustrating a third modification according to the fourteenth embodiment of the present technology.

Furthermore, as a third modification of the above-described fourteenth embodiment, as illustrated in FIG. 58, a dummy transistor DMT may be provided in place of the amplification transistor AMP in FIG. 26 in the element formation region 21*a* of the pixel 3*c*, and two dummy transistors DMT may be provided in place of the amplification transistor AMP and the selection transistor SEL in FIG. 26 in the element formation region 21*a* of the pixel 3*b*.

Figure 59:
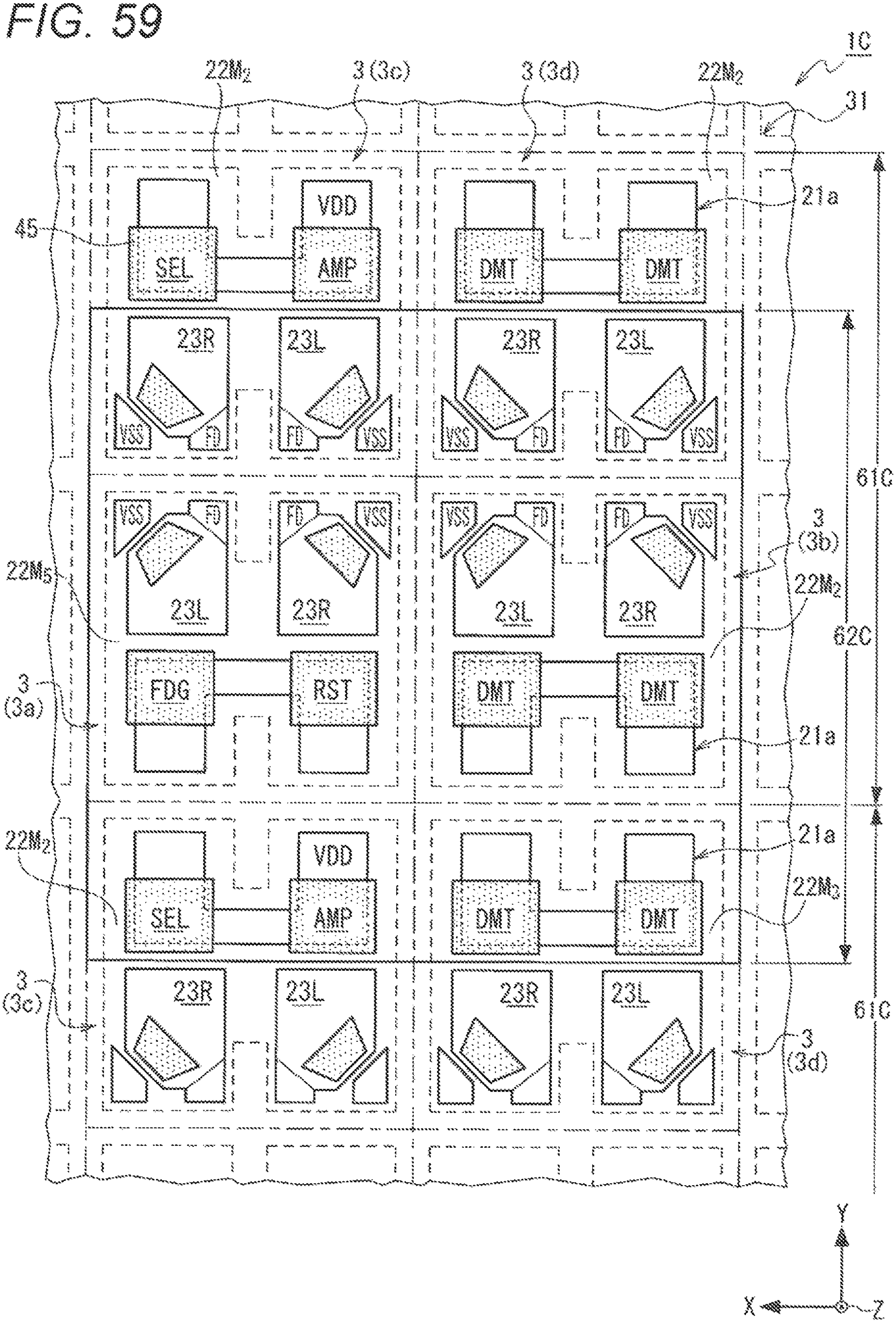
FIG. 59 is a schematic plan view of a pixel block illustrating a fourth modification according to the fourteenth embodiment of the present technology.

Furthermore, as a fourth modification of the above-described fourteenth embodiment, as illustrated in FIG. 59, two dummy transistors DMT may be provided in place of the amplification transistor AMP and the selection transistor SEL in FIG. 26 in the element formation region 21*a* of the pixel 3*d*, and two dummy transistors DMT may be provided in place of the amplification transistor AMP and the selection transistor SEL in FIG. 26 in the element formation region 21*a* of the pixel 3*b*.

That is, the circuit block 62C may include the dummy transistor DMT as a pixel transistor. The number of dummy transistors DMT is not limited to the numbers in the first to fourth modifications of the fourteenth embodiment, and the circuit block 62C is only required to include at least one amplification transistor AMP, one selection transistor SEL, one reset transistor RST, and one switching transistor FDG.

Note that the dummy transistor DMT can also be applied to the above-described thirteenth embodiment.

Furthermore, it goes without saying that the above-described electronic device according to the twenty-third embodiment can be applied to the solid-state imaging device according to the first to fourth modifications of the fourteenth embodiment.

Note that the present technology may have the following configurations.

(1)

A light detecting device including:

a semiconductor layer having a first surface and a second surface located on opposite sides to each other in a thickness direction; and a photoelectric conversion cell provided in the semiconductor layer and partitioned by a first isolation region extending in the thickness direction of the semiconductor layer, in which the photoelectric conversion cell includes a first photoelectric conversion region and a second photoelectric conversion region provided adjacent to each other in plan view in the semiconductor layer and each having a photoelectric conversion unit and a transfer transistor, a second isolation region arranged between the first photoelectric conversion region and the second photoelectric conversion region in plan view and extending in the thickness direction of the semiconductor layer, and an element formation region partitioned by a third isolation region and provided on the first surface side of the semiconductor layer, and provided with a pixel transistor, and the element formation region extends over the first and second photoelectric conversion regions in plan view.

(2)

The light detecting device according to (1) above, in which the photoelectric conversion cell includes a rectangular planar pattern, the second isolation region is provided so as to protrude inward from each of the two first isolation regions located on opposite sides to each other across the photoelectric conversion cell in plan view, and the element formation region crosses a region between the two second isolation regions in plan view.

(3)

The light detecting device according to (1) or (2) above, in which the element formation region includes a first portion crossing a region between the two second isolation regions, and a pair of second portions respectively extending from one end side and the other end side of the first portion to an opposite side to the transfer transistor side of the first portion.

(4)

The light detecting device according to any one of (1) to (3) above, in which the photoelectric conversion cell further includes a semiconductor region of a first conductivity type provided in the semiconductor layer over the element formation region and each of the first and second photoelectric conversion regions, and a contact region of the first conductivity type provided in the first semiconductor region, and the contact region is arranged between the two second isolation regions in plan view.

(5)

The light detecting device according to any one of (1) to (4) above, in which the transfer transistor of each of the first and second photoelectric conversion regions is provided in the element formation region.

(6)

The light detecting device according to any one of (1) to (5) above, further including:

a semiconductor region of a first conductivity type provided in the semiconductor layer over the element formation region and each of the first and second photoelectric conversion regions, and a contact region of the first conductivity type provided in the first semiconductor region, and the contact region is arranged between at least one of the pair of second portions and the first isolation region in plan view.

(7)

The light detecting device according to any one of (1) to (6) above, in which the pixel transistor is provided in each of the first and second photoelectric conversion regions.

(8)

The light detecting device according to any one of (1) to (7) above, in which each of the first isolation region and the second isolation region is integrated with the third isolation region.

(9)

A light detecting device including:

a semiconductor layer having a first surface and a second surface located on opposite sides to each other in a thickness direction; and a photoelectric conversion cell provided in the semiconductor layer and partitioned by a first isolation region extending in the thickness direction of the semiconductor layer, in which the photoelectric conversion cell includes a first photoelectric conversion region and a second photoelectric conversion region provided adjacent to each other in plan view in the semiconductor layer and each having a photoelectric conversion unit and a transfer transistor, a second isolation region arranged between the first photoelectric conversion region and the second photoelectric conversion region in plan view and extending in the thickness direction of the semiconductor layer, an element formation region partitioned by a third isolation region and provided on the first surface side of the semiconductor layer, and provided with a pixel transistor, a charge holding region provided on the first surface side of the semiconductor layer, a semiconductor region of a first conductivity type provided in the semiconductor layer over the element formation region, the first photoelectric conversion region, and the second photoelectric conversion region, and a contact region of a first conductivity type provided in the semiconductor region, and at least one of the charge holding region or the contact region is shared by the first and second photoelectric conversion regions, and is arranged between the first photoelectric conversion region and the second photoelectric conversion region in plan view.

(10)

The light detecting device according to (9) above, in which the photoelectric conversion cell has a planar pattern in a rectangular shape in plan view, and the second isolation region is provided to be separated from each of the two first isolation regions located on opposite sides to each other across the photoelectric conversion cell in plan view.

(11)

The light detecting device according to (9) or (10) above, in which the charge holding region is arranged between one of the two first isolation regions and the second isolation region in plan view, and the contact region is arranged between the other of the two first isolation regions and the second isolation region in plan view.

(12)

The light detecting device according to any one of (9) to (11) above, in which the element formation region and the pixel transistor are individually provided in each of the first and second photoelectric conversion regions.

(13)

The light detecting device according to any one of (9) to (12) above, in which the charge holding region is provided between one of the two first isolation regions and the second isolation region, and the element formation region crosses a region between the other of the two first isolation regions and the second isolation region in plan view and extends over the first and second photoelectric conversion regions.

(14)

The light detecting device according to (10) above, in which the element formation region includes a first portion crossing a region between the other first isolation region and the second isolation region, and a pair of second portions respectively extending from one end side and the other end side of the first portion to an opposite side to the other first isolation region side of the first portion.

(15)

The light detecting device according to any one of (9) to (14) above, in which the pixel transistor is provided in each of the first and second photoelectric conversion regions.

(16)

A light detecting device including:

a semiconductor layer including a plurality of photoelectric conversion cells arranged adjacent to each other via an isolation region in plan view, each of the photoelectric conversion cells being provided with a photoelectric conversion unit and a transfer transistor;

a semiconductor region provided on the isolation region side of each of the plurality of photoelectric conversion cells in plan view; and a conductive pad partially embedded in the isolation region and connected to the semiconductor region of each of the plurality of photoelectric conversion cells across the isolation region in plan view.

(17)

The light detecting device according to (16) above, in which the conductive pad includes a body located in the isolation region and a head protruding from the body to an outside of the element isolation region and wider than the body, and the semiconductor region is connected to each of the body and the head.

(18)

The light detecting device according to (16) or (17) above, in which the semiconductor region is any of a charge holding region, a first contact region to which a first reference potential is applied, or a second contact region to which a second reference potential different from the first reference potential is applied.

(19)

The light detecting device according to any one of (16) to (18) above, further including: relay wiring including the two conductive pads and a coupling portion that couples the two conductive pads.

(20)

The light detecting device according to any one of (16) to (19) above, in which each of the plurality of photoelectric conversion cells further includes a pixel transistor that shares a gate electrode arranged in each of the photoelectric conversion cells across the isolation region.

(21)

The light detecting device according to (20) above, in which the gate electrode includes a body adjacent to the semiconductor layer via a gate insulating film in the isolation region, and a head protruding from the body to an outside of the isolation region, adjacent to the semiconductor layer via the gate insulating film, and wider than the body.

(22)

A light detecting device including:

a semiconductor layer having a first surface and a second surface located on opposite sides to each other in a thickness direction; and a photoelectric conversion cell partitioned by an element isolation region and provided in the semiconductor layer, in which the photoelectric conversion cell includes a transfer transistor, a charge holding region, and a contact region on the first surface side of the semiconductor layer, and a photoelectric conversion unit on the second surface side, and the isolation region includes a first portion with which the charge holding region is in contact in plan view, and a second portion with which the contact region is in contact and which is narrower in width than the first portion.

(23)

The light detecting device according to (22) above, in which a ratio between the first portion and the second portion in plan view of the isolation region is larger in the second portion.

(24)

The light detecting device according to (22) or (23) above, in which the first portion of the isolation region includes a surface portion provided on the first surface side of the semiconductor layer, and a deep layer portion provided in contact with the surface portion at a position deeper than the surface portion in the thickness direction of the semiconductor layer, and narrower in width than the surface portion.

(25)

The light detecting device according to any one of (22) to (24) above, in which the photoelectric conversion unit includes a first semiconductor region, and the photoelectric conversion cell further includes a second semiconductor region that is adjacent to each of the deep layer portion of the first portion and the second portion, extends in the thickness direction of the semiconductor layer, and has an opposite conductivity type to the first semiconductor region.

(26)

The light detecting device according to any one of (22) to (25) above, in which the photoelectric conversion cell further includes a pinning film between each of the deep layer portion of the first portion and the second portion, and the second semiconductor region.

(27)

A light detecting device including:

a pixel unit including four pixels each having two photoelectric conversion regions, two transfer transistors, and two charge holding regions, in which the charge holding regions of the respective pixels of the pixel unit are electrically connected to each other.

(28)

The light detecting device according to (27) above, in which the eight charge holding regions of the pixel unit are electrically connected.

(29)

The light detecting device according to (27) or (28) above, in which the eight charge holding regions are connected to a first amplification transistor.

(30)

The light detecting device according to any one of (27) to (29) above, in which the eight charge holding regions are connected to the first amplification transistor and a second amplification transistor.

(31)

The light detecting device according to any one of (27) to (30) above, in which the eight charge holding regions are connected to a switching transistor and connected to a reset transistor via the switching transistor.

(32)

The light detecting device according to (31) above, further including: capacitance connected between the switching transistor and the reset transistor.

(33)

The light detecting device according to any one of (27) to (32) above, in which the four pixels of the pixel unit include a first pixel, a second pixel, a third pixel, and a fourth pixel, the first pixel includes first and second charge holding regions, the second pixel includes third and fourth charge holding regions, the third pixel includes fifth and sixth charge holding regions, the fourth pixel includes seventh and eighth charge holding regions, a first line connecting the first charge holding region and the fifth charge holding region and a second line connecting the second charge holding region and the sixth charge holding region are parallel, and a third line connecting the first charge holding region and the second charge holding region and a fourth line connecting the fifth charge holding region and the sixth charge holding region are parallel.

(34)

A light detecting device including:

a plurality of pixels provided in a two-dimensional manner, in which five semiconductor regions partitioned by an element isolation region are included in each pixel of the plurality of pixels.

(35)

The light detecting device according to (34) above, in which two regions of the five semiconductor regions are regions provided with a transfer transistor.

(36)

The light detecting device according to (34) or (35) above, in which two regions of the five semiconductor regions are regions provided with a pixel transistor.

(37)

The light detecting device according to (36) above, in which the pixel transistor includes any one of a selection transistor, an amplification transistor, or a reset transistor.

(38)

The light detecting device according to any one of (35) to (37) above, in which one region of the five semiconductor regions is a p-type semiconductor region.

(39)

The light detecting device according to (38) above, in which a reference potential is applied to the p-type semiconductor region as a power supply potential.

(40)

The light detecting device according to (39) above, in which the reference potential is 0 V.

(41)

The light detecting device according to (38) above, in which two regions of the five semiconductor regions are regions provided with a pixel transistor, and the p-type semiconductor region is provided between the regions provided with a pixel transistor.

(42)

The light detecting device according to any one of (34) to (41) above, in which the element isolation region includes STI.

(43)

A light detecting device including:

a plurality of pixels provided in a two-dimensional manner; and five semiconductor regions partitioned by an element isolation region in the pixel, in which the five semiconductor regions include a first semiconductor region provided with a first transfer transistor, a second semiconductor region provided with a second transfer transistor, a third semiconductor region provided with a first pixel transistor other than the first and second transfer transistors, a fourth semiconductor region provided with a second pixel transistor other than the first and second transfer transistors, and a p-type semiconductor region.

(44)

The light detecting device according to (43) above, in which the first or second pixel transistor is any one of a selection transistor, an amplification transistor, or a reset transistor.

(45)

The light detecting device according to (44) or (44) above, in which a reference potential is applied to the p-type semiconductor region as a power supply potential.

(46)

The light detecting device according to (45) above, in which the reference potential is 0 V.

(47)

The light detecting device according to any one of (43) to (46) above, in which the p-type semiconductor region is provided between the third semiconductor region and the fourth semiconductor region.

(48)

The light detecting device according to any one of (43) to (47) above, in which the element isolation region includes STI.

(49)

A light detecting device including:

a first pixel provided on a semiconductor substrate; and a trench including a first region that isolates the first pixel from an adjacent pixel and a second region in which a photoelectric conversion unit provided in the first pixel is shielded in plan view, in which the second region has a first portion between a first floating diffusion region and a second floating diffusion region provided in the first pixel in plan view, the second region has a second portion between a first transistor and a second transistor provided in the first pixel in the plan view, and a contact region is provided between the first portion and the second portion in the plan view.

(50)

The light detecting device according to (49) above, in which the first portion, the contact region, and the second portion are arranged in this order along a first direction in the plan view.

(51)

The light detecting device according to (50) above, in which a first contact, a gate electrode, and a second contact of the first transistor are arranged in this order along the first direction.

(52)

The light detecting device according to (51) above, in which a third contact, a gate electrode, and a fourth contact of the second transistor are arranged in this order along the first direction.

(53)

The light detecting device according to any one of (49) to (52) above, in which the trench penetrates the semiconductor substrate.

(54)

The light detecting device according to any one of (49) to (53) above, in which the contact region is provided at a center of the first pixel.

(55)

The light detecting device according to any one of (49) to (54) above, in which the contact region is a p-type impurity region.

(56)

A light detecting device including:

a first pixel provided on a semiconductor substrate; and an isolation region that isolates the first pixel from an adjacent pixel, in which the first pixel is surrounded by first to fourth portions of the isolation region in plan view, the isolation region includes a fifth portion and a sixth portion provided between the first portion and the third portion in the plan view, a contact region is provided between the fifth portion and the sixth portion in the plan view, and the fifth portion is in contact with the first portion, and the sixth portion is in contact with the third portion.

(57)

The light detecting device according to (56) above, in which an angle formed by the first portion and the fifth portion is perpendicular.

(58)

The light detecting device according to (56) or (57) above, in which the first portion and the third portion face each other.

(59)

The light detecting device according to any one of (56) to (58) above, in which the fifth portion, the contact region, and the sixth portion are arranged in this order along a first direction in the plan view.

(60)

The light detecting device according to (59) above, in which the first pixel includes a first transistor and a second transistor provided on both sides of the sixth portion, and a first contact, a gate electrode, and a second contact of the first transistor are arranged in this order along the first direction.

(61)

The light detecting device according to (60) above, in which a third contact, a gate electrode, and a fourth contact of the second transistor are arranged in this order along the first direction.

(62)

The light detecting device according to any one of (56) to (61) above, in which the trench penetrates the semiconductor substrate.

(63)

The light detecting device according to any one of (56) to (62) above, in which the contact region is provided at a center of the first pixel.

(64)

The light detecting device according to any one of (56) to (63) above, in which the contact region is a p-type impurity region.

(65)

An electronic device including: the light detecting device according to any one of (1), (9), (16), (22), (27), (34), (43), (49), and (56) above; an optical lens that forms an image of image light from an object on an imaging surface of the light detecting device; and a signal processing circuit that performs signal processing for a signal output from the light detecting device.

The scope of the present technology is not limited to the illustrated and described exemplary embodiments, but also includes all embodiments that provide equivalent effects to those for which the present technology is intended. Moreover, the scope of the present technology is not limited to the combinations of the features of the invention defined by the claims, but may be defined by any desired combination of specific features among all the disclosed features.

REFERENCE SIGNS LIST

1 Solid-state imaging device
2 Semiconductor chip
2A Pixel region
2B Peripheral region
3, 3*a*, 3*b*, 3*c*, 3*d* Pixel
4 Vertical drive circuit
Column signal processing circuit
6 Horizontal drive circuit
7 Output circuit
8 Control circuit
Pixel drive line
12 Horizontal signal line
13 Logic circuit
14 Bonding pad
Readout circuit
21 Semiconductor layer
21*a*, 21$b_1$, 21$b_2$, 21*c*, 21*d* Element formation region (active region)
21*z* Feeding region
22A, 22B, 22C, 22D, 22E, 22F, 22G, 22H, 22I, 22J, 22K, 22L, 22$M_1$, 22$M_2$, 22$M_3$, 22$M_4$, 22$M_5$ Photoelectric conversion cell
23L First photoelectric conversion region
23R Second photoelectric conversion region
24 p-type semiconductor region
25 Photoelectric conversion unit
26 n-type semiconductor region
31 Pixel isolation region (first isolation region)
32 In-pixel isolation region (second isolation region)
33 Element isolation region (third isolation region)
41 Gate groove
42 Gate insulating film
43 Gate electrode
44 Gate insulating film
45 Gate electrode
46, 47 Main electrode region
48 Contact region
51 Color filter
52 Microlens
71, 73 Relay wiring
71*a*, 72, 73*a*, 73*b* Conductive pad
71*c*, 73*c* Coupling portion
AMP Amplification transistor
FD, FD1, FD2 Charge holding region (floating diffusion)
FDG Switching transistor
RST Reset transistor
SEL Selection transistor
TR1, TR2 Transfer transistor

What is claimed is:

1. A light detecting device, comprising:
a pixel unit having four pixels, wherein
each pixel of the four pixels in the pixel unit has two photoelectric conversion regions, two transfer transistors, and two charge holding regions, and
the charge holding regions of the respective pixels of the pixel unit are electrically connected to each other,
the four pixels of the pixel unit include a first pixel, a second pixel, a third pixel, and a fourth pixel,
the first pixel includes first and second charge holding regions,
the second pixel includes third and fourth charge holding regions,
the third pixel includes fifth and sixth charge holding regions,
the fourth pixel includes seventh and eighth charge holding regions,
a first line connecting the first charge holding region and the fifth charge holding region and a second line connecting the second charge holding region and the sixth charge holding region are parallel, and
a third line connecting the first charge holding region and the second charge holding region and a fourth line connecting the fifth charge holding region and the sixth charge holding region are parallel.

2. The light detecting device according to claim 1, wherein the eight charge holding regions of the pixel unit are electrically connected.

3. The light detecting device according to claim 1, wherein the eight charge holding regions are connected to a first amplification transistor.

4. The light detecting device according to claim 1, wherein the eight charge holding regions are connected to a first amplification transistor and a second amplification transistor.

5. The light detecting device according to claim 1, wherein the eight charge holding regions are connected to a switching transistor and connected to a reset transistor via the switching transistor.

6. The light detecting device according to claim 5, further comprising: capacitance connected between the switching transistor and the reset transistor.

7. The light detecting device according to claim 1, wherein the two photoelectric conversion regions, the two transfer transistors, and the two charge holding regions are provided so as to overlap one microlens in plan view.

* * * * *